(12) United States Patent
Kawakami et al.

(10) Patent No.: US 6,563,318 B2
(45) Date of Patent: May 13, 2003

(54) DETECTING METHOD FOR DETECTING INTERNAL STATE OF A RECHARGEABLE BATTERY, DETECTING DEVICE FOR PRACTICING SAID DETECTING METHOD, AND INSTRUMENT PROVIDED WITH SAID DETECTING DEVICE

(75) Inventors: Soichiro Kawakami, Nara (JP); Yasusaburo Degura, Souraku-gun (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/862,307

(22) Filed: May 23, 2001

(65) Prior Publication Data

US 2002/0109506 A1 Aug. 15, 2002

(30) Foreign Application Priority Data

May 23, 2000 (JP) ........................................ 2000-151521

(51) Int. Cl.$^7$ ............................................. G01N 27/416

(52) U.S. Cl. ........................................ 324/426; 320/132

(58) Field of Search ................................ 324/426, 427, 324/428, 430, 431, 432, 433; 320/132, 134, 136, 149, DIG. 19, DIG. 21

(56) References Cited

U.S. PATENT DOCUMENTS 5,994,877 A    11/1999    Seri et al. .................... 320/132

FOREIGN PATENT DOCUMENTS

| JP | 4-2066 | 1/1992 |
| JP | 4-136774 | 5/1992 |
| JP | 9-134742 | 5/1997 |
| JP | 11-16607 | 1/1999 |

*Primary Examiner*—Edward H. Tso
(74) *Attorney, Agent, or Firm*—Fitzpatrick, Cella, Harper & Scinto

(57) ABSTRACT

A detecting method for detecting an internal state of an inspective rechargeable battery ($B_a$), said internal state including a deterioration state, an electricity storable capacity, a remaining capacity, and an internal resistance of said inspective rechargeable battery ($B_a$), comprising: (1) a step in which basic data (BD) of characteristics of a normal non-deteriorated rechargeable battery ($B_n$) as a reference rechargeable battery for said inspective rechargeable battery ($B_a$) are provided; and (2) a step in which for said inspective rechargeable battery ($B_a$), a voltage value or/and a current value thereof are measured, and the measured result is compared with said basic data (BD) obtained in said step (1) to judge whether or not said inspective rechargeable battery ($B_a$) is of a deterioration mode and to detect the internal state thereof.

96 Claims, 30 Drawing Sheets

F I G. 20
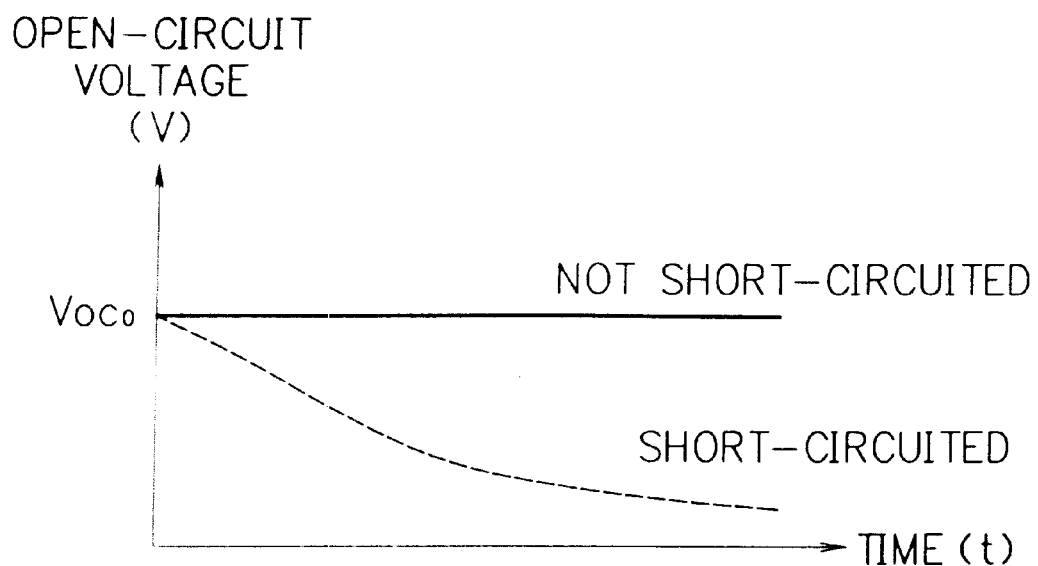

FIG. 21
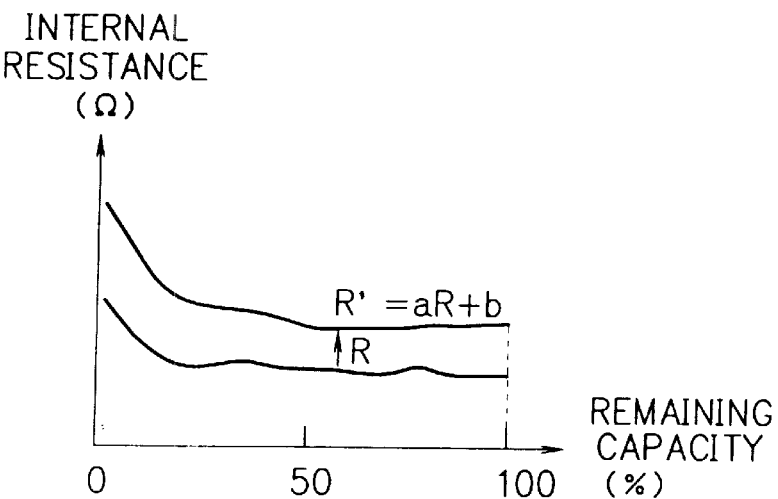
(1)
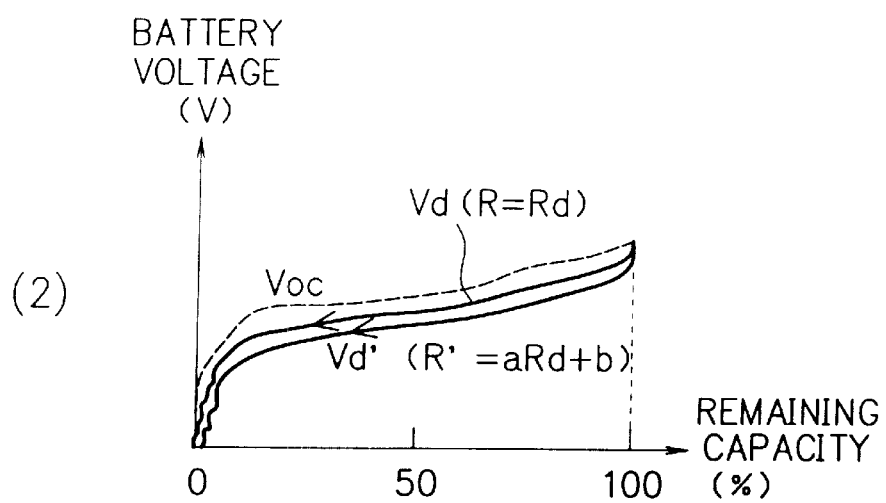
(2)
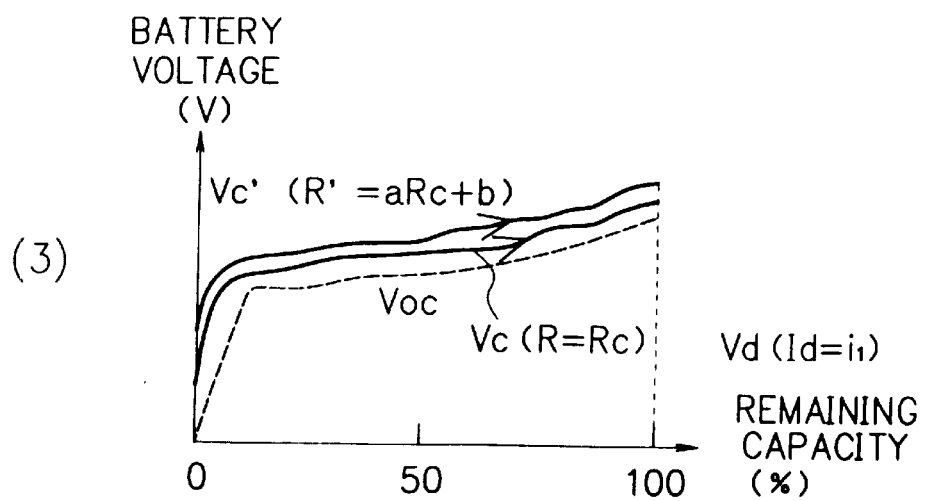
(3)

FIG. 22
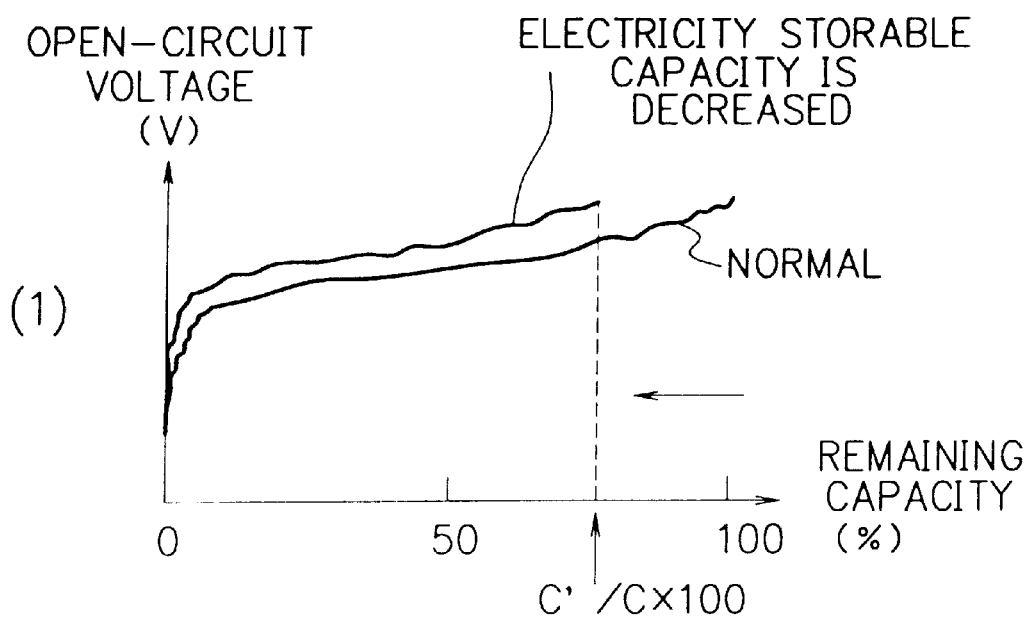
(1)
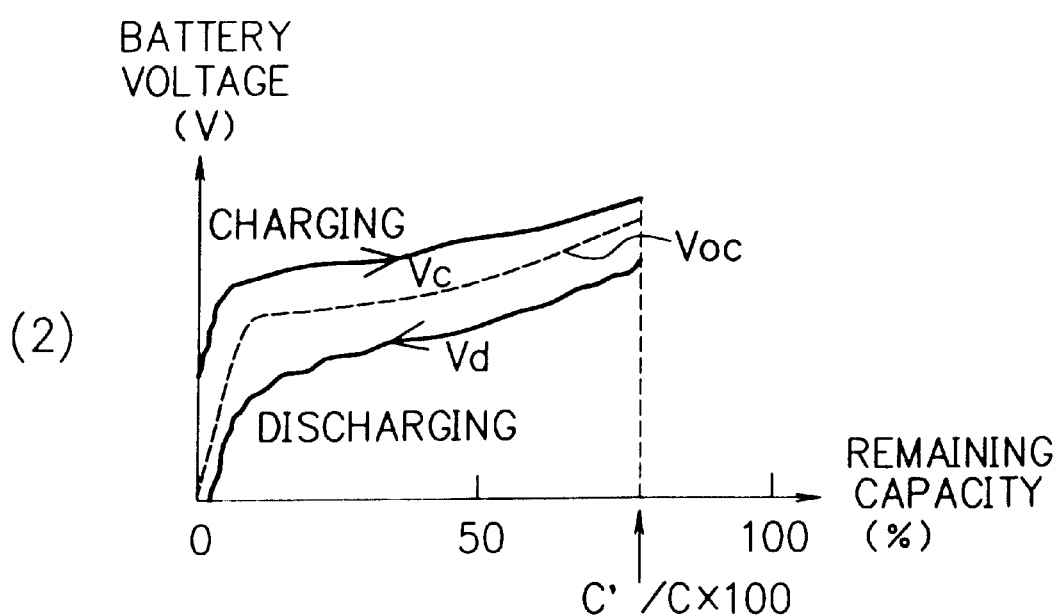
(2)

FIG. 25
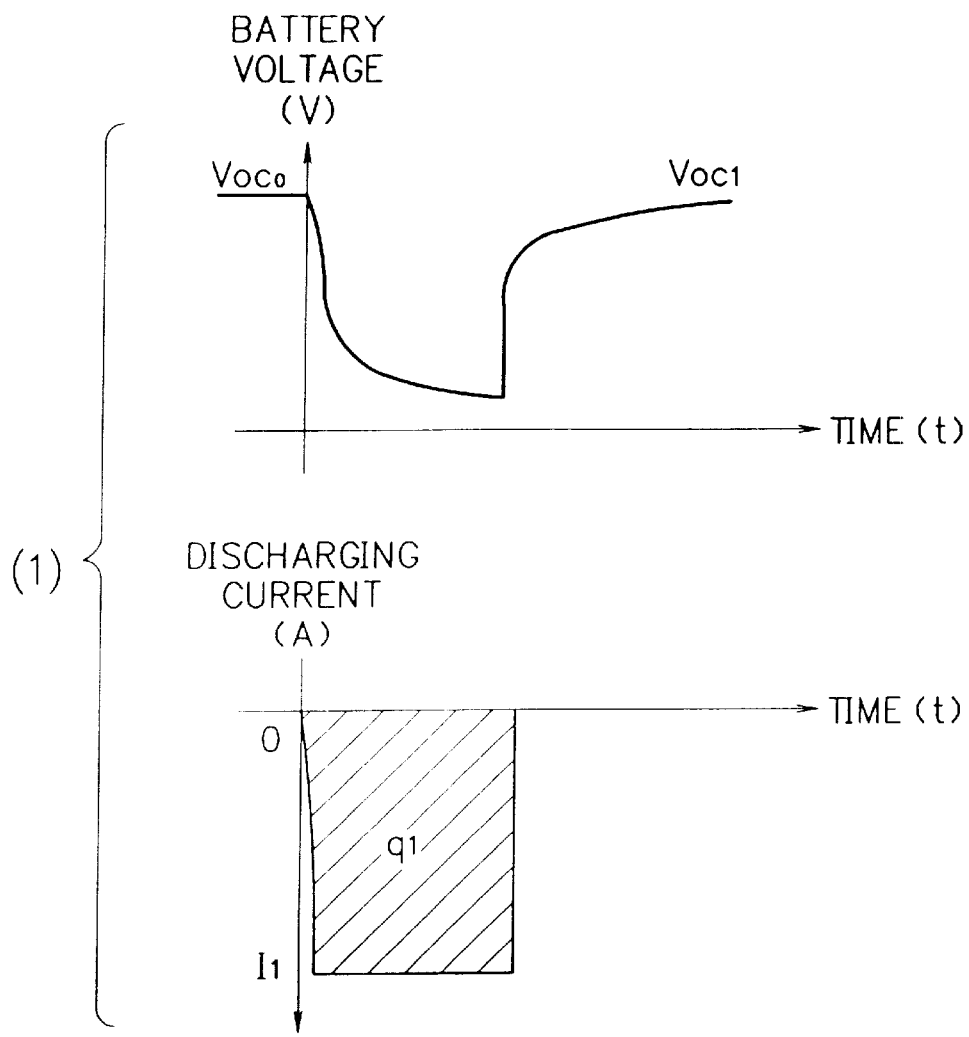
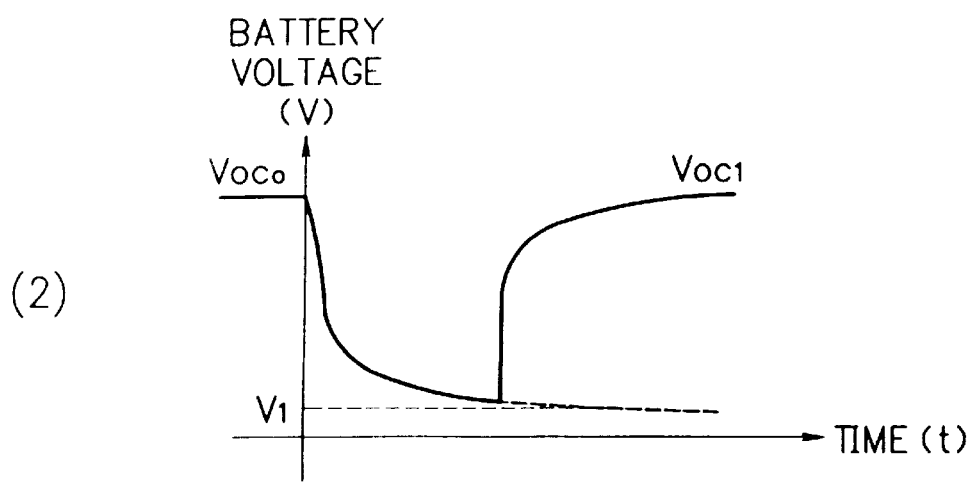

FIG. 26
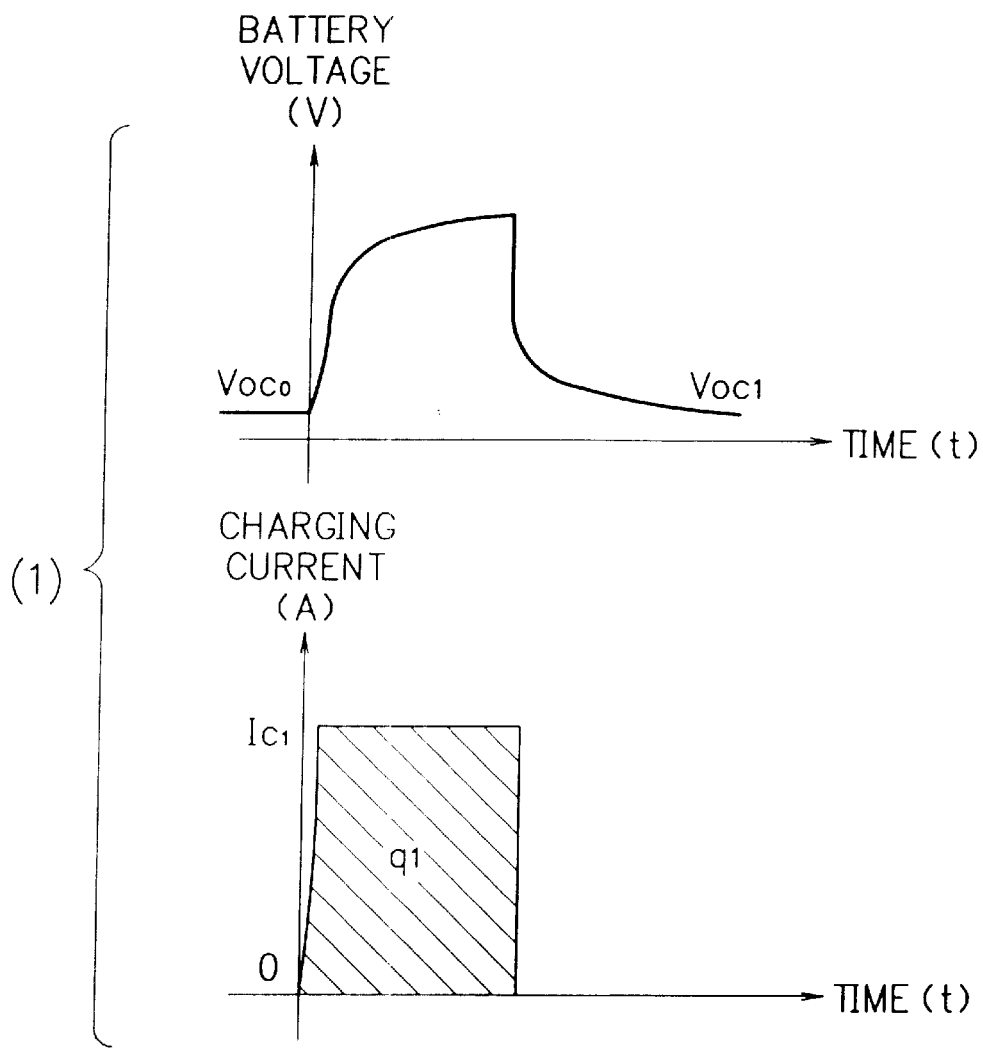
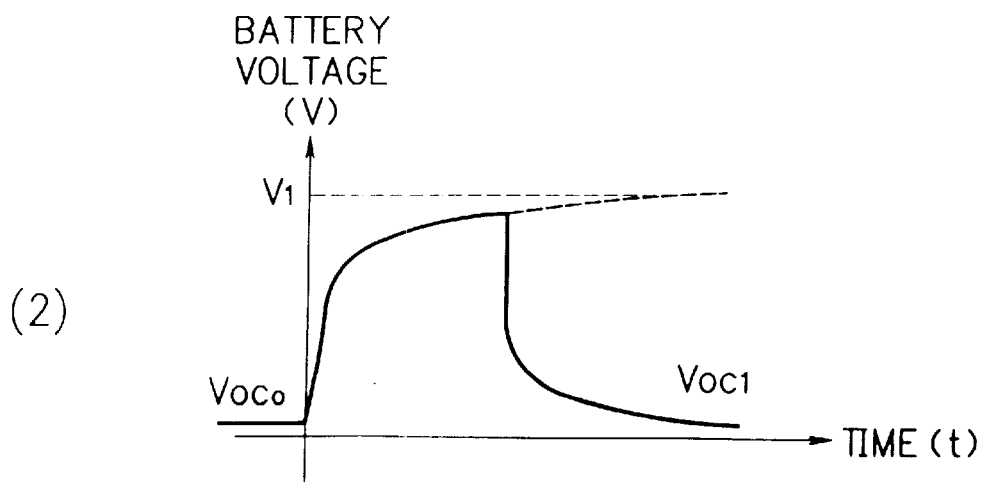

F I G. 31
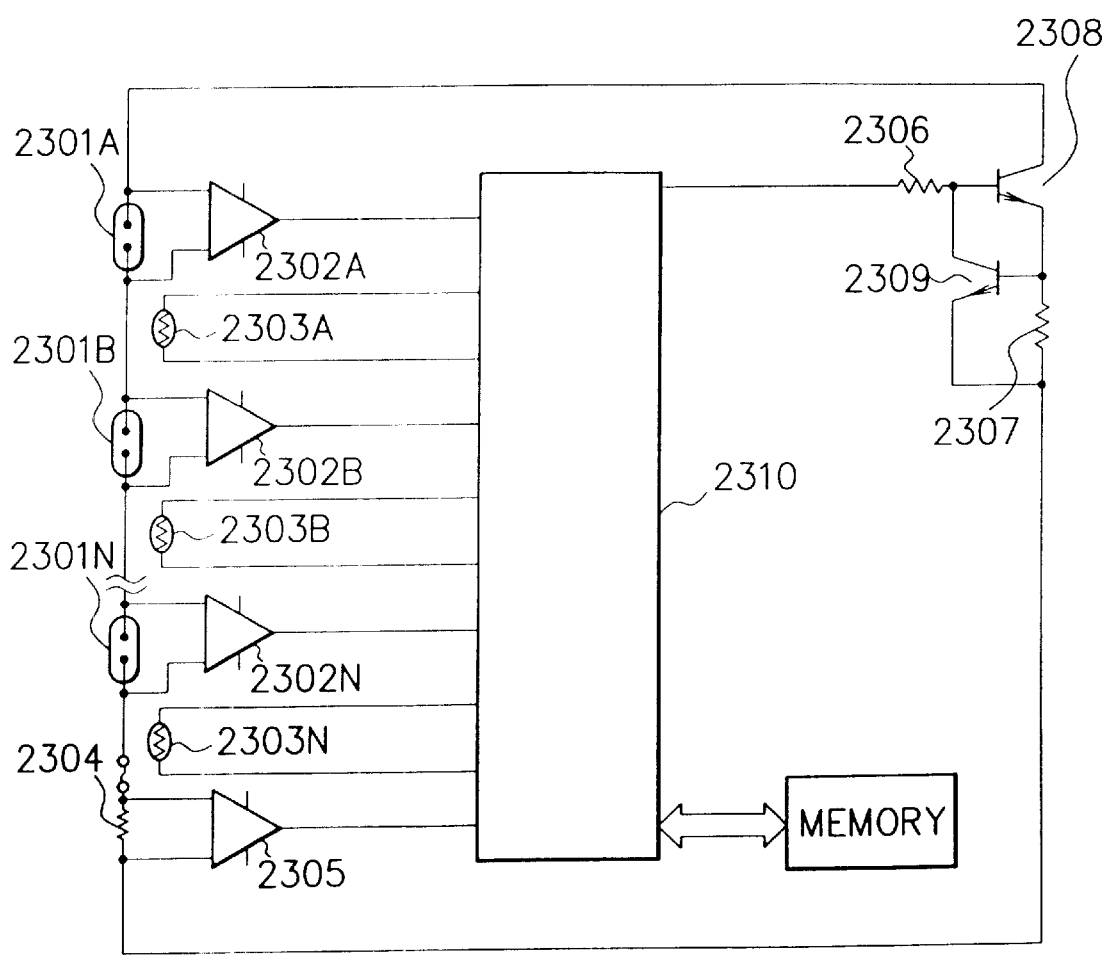

DETECTING METHOD FOR DETECTING INTERNAL STATE OF A RECHARGEABLE BATTERY, DETECTING DEVICE FOR PRACTICING SAID DETECTING METHOD, AND INSTRUMENT PROVIDED WITH SAID DETECTING DEVICE

BACKGROUND OF THE INVENTION

1. Field of the Invention

The present invention relates to a detecting method for detecting internal state of a rechargeable battery and a detecting device suitable for practicing said detecting method. The internal state here is meant to include deterioration state, remaining capacity (=presently stored electricity quantity=dischargeable capacity), usable capacity (=presently residual electricity quantity which is still able to operate an instrument), charging capacity, electricity storable capacity, and internal resistance of said rechargeable battery. The present invention also relates an instrument provided with said detecting device. The present invention includes a program of detecting said internal state of said rechargeable battery and a medium having said program accommodated therein which are available in said detecting method and said detecting device.

2. Prior Art

In recent years, along with development of semiconductor elements and development of miniature, light-weight and high performance rechargeable batteries, mobile instruments such as portable personal computers, video cameras, digital cameras, cellular phones, and personal digital assistants including palmtop PCs have been rapidly progressed.

Separately, in recent years, the global warming of the earth because of the so-called greenhouse effect to an increase in the content of $CO_2$ gas in the air has been predicted. For instance, in thermal electric power plants, thermal energy obtained by burning a fossil fuel is converted into electric energy, and along with burning of such fossil fuel, a large amount of $CO_2$ gas is exhausted in the air. Accordingly, in order to suppress this situation, there is a tendency of prohibiting to newly establish a thermal electric power plant. Under these circumstances, so-called load leveling practice has been proposed in order to effectively utilize electric powers generated by power generators in thermal electric power plants or the like, wherein using a load conditioner having a rechargeable battery installed therein, a surplus power unused in the night is stored in rechargeable batteries installed at general houses and the power thus stored is used in the daytime when the demand for power is increased, whereby the power consumption is leveled.

Separately, in recent years, electric vehicles comprising a rechargeable battery and which do not exhaust any polluting substances have been proposed. Besides hybrid powered automobiles in which a combination of a rechargeable battery and an internal combustion engine or a fuel cell is used and the fuel efficiency is heightened while restraining exhaustion of polluting substances have been also proposed. As the rechargeable battery used in these electric vehicles and hybrid powered automobiles, a high performance rechargeable battery having a high energy density is expected to be developed.

Such rechargeable battery used in the mobile instrument, the load conditioner used for practicing the load leveling, the electric vehicle and the hybrid powered automobile typically includes a rechargeable lithium battery (including a lithium ion battery) in which reduction-oxidation reaction of lithium is used, a nickel-hydride rechargeable battery, a nickel-cadmium rechargeable battery, and a lead rechargeable battery.

Incidentally, in each of the mobile instrument, the load conditioner in the load leveling, the electric vehicle and the hybrid powered automobile, it is important to be able to precisely detect the dischargeable capacity (the remaining capacity), the usable capacity and the lifetime of the rechargeable battery in order to prevent the operation of the mobile instrument, the load conditioner, the electric vehicle or the hybrid powered automobile from being suddenly stopped.

In order to detect the usable capacity of a rechargeable battery, there is known a method wherein the voltage of the battery is measured and based on the measured result, the usable capacity is estimated.

The term "remaining capacity" of the rechargeable battery is meant a presently stored electricity quantity which can be discharged.

The term "usable capacity" is meant a presently residual electricity quantity of the rechargeable battery with which an instrument (or apparatus) having said rechargeable battery can be still operated. The usable capacity is included in the term remaining capacity.

Aforesaid method is applicable in the case of a lithium ion rechargeable battery whose anode material comprising a carbonous material difficult to convert into a graphite and which is distinguished from a graphite, because the battery voltage is gradually decreased in proportion to the quantity for the electricity to be discharged, and therefore, the presently residual electricity quantity can be detected by measuring the battery voltage. However, the method is not always applicable in other rechargeable batteries whose battery voltage is not gradually decreased in proportion to the quantity for the electricity to be discharged as in the case of the lithium ion rechargeable battery (whose anode comprising a graphite), where it is difficult to precisely detect the remaining capacity for the reason that the battery voltage is varied depending on the electric current flown and it is not proportional to the quantity for the electricity to be discharged. Besides, in the case of a rechargeable battery whose performance has been deteriorated to close its lifetime, it is extremely difficult to detect the remaining capacity. Separately, in the case of a lithium ion rechargeable battery whose anode material comprising a graphite series carbonous material, because the battery voltage with respect to the quantity for the electricity to be discharged is flat, the remaining capacity is difficult to obtain from the battery voltage in accordance with the foregoing method.

There is known other method in order to detect the remaining capacity of a rechargeable battery, wherein a cumulative discharged-electricity quantity is memorized and the cummulative discharged-electricity quantity is subtracted from a charged-electricity quantity to obtain a presently residual electricity quantity (that is, a remaining capacity). However, this method has such disadvantages as will be described in the following. That is, the current value and the discharge time are necessary to be always memorized. Besides, in the case where additional charging is performed for the rechargeable battery which is unknown with respect to the discharge depth, although the charged-electricity quantity at that time can be detected, the remaining capacity of the rechargeable battery after the rechargeable battery is subjected to charging cannot be precisely detected because the remaining capacity of the rechargeable battery before the additional charging is unknown. When the method is adopted in this case, because the method is to obtain a remaining capacity by comparing the cumulative discharged-electricity quantity with the remaining capacity prior to the discharging, a large error is likely to occur in the measurement.

Therefore, the method is difficult to cope with a rechargeable battery whose performance has been deteriorated to close its lifetime, where it is difficult to precisely detect the remaining capacity.

Now, Japanese Unexamined Patent Publication No. 2066/1992 discloses a method for observing the capacity of a lead battery in accordance with recovery characteristic of the battery voltage after pulse discharge. Japanese Unexamined Patent Publication No. 136774/1992 discloses a method wherein for a rechargeable battery, when the power source is ON, discharging is temporarily performed at a large current to detect a decrease in the battery voltage, the detected decrease value is compared with a prejudged battery voltage value, where when the difference is great, the residual capacity is judged to be insufficient. Japanese Unexamined Patent Publication No. 16607/1999 discloses a method wherein for a rechargeable battery, the battery voltage when a prescribed current is applied for a prescribed period of time is measured and the measured battery voltage is collated with a previously established battery voltage-residual capacity corresponding table to obtain a residual capacity of the battery. However, for a rechargeable battery whose performance has been deteriorated to increase the internal resistance or to decrease the battery capacity, any of these methods is difficult to precisely detect the residual battery capacity.

Separately, Japanese Unexamined Patent Publication No. 134742/1997 discloses a method wherein for a rechargeable battery, the internal impedance directly before reaching the discharge termination voltage is measured by an impedance-measuring instrument while flowing an alternate current to determine whether or not the rechargeable battery is deteriorated with respect its performance. However, this method is not practically applicable for the reason that such impedance-measuring instrument for measuring the impedance is required to have an alternate current-generating circuit and because of this, the apparatus involved unavoidably becomes large-sized, and in addition, during when the rechargeable battery is operated, the measurement cannot be performed.

Under these circumstances, there is an increased demand for providing a detecting method and a detecting device which enable one to precisely detect the presently residual electricity quantity for any rechargeable batteries even when they are such that their battery capacity is decreased or their internal resistance is increased and their performance is deteriorated. Besides, a detecting method and a detecting device which are applicable in any rechargeable batteries in order to precisely detect their lifetime, i.e., deterioration of their performance are expected to be developed.

SUMMARY OF THE INVENTION

The present invention is aimed at solving the shortcomings in the prior art in that in any of the proposed methods, the detection precision of the presently residual electricity quantity of the rechargeable battery is inferior.

Another object of the present invention is to provide a detecting method which enables one to detect the presently residual electricity quantity of any rechargeable battery at an improved precision even when the rechargeable battery is a rechargeable battery whose performance is deteriorated.

A further object of the present invention is to provide a detecting device which enables one to detect the presently residual electricity quantity of any rechargeable battery at an improved precision even when the rechargeable battery is a rechargeable battery whose performance is deteriorated.

A further object of the present invention is to provide an instrument provided with said detecting device.

A further object of the present invention is to provide a program of detecting internal state of said rechargeable battery and a medium having said program accommodated therein which are usable in said detecting method and said detecting device.

The term "internal state" is meant to include deterioration state, remaining capacity (electricity storable capacity), usable capacity, and internal resistance of the rechargeable battery.

The present inventors conducted studies through experiments in order to find out a practically applicable detecting method capable of precisely detecting internal state of a given rechargeable battery, said internal state including the deterioration state, electricity storable capacity, remaining capacity, usable capacity, and internal resistance.

Particularly, the experiments studies were conducted in the following manner. First, examination is conducted of whether or not a rechargeable battery is normal or deteriorated with respect its performance. In the case where the rechargeable battery is found to have been deteriorated, prior to detecting the rechargeable battery, the deterioration mode is judged depending on the situation of the kind of the deterioration mode, the remaining capacity or the internal resistance is computed.

As a result, it was found that this manner is effective in precisely detecting the internal state of the rechargeable battery.

In a preferred embodiment of the present invention, for a number of normal rechargeable batteries, data of characteristics of these batteries are provided; based on said data, a judgment mode is established; for a given rechargeable battery to be examined, judgment is conducted of whether the battery is short-circuited, whether the internal resistance of the battery is increased, and whether the electricity storable capacity is decreased respectively with reference to previously established standard of judgment; thereafter, depending on the state of the battery (the shutdown state, the charging state, or the discharging state), the extent of deterioration of the battery is grasped, and the remaining capacity (the presently stored electricity quantity) of the battery is computed. Thus, it is possible to detect the internal state of the battery at a high precision.

Further, by equipping a battery module, an instrument or a machine with an apparatus designed so that a detecting method for detecting internal state of a rechargeable battery at a high precision according to the present invention can be function, it is possible to make the battery module or the instrument or machine in which a rechargeable battery is used as a power source to exhibit the performance to the full.

The detecting method according to the present invention comprises:

(i) a step in which a plurality of normal non-deteriorated rechargeable batteries are provided, these batteries are separately subjected to charging and discharging under various temperature conditions and at various rates of charge or discharge where their battery voltages, and their presently stored electricity quantities (their electricity quantities capable of being discharged) or their discharging capacities are obtained, and from these factors, basic data are obtained; and (ii) a step in which for a rechargeable battery (ii-a) to be detected, the voltage value or/and the current value thereof are measured, and the measured result is compared with said basic data to judge:
(a) the rechargeable battery (ii-a) is short-circuited,
(b) the internal resistance of the rechargeable battery (ii-a) is increased,
(c) the electricity storable capacity (the quantity of electricity capable of being stored) of the rechargeable battery (ii-a) is decreased,
(d) the electricity storable capacity of the rechargeable battery (ii-a) is decreased and the internal resistance thereof is increased, or
(e) the rechargeable battery (ii-a) is not deteriorated (normal).

Here, the "normal rechargeable battery" means a rechargeable battery which can achieve a specification of performance such as a nominal capacity or the like of a product (a rechargeable battery).

The "electricity storable capacity" is meant the quantity of electricity capable of being stored in a rechargeable battery, which is corresponding to a nominal capacity as a product. In other words, the presently stored electricity quantity (that is, the remaining capacity) indicates the quantity of electricity capable of being discharged from the then state thereof.

In the present invention, judgment of a combination of two or more of the foregoing items (a) to (e) is also included.

The above-described basic data includes the following factors.

(1) For a normal rechargeable battery having a given open-circuit voltage (Voc). The remaining capacity (Q) [the presently stored electricity quantity] of the battery to the open-circuit voltage (Voc) is measured.

Data or function formula of the relationship with respect to Voc(Q) or Q(Voc) of the open-circuit voltage (Voc) of the battery to the remaining capacity (Q) [the presently stored electricity quantity]. The function Voc(Q) is an open-circuit voltage function formula as a function of the remaining capacity (Q). The function Q(Voc) is a function formula of the remaining capacity (Q) as a function of the open-circuit voltage (Voc).

(2) For a normal rechargeable battery in a full charged state, battery voltages Vd are measured under various temperature conditions T and at various discharge rates Id. The charging is tentatively suspended, where the open-circuit voltage (Voc) is measured. Data or function formula Vd(Voc, Id, T) of the relationship of the battery voltages Vd to the Id, Voc and T. Or the data or function formula Vd(Q, Id, T) or Q(Vd, Id, T) computed from the data or function formula of the relationship of the Voc(Q) of the open-circuit voltage (Voc) to the remaining capacity (Q) described in the above (1).

(3) In the above (2), when the internal resistance of the battery is made to be Rd, there is established relation expression Vd=Voc−Id×Rd or Rd=(Voc−Vd)/Id.

Data computed from this relation expression or function formula Rd(Voc, Id, T) or Rd(Vd, Id, T) obtained based on the data. Or the data or function formula Rd(Q, Id, T) or Q(Rd, Id, T) of the internal resistance (Rd), obtained from the data or function formula of the relationship with respect to Voc(Q) of the open-circuit voltage (Voc) to the remaining capacity (Q) in the above (1).

(4) For a normal rechargeable battery with no electricity stored therein maintained under temperature condition T, the rechargeable battery is subjected to charging at a charge rate (Ic), where the battery voltage (Vc) is measured, and the charging is tentatively suspended, where the open-circuit voltage (Voc) is measured.

Data or function formula Vc(Voc, Ic, T) of the relationship of the battery voltage (Vc), the open-circuit voltage (Voc), and the charge rate (Ic). Or data or function formula Vc(Q, Ic, T) or Q(Vc, Ic, T) of the battery voltage (Vc), computed from the data or function formula Voc(Q) with respect to the open-circuit voltage (Voc) to the remaining capacity (Q) in the above (1).

(5) In the above (4), when the internal resistance of the battery is made to be Rc, there is established relation expression Vc=Voc+Ic×Rc or Rc=(Vc−Voc)/Ic.

Data computed from this relation expression or function formula Rc(Voc, Ic, T) obtained based on the data. Or data or function formula Rc(Q, Ic, T) or Q(Rc, Ic, T) of the internal resistance (Rc), obtained from the data or function formula of the relationship with respect to Voc(Q) of the open-circuit voltage (Voc) to the remaining capacity (Q) in the above (1).

The foregoing basic data comprises at least data or a function formula selected from the above (1) to (5).

According to the detecting method for detecting internal state of a rechargeable battery in the present invention, on the basis of the foregoing basic data or function formulas and in accordance with a prescribed judgment mode while referring to information selected from the open-circuit voltage, battery voltage and internal resistance of a rechargeable battery to be detected in a shutdown state, a charging state, or a discharging state, it is possible to precisely detect the internal state of rechargeable battery.

In the present invention, it is assumed that the transient battery voltage when the charge rate or the discharge rate is changed can be expressed by an exponential function $e^{-t/\tau}$ (with e being the base of the natural constant, t being a time, and $\tau$ being a time constant which is decided by the impedance or the like of the battery), and based on the function, the internal resistance, an increase ratio of the internal resistance, and a decrease ratio of the electricity storable capacity are computed, whereby the remaining capacity (the dischargeable capacity) can be obtained.

Further, in the detecting method of the present invention, by computing the remaining capacity which is reached to the minimum voltage (the lowest operating voltage) required in order to operate an equipment in which a rechargeable battery is used as a power source and referring to the consumed current or the consumed power of the equipment, it is possible to find out the residual operating time of the equipment. By this, it is possible that sudden stoppage of the operation of the equipment is avoided in advance and at a suitable occasion, replacement of the rechargeable battery by a new rechargeable battery or charging for the rechargeable battery is performed.

Thus, the present invention provides a detecting method and a detecting device which enable one to detect internal state of a rechargeable battery at a high precision. According to the present invention, it is possible to readily control a power source of an equipment or an apparatus in which the rechargeable battery is used as the power source. In addition, it is possible to readily find out the residual operating time of the equipment or apparatus, the timing required to charge the power source, and the timing required to replace the rechargeable battery by a new rechargeable battery. Further, by adding the detecting device of the present invention to a battery module, a charger, an equipment or a apparatus in which a rechargeable battery is used as a power source, it is possible that the performance of the rechargeable battery as the power source is exhibited to the utmost limit. In addition, it is possible to make the equipment or apparatus to efficiently operate so as to maximize the function. Further, by adding the detecting device of the present invention to an inspection equipment to determine whether a rechargeable battery product is good or not good prior to shipping, shipment inspection for a rechargeable battery product can be performed at a high precision.

According to the present invention, the energy which a rechargeable battery possesses can be used to the full, and it makes it possible to desirably prolong the operating time of an instrument in which a rechargeable battery is used as the power source.

BRIEF DESCRIPTION OF THE DRAWINGS

FIG. 20 shows a graph of an example of a change with the passage of time in the open-circuit voltage of a rechargeable battery which is short-circuited and a rechargeable battery which is not short-circuited.

FIG. 21 shows a graph (1) [FIG. 21(1)], a graph (2) [FIG. 22(2)], and a graph (3) [FIG. 21(3)], where said graph (1) is of an example for the relationship between the internal resistance of a rechargeable battery (a) whose internal resistance having been increased and the internal resistance of a normal rechargeable battery (b) respectively in relation to the remaining capacity, said graph (2) is of an example for the relationship between the battery voltage (upon discharging) of the rechargeable battery (a) and the battery voltage (upon discharging) of the rechargeable battery (b) respectively in relation to the remaining capacity, said graph (3) is of an example for the relationship between the battery voltage (upon charging) of the rechargeable battery (a) and the battery voltage (upon charging) of the rechargeable battery (b) respectively in relation to the remaining capacity.

FIG. 22 shows a graph (1) [FIG. 22(1)], and a graph (2) [FIG. 22(2)], where said graph (1) is of an example for the relationship between the open-circuit voltage of a normal rechargeable battery (a) and the open-circuit voltage of a rechargeable battery (b) whose electricity storable capacity having been decreased respectively in relation to the remaining capacity, and said graph (2) is of the rechargeable battery (b) and it is of an example for the relationship of the open-circuit voltage, the battery voltage upon charging and the battery voltage upon discharging respectively in relation to the remaining capacity.

FIG. 25 shows a graph (1) [FIG. 25(1)], and a graph (2) [FIG. 25(2)], where said graph (1) is for a rechargeable battery which has been subjected to constant current pulse discharging from its shutdown state and it shows a curve for an example of the relationship between the battery voltage and the current with the passage of time, and said graph (2) is also for said rechargeable battery and it shows a curve for an example of the relationship between a transient performance of the battery voltage and an extrapolation voltage obtained from an equation of time constant.

FIG. 26 shows a graph (1) [FIG. 26(1)], and a graph (2) [FIG. 26(2)], where said graph (1) is for a rechargeable battery which has been subjected to constant current pulse charging from its shutdown state and it shows a curve for an example of the relationship between the battery voltage and the current with the passage of time, and said graph (2) is also for said rechargeable battery and it shows a curve for an example of the relationship between a transient performance of the battery voltage and an extrapolation voltage obtained from an equation of time constant.

FIG. 31 is a schematic diagram illustrating an example of an apparatus in which the detecting device shown in FIG. 29 is connected to a plurality of rechargeable batteries in the present invention.

DESCRIPTION OF THE INVENTION AND PREFERRED EMBODIMENTS

Figure 1:
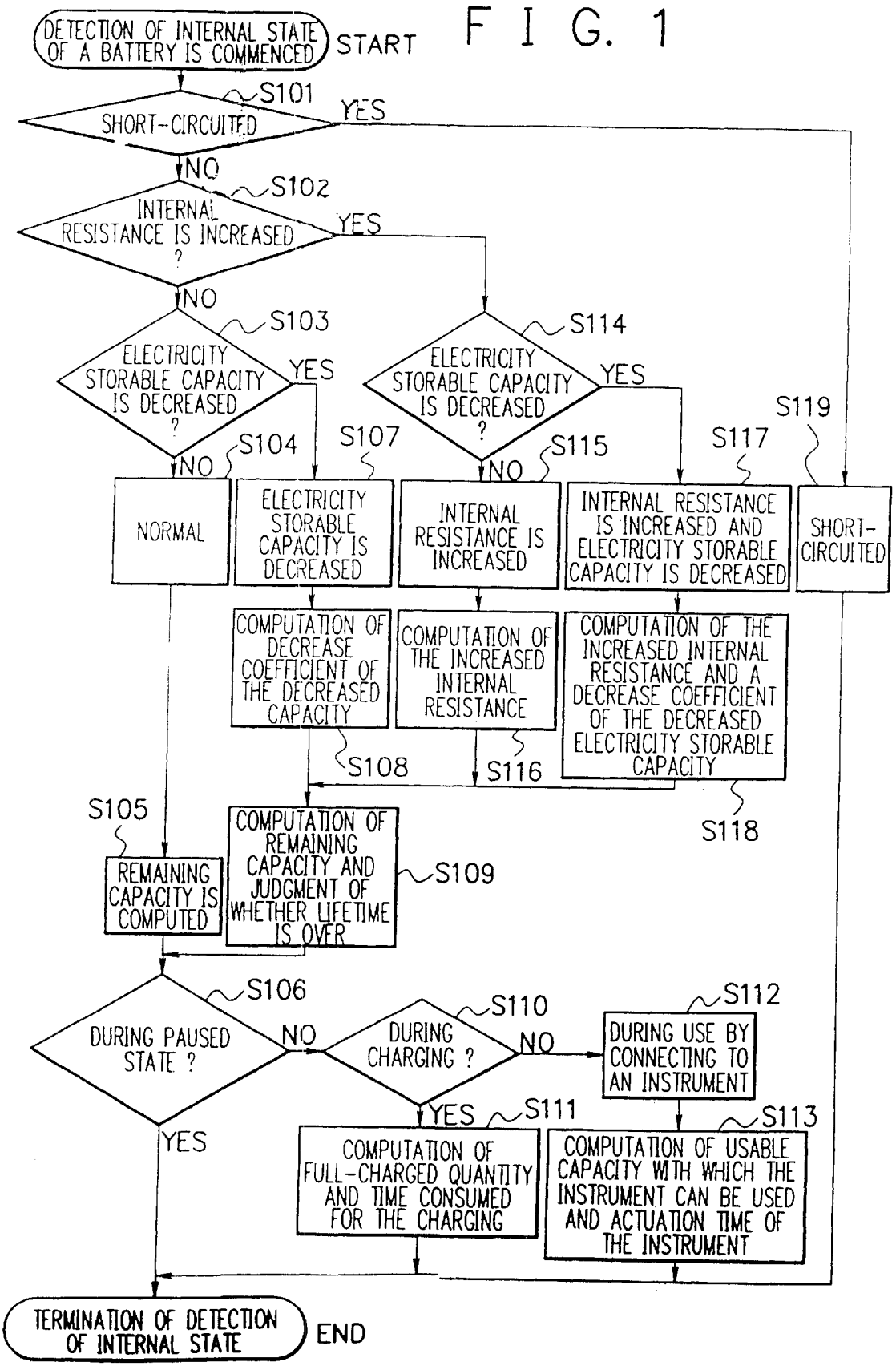
FIG. 1 shows a flow chart illustrating an embodiment of a detecting method for detecting internal state of a rechargeable battery in the present invention.

In order to achieve the foregoing objects of the present invention while solving the shortcomings in the prior art, the present inventors performed experimental studies. As a result, there was obtained the following finding. That is, a plurality of normal rechargeable batteries were separately subjected to charging and discharging under prescribed temperature conditions and at prescribed discharge rates, where their presently stored electricity quantities (their remaining capacities or their dischargeable capacities), their open-circuit voltages, and their internal resistances were examined. And based on the examined characteristics of said plurality of rechargeable batteries, data or function formula of the relationship of the open-circuit voltages and the internal resistance as a function of the remaining capacity were summarized as basic data. And for a given rechargeable battery to be inspected, its battery voltage and its current value were examined, followed by being compared with said basic data to judge of whether the rechargeable battery to be inspected is normal or deteriorated. And based on the examined result, the electricity storable capacity or/and the internal resistance of the rechargeable battery were computed and the remaining capacity (=the residual dischargeable capacity=the presently stored electricity quantity) of the battery was computed. As a result, it was found that according to this manner, a given rechargeable battery to be inspected can be judged whether it is normal or deteriorated at a high precision and the remaining capacity thereof can be detected at a high precision.

The present invention has been accomplished on the basis of this finding.

In the following, the present invention will be detailed, if necessary with reference to the drawings.

[Acquisition of Basic Data and Function Formula of Normal Rechargeable Battery]

The open-circuit voltage of a rechargeable battery is proportional to a difference between chemical potential of the anode and that of the cathode. And depending on the chemical potential of each of the anode and the cathode at a given time, the remaining capacity (=the dischargeable capacity=the presently stored electricity quantity) is decided. That is, the chemical potential of each of the anode and the cathode is changed depending on the remaining capacity and is correlated to the remaining capacity. In other words, the remaining capacity and the open-circuit voltage are correlating to each other. And the state of the anode and that of the cathode differ depending on the remaining capacity, where the resistance value of the anode and that of the cathode also differ. In this connection, when the remaining capacity is changed, the internal resistance of the rechargeable battery comprising such anode and such cathode is changed accordingly.

Therefore, there is a correlation between the internal resistance, the open-circuit voltage and the remaining capacity of the rechargeable battery. In addition, between the battery voltage, the current, the open-circuit voltage, and the internal resistance of the rechargeable battery, there are such relationship as will be described below.

[battery voltage upon discharging]=[open-circuit voltage]−[discharge rate]×[internal resistance]

[battery voltage upon charging]=[open-circuit voltage]+ [charge rate]×[internal resistance]

In view of the above, the present inventors obtained a finding that for a given rechargeable battery, when a correlation between the internal resistance and the remaining capacity and a correlation between the open-circuit voltage and the remaining capacity are obtained, followed by being referred to the relationship of the battery voltage, the current, the open-circuit voltage, and the internal resistance, the remaining capacity (=the dischargeable capacity=the presently stored electricity) can be computed.

Figure 18:
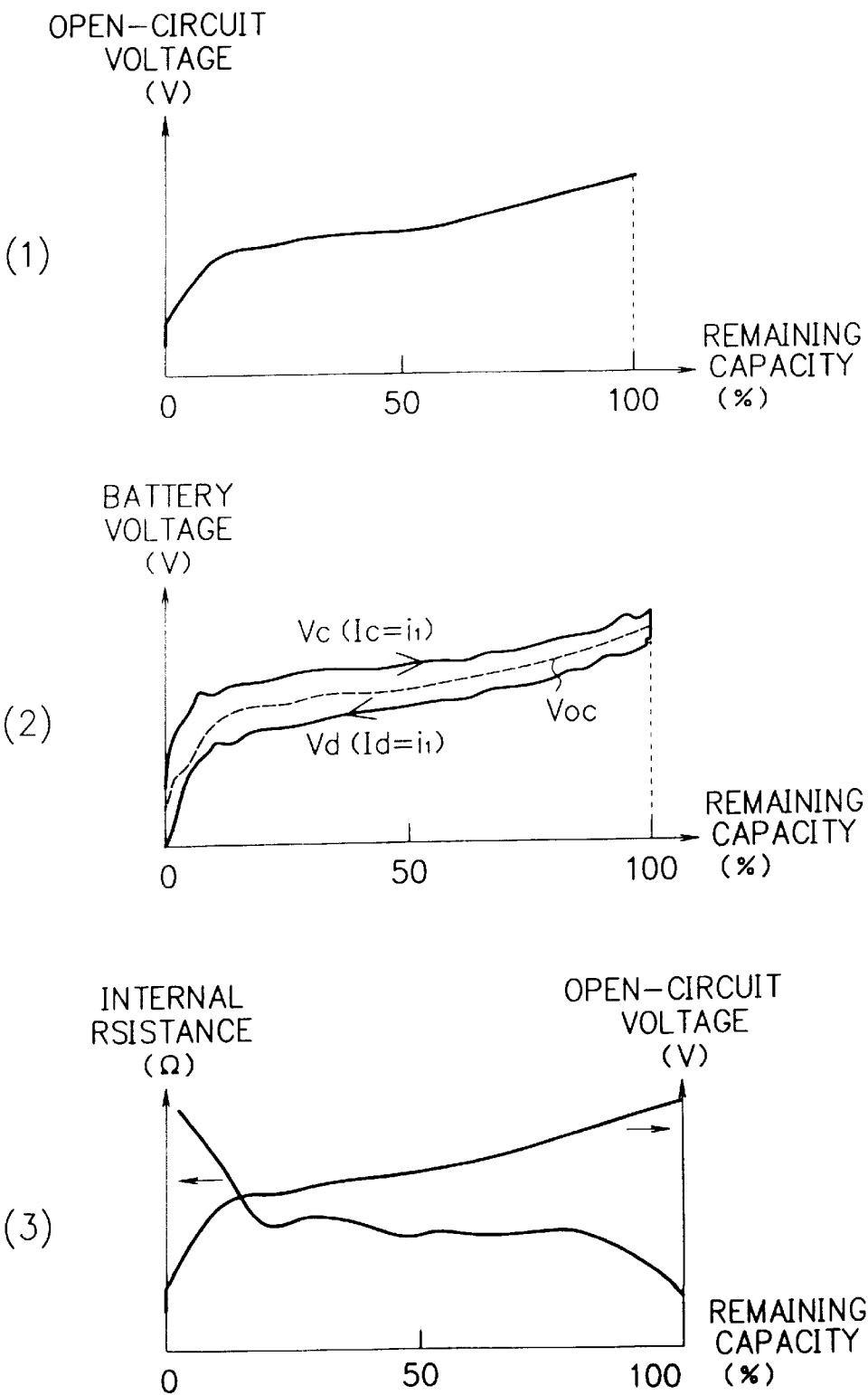
FIG. 18 shows a graph (1) [FIG. 18(1)], a graph (2) [FIG. 18(2)], and a graph (3) [FIG. 18(3)] respectively of a normal rechargeable battery, where said graph (1) is of an example for the relationship of the open-circuit voltage to the remaining capacity, said graph (2) is of an example for the relationship of the battery voltage (the charging voltage or the discharging voltage) to the remaining capacity, and said graph (3) is of an example for the relationship of the open-circuit voltage and the internal resistance to the remaining capacity.
Figure 19:
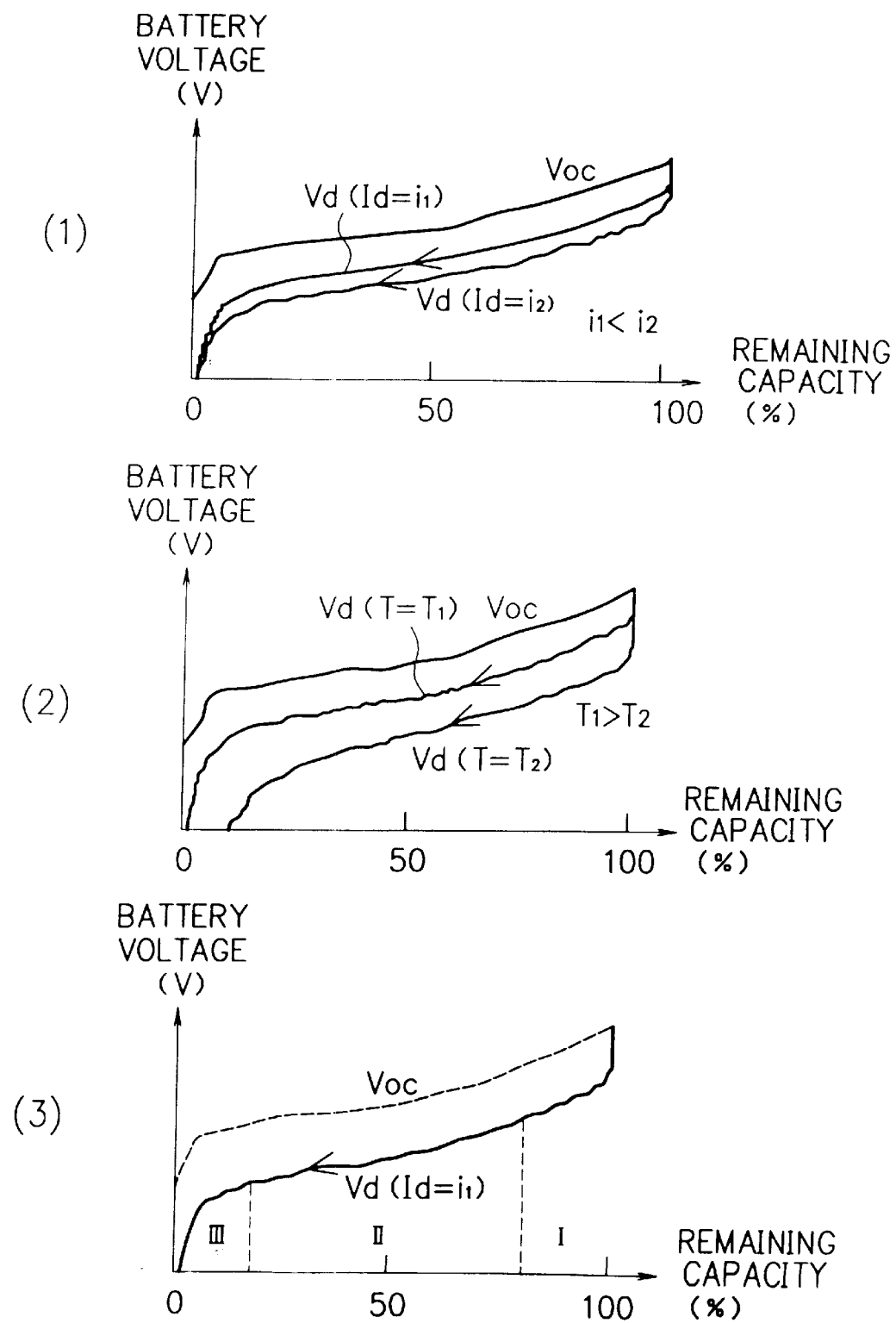
FIG. 19 shows a graph (1) [FIG. 19(1)], a graph (2) [FIG. 19(2)], and a graph (3) [FIG. 19(3)]respectively of a normal-rechargeable battery, where said graph (1) is of an example for the relationship of the battery voltage at a given discharge rate to the remaining capacity, said graph (2) is of an example for the relationship of the battery voltage(the discharging voltage) at a given battery temperature to the remaining capacity, and said graph (3) is of an example for the relationship of the open-circuit voltage and the battery voltage to the remaining capacity, which comprises one at an initial stage, one at a middle stage and one at an end stage respectively of the discharging operation.

FIGS. 18(1) to 18(3) and FIGS. 19(1) to 19(2) are of a normal rechargeable battery and they show respectively a relationship of the open-circuit voltage, the charging voltage or the discharging voltage, the internal resistance and the open-circuit voltage, the battery voltages at two kinds of discharge rates (discharging currents), and the discharging voltages at two kinds of battery temperatures, respectively in relation to the remaining capacity.

Particularly, FIG. 18(1) is a graph of a rechargeable battery whose nominal capacity C or electricity storable capacity (before it is deteriorated) is made to be 100%, showing the relationship of the open-circuit voltage (Voc) to the remaining capacity (Q)[that is, 100×Q/C %]. Now, the open-circuit voltage of a rechargeable battery does not substantially depends on the temperature of the battery (T) (the battery temperature) but is decided depending on the remaining capacity. In this respect, the open-circuit voltage (Voc) of the battery to the remaining capacity (Q) [or the dischargeable capacity] is computed, and based on the result, data or function formula of the relationship of Voc(Q) or Q(Voc) of the open-circuit voltage (Voc) to the remaining capacity (Q) can be obtained.

However, in practice, the open-circuit voltage (Voc) is assumed to be a polynomial expression of n-degree of the remaining capacity (Q): $Voc(Q) = c_n \times Q^n + c_{n-1} \times Q^{n-1} + C_{n-2} \times Q^{n-2} + \ldots + c_1 \times Q + c_0$ (where, n is a positive integer), where a open-circuit voltage (Voc) is measured, followed by measuring the quantity of electricity which could be discharged (that is, a discharged capacity), and the measured values obtained are compared with the Voc(Q). The computation in this case is performed using a method of least-squares or a Newton method. By this, a function formula approximation which is the closest to the measured data can be obtained.

FIG. 18(2) is a graph of a graph of a rechargeable battery whose nominal capacity when the battery temperature is constant at a prescribed temperature is made to be 100%, showing the relationship of the open-circuit voltage (Voc), the charging voltage (Vc), and the discharging voltage (Vd) to the remaining capacity (=the presently stored electricity quantity).

FIG. 18(3) is a graph of a rechargeable battery whose nominal capacity or electricity storable capacity (before it is deteriorated) is made to be 100%, showing the open-circuit voltage and the relationship of the internal resistance (R) to the remaining capacity (=the presently stored electricity quantity).

From the data shown in the graphs shown in FIGS. 18(1) to 18(3), there can be obtained a relational expression Vd=Voc−Id×Rd [with Rd being an internal resistance of the battery upon discharging and Id being a discharging current (or a discharge rate)] or a relational expression Rd=(Voc−Vd)/Id. In accordance with any of these relational expressions, there can be computed data of the internal resistance. This data can be converted into a function formula to obtain Rd(Voc, Id, T) or Rd(Vd, Id, T)[where, T is a battery temperature]. Separately, in accordance with a relational expression Vc=Voc+Ic×Rc or Rc=(Vc−Voc)/Ic when the internal resistance of the battery upon charging is made to be Rc [where Vc is a battery voltage upon charging, and Ic is a charging current], there can be computed data of the internal resistance. This data can be converted into a function formula to obtain Rc(Voc, Ic, T). Further, from these data or function formulas and the data or the function formula of the relationship Voc(Q) of the open-circuit voltage (Voc) to the remaining capacity (Q) obtained from the data shown in FIG. 18(1), there can be obtained data or function formula of internal resistance Rd(Q, Id, T) or Q(Rd, Id, T).

FIG. 19(1) is a graph of a rechargeable battery whose nominal capacity is made to be 100%, showing the relationship of the discharging voltage (Vd) to given discharging currents (Id=$i_1$, $i_2$) in relation to the remaining capacity. Now, depending on the magnitude of the discharging current, the internal resistance of the battery is also changed and because of this, the battery voltage is also changed. It is a matter of course to say that depending on the magnitude of the charging current upon charging, the internal resistance of the battery is also changed and because of this, the battery voltage is also changed.

FIG. 19(2) is a graph of a rechargeable battery whose nominal capacity or electricity storable capacity (before it is deteriorated) is made to be 100%, showing the relationship of the open-circuit voltage (Voc) and the discharging voltage (Vd) to given battery temperatures (T=$T_1$, $T_2$) in relation to the remaining capacity. In accordance with the data shown in the graph of FIG. 19(2), there can be obtained data of the relationship of the battery voltage (Vd) upon discharging, the open-circuit voltage (Voc), the discharging current (Id) and the battery temperature (T). This data can be converted into a function formula to obtain Vd(Voc, Id, T).

From these data or function formulas and the data or the function formula of the relationship Voc(Q) of the open-circuit voltage (Voc) to the remaining capacity (Q) obtained from the data shown in FIG. 18(1), there can be obtained data or function formula of battery voltage Vd(Q, Id, T) or Q(Vd, Id, T). Separately, it is a matter of course to say that there can be obtained data of the relationship of the battery voltage (Vc) upon charging, the open-circuit voltage (Voc), the charging current (Ic) and the battery temperature (T). This data can be converted into a function formula to obtain Vc(Voc, Ic, T).

Incidentally, each of the foregoing battery voltage and the foregoing internal resistance can be expressed by a continuous function to the battery temperature situated in a temperature range (i) which is higher than the freezing point of an electrolyte solution used in the rechargeable battery or in a temperature range (ii) which is higher than the glass transition temperature of a solidified electrolyte used in the rechargeable battery but is lower than the fusing point of said solidified electrolyte, but when the battery temperature is situated in a temperature range outside said temperature range (i) or said temperature range (ii), said function becomes discontinuous to the battery temperature. The reason why the function becomes discontinuous is due to a phenomenon in that the ion conductivity of the electrolyte solution or the solidified electrolyte is suddenly changed in such temperature range.

Now, based on such acquired data as shown in FIGS. 18(1) to 18(3) and FIGS. 19(1) and 19(2), the remaining capacity (=the presently stored electricity quantity) of a rechargeable battery can be expressed as a function formula of the open-circuit voltage, the battery voltage can be expressed as function formulas by the remaining capacity (=the presently stored electricity quantity), the current and the battery temperature, and the internal resistance can be also expressed as function formulas by the remaining capacity (=the presently stored electricity quantity), the current and the battery temperature.

A function formula which is intended to obtain can be obtained, for instance, by assuming it to be a function which can be expressed by an equation of n-dimentions (n is a positive integer) and making a difference with respect to the data involved to be minimum by a method of least-squares or a Newton method.

Separately, FIG. 19(3) is a graph of a rechargeable battery whose nominal capacity or electricity storable capacity (before it is deteriorated) is made to be 100%, showing the relationship of the open-circuit voltage and the battery voltage to the remaining capacity (=the presently stored electricity quantity), which comprises one at an initial stage (I), one at a middle stage(II) and one at an end stage (III) respectively of the discharging operation. By dividing said relationship in this way, the characteristics such as the open-circuit voltage, the battery voltage and the internal resistance respectively in relation to the presently stored electricity quantity can be expressed by a low dimensional equation which is simplified.

[Judgment of Whether a Rechargeable Battery is Normal]

In this embodiment, in practice, prior to computing the remaining capacity (=the presently stored electricity quantity) of a rechargeable battery to be inspected, depending on the situation of the rechargeable battery which is in a shutdown state, during charging or during discharging, a suitable judgment method is adopted, where the rechargeable battery is judged of whether it is short-circuited, the electricity storable capacity is decreased, the internal resistance is increased, or the battery is normal by comparing with the characteristics of a normal rechargeable battery which have been acquired in advance. Thereafter, following the examined result, the remaining capacity (=the presently stored electricity quantity) of the battery is computed.

In the above judgment, first, judgment is conducted of whether the rechargeable battery is short-circuited. Then, judgment is conducted of whether the electricity storable capacity of the rechargeable battery is decreased or the internal resistance thereof is increased. Successively, in the detecting method in this embodiment, internal state of the rechargeable battery including the remaining capacity (=the presently stored electricity quantity), the electricity storable capacity, the internal resistance, a reduction coefficient in the capacity, and the battery lifetime is detected. FIG. 1 shows an example of a flow chart illustrating the procedures of detecting such internal state of the rechargeable battery. In the embodiment of FIG. 1, there is also shown a flow chart for the case where the rechargeable battery is engaged in the charging operation or the case where the rechargeable battery is connected to an equipment, wherein for the former case, the fully charged electricity quantity or the time period consumed until the termination of the charging operation is computed, and for the latter case, the usable capacity (=the presently residual electricity quantity which is still able to operate an instrument) which makes it possible to use the equipment or the period of time during which the equipment can be operated is computed. Further, the embodiment of FIG. 1 is designed such that after judgment is conducted of whether the rechargeable battery is short-circuited, judgment is conducted of whether the electricity storable capacity is decreased. But it is possible to adopt a flow chart in that following the judgment of whether the rechargeable battery is short-circuited, judgment is conducted of whether the electricity storable capacity is decreased, followed by judging of whether the internal resistance is increased.

[Judgment of the Presence or Absence of Short-circuit]

The judgment criteria in the case of judging that a rechargeable battery which is presently used is short-circuited include the following cases (i) to (iv).

(i) A case where upon pausing the rechargeable battery without conducting the charging or discharging operation, there is found a decrease in the short-circuit voltage with the passage of time.

(ii) A case where when the rechargeable battery is subjected to charging, an increase in the battery voltage or the open-circuit voltage is small in comparison with a normal rechargeable battery.

(iii) A case where the open-circuit voltage of the rechargeable battery is markedly small in comparison with that of a normal rechargeable battery and a decrease in the battery voltage of the rechargeable battery upon discharging is markedly large in comparison with that of said normal rechargeable battery.

(iv) A case where the internal resistance of the rechargeable battery is markedly small in comparison with that of a normal rechargeable battery.

In the case where the rechargeable battery falls in at least one of the above-described cases (i) to (iv), it is judged that short-circuit is present in the rechargeable battery.

FIG. 20 graphically shows a change with the passage of time in the open-circuit voltage of a rechargeable battery which is short-circuited, together with a change with the passage of time in the open-circuit voltage of a rechargeable battery which is not short-circuited.

[Judgment of Increase in the Internal Resistance of a Rechargeable Battery]

In the case where a rechargeable battery which is presently used does not fall in any of the foregoing cases (i) to (iv) in the judgment of the presence or absence of short-circuit but falls in at least one of the following cases (i) to (iii), it is judged that the internal resistance of the rechargeable battery is increased.

(i) A case where the open-circuit voltage of the recharge battery is substantially the same as that of a normal rechargeable battery but an increase in the battery voltage of the rechargeable battery upon charging is larger than that of said normal rechargeable battery upon charging.

(ii) A case where the open-circuit voltage of the recharge battery is substantially the same as that of a normal rechargeable battery but a decrease in the battery voltage of the rechargeable battery upon discharging is larger than that of said normal rechargeable battery upon discharging.

(iii) A case where the internal resistance of the rechargeable battery is larger than that of a normal rechargeable battery.

FIG. 21(1) is a graph of a rechargeable battery whose nominal capacity (C) or electricity storable capacity (before it is deteriorated) is made to be 100%, showing the relationship of the internal resistance to the remaining capacity (Q)[=the presently stored electricity quantity], that is, $100 \times Q/C$ %, where an increased internal resistance ($R'=a \times R+b$) of the rechargeable battery is compared with the internal resistance (R) of a normal rechargeable battery.

FIG. 21(2) is a graph of a rechargeable battery whose internal resistance has been increased ($R'=a \times Rd+b$) and a normal rechargeable battery whose internal resistance is normal (R=Rd), showing the relationship of the battery voltage (Vd) to the percentage (%) of the presently stored electricity quantity upon discharging for each of said two rechargeable batteries.

FIG. 21(3) is a graph of a rechargeable battery whose internal resistance has been increased ($R'=a \times Rc+b$) and a normal rechargeable battery whose internal resistance is normal (R=Rc), showing the relationship of the battery voltage (Vc) to the percentage (%) of the remaining capacity (=the presently stored electricity quantity) upon charging for each of said two rechargeable batteries.

Now, the computation of the above internal resistance can be performed on the basis of the transient characteristics of the rechargeable battery from the time when the rechargeable battery is paused to the time when charging or discharging for the rechargeable battery is commenced.

[Judgment of Decrease in the Electricity Storable Capacity of a Rechargeable Battery]

In the case where a rechargeable battery which is presently used does not fall in any of the foregoing cases (i) to (iv) in the judgment of the presence or absence of short-circuit but falls in at least one of the following cases (i) and (ii), it is judged that the electricity storable capacity of the rechargeable battery is decreased.

(i) A case where an increase in the battery voltage of and an increase in the open-circuit voltage of the rechargeable battery upon charging are larger than those of a normal rechargeable batter upon charging.

(ii) A case where a decrease in the battery voltage of and a decrease in the open-circuit voltage of the rechargeable battery upon discharging are smaller than those when the rechargeable battery is short-circuited but are larger than those of a normal rechargeable batter upon discharging.

For a rechargeable battery which is presently used and whose internal resistance is not increased but whose electricity storable capacity (C') is decreased by D time of the electricity storable capacity (C) of a normal rechargeable battery, the relationship of the remaining capacity [$Q'=D \times Q$, with Q being the remaining capacity of said normal rechargeable battery] and the open-circuit voltage (Voc) becomes as shown in FIG. 22(1). The percentage (%) of the remaining capacity (=the presently stored electricity quantity) here is expressed on condition that it corresponds $100 \times Q/C$ %, with Q being the remaining capacity of said normal and capacity-reduced battery when the nominal capacity or the electricity storable capacity (before it is deteriorated) of said normal rechargeable battery is made to be 100%.

From the function formula Voc(Q) of the open-circuit voltage (Voc) of a normal rechargeable battery to the remaining capacity (Q %) of said normal rechargeable battery, the function formula of the open-circuit voltage (Voc) to the remaining capacity (Q') after the electricity storable capacity is reduced can be expressed to be Voc(Q'/D).

FIG. 22(2) shows a graph of the relationship of the battery voltage when the capacity-reduced rechargeable battery is subjected to charging or discharging to the remaining capacity (=the presently stored electricity quantity).

For a rechargeable battery whose electricity storable capacity is decreased from C to C'($C'=D \times C$), the battery voltage upon charging and that upon discharging can be expressed to be Vc(Q'/D, Ic, T) and Vd(Q'/D, Id, T) based on the function formulas of the normal rechargeable battery.

[Judgment of Whether a Rechargeable Battery is Normal]

In the case where a rechargeable battery which is presently used does not fall in any of the foregoing cases mentioned in the judgment of the presence or absence of short-circuit, the judgment of increase in the internal resistance, and the judgment of decrease in the electricity storable capacity, it is judged that the rechargeable battery is not deteriorated but is normal.

[Computation of the Electricity Storable Capacity of a Rechargeable Battery]

For a rechargeable battery which is judged that it is normal, by measuring the open-circuit voltage (Voc), the charging current (Ic) or the discharging current (Id), the battery voltage (V), and the battery temperature (T) and using Voc(Q) for the relationship of the remaining capacity (Q) and the open-circuit voltage (Voc) or V(Q, I, T) for the relationship of the current value (I) upon discharging or charging, the battery temperature (T) and the battery voltage (V), the remaining capacity (Q) of the rechargeable battery can be obtained.

For a rechargeable battery whose electricity storable capacity is decreased, at a stage before or after the rechargeable battery is subjected to charging or at a stage before or after the rechargeable battery is subjected to discharging, by computing a change in the open-circuit voltage (Voc) and an increase or decrease in the remaining capacity (=the presently stored electricity quantity) at that time or computing a change in the battery voltage (Vc) upon charging or a change in the battery voltage (Vd) upon discharging and an increase or decrease in the remaining capacity at that time to obtain a decrease coefficient (D) of the electricity storable capacity, the remaining capacity (Q) of the rechargeable battery at a given stage can be obtained.

The rechargeable battery whose internal resistance is increased but whose electricity storable capacity is not decreased has an open-circuit voltage which is substantially the same as that of a rechargeable battery whose open-circuit voltage is normal. Therefore, the remaining capacity (=the presently stored electricity quantity) of the former rechargeable battery can be obtained by way of measuring the open-circuit voltage thereof. Separately, for the former rechargeable battery, after the current and battery voltage are measured to obtain the internal resistance, it is possible to obtain the electricity storable capacity.

Further, the remaining capacity of a rechargeable battery whose electricity storable capacity is decreased and whose internal resistance is increased can be obtained while computing a decrease coefficient (D) of the electricity storable capacity and the increased internal resistance (R').

[Computation of the Internal Resistance of a Rechargeable Battery]

For a rechargeable battery whose internal resistance is increased, by assuming an increased value (R') of the internal resistance to be capable of being expressed by such function of a normal resistance (R) as shown in the following:

$$R'=a \times R, \ R'=a \times R+b,$$

or $$R'=a_n \times R^n + a_{n-1} \times R^{n-1} + a_{n-2} \times R^{n-2} + \ldots + a_1 \times R + a_0,$$

(n is a positive integer) and obtaining constants a, b, $a_n$, $a_{n-1}$, ..., $a_1$, and $a_0$ from a plurality of measured values of the current and the battery voltage, a value of the increased internal resistant can be obtained.

[Computation of Decrease Coefficient (Ratio) of the Electricity Storable Capacity of a Rechargeable Battery]

For a rechargeable battery whose electricity storable capacity is decreased, from Voc(Q'/D) for the relationship of the open-circuit voltage (Voc) to the remaining capacity (Q') after the electricity storable capacity is decreased to the foregoing D time, and Vc(Q'/D, Ic, T) for the relationship of the battery voltage (Vc) upon charging to the remaining capacity (Q') and an increase in the remaining capacity during charging in practice or Vd(Q'/D, Id, T) for the relationship of the battery voltage (Vd) upon discharging to the remaining capacity (Q') and a decrease in the remaining capacity during discharging in practice, a decrease coefficient (D) of the electricity storable capacity can be computed.

By this, a practical remaining capacity (Q') of the rechargeable battery can be obtained.

[Usable Capacity Capable of Being Used in an Instrument and the Period of Time During Which the Instrument Can Be Operated]

The term "usable capacity" in a rechargeable battery is equal to a presently residual electricity quantity which is still able to operate an instrument.

In an instrument in which a rechargeable battery is used as the power source, the minimum voltage with which the instrument can be operated is decided depending on the kind or scale of the instrument involved. In the case where the voltage of a rechargeable battery used in a given instrument becomes to be lower than the minimum operating voltage required to operate the instrument, even when a certain quantity of electricity capable of being discharged should be remained in the rechargeable battery, the rechargeable battery cannot be used. Here, the presently residual electricity quantity in the rechargeable battery is called "usable capacity".

Description will be made of the usable capacity. When a remaining capacity (a presently stored electricity quantity) of the rechargeable battery prior to operating the instrument is made to be a first remaining capacity ($Q_a$) and the other remaining capacity (the other presently stored electricity quantity) of the rechargeable battery when the voltage of the rechargeable battery reaches a minimum operating voltage of the instrument is made to be a second remaining capacity ($Q_{min}$), an electricity quantity which is corresponding to a difference provided when the second remaining capacity (b) is subtracted from the first remaining capacity ($Q_a$) corresponds the usable capacity.

Figure 23:
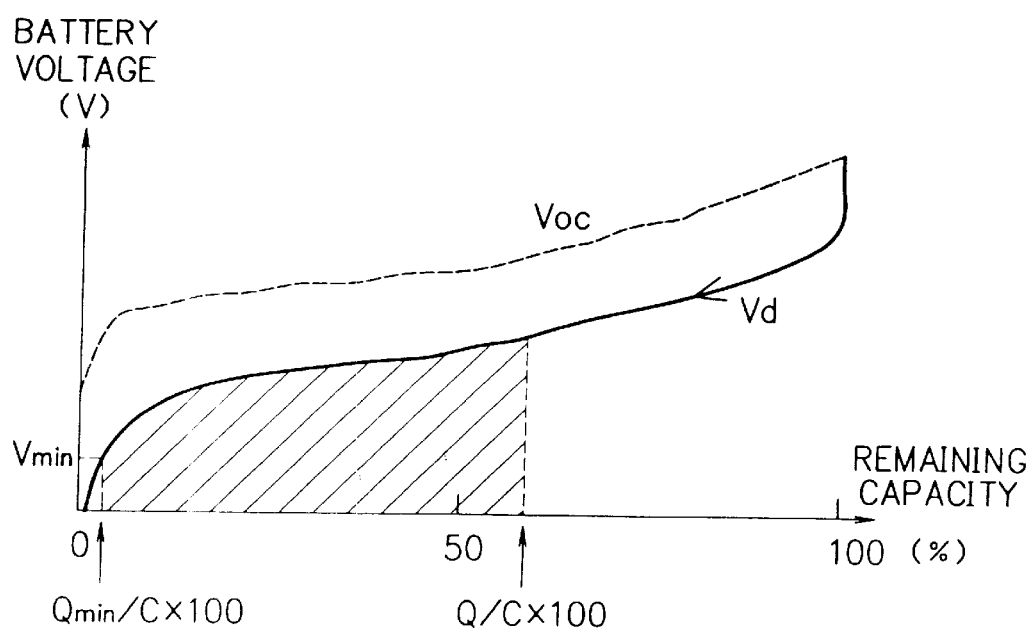
FIG. 23 shows a graph with respect to a normal rechargeable battery and which illustrates an example for the relationship of the open-circuit voltage and the battery voltage upon charging to the remaining capacity, and in said graph, there is together shown a usable region of energy with which an instrument can use in practice.

FIG. 23 is a graph of a normal rechargeable battery, showing the relationship of the open-circuit voltage and battery voltage upon discharging to the remaining capacity (%) [from the nominal capacity or the electricity storable capacity (C)], where when a remaining capacity at the time of using the rechargeable battery is made to be Q and the other remaining capacity when the battery voltage of the rechargeable reaches the minimum operating voltage (Vmin) of the instrument is made to be Qmin, the presently residual electricity quantity, that is, the usable capacity is [Q−Qmin].

Figure 24:
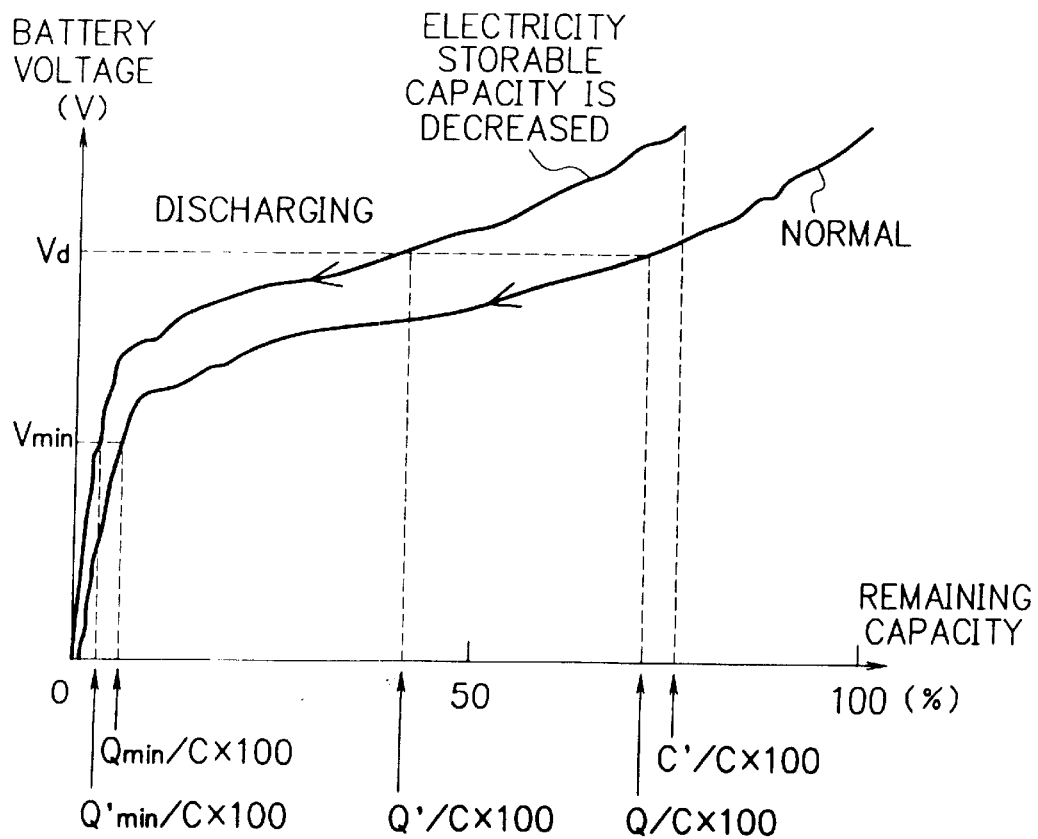
FIG. 24 shows a graph with respect to a normal rechargeable battery (a) and a rechargeable battery (b) whose electricity storable capacity having been decreased and which illustrates an example for the relationship between the battery voltage upon discharging to the remaining capacity for the battery (a) and the battery voltage upon discharging to the remaining capacity for the battery (b), and in said graph, there is together shown an example of a relationship between the usable capacity of the battery (a) and that of the battery (b), which make it possible to use an instrument in practice.

FIG. 24 is a graph of a rechargeable battery (i) whose electricity storable capacity is decreased from C to C'(C'=D×C) and a normal rechargeable battery (ii), showing the relationship of the battery voltage during discharging to the remaining capacity (%) for each of the two rechargeable batteries. Now, when the remaining capacity of the capacity-reduced rechargeable battery (i) whose battery temperature is T, whose discharging current is Id, and whose battery voltage is Vd is made to be Q', the remaining capacity (Q) of the normal rechargeable battery (ii) at Vd becomes to be Q=Q'/D (with D being a decrease coefficient of the electricity storable capacity). And when the remaining capacity of the capacity-reduced rechargeable battery (i) is Q'min when the battery voltage thereof reaches the minimum operating voltage (Vmin) of the instrument, the remaining capacity of the rechargeable battery (ii) at Vmin becomes to be Qmin=Q'min/D (with D being a decrease coefficient of the electricity storable capacity). Therefore, from the relational expressions Vd=Vd(Q'/D, Id, T) and Vmin=Vd(Q'min/D, Id, T) respectively of the battery voltage upon discharging, the remaining capacity Q' at Vd and the remaining capacity Q'min at Vmin for the capacity-reduced rechargeable battery (i) can be computed, where the usable capacity of the rechargeable battery (i) becomes to be [Q'−Q'min].

The period of time during which the instrument can be operated can be expressed by a time obtained by dividing the above usable capacity by the consumed current of the instrument or a time obtained by dividing the energy quantity supplied by the usable capacity of the rechargeable battery until the battery voltage of the rechargeable battery reaches the minimum operating voltage of the instrument by the consumed power of the instrument.

[Detection of Internal State of a Rechargeable Battery in Various Use Situations]

Detection of Internal State of a Rechargeable Battery in a Shutdown State (or a Paused State)

(Judgment of the Present or Absence of Short-circuit in a Rechargeable Battery)

A change with the passage of time in the open-circuit voltage (Voc) of a given rechargeable battery in a paused state is measured.

When the reduction rate of the Voc is greater than a prescribed value (vo), that is, −DVoc/dt>vo>0, it is judged that the rechargeable battery is short-circuited.

When the reduction rate of the Voc is 0≦−dVoc/dt≦vo, it is judged that the rechargeable battery is not short-circuited.

Figure 2:
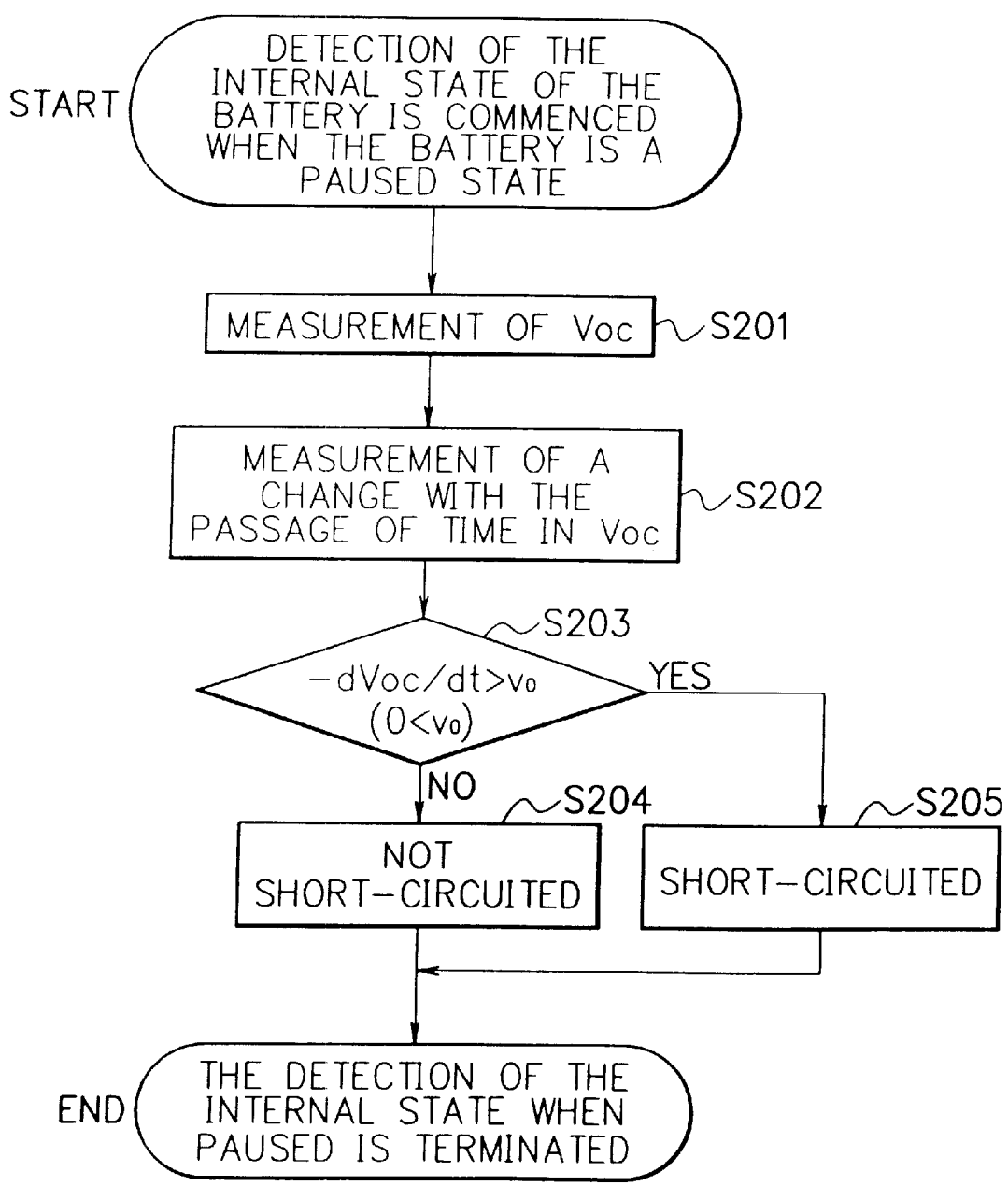
FIG. 2 shows an example of a flow chart of steps of judging the presence or absence of short-circuit in a rechargeable battery which is out of operation.

FIG. 2 shows a flow chart illustrating the procedures for judging the presence or absence of short-circuit in a rechargeable battery to be inspected.

Detection of Internal State of a Rechargeable Battery From Pausing Stage to Discharging Stage When a given rechargeable battery to be inspected is situated in a paused state without subjecting to charging or discharging, a change with the passage of time in the open-circuit voltage (Voc) of the battery is measured. Thereafter, the battery is subjected to discharging with an electricity quantity ($q_1$) of a current value $I_1 \times$ a time $t_1$ from the open-circuit voltage (Voc), where a battery voltage (V) during the time until the discharging operation is terminated and an open-circuit voltage ($Voc_1$) after the termination of the discharging operation are measured, whereby judgment is conducted of whether the battery is normal or it is deteriorated.

FIG. 25(1) graphically shows a change with the passage of time in the battery-voltage and a change with the passage of time in the current in the above operation.

The discharging current in the above operation is preferred to comprise a rectangular wave current or a pulse current.

Figure 3:
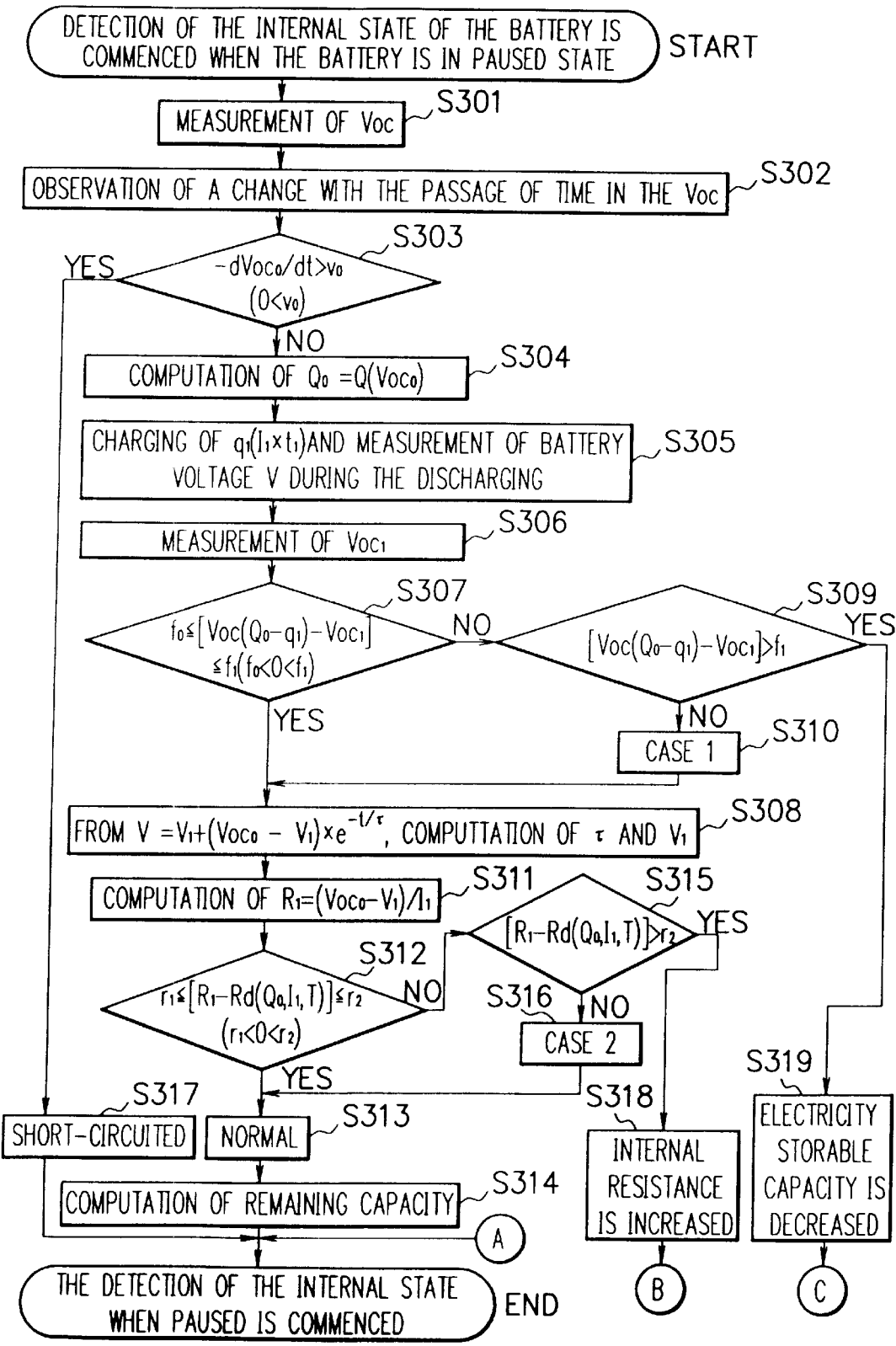
FIG. 3 shows an example of a flow chart of steps in the detecting method, wherein discharging operation is performed for a rechargeable battery from the time when the rechargeable battery is in a shutdown state, where judgment is conducted of whether the rechargeable battery is normal, whether the internal resistance is increased or whether the electricity storable capacity is decreased.

FIG. 3 shows a flow chart illustrating the procedures in which discharging operation is conducted for a given rechargeable battery to be inspected from a stage where the battery is paused, and judgment is conducted of whether the internal resistance is increased or of whether the electricity storable capacity is decreased.

In Case 1 (S310) in the flow chart of FIG. 3, the electricity storable capacity is greater than a previously acquired electricity storable capacity of a normal rechargeable battery and therefore, the rechargeable battery involved is considered to be also normal. In addition, in Case 2 (S316) in the flow chart of FIG. 3, the internal resistance is smaller than a previously acquired internal resistance of a normal rechargeable battery but no short-circuit is present and therefore, the rechargeable battery involved is considered to be also normal.

Now, the computation of the internal resistance after judged that the internal resistance is increased and the computation of the internal resistance after judged that the electricity storable capacity is decreased are shown respectively in FIG. 4 and FIG. 5, which will be described later.

1. Judgment of the Presence of Short-circuit

As previously described, when the reduction rate of the open-circuit voltage (Voc) of a rechargeable battery to be inspected is greater than a prescribed value ($v_0$), that is, $-dVoc/dt > v_0 > 0$, it is judged that the rechargeable battery is short-circuited.

2. Judgment of Whether the Rechargeable Battery is Normal or the Internal Resistance Thereof is Increased For the rechargeable battery judged that the reduction rate of the open-circuit voltage (Voc) thereof is smaller than the above-mentioned prescribed value ($v_0$) in the judgment 1, the rechargeable battery is subjected to judgment of whether it is normal or the internal resistance thereof is increased in the following manner.

In the case where the rechargeable battery is that the electricity storable capacity is not decreased, as will be understood with reference to the graph of FIG. 18(1), the remaining capacity and the open-circuit voltage have a correspondence of 1:1, where when one of the open-circuit voltage and the remaining capacity is found out, the other can be readily found out.

With reference to the graph shown in FIG. 25(1), for the rechargeable battery in a paused state, the open-circuit voltage ($Voc_0$) is measured. Thereafter, from the rechargeable battery, an electricity quantity $q_1$ of a current $I_1 \times$ a time $t_1$ is discharged, where the battery voltage (V) of the battery during the discharging operation and the open-circuit voltage ($Voc_1$) of the battery after termination of the discharging operation are measured. In this case, when the rechargeable battery is that the electricity storable capacity is not decreased, there should be provided such a result that the remaining capacity (Q) when the open-circuit voltage is $Voc_0$ is $Q_0 = Q(Voc_0)$, the remaining capacity after the discharging of the electricity quantity $q1$ is $Q_0 - q_1$, and the open-circuit voltage is $Voc(Q_0 - q_1)$. Here, the remaining capacity (Q) is expressed by the function formula of the open-circuit voltage (Voc): $Q = Q(Voc)$, and the open-circuit voltage (Voc) is expressed by the function formula of the remaining capacity (Q): $Voc = Voc(Q)$.

When the difference between the open-circuit voltage $Voc(Q_0 - q_1)$ and the measured value $Voc_1$ is $f_0 \leq [Voc(Q_0 - q_1) - Voc_1] \leq f_1 (f_0 < 0 < f_1)$ and it falls in a variation range of the characteristics of the corresponding normal rechargeable battery product, the rechargeable battery to be inspected can be deemed to be substantially the same as the normal rechargeable battery. Thus, the rechargeable battery can be judged to be free of a reduction in the electricity storable capacity.

Separately, it is assumed that the transient characteristics of the battery voltage of a rechargeable battery at an initial stage when discharging operation for the battery is initiated can be expressed by the following equation:

$$V = V_1 + (Voc_0 - V_1) \times e^{-t/\tau}$$

(with V being a battery voltage, t being a discharging time, $V_1$ being a battery voltage of the battery when the discharging time is extrapolated to infinity, and $\tau$ being a time constant decided by an internal resistance or the like of the battery). And in accordance with the battery voltage V to a measured discharging time and in accordance with said equation, a time constant $\tau$ when the discharging operation is initiated at a discharging current $I_1$ from the open-circuit voltage $Voc_0$ and a battery voltage $V_1$ are computed.

FIG. 25(2) shows a graph illustrating the interrelation between the battery voltage $V_1$ and the transient characteristics thereof.

Now, when the internal resistance of the rechargeable battery is made to be $R_1$, the $R_1$ can be obtained from equation $V_1 = Voc_0 - I_1 \times R_1$ and equation $R_1 = (Voc_0 - V_1)/I_1$. This internal resistance $R_1$ of the rechargeable battery is compared with the relational expression $Rd(Voc_0, I_1, T)$ [or $Rd(Q_0, I_1, T)$] of the internal resistance (Rd) [upon discharging] of the corresponding normal rechargeable battery versus the previously acquired open-circuit voltage ($Voc_0$) [or the remaining capacity ($Q_0$)], the discharging current ($I_1$), and the battery temperature (T).

In the above comparison, (i) when the internal resistance $R_1$ of the rechargeable battery (to be inspected) is substantially the internal resistance $Rd(Voc_0, I_1, T)$ or $Rd(Q_0, I_1, T)$ of the normal rechargeable battery, in other words, when the internal resistance $R_1$ of the rechargeable battery falls in a variation range of $r_1 \leq [R_1 - Rd(Q_0, I_1, T)] \leq r_2 (r_1 < 0 < r_2)$ for the corresponding rechargeable battery product, the rechargeable battery is judged that it is normal, and (ii) when the internal resistance $R_1$ of the rechargeable battery (to be inspected) falls in a variation region of $[R_1 - Rd(Q_0, I_1, T)] > r_2 (0 < r_2)$, the rechargeable battery is judged that the internal resistance is increased.

3. Judgment of Whether the Electricity Storable Capacity is Decreased

For the rechargeable battery judged that the reduction rate of the open-circuit voltage (Voc) thereof is smaller than the above-mentioned prescribed value ($v_0$) in the judgment 1, the rechargeable battery is subjected to judgment of whether the electricity storable capacity thereof is decreased in the following manner.

With reference to the graph shown in FIG. 25(1), for the rechargeable battery in a paused state, the open-circuit voltage ($Voc_0$) is measured. Thereafter, from the rechargeable battery, an electricity quantity $q_1$ of a current $I_1 \times$ a time $t_1$ is discharged, where the battery voltage (V) of the battery during the discharging operation and the open-circuit voltage ($Voc_1$) of the battery after termination of the discharging operation are measured. In this case, when the rechargeable battery is that the electricity storable capacity is not decreased, there should be provided such a result that the remaining capacity (Q) when the open-circuit voltage is $Voc_0$ is $Q_0=Q(Voc_0)$, the remaining capacity after the discharging of the electricity quantity q1 is $Q_0-q_1$, and the open-circuit voltage is $Voc(Q_0-q_1)$.

When the difference between the open-circuit voltage $Voc(Q_0-q_1)$ and the measured value $Voc_1$ is $[Voc(Q_0-q_1)-Voc_1]>f_1(0<f_1)$, the rechargeable battery to be inspected is judged that the electricity storable capacity thereof is decreased.

[Computation of an Increase in the Internal Resistance]

In the foregoing judgment 2 of whether the internal resistance of the rechargeable battery is increased, when it is judged that the internal resistance is increased, the increased internal resistance can be computed in the following manner.

When it is assumed that the internal resistance is increased from the internal resistance R=Rd(Q, Id, T) of the normal rechargeable battery to R'=a×Rd(Q, Id, T)+b (where each of a and b is a constant, Q is a remaining capacity, Id is a discharge rate (a discharging current), T is a battery temperature), the value of the increased internal resistance can be computed as will be described below.

Figure 4:
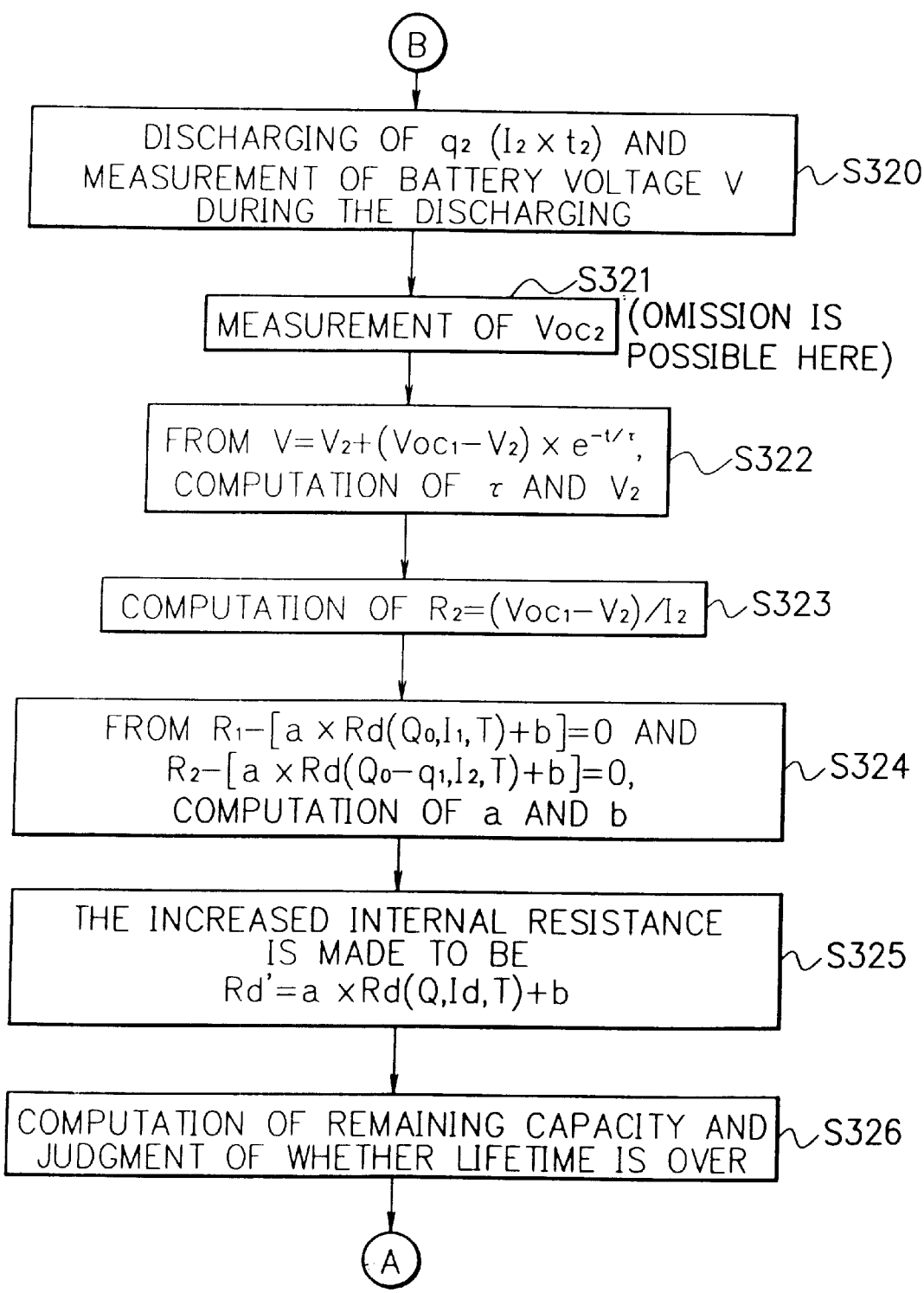
FIG. 4 shows an example of a flow chart of steps for computing an increase in the internal resistance of the rechargeable battery in FIG. 3, wherein it is judged whether the internal resistance is increased.

FIG. 4 shows a flow chart which follows B [S318 (internal resistance increased)] in FIG. 3. Particularly, FIG. 4 shows an example of a flow chart of steps for computing an increase in the internal resistance of the rechargeable battery.

Particularly, the rechargeable battery whose internal resistance is intended to examine is subjected discharging from its paused state at least two times. That is, from the rechargeable battery whose open-circuit voltage is $Voc_0$, an electricity quantity $q_1$ of a current $I_1 \times$ a time $t_1$ is discharged, and thereafter, from the rechargeable battery whose open-circuit voltage is $Voc_1$, an electricity quantity $q_2$ of a current $I_2 \times$ a time $t_2$ is discharged where during the time until the discharging operation is terminated, the battery voltage (V) is measured and the open-circuit voltage ($Voc_2$) after the termination of the discharging operation is measured.

It is assumed that the transient characteristics of the battery voltage at a initial stage of the commencement of the discharging operation can be expressed by the equation $V=V_1+(Voc_0-V_1)\times e^{-t/\tau}$ (with V being a battery voltage, t being a discharging time, $V_1$ being a battery voltage of the battery when the discharging time t is extrapolated to infinity, and $\tau$ being a time constant).

And in accordance with the battery voltage V to a measured discharging time and in accordance with said equation, a time constant $\tau$ when the discharging operation is initiated at a discharging current $I_1$ from the open-circuit voltage $Voc_0$ and a battery voltage $V_1$ are computed.

The internal resistance $R_1$ of the rechargeable battery at this time is computed from the equation $V_1=Voc_0-I_1\times R_1$ or $R_1=(Voc_0-V_1)/I_1$.

Similarly, in accordance with the equation $V=V_2+(Voc_1-V_2)\times e^{-t/\tau}$ (with V being a battery voltage, t being a discharging time, $V_2$ being a battery voltage of the battery when the discharging time t is extrapolated to infinity, and $\tau$ being a time constant), a time constant $\tau$ when the discharging operation is initiated at a discharging current $I_2$ from the open-circuit voltage $Voc_1$ and a battery voltage $V_2$ are computed.

The internal resistance $R_2$ of the rechargeable battery at this time is computed from the equation $V_2=Voc_1-I_2\times R_2$ or $R_2=(Voc_1-V_2)I_2$.

Then, in accordance with the equation $R_1-[a\times Rd(Q_0, I_1, T)+b]=0$ (with $Q_0$ being a remaining capacity when the open-circuit voltage is $Voc_0$) and the equation $R_2[a\times Rd(Q_0-q_1, I_2, T)+b]=0$ (where $Q_1=Q_0-q_1$ and is a remaining capacity when the open-circuit voltage is $Voc_1$) or $R_2=[a\times Rd(Q_1, I_2, T)+b]=0$ where $Q_1$ $Q(Voc_1)$, the constant a, the constant b, and the remaining capacity $Q_0$ are computed.

In this way, the increased internal resistance Rd'=a×Rd(Q, Id, T)+b can be computed.

In this computation of the increased internal resistance, in order to estimate the battery voltage when the discharging current is changed, the foregoing equation which is expressed with the time constant $\tau$ is used. But this is not limitative. It is possible to use other appropriate equations capable of being approximated.

[Computation of a Decrease in the Electricity Storable Capacity]

Figure 5:
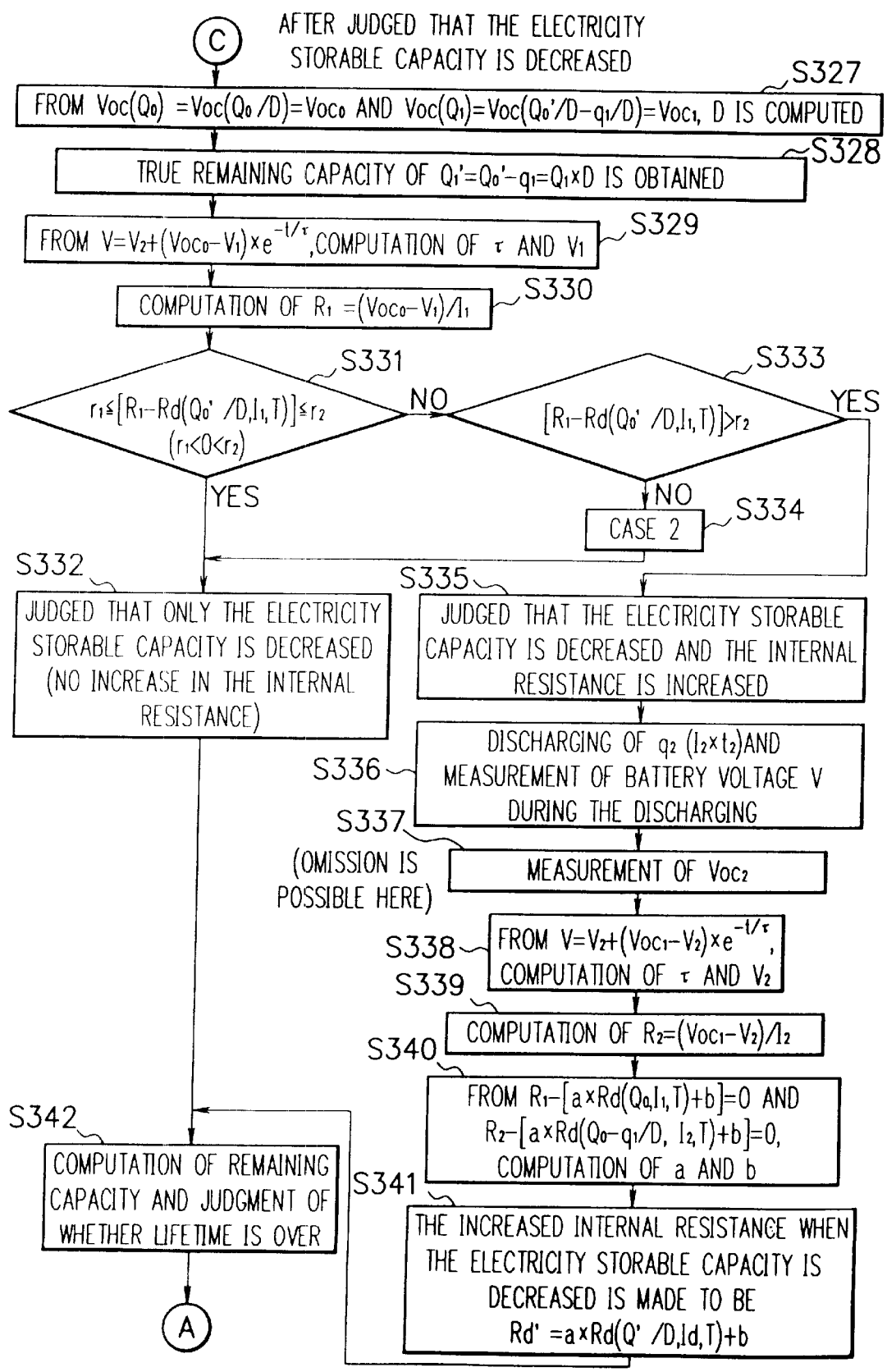
FIG. 5 shows an example of a flow chart of steps for computing a decrease in the electricity storable capacity of the rechargeable battery in FIG. 3, wherein it is judged whether the electricity storable capacity is decreased.

In the foregoing judgment 3 of whether the electricity storable capacity of the rechargeable battery is decreased, for the rechargeable battery judged that the electricity storable capacity is decreased, when it is assumed that the decreased electricity storable capacity is D time (D is a constant of 0<D<1) the electricity storable capacity of the corresponding normal rechargeable battery, the value of the decreased electricity storable capacity can be obtained in accordance with a manner shown in FIG. 5 which follows C [S319 (electricity storable capacity decreased)] in FIG. 3. FIG. 5 shows an example of a flow chart of steps for computing a decrease in the electricity storable capacity of the rechargeable battery. In Case 2 (S334) in FIG. 5, for the rechargeable battery whose internal resistance is smaller than the previously acquired internal resistance of the corresponding normal rechargeable battery and which is free of short-circuit, it is judged that the electricity storable capacity is decreased and the internal resistance is not increased.

Now, the value of the decreased electricity storable capacity can be estimated as will be described below.

In FIG. 25(1), in the case where from a rechargeable battery whose open-circuit voltage is $Voc_0$ and which is in a paused state, an electricity quantity q1 is discharged at a current value $I_1$ and the open-circuit voltage of the battery becomes to be $Voc_1$, the remaining capacity when the open-circuit voltage is $Voc_0$ is $Q_0$ if the battery is normal. However, since the rechargeable battery to be inspected is that the electricity storable capacity is decreased by D time as above described, the remaining capacity when the open-circuit voltage is $Voc_0$ is made to be $Q_0'$.

From Voc(Q) and Q(Voc) of the relationship of the open-circuit voltage (Voc) to the remaining capacity (Q) of the normal rechargeable battery, for the rechargeable battery whose electricity storable capacity is decreased by D time, when the remaining capacity of the rechargeable battery is multiplied by 1/D, the rechargeable battery can be considered as being corresponding to the normal rechargeable battery. This situation can be expressed as follows.

$$Voc_0=Voc(Q_0)=Voc(Q_0'/D)$$

$$Q_0=Q_0'/D=Q(Voc_0)$$

In addition, when the remaining capacity of the rechargeable battery whose electricity storable capacity is decreased after the discharging operation of the electricity quantity q, is made to be $Q_1'$, there is established the following relationship.

$$Q_1' = Q_0' - q_1$$

$$Voc_1 = Voc[(Q_1' - q_1)/D]$$

$$Q_0'/D - q_1/D = Q(Voc_1)$$

$$Q(Voc_0) - q_1/D = Q(Voc_1)$$

$$q_1/D = Q(Voc_0) - Q(Voc_1)$$

$$D = q_1/[Q(Voc_0) - Q(Voc_1)]$$

From this, a reduction constant D of the decreased electricity storable capacity can be estimated. The remaining capacity at this time becomes to be $D \times Q(Voc_1)$.

Separately, when the internal resistance $R_1$ obtained in the same manner as in the foregoing judgment 2 falls in a variation range of $r_1 \leq [R_1 - Rd(Q_0'/D, I_1, T)] \leq r_2 (r_1 < 0 < r_2)$, the rechargeable battery to be inspected can be judged that the internal resistance is not increased but the electricity storable capacity is decreased.

Besides, when the internal resistance $R_1$ obtained in the same manner as in the foregoing judgment 2 falls in a variation range of $[R_1 - Rd(Q_0, I_1, T)] > r_2 (0 < r_2)$, the rechargeable battery to be inspected can be judged that the internal resistance is increased and the electricity storable capacity is decreased.

Particularly, the rechargeable battery whose electricity storable capacity is intended to examine is subjected to discharging from its paused state at least two times. That is, with reference to the graph shown in FIG. 25(1), from the rechargeable battery whose open-circuit voltage is $Voc_0$, an electricity quantity $q_1$ of a current $I_1 \times$ a time $t_1$ is discharged, and thereafter, from the rechargeable battery whose open-circuit voltage is $Voc_1$, an electricity quantity $q_2$ of a current $I_2 \times$ a time $t_2$ is discharged where during the time until the discharging operation is terminated, the battery voltage (V) is measured and the open-circuit voltage ($Voc_2$) after the termination of the discharging operation is measured.

It is assumed that the transient characteristics of the battery voltage at a initial stage of the commencement of the discharging operation can be expressed by the equation $V = V_1 + (Voc_0 - V_1) \times e^{-t/\tau}$ (with V being a battery voltage, t being a discharging time, $V_1$ being a battery voltage of the battery when the discharging time t is extrapolated to infinity, and $\tau$ being a time constant).

And in accordance with the battery voltage V to a measured discharging time and in accordance with said equation, a time constants when the discharging operation is initiated at a discharging current $I_1$ from the open-circuit voltage $Voc_0$ and a battery voltage $V_1$ are computed.

The internal resistance $R_1$ of the rechargeable battery at this time is computed from the equation $V_1 = Voc_0 - I_1 \times R_1$ or $R_1 = (Voc_0 - V_1)/I_1$.

Similarly, in accordance with the equation $V = V_2 + (Voc_1 - V_2) \times e^{-t/\tau}$ (with V being a battery voltage, t being a discharging time, $V_2$ being a battery voltage of the battery when the discharging time t is extrapolated to infinity, and $\tau$ being a time constant), a time constant $\tau$ when the discharging operation is initiated at a discharging current $I_2$ from the open-circuit voltage $Voc_1$ and a battery voltage $V_2$ are computed.

The internal resistance $R_2$ of the rechargeable battery at this time is computed from the equation $V_2 = Voc_1 - I_2 \times R_2$ or $R_2 = (Voc_1 - V_2)/I_2$.

It is assumed that the internal resistance of the rechargeable battery is increased from $Rd(Q, Id, T)$ to $a \times Rd(Q, Id, T) + b$ (where each of a and b is a constant). And in accordance with the equation $R_1 - [a \times Rd(Q_0, I_1, T) + b] = 0$ and the equation $R_2 - [a \times Rd(Q_1, I_2, T) + b] = R_2 - [a \times Rd(Q_0 - q_1/D, I_2, T) + b] = 0$ (where $Q_0 = Q_0'/D$, $Q_1 = Q_1'/D$, $Q_0'$ is a remaining capacity when the open-circuit voltage is $Voc_0$, and $Q_1'$ is a remaining capacity when the open-circuit voltage is $Voc_1$), the constant a, the constant b, the D and the $Q_0'$ are computed.

In this way, for the rechargeable battery whose electricity storable capacity is decreased and whose internal resistance is increased, the relationship of the internal resistance $Rd' = a \times Rd(Q'/D, Id, T) + b$ (where Q' is a true remaining capacity when the electricity storable capacity is decreased) can be obtained.

Detection of Internal State of a Rechargeable Battery From Pausing State to Charging Stage When a given rechargeable battery to be inspected is situated in a paused state without subjecting to charging or discharging, a change with the passage of time in the open-circuit voltage (Voc) of the battery is measured. Thereafter, charging operation (pulse-charging operation) for the battery is started at a current value $Ic_1$, where a battery voltage (Vc) is measured. And when an electricity quantity $q_1$ of a current value $Ic_1 \times$ a time $t_1 \times$ a charge-and-discharge efficiency Eff is charged to make the battery voltage to be $Vc_1$, the charging operation is terminated, where a change with the passage of time in the open-circuit voltage (Voc) is measured and the open-circuit voltage which is settled at a prescribed value is made to be $Voc_1$. In this way, the internal state of the rechargeable battery is detected.

FIG. 26(1) shows a change with the passage of time in the battery voltage and a change with the passage of time in the charging current in the above operation.

The open-circuit voltage $Voc_1$ after the termination of the charging operation can be obtained by measuring an open-circuit voltage $Voc_1$ after an elapse of a prescribed period of time or by using an adequate equation showing the transient characteristics of the open-circuit voltage.

Figure 6:
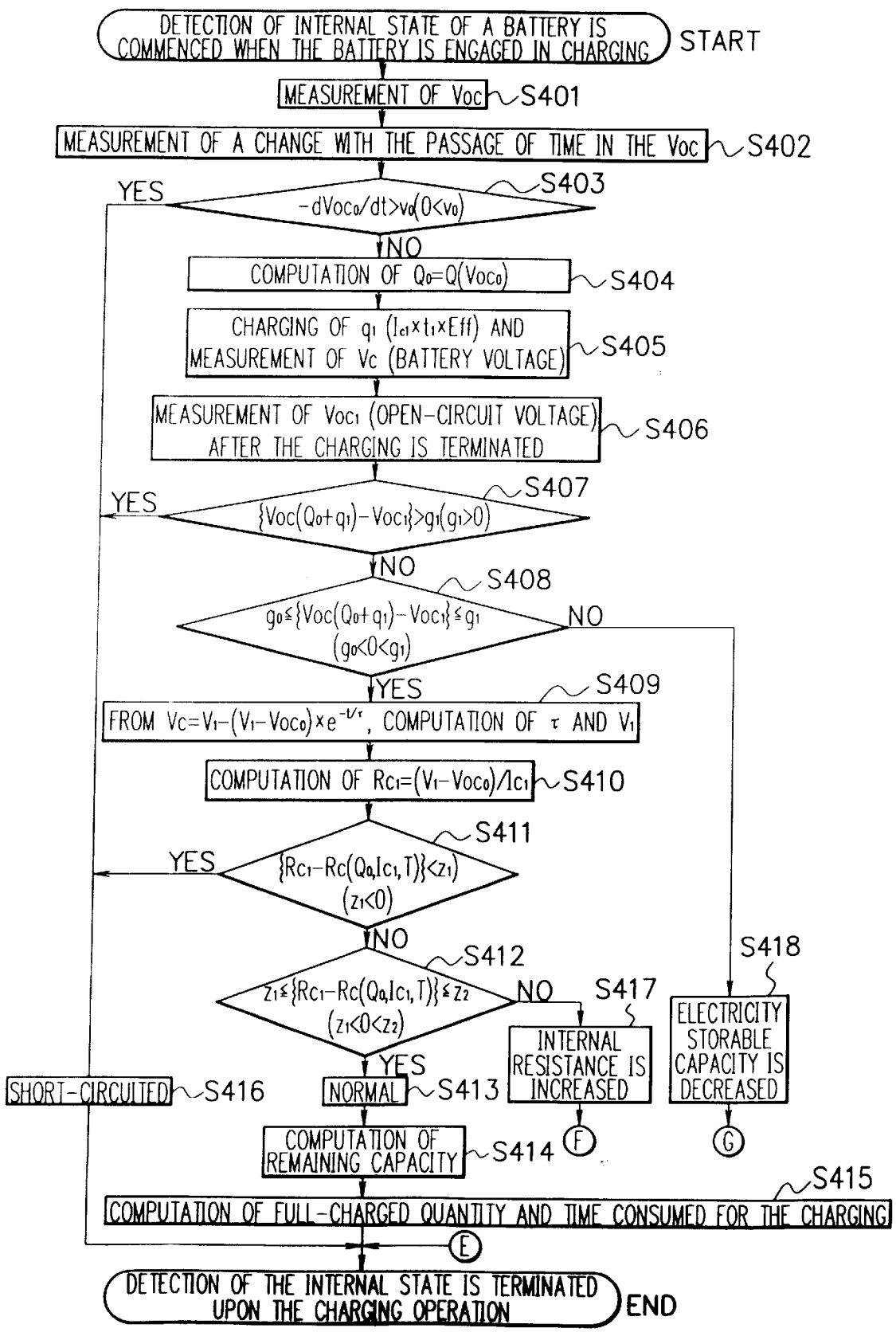
FIG. 6 shows an example of a flow chart of steps, wherein charging operation is performed for a rechargeable battery from the time when the rechargeable battery is in a shutdown state, where judgment is conducted of whether the rechargeable battery is normal, whether the internal resistance is increased or whether the electricity storable capacity is decreased.

FIG. 6 shows an example of a flow chart of steps, wherein charging operation is performed for a rechargeable battery from the time when the rechargeable battery is in a shutdown state (a paused state), where judgment is conducted of whether the rechargeable battery is normal, whether the internal resistance is increased or whether the electricity storable capacity is decreased.

Now, computation of the internal resistance after judged that the internal resistance is increased and computation of the internal resistance after judged that the electricity storable capacity is decreased are shown respectively in FIG. 7 and FIG. 8, which will be described later.

In this embodiment, description is made of the method of detecting the internal state of the rechargeable battery by conducting the charging operation from the paused state. However, this is not limitative. The detection of the internal state of the rechargeable battery can be also conducted by a method wherein the charging operation is performed in a pulse-like manner for the rechargeable battery from its charged state.

1. Judgment of the Presence of Short-circuit

When a rechargeable battery ($B_a$) to be inspected falls in any of the following cases (i) to (iii), the rechargeable battery is judged that it is short-circuited.

(i) A case where from the relationship Voc(Q) between the remaining capacity (Q) and the open-circuit voltage (Voc) of the corresponding normal rechargeable battery ($B_n$) [where n means normal], the remaining capacity $Q_0$ of the rechargeable battery ($B_a$) when the open-circuit voltage is $Voc_0$, and a difference the open-circuit voltage $Voc(Q_0+q_1)$ and the open-circuit voltage $Voc_1$ after the charging operation is $[Voc(Q_0+q_1)-Voc_1]>g_1$ ($g_1>0$).

(ii) A case where from the relationship $Vc(Q, Ic, T)$ between the remaining capacity (Q), the charging current (Ic), the battery temperature (T) and the battery voltage (Vc) of the normal rechargeable battery ($B_n$), $[Vc(Q_0+q_1, Ic, T)-Vc_1]>j_1(j_1>0)$.

(iii) A case where from the relationship Rc (Voc, Ic, T) between the open-circuit voltage (Voc), the charging current (Ic), the battery temperature (T) and the internal resistance (Rc) of the normal rechargeable battery ($B_n$), $[Rc_1-Rc (Voc_1, Ic, T)]<z_1(z_1<0)$, with $Rc_1$ being an internal resistance when the battery voltage is $Vc_1$.

2. Judgment of Whether a Rechargeable Battery to be Inspected is Normal, the Internal Resistance Thereof is Increased, or the Electricity Storable Capacity is Decreased From the relationship Voc(Q) between the remaining capacity (Q) and the open-circuit voltage (Voc) of the corresponding normal rechargeable battery, for the rechargeable battery to be inspected, the remaining capacity $Q_0$ when the open-circuit voltage is $Voc_0$ is obtained. When a difference between the open-circuit voltage $Voc(Q_0+q_1)$ obtained from the relationship of Voc(Q) and the open-circuit voltage $Voc_1$ after the charging operation is $g_0 \leq [Voc(Q_0+q_1)-Voc_1] \leq g_1(g_0<0<g_1)$, it is judged that the rechargeable battery is free of a decrease in the electricity storable capacity.

Separately, it is assumed that the transient characteristics of the battery voltage (Vc) of the rechargeable battery at an initial stage when the charging operation for the battery is commenced can be expressed by the following equation:

$$Vc = V_1 - (V_1 - Voc_0) \times e^{-t/\tau}$$

(with t being a charging time, $V_1$ being a battery voltage of the battery when the charging time is extrapolated to infinity, and $\tau$ being a time constant decided by an internal resistance or the like of the battery). And in accordance with the battery voltage Vc to a measured charging time t and in accordance with said equation, a time constants $\tau$ when the charging operation is initiated at a charging current $Ic_1$ from the open-circuit voltage $Voc_0$ and a battery voltage $V_1$ are computed.

FIG. 26(2) shows a graph illustrating the interrelation between the battery voltage $V_1$ and the transient characteristics thereof.

Now, when the internal resistance of the rechargeable battery is made to be $Rc_1$, the $Rc_1$ can be obtained from equation $V_1 = Voc_0 + Ic_1 \times Rc_1$ and equation $Rc_1 = (V_1 - Voc_0)/Ic_1$. This internal resistance $Rc_1$ of the rechargeable battery is compared with the relational expression Rc ($Voc_0$, $Ic_1$, T) or Rc($Q_0$, $Ic_1$, T) of the internal resistance (Rc) [upon charging] of the corresponding normal rechargeable battery versus the previously acquired open-circuit voltage ($Voc_0$) or [the remaining capacity ($Q_0$)], the charging current ($Ic_1$), and the battery temperature (T).

In the above comparison, (i) when the internal resistance $Rc_1$ of the rechargeable battery falls in a variation range of $z_1 \leq [Rc_1-Rc(Q_0, Ic_1, T)] \leq z_2(z_1<0<z_2)$ or a variation range of $j_1 \leq [Vc_1-Vc(Q_0+q_1, Ic_1, T)] \leq j_2(j_1<0<j_2)$ for the corresponding normal rechargeable battery, the rechargeable battery is judged that it is normal.

The variation range expressed by the above inequality is an allowable range for the characteristics including internal resistance and battery voltage for a normal rechargeable battery product.

(ii) When the internal resistance $Rc_1$ of the rechargeable battery (to be inspected) falls in a variation region of $[Rc_1-Rc(Q_0, Ic_1, T)]>z_2(0<z_2)$ or a variation range of $j_2<[Vc_1-Vc(Q_0+q_1, Ic, T)]$ ($0<j_2$), the rechargeable battery is judged that the internal resistance is increased.

(iii) Separately, when $[Voc(Q_0+q_1)-Voc_1]<g_0(g_0<0)$, the rechargeable battery is judged that the electricity storable capacity is decreased.

[Computation of an Increase in the Internal Resistance]

Figure 7:
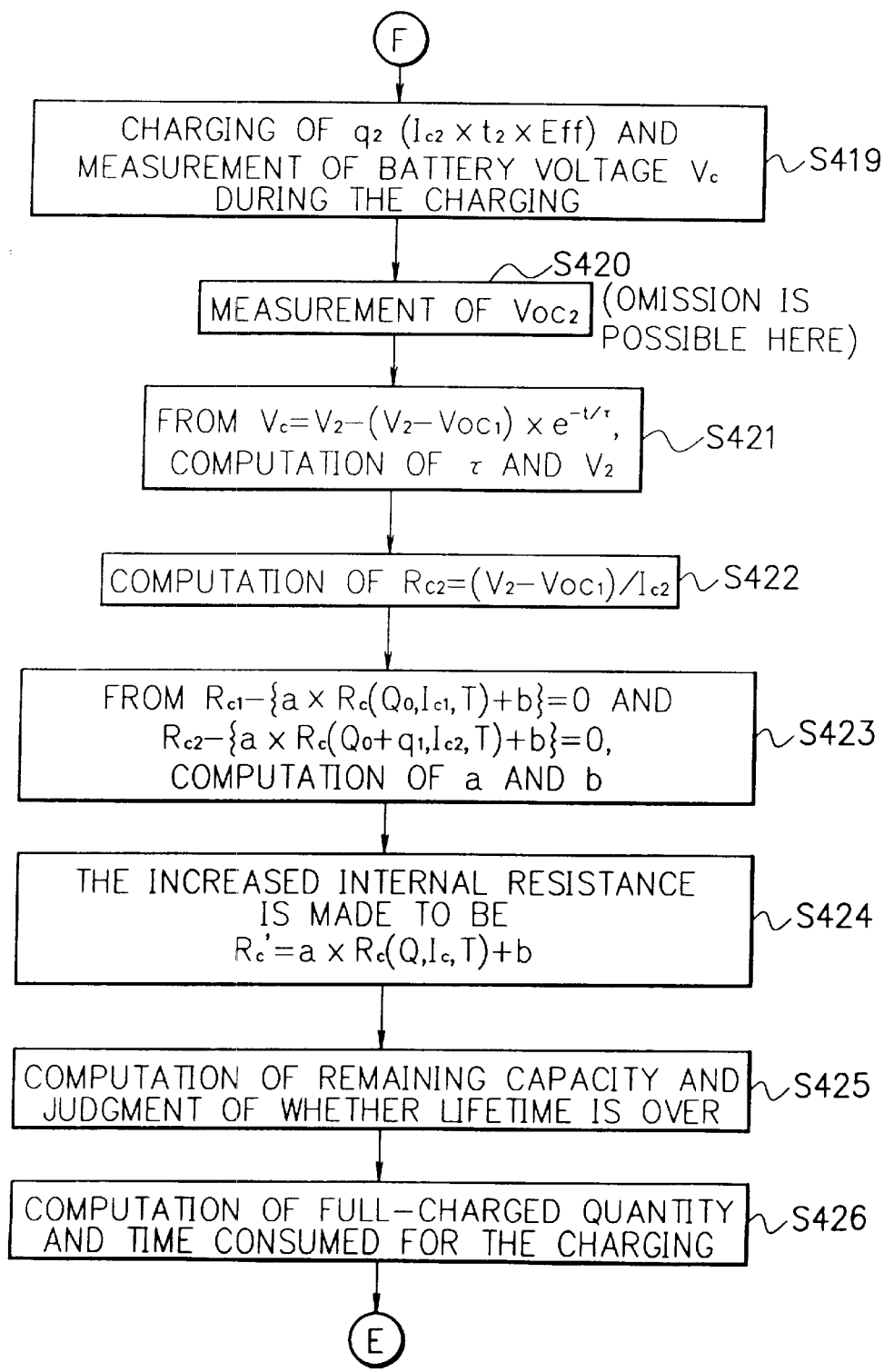
FIG. 7 shows an example of a flow chart of steps for computing an increase in the internal resistance of the rechargeable battery in FIG. 6, where judgment is conducted of whether the internal resistance is increased.

In the foregoing judgment 2, when the rechargeable battery is judged that the internal resistance is increased, the increased internal resistance can be computed in the manner shown in FIG. 7 which follows F [S417(internal resistance increased)] in FIG. 6. FIG. 7 shows an example of a flow chart of steps for computing an increase in the internal resistance of the rechargeable battery.

Particularly, the rechargeable battery whose internal resistance is intended to examine is subjected charging from its paused state at least two times. That is, for the rechargeable battery whose open-circuit voltage is $Voc_0$, an electricity quantity $q_1$ of a current $Ic_1 \times$a time $t_1$ is charged, and thereafter, for the rechargeable battery whose open-circuit voltage becomes to be $Voc_1$, an electricity quantity $q_2$ of a current $Ic_2 \times$a time $t_2$ is charged where during the time until the charging operation is terminated, the battery voltage (Vc) is measured and the open-circuit voltage ($Voc_2$) after the termination of the charging operation is measured. And an increased internal resistance $R' = a \times Rc(Q, Ic, T)+b$ can be computed in the following manner.

It is assumed that the transient characteristics of the battery voltage at a initial stage of the commencement of the charging operation can be expressed by the equation $Vc = V_1 - (V_1 - Voc_0) \times e^{-t/\tau}$ (with t being a charging time, $V_1$ being a battery voltage (Vc) of the battery when the charging time t is extrapolated to infinity, and $\tau$ being a time constant decided by an internal resistance or the like of the battery).

In the first charging operation, in accordance with said equation, a time constant $\tau$ when the charging operation is initiated at a charging current $Ic_1$ from the open-circuit voltage $Voc_0$ and a battery voltage $V_1$ are computed.

The internal resistance $Rc_1$ of the rechargeable battery at this time is computed from the equation $V_1 = Voc_0 + Ic_1 \times Rc_1$ or $Rc_1 = (V_1 - Voc_0)/Ic_1$.

Similarly, in the second charging operation, in accordance with the equation $Vc = V_2 - (V_2 - Voc_1) \times e^{-t/\tau}$ (with t being a charging time, $V_2$ being a battery voltage (Vc) of the battery when the charging time t is extrapolated to infinity, and $\tau$ being a time constant decided by an internal resistance or the like of the battery), a time constant $\tau$ when the charging operation is initiated at a charging current $Ic_2$ from the open-circuit voltage $Voc_1$ and a battery voltage $V_2$ are computed.

The internal resistance $Rc_2$ of the rechargeable battery at this time is computed from the equation $V_2 = Voc_1 + Ic_2 \times Rc_2$ or $Rc_2 = (V_2 - Voc_1)/Ic_2$.

When it is assumed that the internal resistance of the rechargeable battery is increased from Rc(Q, Ic, T) to $a \times Rc(Q, Ic, T)+b$ (where each of a and b is a constant), the above relationship can be expressed as will be described below.

$$Rc_1 - [a \times Rc(Q_0, Ic_1, T)+b] = 0$$

and $$Rc_2 - [a \times Rc(Q_0+q_1, Ic_2, T)+b] = 0,$$

or $$Q_1 = Q(Voc_1) \text{ and } Rc_2 - [a \times Rc(Q_1, Ic_2, T)+b] = 0$$

(where $Q_0$ is a remaining capacity when the open-circuit voltage is $Voc_0$, and $Q_1$ is a remaining capacity when the open-circuit voltage is $Voc_1$)

By solving these equations, the constant a and the constant b can be computed, and the increased internal resistance $Rc'=a \times Rc(Q, Ic, T)+b$ can be computed.

In this computation of the increased internal resistance, in order to obtain the battery voltage when the charging current is changed, the foregoing equation is expressed using the time constant $\tau$. But this is not limitative. It is possible to use other appropriate equations capable of being approximated.

[Computation of a Decrease in the Electricity Storable Capacity]

Figure 8:
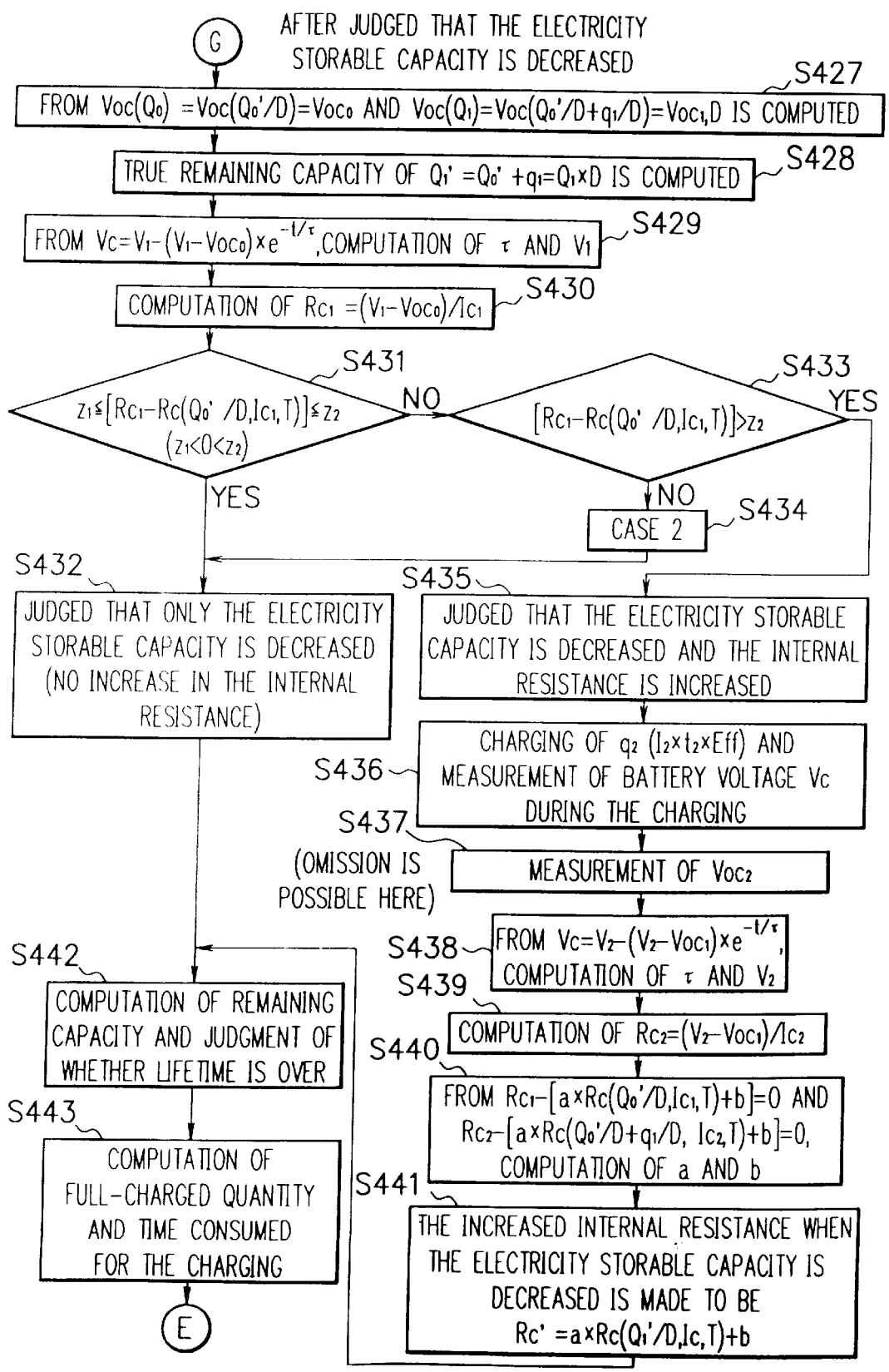
FIG. 8 shows an example of a flow chart of steps for computing an increase in the internal resistance of the rechargeable battery in FIG. 6, where judgment is conducted of whether the electricity storable capacity is decreased.

For the rechargeable battery judged that the electricity storable capacity is decreased in the foregoing judgment 2, when it is assumed that the decreased electricity storable capacity is D time (where D is a constant of 0<D<1) the electricity storable capacity of the corresponding normal rechargeable battery, the value of the decreased electricity storable capacity can be obtained in accordance with the manner shown in FIG. 8 which follows G [S418 (electricity storable capacity decreased)] in FIG. 6. FIG. 8 shows an example of a flow chart of steps for computing a decrease in the electricity storable capacity of the rechargeable battery. In Case 2 (S434) in FIG. 8, for the rechargeable battery whose internal resistance is smaller than the previously acquired internal resistance of the corresponding normal rechargeable battery and which is free of short-circuit, it is judged that the electricity storable capacity is decreased.

In FIG. 26(1), in the case where for a rechargeable battery whose open-circuit voltage is $Voc_0$ and which is in a paused state, an electricity quantity q1 is charged at a current value $Ic_1$ and the open-circuit voltage of the battery becomes to be $Voc_1$, the remaining capacity when the open-circuit voltage is $Voc_0$ is $Q_0$ if the battery is normal. However, since the rechargeable battery to be inspected is that the electricity storable capacity is decreased by D time as above described, the remaining capacity when the open-circuit voltage is $Voc_0$ is made to be $Q_0'$.

From Voc(Q) and Q(Voc) of the relationship of the open-circuit voltage (Voc) to the remaining capacity (Q) of the normal rechargeable battery, for the rechargeable battery whose electricity storable capacity is decreased by D time, when the remaining capacity of the rechargeable battery is multiplied by 1/D, the rechargeable battery can be considered as being corresponding to the normal rechargeable battery. This situation can be expressed as follows.

$$Voc_0=Voc(Q_0)=Voc(Q_0'/D)$$

$$Q_0=Q_0'/D=Q(Voc_0)$$

In addition, when the remaining capacity of the rechargeable battery whose electricity storable capacity is decreased after the charging operation of the electricity quantity q, is made to be $Q_1'$, there is established the following relationship.

$$Q_1'=Q_0'+q_1$$

$$Voc_1=Voc[(Q_0'+q_1)/D]$$

$$Q_0'/D+q_1/D=Q(Voc_1)$$

$$Q(Voc_0)+q_1/D=Q(Voc_1)$$

$$q_1/D=Q(Voc_1)-Q(Voc_0)$$

$$D=q_1/[Q(Voc_1)-Q(Voc_0)]$$

From this, a reduction constant D of the decreased electricity storable capacity can be computed. The remaining capacity at this time becomes to be $D \times Q(Voc_1)$.

Particularly, the rechargeable battery whose electricity storable capacity is intended to examine is subjected to charging from its paused state at least two times. That is, for the rechargeable battery whose open-circuit voltage is $Voc_0$, an electricity quantity $q_1$ of a current value $Ic_1 \times a$ time $t_1$ is pulse-charged in the first charging operation [see, FIG. 26(1)]. After the termination of the first charging operation, for the rechargeable battery whose open-circuit voltage becomes to be $Voc_1$ after the first charging operation, an electricity quantity $q_2$ of a current value $Ic_2 \times a$ time $t_2$ is pulse-charged in the second charging operation [see, FIG. 26(2) where the charged electricity quantity $q_2$ in relation to the charging current $Ic_2$ and the charging time t is not shown], where during the time until the charging operation is terminated, the battery voltage (Vc) is measured and the open-circuit voltage ($Voc_2$) after the termination of the second charging operation is measured.

It is assumed that the transient characteristics of the battery voltage (Vc) in the second charging operation can be expressed by the equation $$Vc=V_2-(V_2-Voc_1) \times e^{-t/\tau}$$

(with t being a charging time, $V_2$ being a battery voltage (Vc) of the battery when the charging time t is extrapolated to infinity, and $\tau$ being a time constant decided by an internal resistance or the like of the battery).

And in accordance with said equation, a time constant $\tau$ when the charging operation is initiated at the charging current value $Ic_2$ from the open-circuit voltage $Voc_1$ and a battery voltage $V_2$ are computed.

The internal resistance $Rc_2$ of the rechargeable battery at this time can be computed from the equation $V_2=Voc_1+Ic_2 \times Rc_2$ or $Rc_2=(V_2-Voc_1)/Ic_1$.

When it is assumed that the internal resistance of the rechargeable battery is increased from $Rc(Q \times D, Ic, T)$ to $a \times Rc(Q \times D, Ic, T)+b$ (where each of a and b is a constant), the above relationship can be expressed as will be described below.

$$Rc_1-[a \times Rc(Q_0'/D, Ic_1, T)+b]=0$$

and $$Rc_2-[a \times Rc(Q_1'/D+q_1/D, Ic_2, T)+b]=0,$$

or $$Q_1=Q_1'/D=Q(Voc_1)$$

and $$Rc_2-[a \times Rc(Q_1'/D, Ic_2, T)+b]=0$$

By solving these equations, the constant a and the constant b can be computed, and the increased internal resistance $Rc'=a \times Rc(Q'/D, Ic, T)+b$ of the rechargeable battery whose electricity storable capacity is decreased can be computed.

[Detection of Internal State of a Rechargeable Battery After the Termination of the Charging Operation]

After the charging operation for a rechargeable battery to be inspected is terminated at a battery voltage $Vc_E$, the internal state of the battery is detected by measuring a change with the passage of time in the battery voltage and estimating the open-circuit voltage (Voc).

Figure 27:
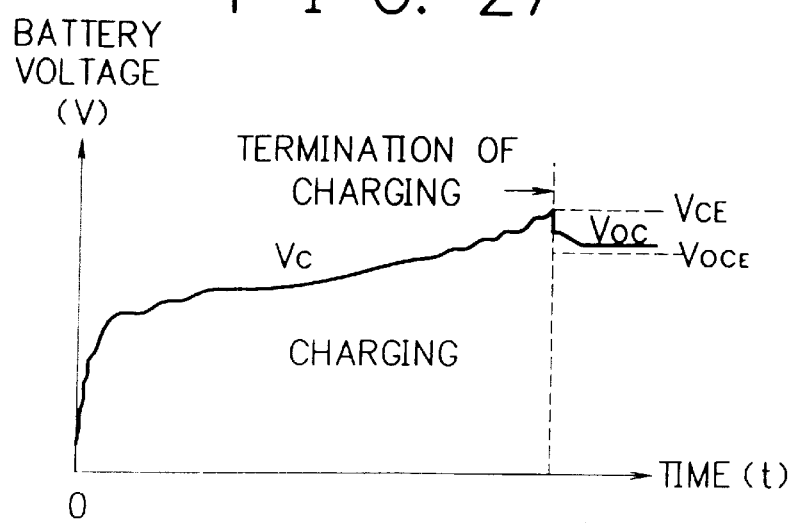
FIG. 27 shows a graph for an example of the relationship between the battery voltage of a rechargeable battery upon constant current charging and a change with the passage of time in the open-circuit voltage of the battery after the charging operation is terminated.

FIG. 27 shows a graph for an example of the relationship between the battery voltage of a rechargeable battery upon constant current charging and a change with the passage of time in the open-circuit voltage of the battery after the charging operation is terminated.

The estimation of the above open-circuit voltage (Voc) is performed as follows. The open-circuit voltage (after an elapse of a prescribed period of time from the time when the charging operation is terminated is made to be an open-circuit voltage $Voc_E$. Or the time t from the time when the charging operation is terminated and the open-circuit voltage at that time are measured, where the open-circuit voltage which becomes steady at a given value is made to be $Voc_E$.

It is assumed that the transient characteristics of the open-circuit voltage (Voc) can be expressed by the equation $Voc = Voc_E + (Vc_E - Voc_E) \times e^{-t/\tau}$ (with t being a charging time, $Voc_E$ being a battery voltage of the battery when the charging time t is extrapolated to infinity, and $\tau$ being a time constant decided by an internal resistance or the like of the battery).

In accordance with said equation, the time constant $\tau$ is obtained from the Voc values measured at a plurality of points and a true value of the open-circuit voltage $Voc_E$ is obtained.

[Judgment of the Presence of Short-circuit]

When the change with the passage of time in the open-circuit voltage (Voc), that is, the reduction rate $-dVoc_E/dt$ of the open-circuit voltage (Voc) of a rechargeable battery to be inspected is greater than a prescribed value ($v_c$), that is, $-dVoc/dt > v_c > 0$, it is judged that the rechargeable battery is short-circuited.

Separately, when the battery voltage $Vc_E$ of the rechargeable battery at the time when the charging operation is terminated is smaller than that ($m_0 > 0$) of the corresponding normal rechargeable battery, that is, $Vc_E < m_0$, the rechargeable battery to be inspected can be judged that it is short-circuited.

Figure 9:
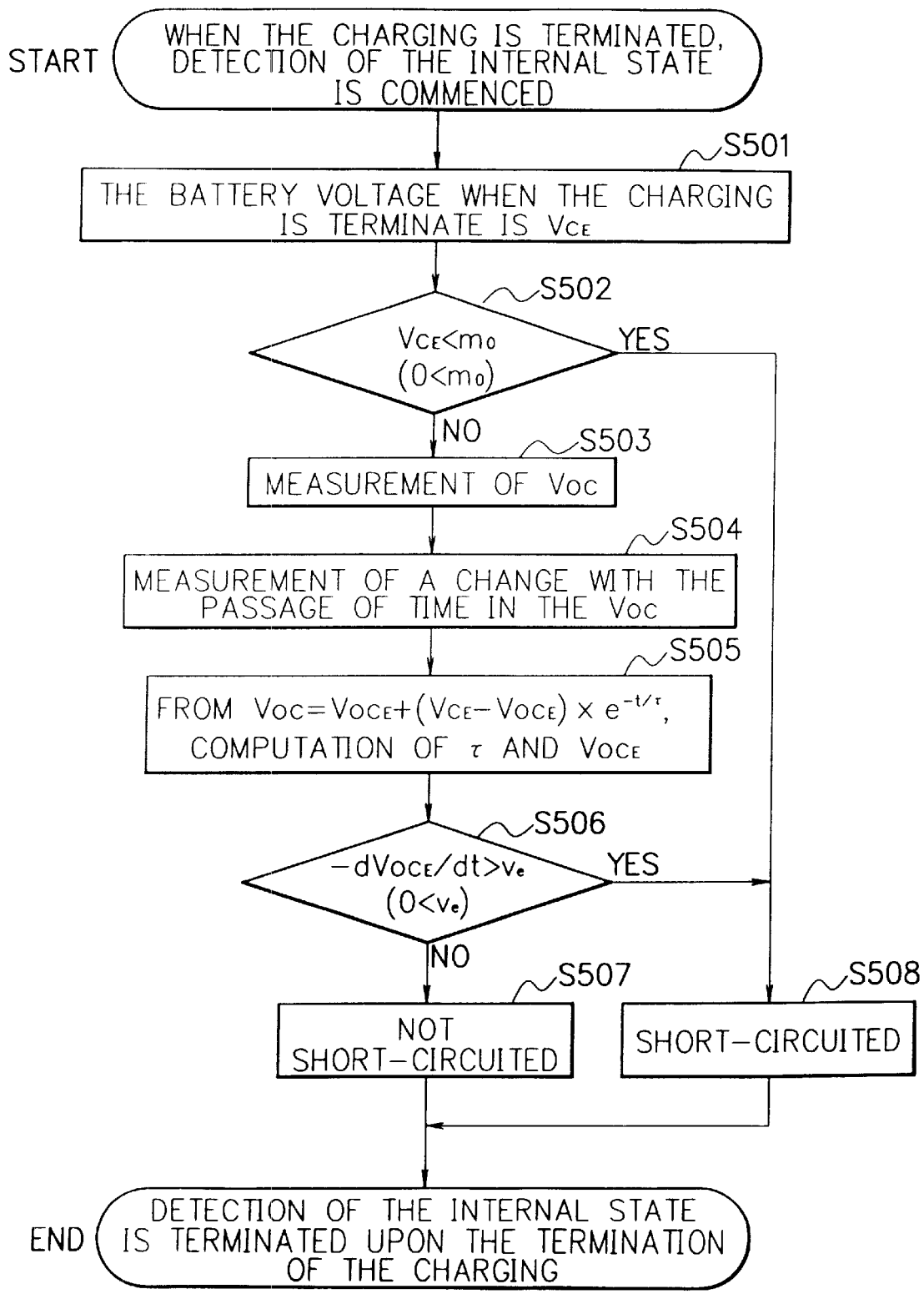
FIG. 9 shows an example of a flow chart illustrating procedures of judging the presence or absence of short-circuit in a rechargeable battery for which charging operation is terminated.

FIG. 9 shows an example of a flow chart illustrating the judgment procedures.

[Judgment of Internal State of a Rechargeable Battery in Constant Current-constant Voltage Charging Operation]

In accordance with a constant current-constant voltage charging, constant current charging operation is performed for a rechargeable battery at a prescribed constant current value, when the battery voltage reaches a prescribed upper limit battery voltage $Vc_L$, the constant current charging operation is switched to constant voltage charging operation, where the constant voltage charging operation is performed for the rechargeable battery whose battery voltage becomes $Vc_L$ at a prescribed constant voltage which is the same value as the battery voltage $Vc_L$ and after an elapse of a prescribed period of time, the charging operation is terminated. When the rechargeable battery is charged in this way, the internal state of the rechargeable battery is judged.

In this constant current-constant voltage charging method, when the charging operation for the rechargeable battery is normally accomplished without the charging operation being suspended in the course thereof, the presently stored electricity quantity (that is, the remaining capacity) of the rechargeable battery becomes to be a full-charging of substantially 100% of the electricity storable capacity.

In this judgment, a rechargeable battery ($B_b$) to be inspected is charged in accordance with the above constant current-constant voltage charging method so that the settled open-circuit voltage thereof after the full-charging is $Voc_E$.

The internal state of the rechargeable battery ($B_b$) is judged by comparing with that of the normal rechargeable battery ($B_n$) as will be described below.

1. Judgment of the Presence or Absence of Short-circuit

When the rechargeable battery ($B_b$) falls in any of the following cases (i) to (iv), the rechargeable battery is judged that it is short-circuited.

(i) A case where a change ($-dVoc_E/dt$) with the passage of time in the open-circuit voltage of the rechargeable battery ($B_b$) after the full-charging is greater than that ($v_e$) of the normal rechargeable battery ($B_n$), that is, $-dVoc_E/dt > v_e > 0$.

(ii) A case where the battery voltage ($Vc_E$) of the rechargeable battery ($B_b$) when the entire charging operation is terminated is smaller than that ($m_0$) of the normal rechargeable battery ($B_a$), that is, $Vc_E < m_0 0 < m_0$).

(iii) A case where an increase (dVc/dt) in the battery voltage of the rechargeable battery ($B_b$) upon the constant current charging operation is smaller than that ($s_0$) of the normal rechargeable battery ($B_a$), that is, $dVc/dt < s_0 (0 < s_0)$.

(iv) A case where a temperature rise (dT/dt) in the battery temperature (T) of the rechargeable battery ($B_b$) since the commencement of the charging operation is greater than that ($u_0$) of the normal rechargeable battery ($B_n$), that is, $dT/dt > u_0 (u_0 > 0)$.

2. Judgment of Increase in the Internal Resistance

When an increase rate (dVc/dt) of the battery voltage (Vc) of the rechargeable battery ($B_b$) in the constant current charging operation is greater than that of the normal rechargeable battery ($B_n$), and the open-circuit voltage ($Voc_E$) of the rechargeable battery ($B_b$) after the full-charging is smaller than that ($k_0$) of the normal rechargeable battery ($B_n$), that is, $0 < Voc_E < k_0$, the rechargeable battery ($B_b$) is judged that the internal resistance is increased.

3. Judgment of Decrease in the Electricity Storable Capacity

When in the constant current charging operation, the period of time consumed to reach the upper limit voltage ($Vc_L$) from the prescribed battery voltage in the case of the rechargeable battery ($B_b$) is shorter than that in the case of the normal rechargeable battery ($B_n$) or an increase rate (dVc/dt) of the battery voltage of the rechargeable battery ($B_b$) in the constant current charging operation is greater than that ($dVc_n/dt$) of the normal rechargeable battery ($B_n$), that is, $dVc/dt > dVc_n/dt > 0$, and the open-circuit voltage ($Voc_E$) of the rechargeable battery ($B_b$) after the full-charging is greater than that ($k_0$) of the rechargeable battery ($B_n$), that is, $Voc_E > k_0 > 0$, the rechargeable battery ($B_b$) is judged that the electricity storable capacity is decreased.

4. Judgment of Whether the Rechargeable Battery is Normal

When in the constant current charging operation, the period of time consumed to reach the upper limit voltage ($Vc_L$) from the prescribed battery voltage in the case of the rechargeable battery ($B_b$) is substantially the same as that in the case of the normal rechargeable battery ($B_n$) or an increase rate (dVc/dt) of the battery voltage of the rechargeable battery ($B_b$) in the constant current charging operation is substantially the same as that ($dVc_n/dt$) of the normal rechargeable battery ($B_n$), that is, $s_0 \leq dVc/dt \leq s_1 (0 < s_0 < s_1)$, and the open-circuit voltage ($Voc_E$) of the rechargeable battery ($B_b$) after the full-charging is substantially the same as or somewhat greater than that ($k_0$) of the rechargeable battery ($B_n$), that is, $Voc_E \leq k_0 > 0$, the rechargeable battery ($B_b$) can be judged that it is normal.

Figure 10:
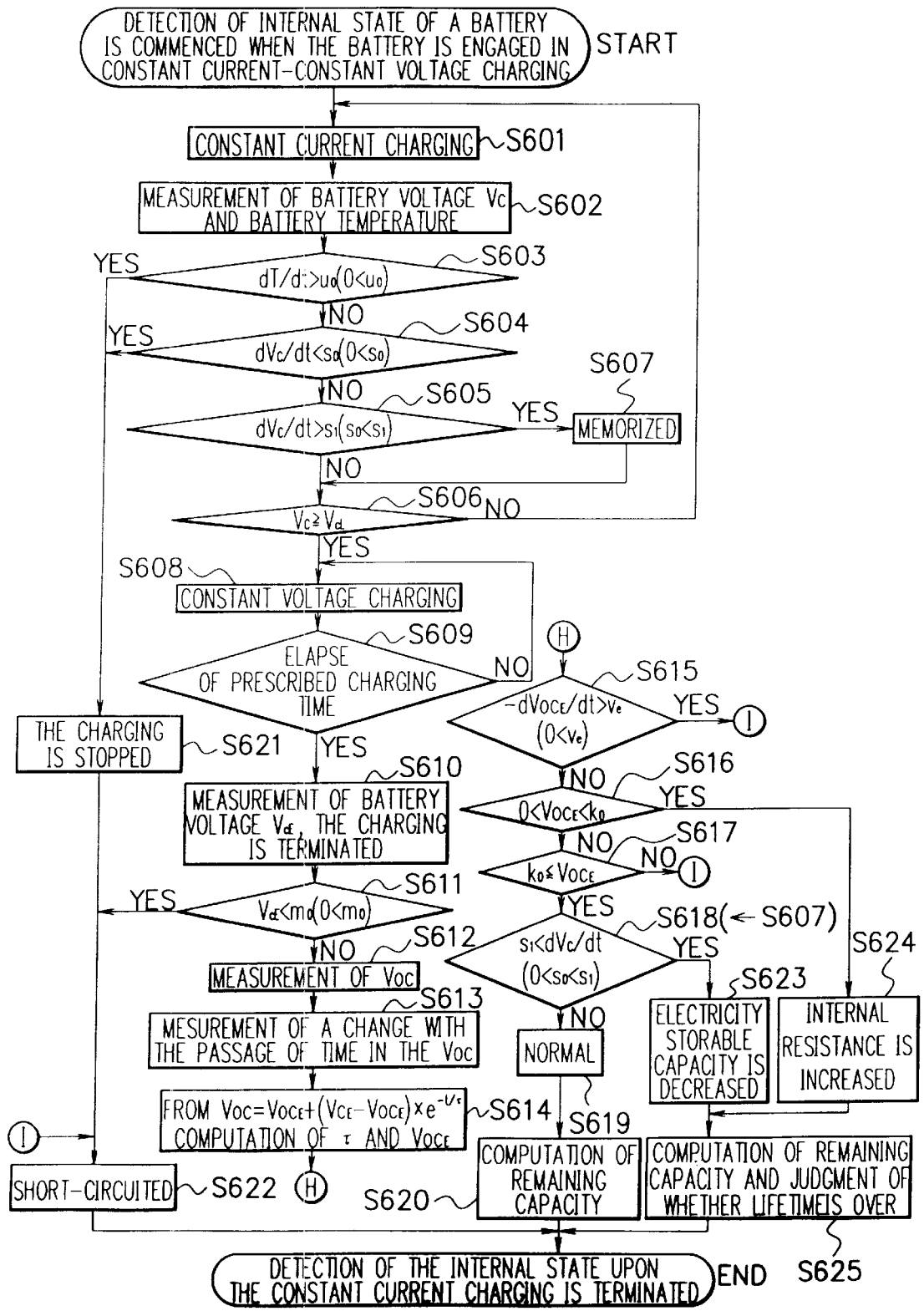
FIG. 10 shows an example of a flow chart wherein for a rechargeable battery which is engaged in constant current-constant voltage charging, judgment is conducted of whether the rechargeable battery is normal, whether the internal resistance is increased or whether the electricity storable capacity is decreased.

FIG. 10 shows a flow chart illustrating an example of the above judgment procedure.

[Judgment of Internal State of a Rechargeable Battery in the Case Where the Rechargeable Battery is Charged by Using a Constant Current Charging Method While Monitoring a Change in the Battery Temperature or the Battery Voltage]

In the charging method using the constant current charging method, charging operation for a rechargeable battery is conducted such that the charging operation is controlled or terminated by detecting a change with the passage of time in the battery temperature and/or a change with the passage of time in the battery voltage, that is, by detecting an increase in the battery temperature at a last stage of the charging operation and/or a decrease in the battery voltage at a last stage of the charging operation. Particularly, when the battery temperature is increased and/or the battery voltage is decreased at a last stage of the charging operation, the charging operation is terminated, where it is considered that the rechargeable battery becomes to be a full-charging of substantially 100% of the electricity storable capacity.

Each of a normal rechargeable battery ($B_n$) and a rechargeable battery ($B_b$) to be inspected is subjected to charging by the above charging method.

And the internal state of the rechargeable battery ($B_b$) to be inspected is judged by comparing with that of the normal rechargeable battery ($B_n$) as will be described below.

1. Judgment of the Presence or Absence of Short-circuit

When the rechargeable battery ($B_b$) falls in any of the following cases (i) to (iv), the rechargeable battery is judged that it is short-circuited.
 (i) A case where a change ($-dVoc_E$) with the passage of time in the open-circuit voltage of the rechargeable battery ($B_b$) after the full-charging is greater than that ($v_e$) of the normal rechargeable battery ($B_n$), that is, $-dVoc_E/dt > v_e > 0$.
 (ii) A case where an increase (dT/dt) in the battery temperature (T) of the rechargeable battery ($B_b$) from the time when the charging operation is commenced is greater than that ($u_0$) of the normal rechargeable battery ($B_n$), that is, $dT/dt > u_0 (0 < u_0)$.
 (iii) A case where an increase (dVc/dt) in the battery voltage (Vc) of the rechargeable battery ($B_b$) upon the constant current charging operation is smaller than that ($s_0$) of the normal rechargeable battery ($B_n$), that is, $dVc/dt < s_0 \ (0 < s_0)$.

2. Judgment of Increase in the Internal Resistance

When an increase rate (dVc/dt) of the battery voltage (Vc) of the rechargeable battery ($B_b$) in the constant current charging operation is greater than that ($s_1$) of the normal rechargeable battery ($B_n$), that is, $dVc/dt > s_1 (0 < s_1)$, and the open-circuit voltage ($Voc_E$) of the rechargeable battery ($B_b$) after the full-charging is smaller than that ($k_0$) of the normal rechargeable battery ($B_n$) that is, $0 < Voc_E \leq k_0$, the rechargeable battery ($B_b$) is judged that the internal resistance is increased.

3. Judgment of Decrease in the Electricity Storable Capacity

When an increase rate (dVc/dt) in the battery voltage (Vc) of the rechargeable battery ($B_b$) in the constant current charging operation is greater than that ($s_1$) of the normal rechargeable battery ($B_n$), that is, $dVc/dt > s_1(0 < s_1)$, and the open-circuit voltage ($Voc_E$) of the rechargeable battery ($B_b$) after the full-charging is greater than that ($k_0$) of the rechargeable battery ($B_n$), that is, $Voc_E > k_0 > 0$, the rechargeable battery ($B_b$) is judged that the electricity storable capacity is decreased.

4. Judgment of Whether the Rechargeable Battery is Normal

When an increase rate (dVc/dt) in the battery voltage (Vc) of the rechargeable battery ($B_b$) in the constant current charging operation is substantially the same as that ($dVc_n/dt$) of the normal rechargeable battery ($B_n$), that is, $s_0 \leq dVc/dt \leq s_1 (0 < s_0 < s_1)$, and the open-circuit voltage ($Voc_E$) of the rechargeable battery ($B_b$) after the full-charging is substantially the same as or somewhat greater than that ($k_0$) of the rechargeable battery ($B_n$), that is, $Voc_E \leq k_0 > 0$, the rechargeable battery ($B_b$) can be judged that it is normal.

Figure 11:
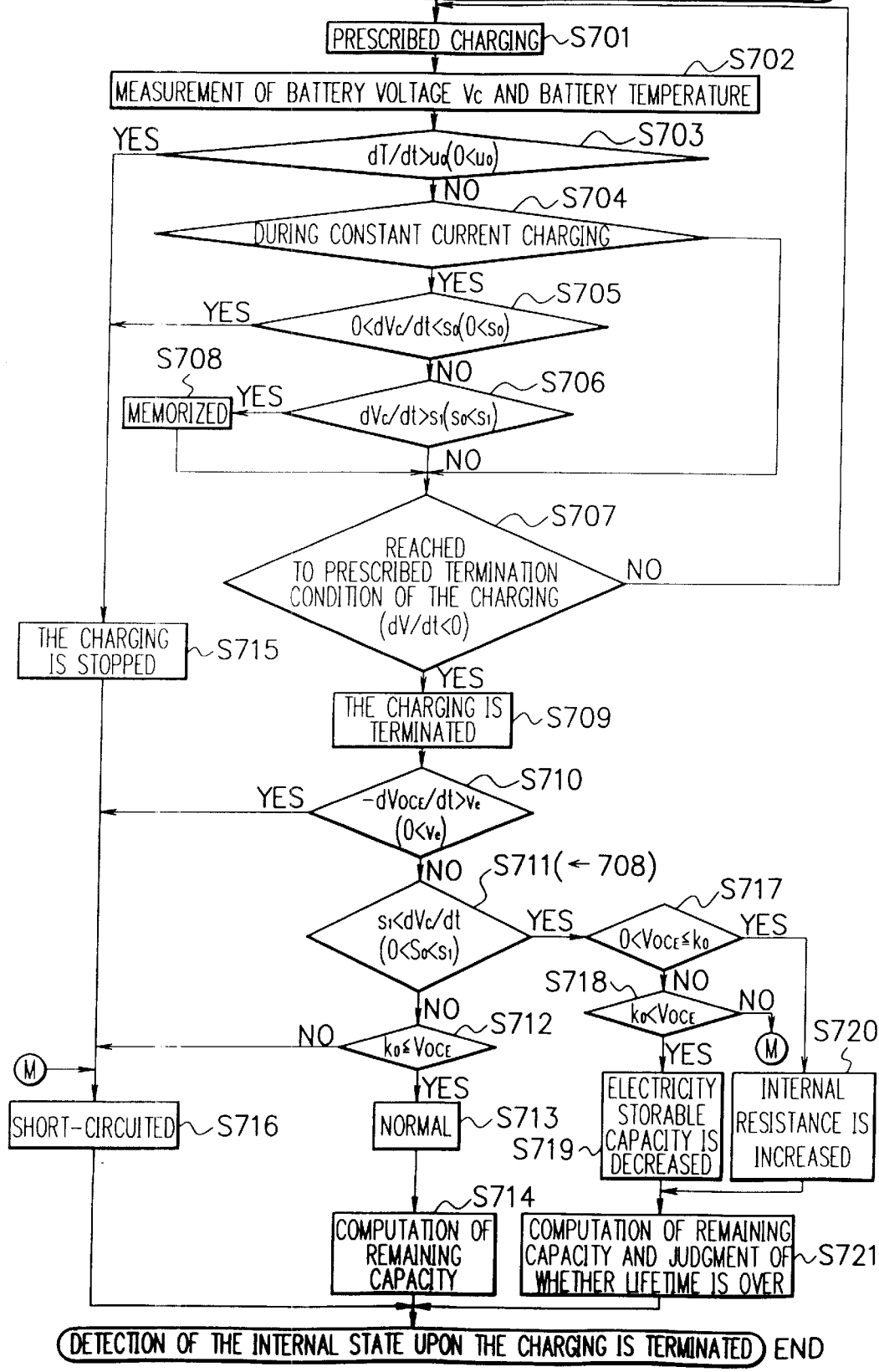
FIG. 11 shows an example of a flow chart wherein for a rechargeable battery in a charged state and which is controlled with respect to a change in the battery voltage change or the battery temperature, judgment is conducted of whether the rechargeable battery is normal, whether the internal resistance is increased or whether the electricity storable capacity is decreased.

FIG. 11 shows a flow chart illustrating an example of the above judgment procedure.

[Judgment of Internal State of the Rechargeable Battery Upon the Termination of the Constant Current Charging Operation in the Charging Method Using Constant Current Charging]

In the constant current charging operation in the charging method, when the open-circuit voltage of the rechargeable battery is less than a certain voltage value and after an elapse of a prescribed period of time, the charging operation is terminated. However, in the case where the battery voltage of the rechargeable battery reaches a prescribed upper limit voltage $Vc_L$, the charging operation is terminated.

The internal state of the rechargeable battery ($B_b$) is judged by comparing with that of the normal rechargeable battery ($B_n$) as will be described below.

1. Judgment of the Presence or Absence of Short-circuit

When the rechargeable battery ($B_b$) falls in any of the following cases (i) to (iv), the rechargeable battery is judged that it is short-circuited.
 (i) A case where a change ($-dVoc_E$) with the passage of time in the open-circuit voltage of the rechargeable battery ($B_b$) after the full-charging is greater than that ($v_e$) of the normal rechargeable battery ($B_n$), that is, $-dVoc_E/dt > v_e > 0$.
 (ii) A case where the battery voltage ($Vc_E$) of the rechargeable battery ($B_b$) when the entire charging operation is terminated is smaller than that ($m_0$) of the normal rechargeable battery ($B_n$), that is, $Vc_E < m_0$ $(0 < m_0)$.
 (iii) A case where an increase (dVc/dt) in the battery voltage of the rechargeable battery ($B_b$) upon the constant current charging operation is smaller than that ($s_0$) of the normal rechargeable battery ($B_n$), that is, $dVc/dt < s_0 (0 < s_0)$.
 (iv) A case where a temperature rise (dT/dt) in the battery temperature (T) of the rechargeable battery ($B_b$) since the commencement of the charging operation is greater than that ($u_0$) of the normal rechargeable battery ($B_n$), that is, $dT/dt > u_0 (u_0 > 0)$.

2. Judgment of Increase in the Internal Resistance

When an increase rate (dVc/dt) of the battery voltage (Vc) of the rechargeable battery ($B_b$) in the constant current charging operation is greater than that ($s_1$) of the normal rechargeable battery ($B_n$), that is, $dVc/dt > s_1(0 < s_1)$, and the open-circuit voltage ($Voc_E$) of the rechargeable battery ($B_b$) after the full-charging is smaller than that ($k_0$) of the normal rechargeable battery ($B_n$), that is, $0 < Voc_E < k_0$, the rechargeable battery ($B_b$) is judged that the internal resistance is increased.

3. Judgment of Decrease in the Electricity Storable Capacity

When an increase rate (dVc/dt) of the battery voltage of the rechargeable battery ($B_b$) in the constant current charging operation is greater than that ($dVc_n/dt$) of the normal rechargeable battery ($B_n$), that is, $dVc/dt > dVc_n/dt > 0$, and the open-circuit voltage ($Voc_E$) of the rechargeable battery ($B_b$) after the full-charging is greater than that ($k_0$) of the rechargeable battery ($B_n$), that is, $Voc_E > k_0 > 0$, the rechargeable battery ($B_b$) is judged that the electricity storable capacity is decreased.

4. Judgment of Whether the Rechargeable Battery is Normal

When an increase rate (dVc/dt) of the battery voltage of the rechargeable battery ($B_b$) in the constant current charging operation is substantially the same as that ($dVc_n/dt$) of the normal rechargeable battery ($B_n$), that is, $s_0 \leq dVc/dt \leq s_1$ ($0 < s_0 < s_1$), and the open-circuit voltage ($Voc_E$) of the rechargeable battery ($B_b$) after the full-charging is substantially the same as or somewhat greater than that ($k_0$) of the rechargeable battery ($B_n$), that is, $Voc_E \geq k_0 \geq 0$, the rechargeable battery ($B_b$) can be judged that it is normal.

Figure 12:
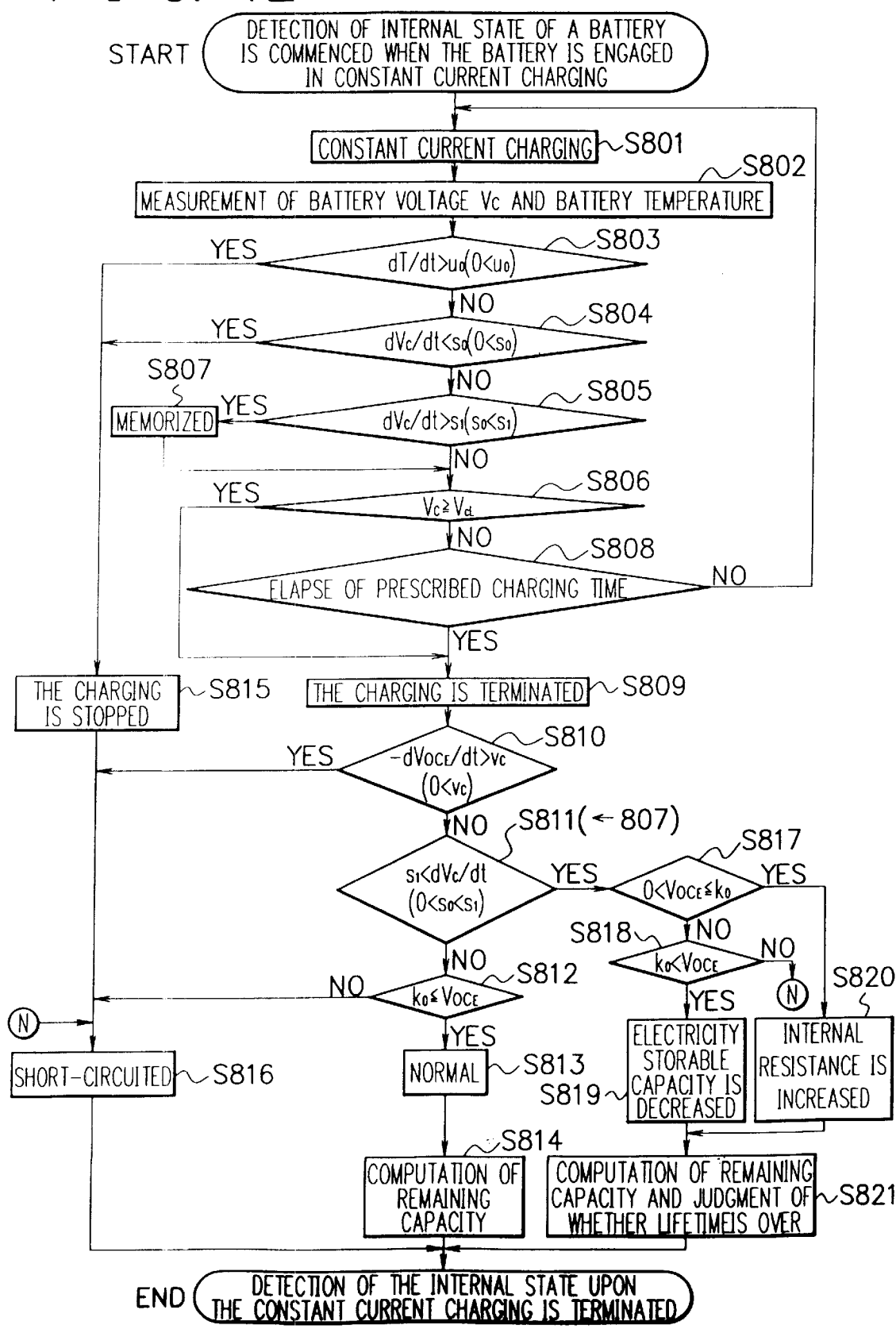
FIG. 12 shows an example of a flow chart wherein for a rechargeable battery which is engaged in constant current charging, judgment is conducted of whether the rechargeable battery is normal, whether the internal resistance is increased or whether the electricity storable capacity is decreased.

FIG. 12 shows a flow chart illustrating an example of the above judgment procedure.

Detection of Internal State of a Rechargeable Battery in a Discharging State (Judgment of the Presence of Short-circuit)

For a rechargeable battery to be inspected is in a discharging state, the discharging current $Id_0$ and the battery voltage Vd are measured.

When the rechargeable battery falls in any of the following cases (i) and (ii), it is judged that the rechargeable battery is short-circuited or the remaining capacity thereof is very small.

(i) A case where the battery voltage is less than a prescribed voltage value.

(ii) A case where a decrease rate (−dVd/dt) of the battery voltage (Vd) is greater than a prescribed voltage value $x_1$, that is, $-dVd/dt > x_1 (0 < x_1)$.

Separately, when the battery voltage is greater than the prescribed voltage value or when the decrease rate (−dVd/dt) of the battery voltage (Vd) is less than the prescribed voltage value $x_1$, that is, $0 < -dVd/dt \leq x_1$, it is judged that the rechargeable battery is normal or that a deterioration mode other than short-circuit is present in the rechargeable battery.

Figure 13:
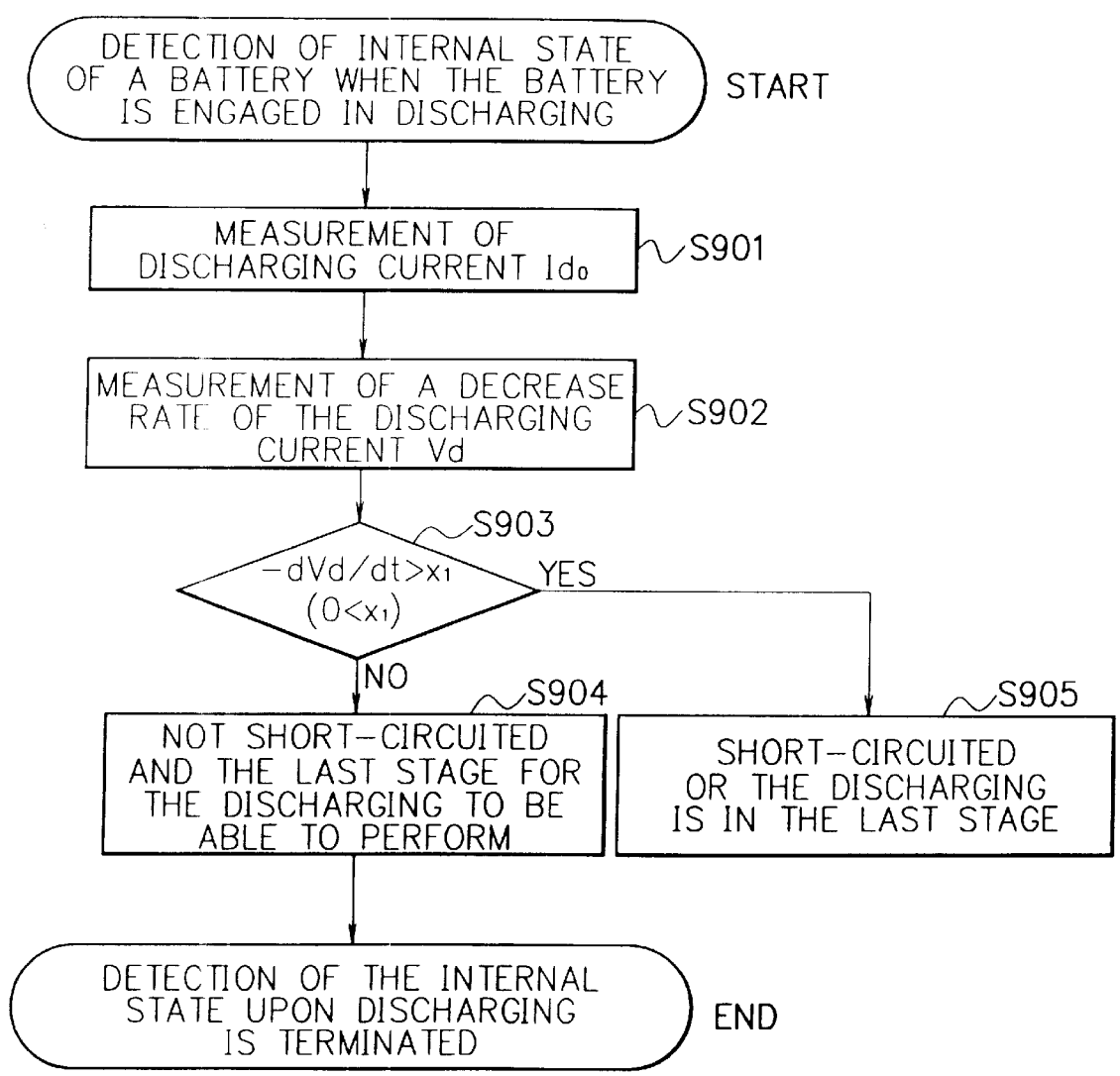
FIG. 13 shows an example of a flow chart wherein for a rechargeable battery which is engaged in discharging, judgment is conducted of the presence or absence of short-circuit in the rechargeable battery.

FIG. 13 shows a flow chart illustrating an example of the above judgment procedure.

[Detection of Internal State of a Rechargeable Battery from its Steady Discharging State]

For the rechargeable battery which is judged to be free of short-circuit from a change with the passage of time in the battery voltage upon the discharging in the above and which is in a steady discharging state, where the battery temperature of the rechargeable battery is T, the discharging current is $Id_1$, and the battery voltage is $Vd_0$, in the case where after a electricity quantity q is discharged from the rechargeable battery, the battery voltage becomes to be $Vd_1$ at the discharging current $Id_1$ in the steady discharging state, and the rechargeable battery is normal in this case, when the open-circuit voltage (Voc) and the remaining capacity (Q) [the presently stored electricity quantity] when the battery voltage is $Vd_0$ are made to be $Voc_0$ and $Q_0$ respectively, the relationship of the characteristics of the rechargeable battery in this case can be expressed as will be described in the following from the previously acquired relationship of the characteristics of the corresponding normal rechargeable battery.

$$Voc_0 = Voc(Q_0)$$

$$Q_0 = Q(Voc_0)$$

$$Vd_0 = Vd(Id_0, Q_0, T)$$

$$Q_0 = Q(Vd_0, Id_0, T)$$

$$Q_0 - q = Q(Vd_1, Id_1, T)$$

$$Vd_1 = Vd(Id_1, Q_0 - q, T)$$

By this, the internal state of the rechargeable battery can be judged as will be described below.

1. Judgment of Whether the Rechargeable Battery is Normal

From the previously acquired relationship of the remaining capacity, the discharging current, the battery temperature, and the battery voltage of the corresponding rechargeable battery, (i) when $y_1 \leq [Vd_1 - Vd(Q_0 - q, Id_1, T)] \leq y_2 (y_1 < 0 < y_2)$ or (ii) when $w_1 \leq Q(Id_1, Vd_1, T) - [Q(Id_0, Vd_0, T) - q] \leq w_2 (w_1 < 0 < w_2)$, the rechargeable battery is judged that it is normal.

2. Judgment of Increase in the Internal Resistance

From the previously acquired relationship of the remaining capacity, the discharging current, the battery temperature, and the battery voltage of the corresponding rechargeable battery, (i) when $[Vd_1 - Vd(Q_0 - q, Id_1, T)] > y_2 (0 < y_2)$ or (ii) when $Q(Id_1, Vd_1, T) - [Q(Id_0, Vd_0, T) - q] > w_2 (0 < w_2)$, the rechargeable battery is judged that the internal resistance is increased.

3. Judgment of Decrease in the Electricity Storable Capacity

From the previously acquired relationship of the remaining capacity, the discharging current, the battery temperature, and the battery voltage of the corresponding rechargeable battery, (i) when $[Vd_1 - Vd(Q_0 - q, Id_1, T)] < y_1 (y_1 < 0)$ or (ii) when $Q(Id_1, Vd_1, T) - [Q(Id_0, Vd_0, T) - q] < w_1 (w_1 < 0)$, the rechargeable battery is judged that the electricity storable capacity is decreased.

Figure 14:
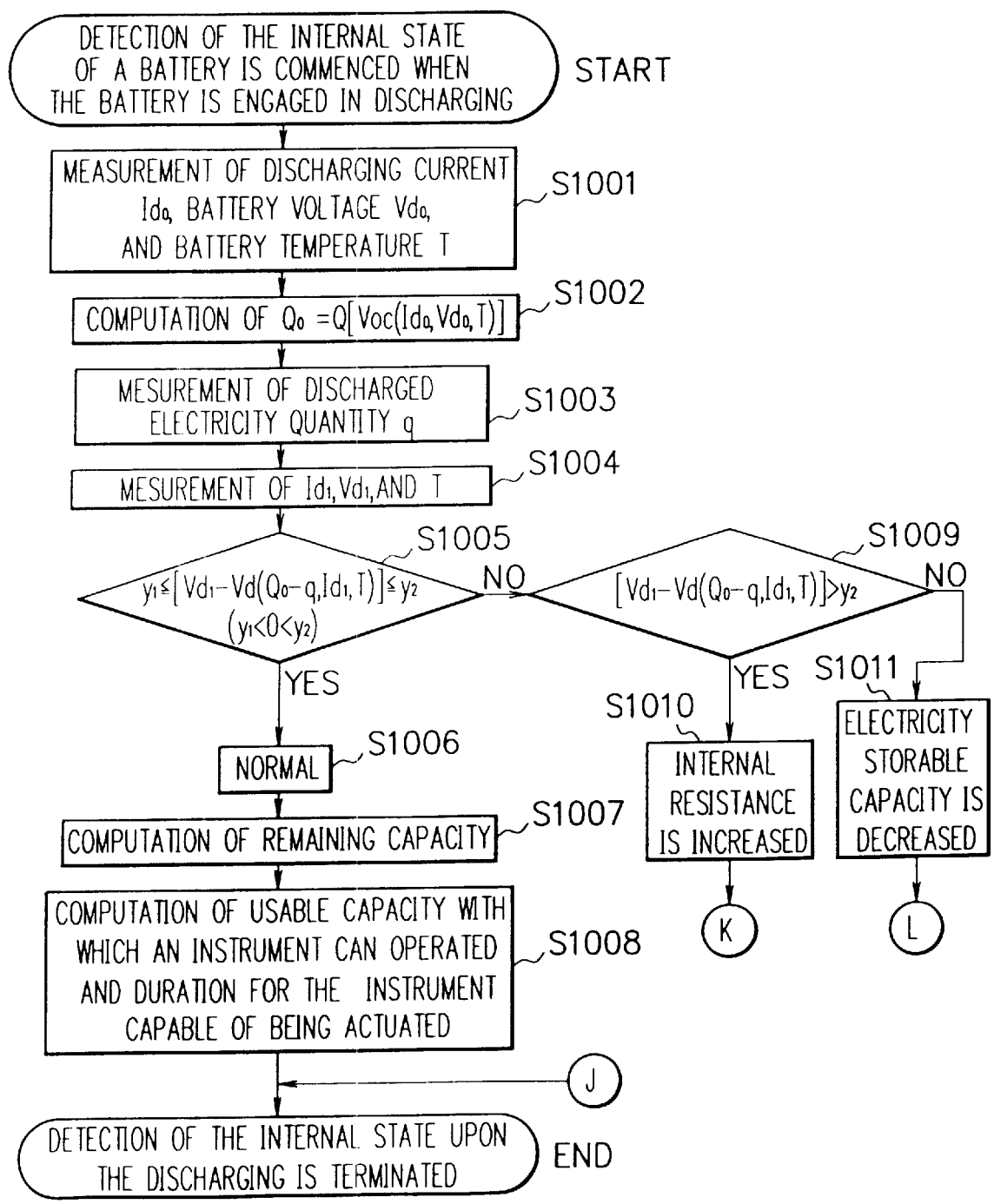
FIG. 14 shows an example of a flow chart wherein for a rechargeable battery which is engaged in discharging, judgment is conducted of whether the rechargeable battery is normal, whether the internal resistance is increased or whether the electricity storable capacity is decreased.

FIG. 14 shows a flow chart illustrating an example of the above judgment procedures.

The various thresholds ($v_0$, $f_0$, $f_1$, $r_1$, $r_2$, $g_0$, $g_1$, $j_i$, $j_2$, $z_1$, $z_2$, $v_e$, $m_0$, $k_0$, $s_0$, $s_1$, $u_0$, $x_1$, $w_1$, $w_2$, $y_1$, $y_2$, etc.) in the specification and the flow charts are different depending on the kinds and types of rechargeable batteries and cannot be uniformly decided. These are decided from actually measured values of a normal rechargeable battery whose kind and type are the same as those of a rechargeable battery to be inspected.

[Detection of internal state of a rechargeable battery when the discharging is changed from the steady discharging]

In the case where the discharging current of the rechargeable battery in a substantially steady discharging state is changed n time(s) (where n is a positive integer, n=1, 2, 3, 4, . . . ), in this embodiment, by measuring the transient characteristics of the battery voltage when the discharging current is changed, the internal state of the rechargeable battery is detected. The graph shown in FIG. 28(1) and that shown in FIG. 28(2) show respectively a change with the passage of time in the battery voltage and a change with the passage of time in the discharging current in the case where the discharging current was changed four times at the time of the steady charging. It is possible to intentionally occur a change in the discharging. The discharging current to change the discharging in this case is preferred to comprise a pulse current in a rectangular wave form. Separately, when the change of the discharging does not influence to an instrument in which the rechargeable battery is used, the change of the discharging may be occurred by making the discharging to be a pulse-like state such that the discharging current intermittently becomes to be 0.

Now, in the case where the discharging current in a steady state is $I_{n0}$ and the battery voltage at that time is $Vd_0$, when the discharging current $I_{n0}$ is changed to $I_{n1}$, an electricity quantity $q_n$ of a current value $I_{n1} \times$ a time $t_{n1}$ is discharged, and the discharging is returned to the discharging at the steady discharging current $I_{n0}$, the battery voltage when the discharging is changed is measured at several points. And it is assumed that the transient characteristics of the battery voltage (V) when the discharging current is changed can be expressed by the equation $V = V_{n1} + (V_{n0} - V_{n1}) \times e^{-t/\tau}$ (with t being a discharging time, $V_{n1}$ being a battery voltage of the battery when the discharging time t is extrapolated to infinity, $\tau$ being a time constant decided by an internal resistance or the like of the battery, and n is a positive integer of 1, 2, 3, 4, . . . ).

In accordance with the measured battery voltages V to the time t since the time when the discharging current is changed and in accordance with said equation, the time constant $\tau$ is estimated and a true value of the $V_{n1}$ is estimated. Using the result obtained, the internal state of the rechargeable battery is detected.

Figure 28:
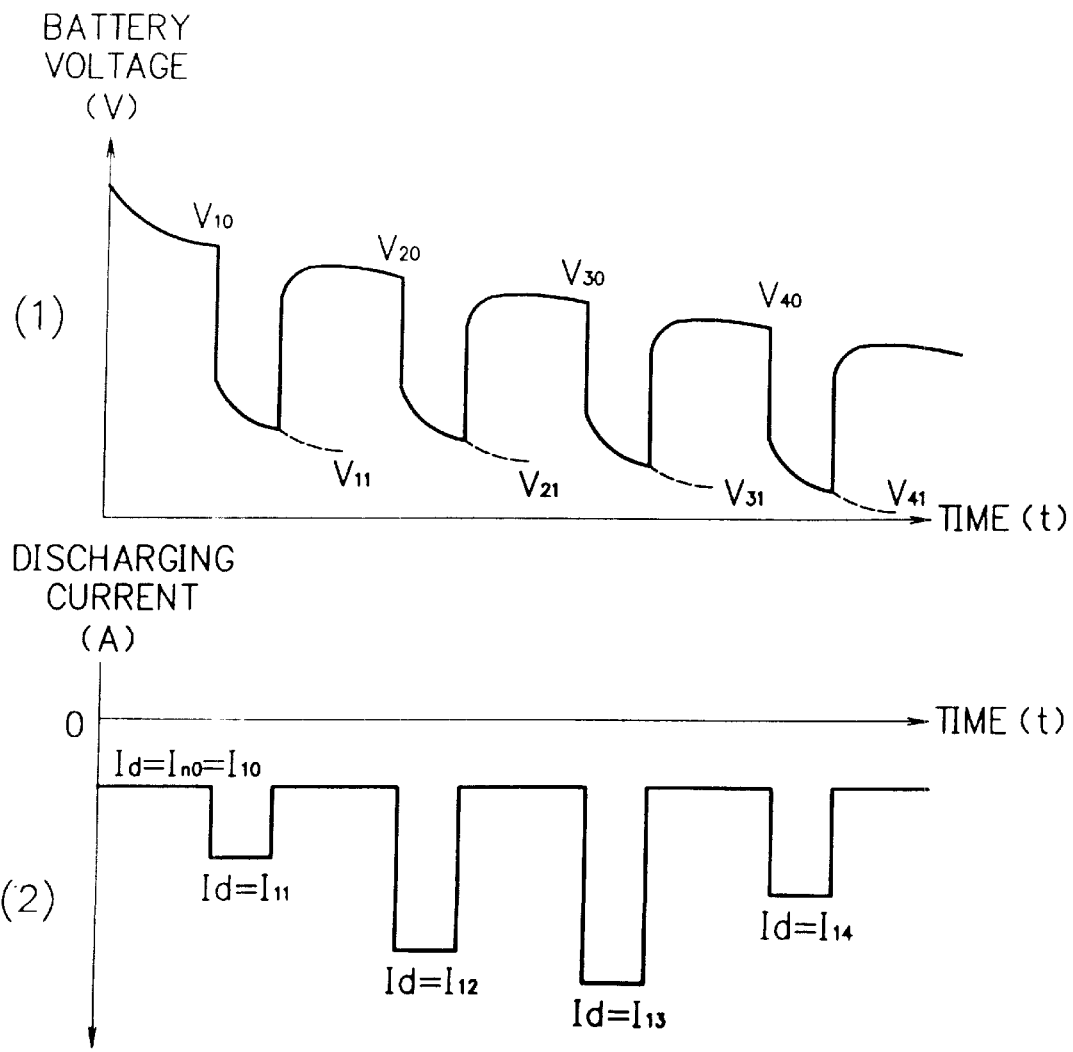
FIG. 28 shows a graph (1) [FIG. 28(1)], and a graph (2) [FIG. 28(2)], where said graph (1) is for a rechargeable battery which has been subjected to constant current pulse discharging from its shutdown state and it shows a curve for an example of a change with the passage of time in the battery voltage, and said graph (2) is also for said rechargeable battery and it shows a curve for an example of a change with the passage of time in the discharge rate.

$V_{11}$, $V_{21}$, $V_{31}$ and $V_{41}$ in FIG. 28 (1) are battery voltages when the discharging current is changed four times. Particularly, the graph shown in FIG. 28(1) shows the of the relationship of the changes in the battery voltage which are corresponding to the $V_{n1}$ (n=1, 2, 3, 4) in the case where it is assumed that the transient characteristics of the battery voltage when the discharging current is changed four times can be expressed by the equation $V=V_{n1}+(V_{n0}-V_{n1}) \times e^{-t/\tau}$.

[Computation of the Internal Resistance]

For the rechargeable battery judged that the internal resistance is increased in the above judgment 2 (from the discharging in the steady state), description will be made of a method of computing the internal resistance and the remaining capacity (the presently stored electricity quantity) in the case where the internal resistance of the rechargeable battery is assumed, for instance, such that it is decreased from Ra(Q, Id, T) to a×Rd(Q, Id, T)+b (where each of a and b is a constant).

When the discharging current is changed at least three times from the steady discharging state, specifically, for instance, when the battery voltage in the steady discharging at a discharging current $I_{10}$ is $V_{10}$, it is supposed that the discharging current is changed to $I_{11}$ and an electricity quantity $q_1$ of a current value $I_{11} \times$a time $t_{11}$ from the battery voltage $V_{10}$ is discharged where the battery voltage is changed to $V_{20}$ from $V_{10}$; then, the discharging current $I_{20}$ of the steady discharging is changed to $I_{21}$ and an electricity quantity $q_2$ of a current value $I_{21} \times$a time $t_{21}$ is discharged from the battery voltage $V_{20}$ where the battery voltage is changed to $V_{30}$ from $V_{20}$; and the discharging current $I_{21}$ of the steady discharging is changed to $I_{31}$ and an electricity quantity $q_3$ of a current value $I_{31} \times$a time $t_{31}$ is discharged from the battery voltage $V_{30}$ where the battery voltage is changed to $V_{40}$ from $V_{30}$. In this case, when the discharging current $I_{n0}$ of the steady discharging is changed to $I_{n1}$ and an electricity quantity $q_n$ of a current value $I_{n1} \times$a time$_{n1}$ is discharged, it is assumed that the transient characteristics of the battery voltage in every case where the discharging current is changed can be expressed by the equation $V=V_{n1}+(V_{n0}-V_{n1}) \times e^{-t/\tau}$ (with t being a discharging time, $V_{n1}$ being a battery voltage of the battery when the discharging time t is extrapolated to infinity, $\tau$ being a time constant decided by an internal resistance or the like of the battery, and n is a positive integer of 1, 2, 3, 4, . . . ).

In accordance with the measured battery voltages V to the time t since the time when the discharging current is changed and in accordance with said equation, the time constant $\tau$ when the discharging current $I_{n0}$ is changed to $I_{n1}$ is estimated and a true value of the $V_{n1}$ is estimated.

Next, in the case where the open-circuit voltage of the rechargeable battery having the remaining capacity (the presently stored electricity quantity) when discharging current is $I_{n0}$ and the battery voltage is $V_{n0}$ and when the internal resistance Rd' is expressed to be Rd'(Q, I, T) is made to be $Voc_{n0}$, the relationship in this case can be expressed as follows.

$$Voc_{n0}=V_{n0}+I_{n0} \times Rd'(Q_{n0}, I_{n0}, T)=v_{n1}+I_{n1} \times Rd'(Q_{n0}, I_{n1}, T)$$

[where n=1, 2, 3, . . . ].

And when the remaining capacities when battery voltages are $V_{10}$, $V_{20}$, and $V_{30}$ are made to be $Q_{10}$, $Q_{20}$, and $Q_{30}$, the following relationship is established.

$$Q_{20}=Q_{10}-q_1$$

$$Q_{30}=Q_{20}-q_2=Q_{10}-q_1-q_2$$

In addition, the following relationship is established.

$$V_{10}-V_{11}=I_{11} \times Rd'(Q_{10}, I_{11}, T)-I_{10} \times Rd'(Q_{10}, I_{10}, T)$$

$$V_{20}-V_{21}=I_{21} \times Rd'(Q_{20}, I_{21}, T)-I_{20} \times Rd'(Q_{20}, I_{20}, T)$$

$$V_{30}-V_{31}=I_{31} \times Rd'(Q_{30}, I_{31}, T)-I_{30} \times Rd'(Q_{30}, I_{30}, T)$$

$$Rd'(Q_{10}, I_{10}, T)=a \times Rd(Q_{10}, I_{10}, T)+b$$

$$Rd'(Q_{10}, I_{11}, T)=a \times Rd(Q_{10}, I_{11}, T)+b$$

$$Rd'(Q_{20}, I_{20}, T)=a \times Rd(Q_{20}, I_{20}, T)+b$$

$$Rd'(Q_{20}, I_{21}, T)=a \times Rd(Q_{20}, I_{21}, T)+b$$

$$Rd'(Q_{30}, I_{30}, T)=a \times Rd(Q_{30}, I_{30}, T)+b$$

$$Rd'(Q_{30}, I_{31}, T)=a \times Rd(Q_{30}, I_{31}, T)+b$$

(where each of a and b is a constant)

By solving these equations, the remaining capacity $Q_{10}$, the constant a, and the constant b can be obtained. In addition, the present remaining capacity $Q_{30}$ and the internal resistance Rd'(Q, I, T) of the rechargeable battery which is deteriorated to increase the internal resistance can be obtained.

Figure 15:
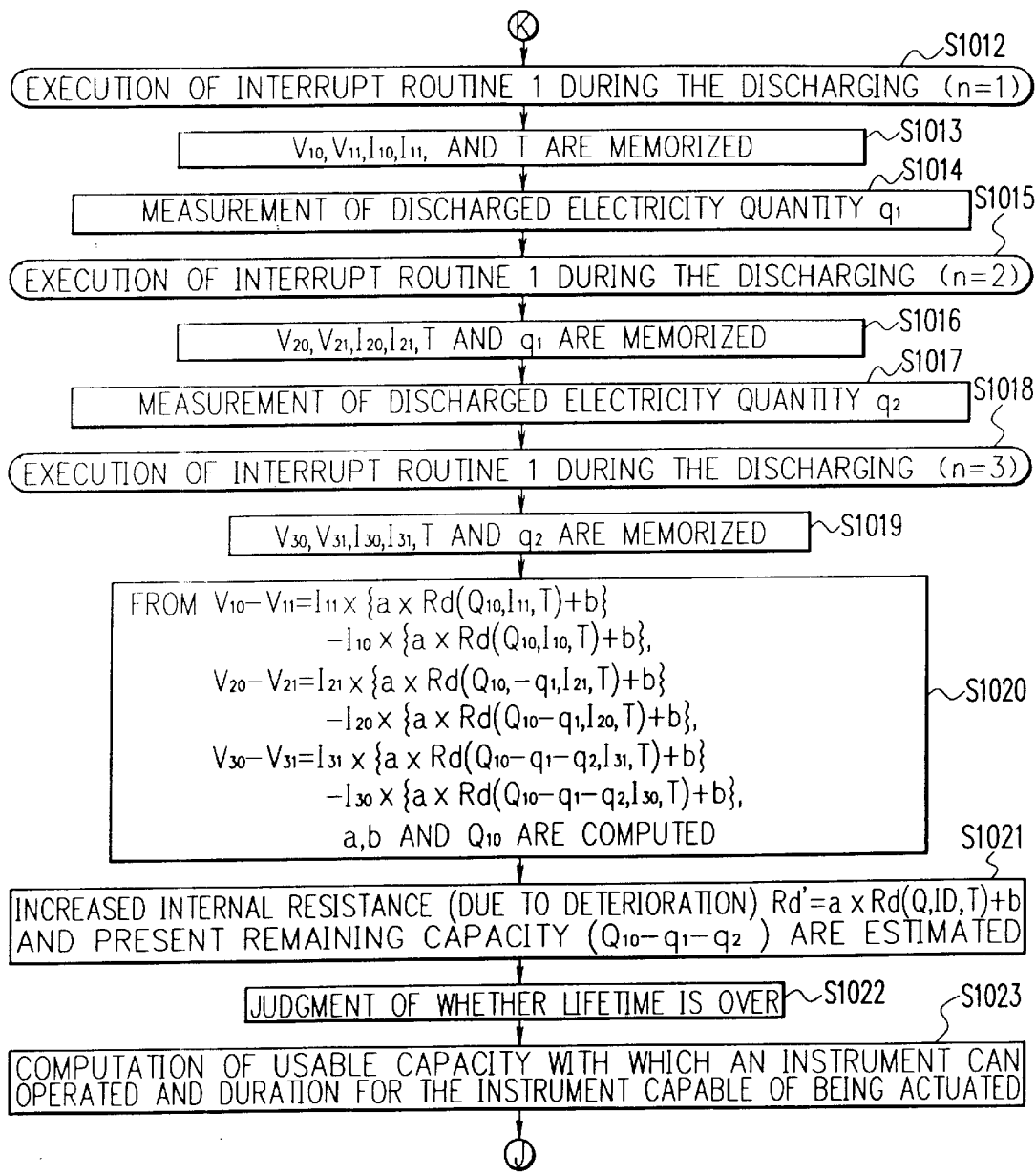
FIG. 15 shows an example of a flow chart of steps for computing the internal resistance of the rechargeable battery in FIG. 14, where judgment is conducted of whether the internal resistance is increased.
Figure 17:
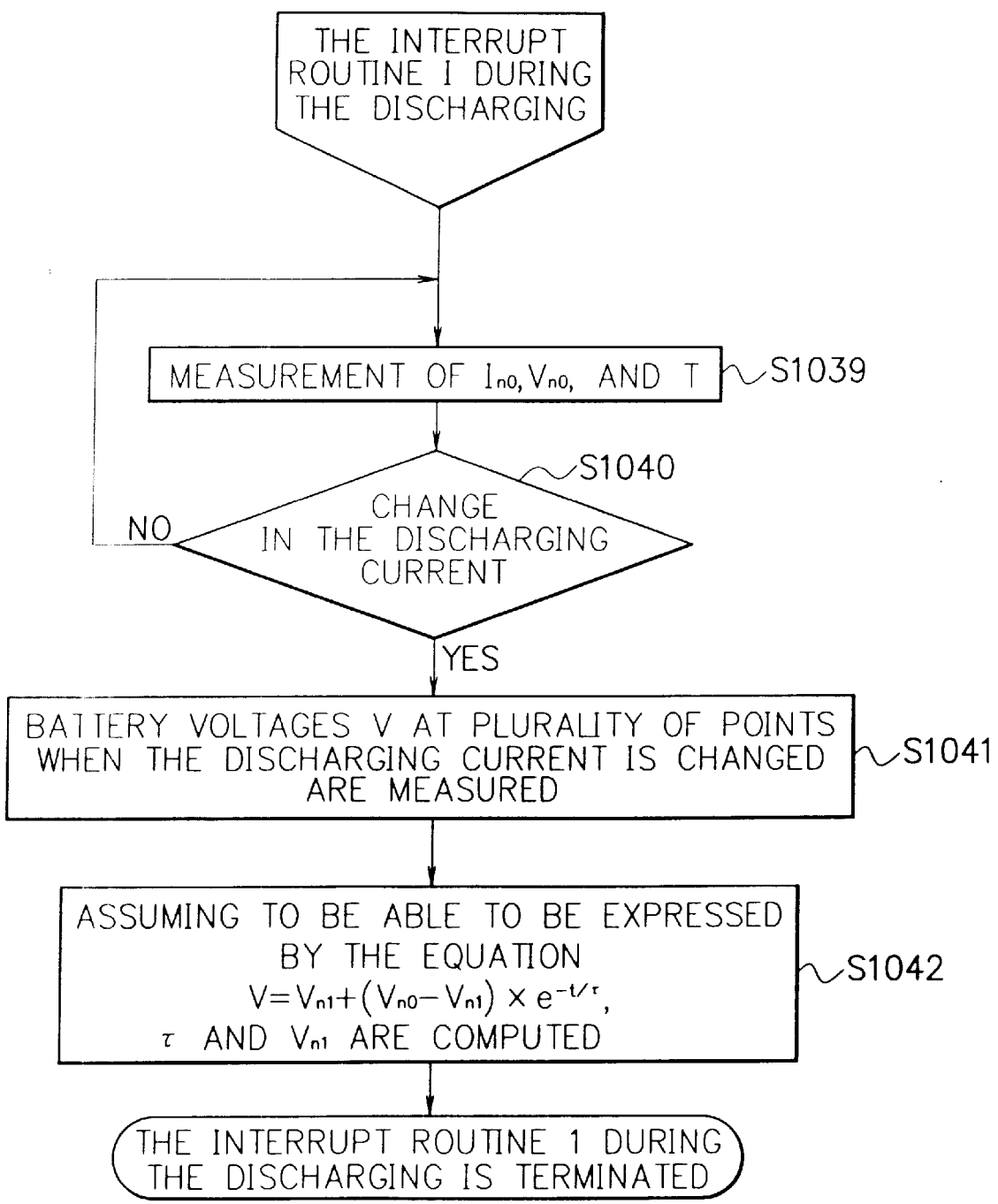
FIG. 17 shows a flow chart illustrating details of the interrupt routine during the charging in FIG. 15 and FIG. 16.

The flow chart shown in FIG. 15 and that shown in FIG. 17 which is annexed to FIG. 15 show an example of the procedures wherein after judging that the internal resistance is increased in FIG. 14, the internal resistance and the present remaining capacity are computed as above described.

In the above computation of the internal resistance, in order to estimate the battery voltage when the discharging current is changed, the equation in which the time constant $\tau$ is used is used. This is not limitative. It is possible to use other appropriate equation capable of approximating.

[Computation of a Decrease Coefficient When the Electricity Storable Capacity is Decreased and the Internal Resistance]

For the rechargeable battery judged that the electricity storable capacity is decreased in the above judgment 3 (from the discharging in the steady state), description will be made of a method of computing a decrease coefficient of the decreased electricity storable capacity and the internal resistance by assuming that electricity storable capacity of the rechargeable battery is decreased from C to C'=D×C (where D is a constant of 0<D<1) and the internal resistance of the rechargeable battery is increased from Ra(Q, Id, T) to Rd'(Q, Id, T)=a×Rd(Q, Id, T)+b (where each of a and b is a constant). Here, because of the above assumption of the decrease in the electricity storable capacity, the remaining capacity Q of the corresponding normal rechargeable battery which is computed from the previously acquired relationship of the discharging current and the battery voltage of the normal rechargeable battery comes to a result that it is decreased to Q'=D×Q in practice.

Now, when the discharging current is changed at least four times from the steady discharging state, specifically, for instance, when the battery voltage in the steady discharging at a discharging current $I_{10}$ is $V_{10}$, it is supposed that the discharging current is changed to $I_{11}$ and an electricity quantity $q_1$ of a current value $I_{11}\times$a time $t_{11}$ from the battery voltage $V_{10}$ is discharged where the battery voltage is changed to $V_{20}$ from $V_{10}$; then, the discharging current $I_{20}$ of the steady discharging is changed to $I_{21}$ and an electricity quantity $q_2$ of a current value $I_{21}\times$a time $t_{21}$ is discharged from the battery voltage $V_{20}$ where the battery voltage is changed to $V_{30}$ from $V_{20}$; successively, the discharging current $I_{30}$ of the steady discharging is changed to $I_{31}$ and an electricity quantity $q_3$ of a current value $I_{31}\times$a time $t_{31}$ is discharged from the battery voltage $V_{30}$ where the battery voltage is changed to $V_{40}$ from $V_{30}$; further, the discharging current $I_{40}$ of the steady discharging is changed to $I_{41}$ and an electricity quantity $q_4$ of a current value $I_{41}\times$a time $t_{41}$ is discharged from the battery voltage $V_{40}$ where the battery voltage is changed to $V_{50}$ from $V_{40}$.

In this case, when the discharging current $I_{n0}$ of the steady discharging is changed to $I_{n1}$ and an electricity quantity $q_n$ of a current value $I_{n1}\times$a time $n_1$ is discharged, it is assumed that the transient characteristics of the battery voltage in every case where the discharging current is changed can be expressed by the equation $V=V_{n1}+(V_{n0}-V_{n1})\times e^{-t/\tau}$ (with t being a discharging time, $V_{n1}$ being a battery voltage of the battery when the discharging time t is extrapolated to infinity, $\tau$ being a time constant decided by an internal resistance or the like of the battery, and n is a positive integer of 1, 2, 3, 4, . . . ).

In accordance with the measured battery voltages V to the time t since the time when the discharging current is changed and in accordance with said equation, the time constant $\tau$ when the discharging current $I_{n0}$ is changed to $I_{n1}$ is estimated and a true value of the $V_{n1}$ is estimated.

Next, in the case where the open-circuit voltage of the rechargeable battery having the remaining capacity (the presently stored electricity quantity) when discharging current is $I_{n0}$ and the battery voltage is $V_{n0}$ and when the internal resistance is expressed to be Rd'(Q, I, T) is made to be $Voc_{n0}$, the relationship in this case can be expressed as follows.

$$Voc_{n0}=V_{n0}+I_{n0}\times Rd'(Q_{n0}, I_{n0}, T)=V_{n1}+I_{n1}\times Rd'(Q_{n0}, I_{n1}, T)$$

[where n=1, 2, 3, . . . ].

And when the remaining capacities when battery voltages are $V_{10}$, $V_{20}$, $V_{30}$, and $V_{40}$ are made to be $Q_{10}$, $Q_{20}$, $Q_{30}$ and $Q_{40}$, the following relationship is established.
When $$Q=Q'/D,$$

$$Q_{20}'=Q_{10}'-q_1$$

$$Q_{30}'=Q_{20}'-q_2=Q_{10}'-q_1-q_2$$

$$Q_{40}'=Q_{30}'-q_3=Q_{10}'-q_1-q_2-q_3$$

That is, when $$Q_{10}=Q_{10}'/D,\ Q_{20}=(Q_{10}'-q_1)/D,\ Q_{30}=(Q_{10}'-q_1-q_2)/D,$$

and $$Q_{40}=(Q_{10}'-q_1-q_2-q_3)/D,$$

$$V_{10}-V_{11}=I_{11}\times Rd'(Q_{10}, I_{11}, T)-I_{10}\times Rd'(Q_{10}, I_{10}, T)$$

$$V_{20}-V_{21}=I_{21}\times Rd'(Q_{20}, I_{21}, T)-I_{20}\times Rd'(Q_{20}, I_{20}, T)$$

$$V_{30}-V_{31}=I_{31}\times Rd'(Q_{30}, I_{31}, T)-I_{30}\times Rd'(Q_{30}, I_{30}, T)$$

$$V_{40}-V_{41}=I_{41}\times Rd'(Q_{40}, I_{41}, T)-I_{40}\times Rd'(Q_{40}, I_{40}, T)$$

$$Rd'(Q_{10}, I_{10}, T)=a\times Rd(Q_{10}, I_{10}, T)+b$$

$$Rd'(Q_{10}, I_{11}, T)=a\times Rd(Q_{10}, I_{11}, T)+b$$

$$Rd'(Q_{20}, I_{20}, T)=a\times Rd(Q_{20}, I_{20}, T)+b$$

$$Rd'(Q_{20}, I_{21}, T)=a\times Rd(Q_{20}, I_{21}, T)+b$$

$$Rd'(Q_{30}, I_{30}, T)=a\times Rd(Q_{30}, I_{30}, T)+b$$

$$Rd'(Q_{30}, I_{31}, T)=a\times Rd(Q_{30}, I_{31}, T)+b$$

$$Rd'(Q_{40}, I_{40}, T)=a\times Rd(Q_{40}, I_{40}, T)+b$$

$$Rd'(Q_{40}, I_{41}, T)=a\times Rd(Q_{40}, I_{41}, T)+b$$

(where each of a and b is a constant)

By solving these equations, the constant a, the constant b, the D, and the $Q_{10}=Q_{10}'/D$ can be obtained. In addition, the electricity storable capacity which is deteriorated to be D time and the increased internal resistance can be obtained.

For the discharging current changed from the steady discharging, by intentionally flowing it so that the discharging current $I_{n1}$ is greater than the steady discharging current $I_{n0}$ and it is $I_{n1}=I_{n0}+\Delta Id$, the internal state of the rechargeable battery can be more accurately detected. The discharging current $I_{n1}$ here is preferred to be less than the current value of the 0.5 hour rate (2C) discharging.

Figure 16:
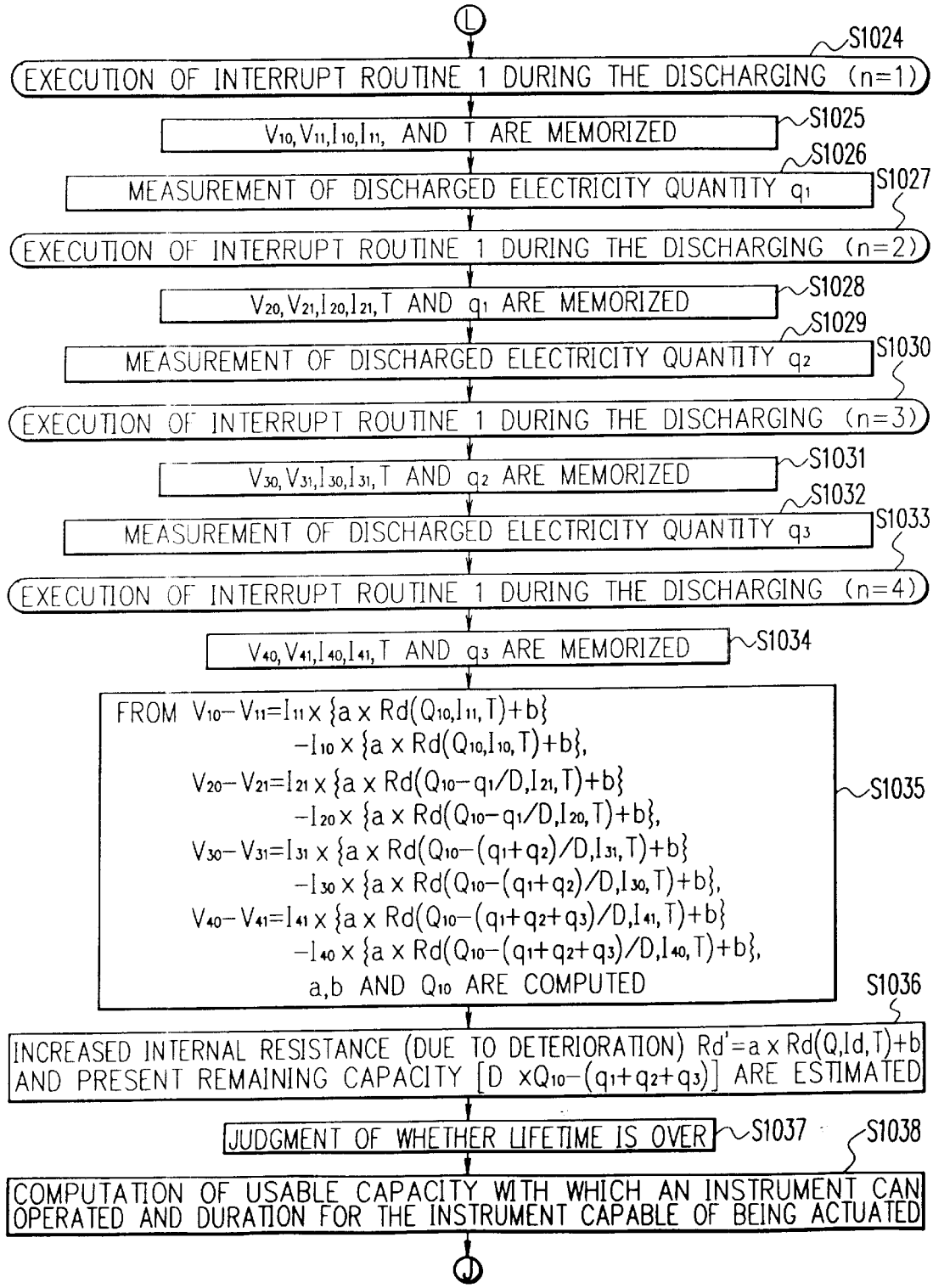
FIG. 16 shows an example of a flow chart of steps for computing the internal resistance and the electricity storable capacity of the rechargeable battery in FIG. 14, where judgment is conducted of whether the electricity storable capacity is decreased.

The flow chart shown in FIG. 16 and that shown in FIG. 17 which is annexed to FIG. 16 show an example of the procedures wherein after judging that the electricity storable capacity is decreased in FIG. 14, the internal resistance and the present remaining capacity are computed as above described.

Computation of the Remaining Capacity of the Rechargeable Battery Which is Judged to be Normal The remaining capacity (the presently stored electricity quantity) of the rechargeable battery which is judged to be normal in the paused state, the charging state, or the discharging state can be computed as will be described below.

1. In the Case Where the Rechargeable Battery is in the Pausing State

With reference to the measured open-circuit voltage $Voc_0$ of the rechargeable battery (to be inspected) in the paused state and with reference to the previously acquired relationship Voc(Q) of the open-circuit voltage (Voc) to the remaining capacity (Q) for the corresponding normal rechargeable battery, there is established the function formula $Voc(Q_0)=Voc_0$ or $Q_0=Q(Voc_0)$.

In accordance with this function formula, the remaining capacity $Q_0$ of the rechargeable battery to be inspected can be estimated.

2. In the Case Where the Rechargeable Battery is in the Charging State (i) For the rechargeable battery to be inspected, the charging current, the battery temperature and the battery voltage are measured. And with reference to the previously acquired relational expression Vc(Q, Ic, T) or Q(Vc, Ic, T) of the battery voltage (Vc) to the remaining capacity (Q), the charging current (Ic) and the battery temperature (T) for the corresponding normal rechargeable battery, the remaining capacity Q of the rechargeable battery to be inspected can be estimated.

(ii) From the temporal suspension of the charging, the open-circuit voltage Voc of the rechargeable battery is measured as the time constant $\tau$ in accordance with the foregoing equation showing the transient characteristics of the battery voltage. And the remaining capacity of the rechargeable battery at this time is measured.

(iii) From the measured value of a charging termination battery voltage $Vc_E$ at a discharging current Ic for the rechargeable battery to be inspected and from the previously relational expression of the battery voltage (Vc) to the remaining capacity (Q), the charging current (Ic) and the battery temperature (T) for the corresponding normal rechargeable battery, when the remaining capacity of the rechargeable battery to be inspected when the charging operation is terminated is made to be $Q_E$, there is established the function formula $Vc_E = Vc(Q_E, Ic, T)$ or $Q(Vc_E, Ic, T)$. Or from the previously acquired relational expression Voc(Q) of the open-circuit voltage (Voc) to the remaining capacity (Q) for the corresponding normal rechargeable battery, there is established the function formula $Voc(Q_E) = Voc_E$ or $Q_E = Q(Voc_E)$. Using these function formulas, the remaining capacity $Q_E$ of the rechargeable battery to be inspected can be estimated.

The remaining capacity of the rechargeable battery to be inspected can be estimated by using any of the above-described methods (i) to (iii).

3. In the Case Where the Rechargeable Battery is in the Discharging State (i) The remaining capacity of the rechargeable battery (to be inspected) which is engaged in the discharging operation is estimated with reference to the previously acquired relational expression Vd(Q, Id, T) or Q(Vd, Id, T) of the battery voltage (Vd) in relation to the remaining capacity (Q), the discharging current (Id) and the battery temperature (T) for the corresponding normal rechargeable battery.

(ii) The remaining capacity of the rechargeable battery (to be inspected) which is engaged in the discharging operation is estimated with reference to the previously acquired relational expression Q(Rd, Id, T) of the internal resistance (Rd) in relation to the remaining capacity (Q), the discharging current (Id) and the battery temperature (T) for the corresponding normal rechargeable battery.

The remaining capacity of the rechargeable battery to be inspected can be estimated by using any of the above-described methods (i) and (ii).

Computation of the Remaining Capacity of the Rechargeable Battery Whose Internal Resistance is Increased When the Rechargeable Battery is Engaged in the Charging Operation or When the Charging Operation is Terminated When the rechargeable battery is judged to be free of short-circuit and of decrease in the electricity storable capacity but that the internal resistance is increased during the operation where the battery is engaged in the charging operation from the paused state and the battery is paused, the increased internal resistance Rc'(Q, Ic, T) upon the charging operation is estimated. And in accordance with the function formula Vc=Voc(Q)+Ic×Rc'(Q, Ic, T) of the relationship between the open-circuit voltage (Voc), the battery voltage (Vc), the charging current (Ic) and the internal resistance (Rc') upon the charging operation, the remaining capacity of the rechargeable battery to be inspected when the battery is engaged in the charging operation or the charging operation is terminated can be computed.

Computation of the Remaining Capacity of the Rechargeable Battery Whose Internal Resistance is Increased When the Battery is Engaged in the Discharging Operation For the rechargeable battery judged to be free of short-circuit and of decrease in the electricity storable capacity but that the internal resistance is increased during the operation where the battery is engaged in the discharging operation from the paused state and the battery is paused or from the computation of a change in the discharging during the steady discharging, the increased internal resistance Rd' (Q, Id, T) upon the discharging is estimated. From the function formula Vd=Voc(Q)−Id×Rd'(Q, Id, T) of the relationship between the open-circuit voltage (Voc), the battery voltage (Vd), the discharging current (Id), and the internal resistance [Rd'(Q, Id, T)] upon the discharging operation, the battery voltage upon the discharging operation can be expressed as a function formula Vd=Vd'(Q, Id, T) of the battery voltage (Vd) to the remaining capacity (Q), the discharging current (Id), and the battery temperature (T).

Based on this, by measuring the battery voltage (Vd), the discharging current (Id) and the battery temperature (T), the remaining capacity (Q) of the rechargeable battery (to be inspected) upon the discharging operation can be computed.

Computation of the Remaining Capacity of the Rechargeable Battery Whose Electricity Storable Capacity is Decreased When the Battery is Engaged in the Charging Operation or When the Charging Operation is Terminated For the rechargeable battery judged that the electricity storable capacity is decreased in the operation where the battery is engaged in the charging operation from the paused state and the battery is paused, a decrease coefficient D of the decreased electricity storable capacity (0<D<1) is estimated. And the remaining capacity (the presently stored electricity quantity) of the rechargeable battery is computed as will be described below.

1. In the Case Where the Internal Resistance of the Rechargeable Battery is not Increased A value obtained by multiplying an estimated remaining capacity of the rechargeable battery (which is considered as being normal) by D time is made to be a practical remaining capacity. And the electricity storable capacity of the rechargeable battery when the charging operation is terminated (upon the full-charging) is made to be D time the nominal capacity of the corresponding normal rechargeable battery.

2. In the Case Where the Internal Resistance of the Rechargeable Battery is Increased The increased internal resistance Rc'(Q, Ic, T) of the rechargeable battery is estimated. And in accordance with the relational formula Vc=Voc(Q)+Ic×Rc'(Q, Ic, T) of the relationship between the open-circuit voltage (Voc), the battery voltage (Vc), the charging current (Ic) and the internal resistance (Rc') upon the charging operation, the remaining capacity Q of the rechargeable battery is computed. The Q obtained is multiplied by D time to obtain a value of Q'=D×Q. This value is made to be a practical remaining capacity of the rechargeable battery.

Separately, a value obtained by multiplying the electricity storable capacity C (the nominal capacity) of the corresponding normal rechargeable battery can be considered as the electricity storable capacity C' of the rechargeable battery (to be inspected) when the charging operation is terminated (upon the full-charging).

Besides, when the nominal capacity of a rechargeable battery or the electricity storable capacity thereof at an initial stage when the battery is started using is made to be C, the battery performance relative to the electricity storable capacity of the rechargeable battery after the battery is deteriorated can be computed as C'/C or 100×C'/C [%]. And when the battery performance relative to the electricity storable capacity of the rechargeable battery after the battery is deteriorated becomes to be, for instance, less than 60%, it is possible to judge that the rechargeable battery is over the lifetime.

Computation of the Remaining Capacity of the Rechargeable Battery Whose Electricity Storable Capacity is Decreased When the Battery is Engaged in the Discharging Operation For the rechargeable battery judged that the electricity storable capacity is decreased during the operation where the battery is engaged in the discharging operation from the paused state and the battery is paused or from the computation of a change in the discharging during the steady discharging, a decrease coefficient D of the decreased electricity storable capacity (0<D<1) is estimated. And the remaining capacity (the presently stored electricity quantity) of the rechargeable battery is obtained as will be described below.

1. In the Case Where the Internal Resistance of the Rechargeable Battery is Not Increased A value obtained by multiplying an estimated remaining capacity of the rechargeable battery (which is considered as being normal) by D time is made to be a practical remaining capacity. And the electricity storable capacity of the rechargeable battery is made to be D time the nominal capacity of the corresponding normal rechargeable battery.

2. In the Case Where the Internal Resistance of the Rechargeable Battery is Increased A decrease coefficient D of the decreased electricity storable capacity of the rechargeable battery is estimated. The increased internal resistance of the rechargeable battery upon the discharging operation is obtained in terms of the function formula $Rd'(Q, Id, T)$.

And in accordance with the relational formula $Vd=Voc(Q)-Id\times Rd'(Q, Id, T)$ of the relationship between the open-circuit voltage (Voc), the battery voltage (Vd), the discharging current (Id) and the internal resistance (Rd') upon the discharging operation, the battery voltage of the rechargeable battery (Vd) upon the discharging operation can be expressed as a function formula $Vd=Vd'(Q, Id, T)$ of the relationship between an apparent remaining capacity (Q), the discharging current (Id) and the battery temperature (T). From the measured result of the battery voltage (Vd), that of the discharging current (Id) and that of the battery temperature (T), the apparent remaining capacity (Q) can be computed. The Q computed is multiplied by D time to obtain a value of $Q'=D\times Q$. This value is made to be a practical remaining capacity of the rechargeable battery.

Computation of the Period of Time Until the Charging Operation is Terminated

By estimating the remaining capacity (Q) of the rechargeable battery during the charging operation by the previously described method, the period of time until reaching the remaining capacity when the charging operation is terminated can be computed.

Computation of the Usable Capacity (the Presently Residual Electricity Quantity) With Which an Instrument Can be Used For a rechargeable battery which is used in an instrument as the power source, after the remaining capacity Q of the rechargeable battery when the battery is engaged in the discharging operation is estimated by the previously described method, by computing the remaining capacity $Q_{min}$ of the rechargeable battery when the voltage of the battery becomes to be the minimum voltage $V_{min}$ capable of actuating the instrument, the usable capacity $(Q-Q_{min})$[the presently residual electricity quantity] with which the instrument can be used can be estimated.

Computation of Actuation Duration of the Instrument

The usable capacity $(Q-Q_{min})$ of the rechargeable battery with which the instrument can be used is computed as above described. When an average consumptive current consumed by the instrument is made to be i, and an average consumptive power consumed by the instrument is made to be p, an actuation duration h of the instrument can be computed in accordance with the equation $h=(Q-Q_{min})/i$ or $h=(Vd+V_{min})\times(Q-Q_{min})/2p$.

The value of the average consumptive current or the value of the average consumptive power is preferred to be computed depending on an instrument operation pattern and a use frequency of a user of the instrument.

Rechargeable Batteries for Which the Detecting Method for Detecting Internal State of a Rechargeable Battery According to the Present Invention Can be Applied The detecting method of the present invention can be adopted for any rechargeable batteries. As specific examples of such rechargeable battery, there can be mentioned, for example, rechargeable lithium (ion) batteries, rechargeable nickel-metal hydride batteries, rechargeable nickel-cadmium batteries, rechargeable nickel-zinc batteries, and rechargeable lead acid batteries. Besides, the detecting method of the present invention can be adopted for primary batteries. In this case, for a given primary battery to be inspected, when a primary battery product which is corresponding to said given primary battery is provided, and for the primary battery product, measured data of the relationship between the dischargeable capacity and the open-circuit voltage and the relationship between the discharging current, the battery voltage, the battery temperature and the dischargeable capacity are acquired in advance, it is possible to compute the remaining capacity of the primary battery (to be inspected) upon the discharging operation or the pausing time. Besides, for an instrument in which the primary battery is used as the power source, it is possible to compute an approximate usable capacity of the primary battery with which the instrument can be used.

Detecting Device for Detecting Internal State of a Rechargeable Battery

The present invention provides a detecting device for detecting internal state of a rechargeable battery. The detecting device of the present invention comprises at least (i) a voltage-detecting means for detecting a voltage between a pair of terminals of an inspective rechargeable battery, (ii) a current-detecting means for detecting a current (a charging current or a discharging current) flown in said inspective rechargeable battery, (iii) a temperature-detecting means for detecting a temperature of said inspective rechargeable battery, and (iv) a memorizing means for memorizing previously acquired basic data of a normal rechargeable battery which is the same kind and the same type of said inspective rechargeable battery or a function formula obtained by digitizing said basic data, wherein from said basic data or said function formula memorized in said memorizing means (iv) and information obtained from said voltage-detecting means (i), said current-detecting means (ii) and said temperature-detecting means (iii), an internal state of said inspective rechargeable battery is detected.

The detecting device of the present invention is preferred to have an operational means (v) for processing said basic data and said information obtained from said voltage-detecting means (i), said current-detecting means (ii) and said temperature-detecting means (iii). The operational means (v) is preferred to have one or more means selected from the group consisting of (1) a computation means for computing a remaining capacity (a presently stored electricity quantity) of said inspective rechargeable battery, (2) a computation means for computing an internal resistance of said inspective rechargeable battery, (3) a computation means for computing a usable capacity (a presently residual electricity quantity) of said inspective rechargeable battery with which an instrument can be used, (4) a computation means for computing an average consumptive current or an average consumptive power which is consumed by said instrument, (5) a computation means for computing a time required until charging operation for said inspective rechargeable battery is terminated, and (6) a computation means for computing a remaining capacity of said inspective rechargeable battery after said charging operation is terminated.

Further, the detecting device of the present invention is preferred to have a judging means for judging of whether said inspective rechargeable battery is normal or deteriorated and judging a deterioration mode when said inspective rechargeable battery is deteriorated.

Further in addition, the detecting device of the present invention is preferred to have an output means for outputting said information obtained from said voltage-detecting means (i), said current-detecting means (ii) and said temperature-detecting means (iii) or/and information relating to the internal state of said inspective rechargeable battery or an indication means for indicating these information.

Examples of the Detecting Device of the Present Invention

Figure 29:
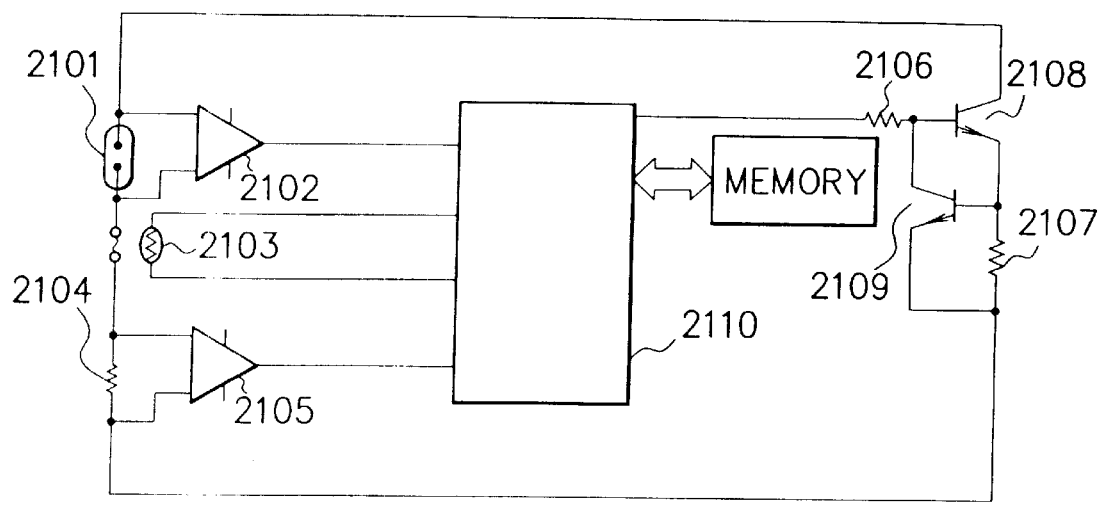
FIG. 29 is a schematic diagram illustrating an example of a detecting device for detecting internal state of a rechargeable battery in the present invention.

FIG. 29 is a schematic diagram illustrating an example of the detecting device of the present invention for detecting an internal state of an inspective rechargeable battery, having such circuit constitution as shown in FIG. 29. The internal state typically includes a deterioration state, an electricity storable capacity, a remaining capacity (a presently stored electricity quantity), and an internal resistance of the rechargeable battery as previously described.

The circuit constitution of the detecting device of the present invention basically comprises a pair of terminals 2101 for connecting the rechargeable battery to the apparatus body, a battery voltage-detecting portion 2102 for detecting a voltage between a pair of terminals (an inter-terminal voltage) of the rechargeable battery, a battery temperature-detecting portion 2103 for detecting a temperature of the rechargeable battery, a current sense resistor 2104 for detecting a charging or discharging current of the rechargeable battery, an amplifier 2105, a resistor 1 (2106), a resistor 2 (2107), a transistor 1 (2108), a transistor 2 (2109), and a control portion 2110. The resistor 1 (2106), the resistor 2 (2107), the transistor 1 (2108), and the transistor 2 (2109) together serve to add a charging or discharging pulse current to the rechargeable battery. The terminals 2101 serve to readily and surely electrically connect a rechargeable battery, a battery pack (having one or more rechargeable batteries packaged therein), or a rechargeable battery module respectively to be inspected in accordance with the detecting method of the present invention (these to be inspected will be hereinafter collectively referred to as "inspective rechargeable battery") with the apparatus body. The battery-voltage detecting portion 2102 with a high input impedance serves to detect an inter-terminal voltage between the anode and the cathode of the inspective rechargeable battery, where information of the detected voltage is outputted from the battery-voltage detecting portion 2102 into the control portion 2110. The battery temperature-detecting portion 2103 serves to detect a temperature of the inspective rechargeable battery by means of, for instance, a thermister or a thermocouple, where information of the detected battery temperature is outputted from the battery temperature-detecting portion 2103 into the control portion 2110. A charging or discharging current of the inspective rechargeable battery is detected and converted into a voltage signal by the current sense resistor 2104, the voltage signal from the current sense resistor 2104 is inputted into the amplifier 2105 where the voltage signal with current information is amplified, and the current information is inputted into the control portion 2110. A pulse current-adding portion comprising the resistor 1 (2106), the resistor 2 (2107), the transistor 1 (2108), and the transistor 2 (2109) serves to flow a current of a value which is corresponding to a voltage signal wave from the control portion to the system containing the current sense resistor 2104 and the inspective rechargeable battery which are electrically connected with the terminals 2101. The voltage signal wave comprises a rectangular wave, a stepwise wave or a wave comprising these waves.

The control portion 2110 has a memory in the inside or the outside thereof. Tables of previously acquired characteristics data of a normal rechargeable battery corresponding to the inspective rechargeable battery electrically connected with the terminals 2101 or function formulas $Voc(Q)$, $Vd(Q, Id, T)$, $Vc(Q, Ic, T)$, $Rd(Q, Id, T)$, and $Rc(Q, Ic, T)$ of approximation curves based on said data of the normal rechargeable battery are memorized in the memory of the control portion 2110, where Q is a remaining capacity (a presently stored electricity quantity) of the normal rechargeable battery, Voc is an open-circuit voltage of the normal rechargeable battery, T is a temperature of the normal rechargeable battery, Id is a discharging current for the normal rechargeable battery, Vd is a battery voltage of the normal rechargeable batter when the battery is subjected to discharging, Ic is a charging current for the normal rechargeable battery, Vc is a battery voltage of the normal rechargeable battery when the battery is subjected to charging, Rd is an internal resistance of the normal rechargeable battery when the battery is subjected to discharging, and Rc is an internal resistance of the normal rechargeable battery when the battery is subjected to charging.

According to the detecting device of the present invention which is provided with the temperature (T)-detecting means, the current(I)-detecting means, the voltage (V)-detecting means and the pulse current-adding means for the inspective rechargeable battery connected to the terminals (2101) as above described, by performing the execution operation of the previously described detection procedures, detection of the internal state of the inspective rechargeable battery can be conducted.

Separately, in the case where data of the voltage, the current and a change state of the current, a change frequency of the current, and the like for a normal rechargeable battery or a normal battery pack are memorized in the control portion of the detecting device, not only for the detecting device but also for an instrument in which a rechargeable battery or a battery pack is used, an operation pattern or use frequency by a user can be grasped. In this case, from the usable capacity (the presently residual electricity quantity) of the inspective rechargeable battery which is computed by the method of the present invention, with reference to the grasped operation pattern or use frequency by the user, by digitizing an average consumptive current or power necessary in order to compute the actuation time of the instrument in which the rechargeable battery is used into a vale which conforms the realities, the usable capacity of the rechargeable battery can be more accurately detected.

Besides, in the detecting device of the present invention, it is possible to provide an indication function means for indicating information of a computed electricity storable capacity, a computed usable capacity of the rechargeable battery and a computed deterioration rate of the electricity storable capacity, an indication function means for indicating information of a judged result of the rest of lifetime of the rechargeable battery, and an indication function means for indicating information of a consumed power and the like. In this case, it is possible to inform a user of an accurate present state of the rechargeable battery. As such indication function means, there can be mentioned liquid crystal displays, sounders, alarms such as warning buzzers and lamps, or the like The above-described detecting device shown in FIG. 29 according to the present invention can be independently actuated by connecting to a given inspective rechargeable battery. In the detecting device shown in FIG. 29, a power source necessary to actuate the apparatus is not shown. The power in order to actuate the apparatus may be supplied from the outside. Alternatively, the power in order to actuate the apparatus can supplied from an inspective rechargeable battery connected to the apparatus through a regulator.

Figure 30:
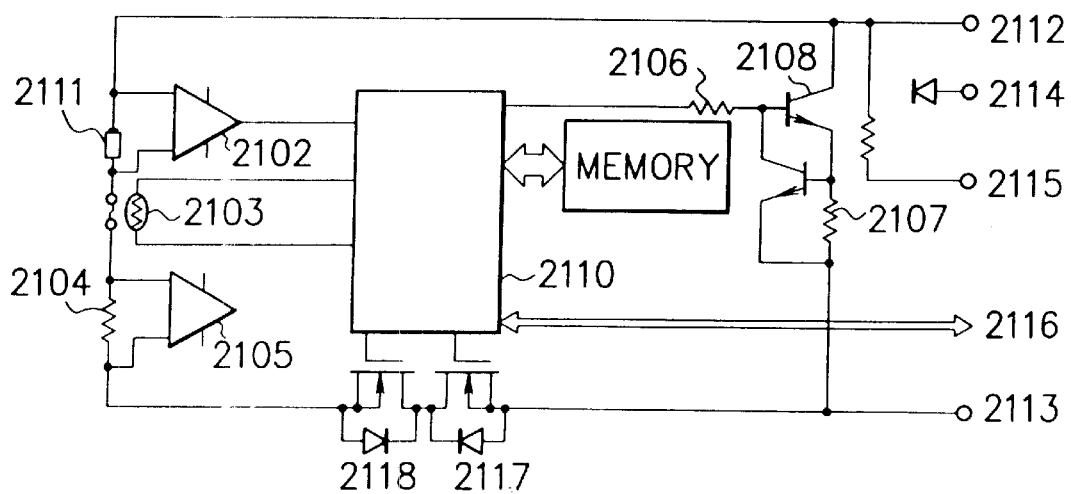
FIG. 30 is a schematic diagram illustrating an embodiment in which a combination of the detecting device shown in FIG. 29 and a rechargeable battery is installed in a battery pack (module).

FIG. 30 is a schematic diagram illustrating another example of the detecting device of the present invention wherein the detecting device shown in FIG. 29 is combined with a rechargeable battery (2111) and accommodated in a battery module (or a battery pack), having such circuit constitution as shown in FIG. 30.

The circuit constitution of the detecting device shown in FIG. 30 is a partial modification of the circuit constitution shown in FIG. 29. Therefore, here, description will be made of the constitution not shown in FIG. 29.

The circuit constitution shown in FIG. 30 has a positive terminal 2112 of the battery module (or the battery pack), a negative terminal 2113 of the battery module (the negative terminal 2113 is capable of serving also as a charging negative terminal), a charging positive terminal 2114, a battery voltage monitor output terminal 2115, and a communication mechanism 2116 to an instrument to be connected.

By having such communication mechanism, the battery module having the detecting device of the present invention accommodated therein is able to notice information of internal state of the rechargeable battery 2111 or battery pack such as the remaining capacity, the lifetime, and the like to the instrument connected and to obtain information of the charging or occurrence of a change in the charging current from the side of the instrument.

Separately, if necessary, after the operation described in the case shown in FIG. 29, it is possible to make the control portion of the apparatus in this embodiment to perform control in order for the rechargeable battery (2111) to be prevented from being overcharged (2117) or overdischarged (2118).

Besides, it is possible that the detecting device of the present invention is accommodated in a rechargeable battery or in a charger of a battery pack. In this case, an inspective rechargeable battery or an inspective battery pack is set to the battery charger, where the remaining capacity of the rechargeable battery prior to commencing charging or during the charging operation can be distinguished. By this, it is possible that the residual time required until the full-charging is grasped and the grasped result is noticed to the outside as an indication or information. It is also possible that the deterioration state or the rest of lifetime of the rechargeable battery is noticed to the outside as an indication or information.

Further, the detecting device of the present invention can be accommodated in an instrument in which a rechargeable battery is used. In this case, for the instrument, by way of a slight modification, the internal state thereof represented by the usable capacity and the lifetime of a rechargeable battery or a battery pack connected to the instrument can be distinguished. It is also possible that the control portion of the main body of the instrument is made to have the function of the control portion of the detecting device of the present invention. In this case, it is possible to omit the control portion of the detecting device of the present invention.

Incidentally, in the detecting device of the present invention, it is effective to provide a processing portion for processing a detecting signal wave form in series or parallel connection between the control portion and each of the temperature(T)-detecting means, the current(I)-detecting means, and the voltage(V)-detecting means. Specifically, for instance, for the output of each of the temperature(T)-detecting means and the current(I)-detecting means, a differentiator is provided in parallel connection with the control portion, where by means of the differentiator, a change in the information signal from one of the temperature(T)-detecting means and the current(I)-detecting means is detected, followed by noticing the information to the control portion. In this case, in the control portion, it is possible to detect a change in the temperature (T) and a change in the current (I) without necessity of always observing the temperature (T) and the current (I). This situation makes it possible to diminish the load of the control portion. In addition, it is also effective to provide, for instance, an integrator in series connection between the voltage(V)-detecting means and the control portion, where part of the signal processing is performed in the control portion in advance. This makes also it possible to diminish the load of the control portion.

In the above-described embodiments of the detecting device of the present invention, in the memory of the control portion, it is required to memorize the tables of previously acquired characteristics data of the normal rechargeable battery corresponding to the inspective rechargeable battery or the function formulas $Voc(Q)$, $Vd(Q, Id, T)$, $Vc(Q, Ic, T)$, $Rd(Q, Id, T)$, and $Rc(Q, Ic, T)$ of the approximation curves based on said data of the normal rechargeable battery. This is meant that detection of internal state of an inspective rechargeable battery can be performed only when tables of previously acquired characteristics data of a normal rechargeable battery corresponding to the inspective rechargeable battery or function formulas $Voc(Q)$, $Vd(Q, Id, T)$, $Vc(Q, Ic, T)$, $Rd(Q, Id, T)$, and $Rc(Q, Ic, T)$ of approximation curves based on said data of the normal rechargeable battery are memorized in the memory of the control portion.

However, by making the detecting device of the present invention have such function as will be described in the following, a variety of rechargeable batteries can be detected with respect to their internal state.

That is, for instance, in order to realize detection of a plurality of different kinds of rechargeable batteries to be inspected, there are provided data tables of previously acquired characteristics data of several kinds of normal rechargeable batteries or function formulas $Voc(Q)$, $Vd(Q, Id, T)$, $Vc(Q, Ic, T)$, $Rd(Q, Id, T)$, and $Rc(Q, Ic, T)$ of approximation curves based on said data are memorized in the memory of the control portion in advance. In this case, there is provided a type selection means for selecting a rechargeable battery type which is suitable for detecting the internal state of a given inspective rechargeable battery in the detecting device. The type selection means is made have a switch-inputting function or an inputting function by a wire or radio electric signal or an optical signal. In the case where the inspective rechargeable battery or a battery module (or a battery pack) having the inspective rechargeable battery provided therein has a communication function to the outside, the control portion of the detecting device is made have a communication function corresponding to said communication function. By this, it is possible to distinguish information of the battery type from the rechargeable battery or the battery module (or the battery pack) and to select said data or said function formula suited for the battery type.

In the previously described embodiments of the detecting device of the present invention, description has been made of the case where the pair of the terminals (2101), the battery voltage-detecting portion (2102), the battery temperature-detecting portion (2103), the current sense resistor (2104), and the amplifier (2105) are singly used. The present invention is not limited to this embodiment.

FIG. 31 is a schematic diagram illustrating a further example of the detecting device of the present invention wherein the detecting device shown in FIG. 29 is connected to a plurality of rechargeable batteries, having such circuit constitution as shown in FIG. 31.

The circuit constitution of the detecting device shown in FIG. 31 basically comprises a plurality of terminals (2301a to 2301n, each comprising a pair of terminals) for connecting a plurality of rechargeable batteries (to be inspected)[n numbers] to the apparatus body, a plurality of battery voltage-detecting portions (2302a to 2302n) respectively for detecting a voltage between a pair of terminals (an inter-terminal voltage) of one of the rechargeable batteries, a plurality of battery temperature-detecting portions (2303A to 2303N) respectively for detecting a temperature of one of the rechargeable batteries, a current sense resistor (2304) for detecting a charging or discharging current of each of the rechargeable batteries, an amplifier (2305), a resistor 1 (2306), a resistor 2 (2307), a transistor 1 (2308), a transistor 2 (2309), and a control portion 2310. The resistor 1 (2306), the resistor 2 (2307), the transistor 1 (2308) and the transistor 2 (2309) together serve to add a charging or discharging pulse current to each of the rechargeable batteries.

The terminals (2301A to 2301N) serve respectively to readily and surely electrically connect one of rechargeable batteries with the apparatus body. Each of the battery-voltage detecting portions (2302A to 2302N) serves to detect an inter-terminal voltage between the anode and the cathode of one of the rechargeable batteries at a high input impedance, where information of the detected voltage is outputted from the battery-voltage detecting portion into the control portion (2310) in each case. Each of the battery temperature-detecting portions (2303A to 2303N) serves to detect a temperature of one of the rechargeable batteries by means of, for instance, a thermister or a thermocouple, where information of the detected battery temperature is outputted from the battery temperature-detecting portion into the control portion (2310) in each case. A charging or discharging current of each of the rechargeable batteries is detected and converted into a voltage signal by the current sense resistor (2304), the voltage signal from the current sense resistor 2104 is inputted into the amplifier 2305 where the voltage signal is processed into voltage information, and the voltage information is inputted into the control portion (2310). A pulse current-adding portion comprising the resistor 1 (2306), the resistor 2 (2307), the transistor 1 (2308), and the transistor 2 (2309) serves to flow a current of a value which is corresponding to a voltage signal wave from the control portion to the system containing the current sense resistor 2304 between the rechargeable batteries, where the anode and the cathode are electrically connected with one of the terminal (2301A to 3101N). The voltage signal wave comprises a rectangular wave, a stepwise wave or a wave comprising these waves.

The control portion 2310 has a memory in the inside or the outside thereof. Tables of previously acquired characteristics data of the normal rechargeable battery which is the same kind and type as the rechargeable batteries to be inspected each electrically connected with one of the terminals (2301A to 2301N) or function formulas $Voc(Q)$, $Vd(Q, Id, T)$, $Vc(Q, Ic, T)$, $Rd(Q, Id, T)$, and $Rc(Q, Ic, T)$ of approximation curves based on said data of the normal rechargeable battery are memorized in the memory of the control portion (2310), where Q is a remaining capacity (a presently stored electricity quantity) of one of the normal rechargeable batteries, Voc is an open-circuit voltage of said normal rechargeable battery, T is a temperature of said normal rechargeable battery, Id is a discharging current for said normal rechargeable battery, Vd is a battery voltage of said normal rechargeable battery when the battery is subjected to discharging, Ic is a charging current for said normal rechargeable battery, Vc is a battery voltage of said normal rechargeable batter when the battery is subjected to charging, Rd is an internal resistance of said normal rechargeable battery when the battery is subjected to discharging, and Rc is an internal resistance of said normal rechargeable battery when the battery is subjected to charging.

In the detecting device shown in FIG. 31 having the temperature (T)-detecting means, the current (I)-detecting means, and the voltage(V)-detecting means for each of the rechargeable batteries respectively connected to one of the terminals (2301A to 2301N), by conducting detection of the internal state of each of the rechargeable batteries in accordance with the previously described detection procedures, the internal state (including deterioration state, electricity storable capacity, remaining capacity, and internal resistance) of each of the rechargeable batteries can be detected.

In this embodiment, in order to detect the temperature of the plurality of the rechargeable batteries (to be inspected), the plurality of battery temperature-detecting portions (2303A to 2303N) are provided. All the battery temperature-detecting portions (2303a to 2303n) are not always necessary to be used. For instance, in the case where the plurality of the rechargeable batteries (to be inspected) are installed in a substantially same atmosphere, it is possible that only a few of temperature-detecting portions are provided, and temperature information provided by these temperature-detecting portions are shared.

Separately, in this embodiment, by means of the plurality of battery voltage-detecting portions (2302A to 2302N), the inter-terminal voltage (the voltage between the anode and the cathode) of each rechargeable battery which is corresponding to one of the battery voltage-detecting portions (2302A to 2302N) is detected, followed by inputting into the control portion (2310). In this case, it is possible that the outputs of the battery voltage-detecting portions (2302A to 2302N) are individually inputted into a circuit switching device (comprising, for instance, a multiplexor) and depending on a demand from the control portion (2310), only the voltage information of optional one of the rechargeable batteries is outputted into the control portion (2310).

In the above, description has been made of the case where the plurality of the rechargeable batteries are connected to the detecting device in series connection. This is not limitative. The detecting device of the present invention can also comply with the case where a number of rechargeable batteries (to be inspected) are connected to the detecting device in series connection and in parallel connection so as to have a number of parallel connected strings in which a prescribed number of the rechargeable batteries are connected in series connection, by providing a prescribed number of current-detecting portions for detecting a charging or discharging current of a rechargeable battery in each of the parallel connected strings.

In this case, the output of each of the current-detecting portions becomes to a voltage signal through current-voltage conversion by the current sense resistor. Therefore, it is possible that the voltage signals based on the outputs from the current-detecting portions are individually inputted into a circuit switching device (comprising, for instance, a multiplexor) and depending on a demand from the control portion (2310), only the voltage information of optional one of the rechargeable batteries is outputted into the control portion (2310).

[Memory Medium Having Arithmetic Program Therein]

A principal feature of the detecting device described in the above is that the apparatus basically has the battery temperature (T)-detecting means (a) for an inspective rechargeable battery, the charging or discharging current (I)-detecting means (b) for the rechargeable battery, the battery voltage (V)-detecting means (c) for the rechargeable battery, if necessary, the pulse current-adding means (d) for the rechargeable battery, and the memorizing means (e) for memorizing tables of previously acquired characteristics data of a normal rechargeable battery corresponding to the inspective rechargeable battery or function formulas $Voc(Q)$, $Vd(Q, Id, T)$, $Vc(Q, Ic, T)$, $Rd(Q, Id, T)$, and $Rc(Q, Ic, T)$ of approximation curves based on said data of the normal rechargeable battery, wherein from said basic data or said function formulas memorized in said memorizing means (e) and information obtained from the battery temperature (T)-detecting means (a), the charging or discharging current (I)-detecting means (b), the battery voltage (V)-detecting means (c), internal state of the inspective rechargeable battery is detected.

In the above function formulas, Voc is an open-circuit voltage of the normal rechargeable battery, T is a temperature of the normal rechargeable battery, Id is a discharging current for the normal rechargeable battery, Vd is a battery voltage of the normal rechargeable batter when the battery is subjected to discharging, Ic is a charging current for the normal rechargeable battery, Vc is a battery voltage of the normal rechargeable battery when the battery is subjected to charging, Rd is an internal resistance of the normal rechargeable battery when the battery is subjected to discharging, and Rc is an internal resistance of the normal rechargeable battery when the battery is subjected to charging.

In the detecting device of the present invention which is provided with such hardware means which are essential, by inputting a prescribed program in order to practice the detecting method of the present invention for detecting internal state of a inspective rechargeable battery and tables of previously acquired characteristics data of a normal rechargeable battery corresponding to the inspective rechargeable battery or function formulas $Voc(Q)$, $Vd(Q, Id, T)$, $Vc(Q, Ic, T)$, $Rd(Q, Id, T)$, and $Rc(Q, Ic, T)$ of approximation curves based on said data of the normal rechargeable battery, the detecting method of the present invention can be practiced. Thus, a memory medium having the prescribed control program installed therein is an embodiment of the present invention.

Description will be made of this memory medium in the following.

For instance, a portable type personal computer in which a rechargeable battery is connected generally has a main control portion which is chiefly engaged in operation of the main body and a sub-control portion which is chiefly engaged in exchange with peripheral equipments. In the sub-control portion, in many case, the inter-terminal voltage (the voltage between the anode and the cathode) and the temperature of a rechargeable battery [or a battery pack (module)] mounted on or connected to the main body are monitored. In the case where the rechargeable battery is connected to the main body, the state of a current flown in the system is monitored. In the sub-control portion which acquires the monitored information, by inputting the control program of the present invention and tables of previously acquired characteristics data of a normal rechargeable battery corresponding to said rechargeable battery in the personal computer or function formulas $Voc(Q)$, $Vd(Q, Id, T)$, $Vc(Q, Ic, T)$, $Rd(Q, Id, T)$, and $Rc(Q, Ic, T)$ of approximation curves based on said data of the normal rechargeable battery, the internal state of the rechargeable battery in the personal computer can be detected. In this case, it is possible that said control program, said data tables or said functional formulas are inputted in the main control portion.

Aforesaid personal computer is not provided with such pulse current-adding means as in the present invention. Upon having access to, for instance, a hardware disk or the peripheral equipments which are using, the consumptive current in the computer is changed to entail a change in the discharging current of the rechargeable battery. The change in the discharging current can be considered to fall in the previously described case where the discharging current of the inspective rechargeable battery is changed by means of the pulse current adding means in order to detect the internal state of the battery.

The access to the hardware disc or the peripheral equipments is performed on the basis of a demand by the main control portion or the sub-control portion. Thus, in the sub-control portion or the main control portion in which the control program of the present invention is inputted, occurrence of an event having access to the hardware disc or the peripheral equipments can be recognized in advance.

Such change in the discharging current of the rechargeable battery in the instrument in which the rechargeable battery is connected is not occurred only in the personal computer but it is occurred also in other instruments. For instance, it is occurred when a cellular phone in which a rechargeable battery is used is in a transmitted state, when a digital camera in which a rechargeable battery is used or the like is engaged in flash operation, or the like. Therefore, by grasping a change in the consumptive current of such instrument to detect a change in the discharging current of the rechargeable battery used therein, detection of the internal state (including the deterioration state, the electricity storable capacity, the remaining capacity, and the internal resistance) of the rechargeable battery can be conducted. In addition, information of the detected internal state can be indicated at a prescribed portion which is already present in an instrument in which the present invention is applied.

[Instruments in Which the Detecting Method and Apparatus for Detecting Internal State of a Rechargeable Battery in the Present Invention Can be Adopted]

As previously described, the detecting method of the present invention makes it possible to accurately compute the remaining capacity (the presently stored electricity quantity) of a given inspective rechargeable battery even when the rechargeable battery is a charging state, in a discharging state or in a paused state where neither charging operation nor discharging operation are performed, or the rechargeable battery is a rechargeable battery which is deteriorated, whose electricity storable capacity is decreased or whose internal resistance is increased. Because of this, For an instrument in which a rechargeable is used as the power source, it is possible to accurately distinguish not only the remaining actuation time of the instrument but also the exchanging time of the rechargeable battery. Thus, by mounting the detecting device in which the detecting method for detecting internal state of a rechargeable battery according to the present invention in such instrument, the performance of the instrument and that of the rechargeable battery used in the instrument can be maximized.

As such instrument whose performance can be maximized by mounting the detecting device of the present invention therein, there can be mentioned, for example, cellular phones and personal digital assistants respectively having an information communication function, computers, vehicles in which a rechargeable battery is used as the power source such as electric vehicles and hybrid powered automobiles.

Besides, there can be also mentioned battery modules including battery packs (in which a single rechargeable battery is packaged or a plurality of rechargeable batteries are packaged while being connected in series or parallel connection) in which the detecting device of the present invention is mounted, and chargers in which the detecting device of the present invention is mounted. For such battery module, it is possible to make the battery module to have a communication function which exchanges information of the internal state of the rechargeable battery with an instrument.

Further, as other instrument (or a system) whose performance can be improved by mounting the detecting device of the present invention therein, there can be mentioned, for example, instruments for inspecting whether a rechargeable battery product is good or not good, and power storage systems.

In the following, the present invention will be described in more detail with reference to examples. It should be understood that these examples are only for illustrative purposes and not intended to restrict the scope of the invention.

EXAMPLE A

Acquisition of Basic Data of Characteristics of Normal Rechargeable Battery

Figure 32:
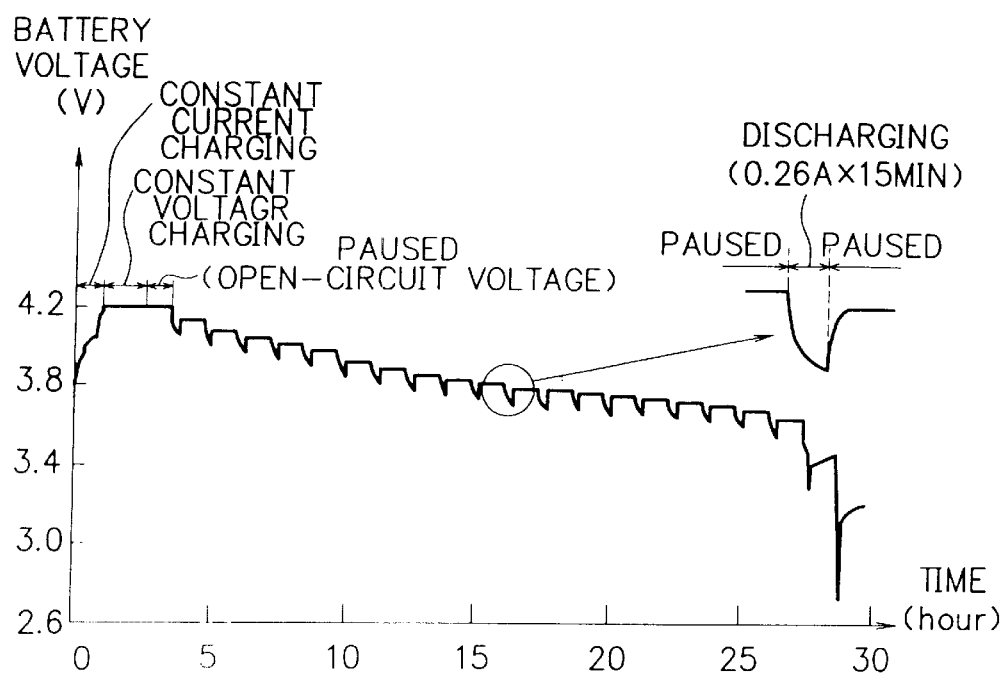
FIG. 32 shows a graph of a change with the passage of time in the battery voltage when a commercially available lithium ion rechargeable battery whose nominal capacity is 1300 mAh was subjected to constant current-constant voltage charging and thereafter, a cycle of conducting discharging operation and pausing the discharging operation was repeated.
Figure 33:
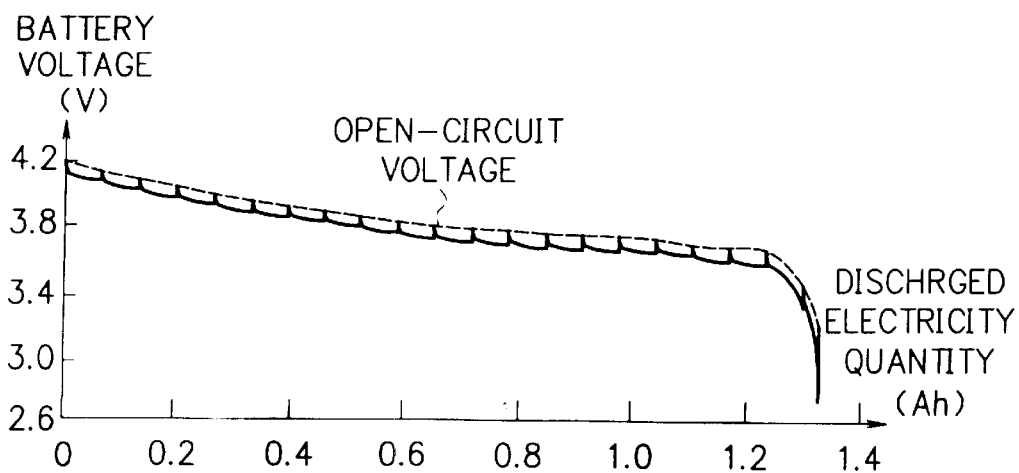
FIG. 33 shows a graph for the results obtained in FIG. 32, where said graph illustrates the relationship between the battery voltage upon the discharging to an integrated discharging capacity from the data upon the discharging and the open-circuit voltage upon pausing the discharging operation.
Figure 34:
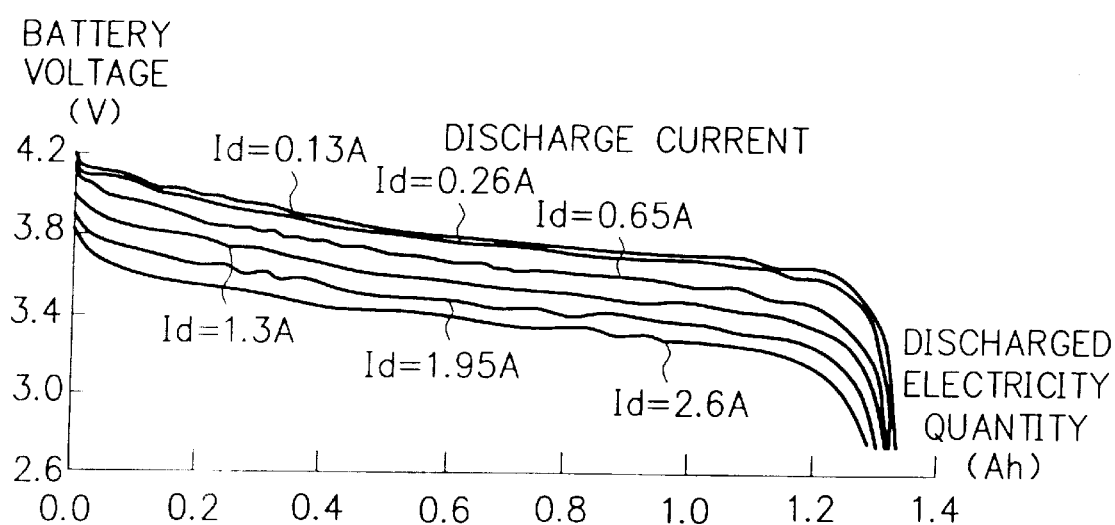
FIG. 34 shows a graph for a commercially available lithium ion rechargeable battery whose nominal capacity is 1300 mAh having been 100% charged, where said graph indicates the relationship of the battery voltage to an integrated discharging capacity when the discharge rate is changed.

With reference to FIGS. 32 to 34, description will be made of an example of a method of acquiring data or function formulas for a given normal rechargeable battery (corresponding to a given inspective rechargeable battery) with respect to a relationship $Voc(Q)$ of the open-circuit voltage (Voc) to the remaining capacity (Q) (or the dischargeable capacity) and data or function formulas of said normal rechargeable battery with respect to a relationship $V(Q, I, T)$ of the battery voltage (V) in relation to the battery temperature (T), the current (I) (flown in a system where the normal rechargeable battery is connected), and the remaining capacity (Q) and a relationship $R(Q, I, T)$ of the internal resistance (R) in relation to said T, said I, and said Q.

FIG. 32 is a graph showing charge-discharge characteristics of a commercially available lithium ion rechargeable battery having a diameter of 17 mm, a length of 67 mm, and a nominal capacity of 1300 mAh when charging and discharging were performed for the rechargeable battery in the following manner, where the abscissa shows time and the ordinate shows battery voltage. That is, first, the rechargeable battery was charged for 2.5 hours by a constant current-constant voltage charging method under condition of 4.2 V for the maximum charging voltage, where under condition of maintaining the temperature of the rechargeable battery at 25° C., the rechargeable battery was subjected to constant current charging at a charging current of 1 A until the battery voltage reached 4.2 V, followed by subjecting to constant voltage charging. After this charging operation, the rechargeable battery was paused for a prescribed period of time, and thereafter, the rechargeable battery was subjected to discharging, where a discharging cycle of subjecting the rechargeable battery to discharging at a discharging current of 0.2 C (=0.26 A) for 15 minutes (an electricity quantity corresponding to about 5% of the nominal electric capacity of the rechargeable battery is discharged) and pausing the rechargeable battery for a prescribed period of time was repeated until the battery voltage of the rechargeable battery reached a prescribed cut-off voltage (2.75 V).

FIG. 33 is a graph showing relationships of the battery voltages upon the intermittent discharging operations to and the open-circuit voltages upon the pausing times each after the discharging operation to the discharged quantities integrated based on the data upon the discharging operation shown in FIG. 32. In FIG. 33, the broken line shows a traced result of the open-circuit voltages of the rechargeable battery upon the pausing times each after the discharging operation (the intermittent discharging operation) and the solid line shows a traced result of the battery voltages of the rechargeable battery upon the intermittent discharging operations, where each spike portion indicates a point of time when the discharging operation is suspended and the rechargeable battery is paused.

The above integrated discharged quantities indicate electricity quantities obtained by subtracting the dischargeable electricity quantity (that is, the remaining capacity) from the nominal capacity (or the electricity storable capacity) of the rechargeable battery. Therefore, it is understood that FIG. 33 shows a relationship of the open-circuit voltage Voc (see, the curve of the broken line) and the battery voltage Vd upon discharging (see, the curve of the solid line) to the remaining capacity Q.

Separately, the foregoing measurement procedures were repeated by changing the discharging current (0.2 C) to a given discharging current [0.1 C (=0.13 A), 0.5 C (=0.65 A), 1.0 C (=1.3 A), 1.5 C (=1.95 A), or 2.0 C (=2.6 A)]. As a result, it was found that in any of the cases, the foregoing relationship of the open-circuit voltage Voc to the remaining capacity Q is not changed, except that the remaining capacity when the battery voltage reached aforesaid discharging cut-off voltage is different in each case.

In this embodiment, from the curves of the battery characteristics obtained in this way, the open-circuit voltages to optional remaining capacities were read to obtain discrete data and based on the discrete data, a data base (a data table) for the relationship of the open-circuit voltage Voc to the remaining capacity Q was prepared. In addition, from the data base, a function formula Voc(Q) of an approximate curve with respect to said data base.

FIG. 34 a graph showing discharge characteristics of a commercially available lithium ion rechargeable battery having a diameter of 17 mm, a length of 67 mm, and a nominal capacity of 1300 mAh when the rechargeable battery was discharged at respective discharging currents of 0.1 C (=0.13 A), 0.2 C (=0.26 A), 0.5 C (=0.65 A), 1.0 C (=1.3 A), 1.5 C (=1.95 A), and 2.0 C (=2.6 A) under condition of maintaining the temperature of the rechargeable battery at 25° C. In FIG. 34, the abscissa shows discharged quantities integrated and the ordinate shows battery voltages. The integrated discharged quantities indicate electricity quantities obtained by subtracting the dischargeable electricity quantity (that is, the remaining capacity) from the nominal capacity (or the electricity storable capacity) of the rechargeable battery. In FIG. 34, before the rechargeable battery was subjected to discharging at a prescribed discharging current in each case, the rechargeable battery was charged for 2.5 hours by a constant current-constant voltage charging method under condition of 4.2 V for the maximum charging voltage, where under condition of maintaining the temperature of the rechargeable battery at 25° C., the rechargeable battery was subjected to constant current charging at a charging current of 1 A until the battery voltage reached 4.2 V, followed by subjecting to constant voltage charging, whereby the rechargeable battery was made to be in a full-charged state. After this, the rechargeable battery was paused for a prescribed period of time, and thereafter, the rechargeable battery was subjected to the discharging operation.

The curve of the battery characteristics at each discharging current was expressed as a function of an approximate curve with respect to said curve.

Separately, at respective temperatures of −20° C., −10° C., 0° C., 40° C., and 50° C. each as an operation atmosphere of an instrument in which the rechargeable battery is mounted, data with respect to the battery characteristics upon the discharging operation were obtained as well as in the above. From the curves of the battery characteristics obtained based on said discrete data, the open-circuit voltages and the battery voltages to optional remaining capacities were read and data bases (data tables) for the relationship of the battery voltage Vd and the internal resistance Rd upon the discharging operation to the remaining capacity Q were prepared. In addition, from the data base, function formulas Vd(Q, Id, T) and Rd(Q, Id, T) respectively of an approximate curve with respect to said data bases.

In Table 1 as an example of the foregoing data tables obtained in the above for the lithium ion rechargeable battery (having a diameter of 17 mm, a length of 67 mm, and a nominal capacity of 1300 mAh), there are shown relationships of the open-circuit voltage Voc(V) to the remaining capacity Q [Ah] upon the discharging operation and those of the battery voltage Vd(V) at each of constant currents Id (=0.13 A, 0.26 A, 0.65 A, 1.3 A, 1.95 A, and 2.6 A) when the battery temperature is 25° C. to the remaining capacity Q [Ah] upon the discharging operation.

Open-circuit Voltage Which is a Function of Remaining Capacity or Integrated Discharged Quantity The open-circuit voltage Voc can be regarded as a function decided only by the remaining capacity Q. In this respect, instead of the foregoing data table, the open-circuit voltage Voc can be expressed as a function of the remaining capacity Q, for instance, as will be described below.

$$Voc(Q) = P_n \times Q^n + P_{n-1} \times Q^{n-1} + P_{n-2} \times Q^{n-2} + \ldots + P_1 \times Q^1 + P_0 \times Q^0$$

(where each of $P_n$ to $P_0$ is a constant which is different depending on the kind, type, nominal capacity or the like of a rechargeable battery.)

An actual example where a function formula of an approximate curve for a relationship Voc(Q) of the open-circuit voltage Voc to the remaining capacity Q is obtained will be described in the following.

When the electricity storable capacity (the nominal capacity) of a rechargeable battery is made to be C and the remaining capacity of said battery at a certain point of time is made to be Q, an integrated discharged quantity can be expressed to be (C−Q). In this embodiment, it is assumed that the open-circuit voltage Voc is a twelve-dimensional polynomial of the integrated discharged quantity (C−Q). And based on the acquired basic data with respect to the open-circuit voltage Voc and the integrated discharged quantity (C−Q) for the lithium ion rechargeable battery (having a diameter of 17 mm, a length of 67 mm, and a nominal capacity of 1300 mAh), a function formula of the open-circuit voltage Voc to the remaining capacity Q was computed. Here, the value of the C is 1.3 Ah as the nominal capacity of the rechargeable battery. And a range capable of being taken by the remaining capacity Q is made to be $0 \leq Q \leq C$. The computed function formula of the open-circuit voltage Voc to the remaining capacity Q is as follows.

$$\begin{aligned}Voc(Q) = &-661.900042980173225 \times (C-Q)^{12} + \\ &4678.290484010105502 \times (C-Q)^{11} - \\ &14335.21335398782685 \times (C-Q)^{10} + \\ &24914.67028729754384 \times (C-Q)^{9} - \\ &26969.20124879933792 \times (C-Q)^{8} + \\ &18786.93847206758073 \times (C-Q)^{7} - \\ &8401.942857432433812 \times (C-Q)^{6} + \\ &2331.619009308063141 \times (C-Q)^{5} - \\ &370.18004193870911 \times (C-Q)^{4} + \\ &26.914989189437676 \times (C-Q)^{3} + \\ &0.445460210498741 \times (C-Q)^{2} - \\ &0.883133725562348 \times (C-Q) + \\ &4.188863096991684\end{aligned}$$

Internal Resistance Which is a Function of Remaining Capacity or Integrated Discharged Quantity A relationship between the discharging current Id, the open-circuit voltage Voc, the battery voltage Vd, and the internal resistance Rd of a rechargeable battery when the battery is engaged in discharging operation can be expressed to be Vd=Voc−Id×Rd. And a relationship between the charging current Ic, the open-circuit voltage Voc, the battery voltage Vc, and the internal resistance Rc of the rechargeable battery when the battery is engaged in charging operation can be expressed to be Vc=Voc+Ic×Rc. In addition, the internal resistance can be regarded as a function of the battery temperature. In this respect, a relationship of the battery voltage V to the remaining capacity Q and that of the internal resistance R to the remaining capacity Q can be expressed to be an approximate curve of V(Q, I, T) and an approximate curve of R(Q, I, T) respectively, where said V(Q, I, T) is a function of the battery voltage V in relation to the remaining capacity Q, the current I, and the battery temperature T and said R(Q, I, T) is a function of the internal resistance R in relation to the remaining capacity Q, the current I, and the battery temperature T.

Now, when the battery temperature of a rechargeable battery is made to be T, the discharging current of the rechargeable battery is made to be I, the electricity storable capacity (the nominal capacity) of the rechargeable battery is made to be C, and the remaining capacity of the rechargeable battery at a certain point of time is made to be Q, the integrated discharged quantity of the rechargeable battery can be expressed to be (C−Q).

In this respect, a relational formula Rd(Q, I, T) with respect to the internal resistance Rd in relation to the remaining capacity upon discharging operation can be expressed as a function formula of n-dimension concerning, for instance, the remaining capacity or the discharged quantity as will be described below. In this case, a range capable of being taken by the remaining capacity Q is made to be $0 \leq Q \leq C$.

$$Rd(Q, I, T)=F_n \times (C-Q)^n + F_{n-1} \times (C-Q)^{n-1} + F_{n-2} \times (C-Q)^{n-2} + \ldots + F_1 \times (C-Q)^1 + F_0 \times (C-Q)^0$$

(where each of $F_n$ to $F_0$ can be expressed, for instance, as a function formula $F_n = G_n(T) \times H_n(I)$ or $F_n = G_n(T) + H_n(I)$, with $G_n(T)$ being a function of the battery temperature T and $H_n(I)$ being a function of the current)

Alternatively, by making said $F_n$ to said $F_0$ to be as follows:

$$F_n = K_{n,m} \times I^m + K_{n,m-1} \times I^{m-1} + K_{n,m-2} \times I^{m-2} + \ldots + K_{n,1} \times I^1 + K_{n,0} \times I^0$$

$$F_{n-1} = K_{n-1,m} \times I^m + K_{n-1,m-1} \times I^{m-1} + K_{n-1,m-2} \times I^{m-2} + \ldots + K_{n-1,1} \times I^1 + K_{n-1,0} \times I^0$$

$$F_0 = K_{0,m} \times I^m + K_{0,m-1} \times I^{m-1} + K_{0,m-2} \times I^{m-2} + \ldots + K_{0,1} \times I^1 + K_{0,0} \times I^0$$

each of $K_{n,m}$ to $K_{n,o}$, each of $K_{n-1,m}$ to $K_{n-1,o}$, ... each of $K_{o,m}$ to $K_{o,o}$ can be expressed respectively as a function of the battery temperature T.

As one of actual examples where the foregoing function formulas are obtained, in the following, there is shown an example where for a commercially available lithium ion rechargeable battery having a diameter of 17 mm, a length of 67 mm, and a nominal capacity of 1300 mAh, basic data with respect to the internal resistance (Rd) in relation to the remaining capacity Q (or the integrated discharged quantity), the discharging current (I), and the battery temperature (T) were obtained by subjecting the rechargeable battery to charging and discharging as previously described, and said basic data were expressed by a functional formula of an approximate curve of Rd(Q, I, T). In this embodiment, by assuming that the internal resistance Rd can expressed by a twelve-dimensional polynomial of the integrated discharged quantity (C-Q)[with C being the nominal capacity (1300 mAh=1.3 Ah) of the above described rechargeable battery], there was computed a function formula capable fitting to the basic data concerning the internal resistance. The computed function formula of the internal resistance Rd(Q, I, T) upon the discharging operation is as will be described below.

$$Rd(Q, I, T)=F_{12} \times (C-Q)^{12} + F_{11} \times (C-Q)^{11} + F_{10} \times (C-Q)^{10} + \ldots + F_1 \times (C-Q)^1 + F_0 \times (C-Q)^0$$

Here, the coefficients $F_{12}$ to $F_0$ could be expressed respectively by the following penta-dimensional polynomial of the current value (I).

$$F_{12} = K_{12,5} \times I^5 + K_{12,4} \times I^4 + K_{12,2} \times I^2 + K_{12,1} \times I^1 + K_{12,0} \times I^0$$

$$F_{11} = K_{11,5} \times I^5 + K_{11,4} \times I^4 + K_{11,3} \times I^3 + K_{11,2} \times I^1 + K_{11,0} \times I^0 \ldots$$

$$F_0 = K_{0,5} \times I^5 + K_{0,4} \times I^4 + K_{0,3} \times I^3 + K_{0,2} \times I^2 + K_{0,1} \times I^0 K_{0,0} \times I^0$$

Further, the coefficients $K_{0,0}$ to $K_{12,5}$ could be expressed respectively by the following quatre-dimensional polynomial of the battery temperature (T).

$K_{0,0}=0.0000003728422193 \times T^4 - 0.0004690399886317 \times T^3 + 0.219630909372119 \times T^2 - 45.393541420206056 \times T + 3495$ $K_{1,0}=-0.000179118075830736 \times T^4 + 0.019047317301656 \times T^3 - 7.507153217164846 \times T^2 + 1295.900128065855824 \times T - 82320.66124016915274$ $K_{2,0}=0.0008393300954506 \times T^4 - 0.925251141189932 \times T^3 + 380.532287220051614 \times T^2 - 69147.14363160646462 \times T + 4$ $K_{3,0}=-0.017185353004619 \times T^4 + 19.234599304257944 \times T^3 - 8046.433143414219558 \times T^2 + 1490563.733755752211 \times T - 103127364.48805916309$ $K_{4,0}=0.169551698762352 \times T^4 - 190.999908140883917 \times T^3 + 80470.07880103871866 \times T^2 - 15024311.89118036628 \times T + 1.048650819771948e+9$ $K_{5,0}=-0.955959118340144 \times T^4 + 1080.745597758554595 \times T^3 - 457103.8624067021883 \times T^2 + 85709740.95309616626 \times T - 6.01059936858493e+9$ $K_{6,0}=3.375841083746783 \times T^4 - 3825.451933311166158 \times T^3 + 1622083.712826749077 \times T^2 - 304991211.3940501213 \times T + 2.145317715502894e+10$ $K_{7,0}=-7.810843719833634 \times T^4 + 8866.183584053051163 \times T^3 - 3766345.644136840012 \times T^2 + 709567942.1204522848 \times T - 5.001923236648273e+10$ $K_{8,0}=12.033631252687844 \times T^4 - 13677.64824440043594 \times T^3 + 5818483.242671614513 \times T^2 - 1.097858196917345e+9 \times T + 7.751905044076741e+10$ $K_{9,0}=-12.238187331253075 \times T^4 + 13925.33526539518061 \times T^3 - 5930710.459638201632 \times T^2 + 1.120421761057557e+9 \times T - 7.921808331037033e+10$ $K_{10,0}=7.893435909900529 \times T^4 - 8989.98957545310077 \times T^3 + 3832542.024125073105 \times T^2 - 724796162.165166378 \times T + 5.130331180844828e+10$ $K_{11,0}=-2.925896962983863 \times T^4 + 3335.077681152527475 \times T^3 - 1423000.113370831124 \times T^2 + 269356095.2803371549 \times T - 1.908424205759282e+10$ $K_{12,0}=0.474786593515207 \times T^4 - 541.575826871208278 \times T^3 + 231252.3383636772924 \times T^2 - 43807985.50071253628 \times T + 3.106470547152108e+9$ $K_{0,1}=0.000002810514762 \times T^4 - 0.002898202547079 \times T^3 + 1.105541936798752 \times T^2 - 184.521855864246987 \times T + 11343$ $K_{1,1}=0.000551705428643872 \times T^4 - 0.618741510687609 \times T^3 + 259.586933909031927 \times T^2 - 48283.85493898519053 \times T + 3359573.6900693262$ $K_{2,1}=-0.0195475060621 \times T^4 + 22.088617721865582 \times T^3 - 9341.226422357953197 \times T^2 + 1752157.602624612628 \times T - 122996540.8737580031$ $K_{3,1}=0.325763020172631 \times T^4 - 369.724916377202248 \times T^3 + 157069.7521357303194 \times T^2 - 29601894.0842731744 \times T + 2.088209856891993e+9$ $K_{4,1}=-2.908705926352533 \times T^4 + 3309.493716794020656 \times T^3 - 1409607.063310474623 \times T^2 + 266370644.6106990278 \times T - 1.884257213245936e+10$ $K_{5,1}=15.522568640313624 \times T^4 - 17689.339928652651 \times T^3 + 7546667.398559059016 \times T^2 - 1.428474185012642e+9 \times T + 1.012224248948845e+11$ $K_{6,1}=-52.917599424765683 \times T^4 + 60369.46012100671942 \times T^3 - 25783514.46398825198 \times T^2 + 4.88600354697663e+9 \times T - 3.46629897478479e+11$ $K_{7,1}=119.343894918586244 \times T^4 - 136256.5889387205825 \times T^3 + 58241129.37237557024 \times T^2 - 1.104580399434835e+10 \times T + 7.84285673315848e+11$ $K_{8,1}=-180.13279743136772 \times T^4 + 205783.2935366885795 \times T^3 - 88013024.84585164488 \times T^2 + 1.670262265534591e+10 \times T - 1.186691748976397e+12$ $K_{9,1}=179.977612805760856 \times T^4 - 205704.7138883229345 \times T^3 + 88022247.56138792634 \times T^2 - 1.671265663160231e+10 \times T + 1.188005733152792e+12$ $K_{10,1} = -114.22103353999718 \times T^4 + 130600.7620928548568 \times T^3 - 55907464.3364872858 \times T^2 + 1.061943998671068e+10 \times T - 7.551911324552615e+11$ $K_{11,1} = 41.695827710871889 \times T^4 - 47691.58228996800608 \times T^3 + 20422870.60793861002 \times T^2 - 3.880626435474761e+9 \times T + 2.760661086077543e+11$ $K_{12,1} = -6.666496484950264 \times T^4 + 7627.427708115624228 \times T^3 - 3267274.46735554561 \times T^2 + 621019135.6699528694 \times T - 4.41929345856 1603e+10$ $K_{0,2} = -0.0000149877533689156 \times T^4 + 0.016264765981062 \times T^3 - 6.586433677933296 \times T^2 + 1179.630127694138537 \times T - 78854.88604895926256$ $K_{1,2} = -0.001671225994427 \times T^4 + 1.877401817058471 \times T^3 - 789.07213084094451 \times T^2 + 147061.7484517464472 \times T - 10255014.040370674804$ $K_{2,2} = 0.050857806024981 \times T^4 - 57.421146649059438 \times T^3 + 24263.23108479666916 \times T^2 - 4547478.023707655258 \times T + 318979066.9375175238$ $K_{3,2} = -0.767138695737053 \times T^4 + 869.501589442514955 \times T^3 - 368895.5433750267257 \times T^2 + 69431079.11021871865 \times T - 4.891503969447994e+9$ $K_{4,2} = 6.458605207522703 \times T^4 - 7339.346130055530012 \times T^3 + 3122145.968177304138 \times T^2 - 589259323.2726836204 \times T + 4.163276005699007e+10$ $K_{5,2} = -33.210693487729266 \times T^4 + 37806.52151914418209 \times T^3 - 16112231.32226052508 \times T^2 + 3.046667102485437e+9 \times T - 2.156707719286414e+11$ $K_{6,2} = 110.41654910551955 \times T^4 - 125865.3597195415496 \times T^3 + 53705964.79313132912 \times T^2 - 1.0168738968952e+10 \times T + 7.208109075952678e+11$ $K_{7,2} = -244.609733706370236 \times T^4 + 279071.9859447662602 \times T^3 - 119200855.458073914 \times T^2 + 2.259145651305348e+10 \times T - 1.602974000459222e+12$ $K_{8,2} = 364.280446611480329 \times T^4 - 415899.7378741699504 \times T^3 + 177773139.5446700454 \times T^2 - 3.37170978830763e+10 \times T + 2.394178279874176e+12$ $K_{9,2} = -360.133009104473672 \times T^4 + 411398.5785509308916 \times T^3 - 175950132.9841732085 \times T^2 + 3.339073499857018e+10 \times T - 2.372399659849292e+12$ $K_{10,2} = 226.571828904114568 \times T^4 - 258946.2668825854489 \times T^3 + 110800467.2156397104 \times T^2 - 2.103706218735303e+10 \times T + 1.495396594538536e+12$ $K_{11,2} = -82.097460356641946 \times T^4 + 93865.67427578115894 \times T^3 - 40180264.4568978697 \times T^2 + 7.631883991534069e+9 \times T - 5.42725 5754183317e+11$ $K_{12,2} = 13.041315019963541 \times T^4 - 14915.89122739454251 \times T^3 + 6387139.428232744336 \times T^2 - 1.213605887380284e+9 \times T + 8.633362065024582e+10$ $K_{0,3} = 0.0000251678427397413 \times T^4 - 0.027749417567646 \times T^3 + 11.431003896028034 \times T^2 - 2085.159978444959506 \times T + 142128.8166474564059$ $K_{1,3} = 0.001751449385998 \times T^4 - 1.965532828562073 \times T^3 + 825.198818901071149 \times T^2 - 153608.5966555425257 \times T + 10697382.97613775916$ $K_{2,3} = -0.045992909613442 \times T^4 + 51.765049403509529 \times T^3 - 21800.6951406261469 \times T^2 + 4071656.867690694518 \times T - 284551801.1211410761$ $K_{3,3} = 0.609139955562425 \times T^4 - 687.607714664136665 \times T^3 + 290488.4805661713472 \times T^2 - 54432601.20337542892 \times T + 3.817251073175302e+9$ $K_{4,3} = -4.654946445586634 \times T^4 + 5267.515010680999694 \times T^3 - 2231088.309676257428 \times T^2 + 419202946.5956563354 \times T - 2.948124603910822e+10$ $K_{5,3} = 22.286869517195672 \times T^4 - 25270.05467747936928 \times T^3 + 10725593.31009998918 \times T^2 - 2.019626285390959e+9 \times T + 1.423544581998099e+11$ $K_{6,3} = -70.273845850297775 \times T^4 + 79808.32413277083833 \times T^3 - 33930159.44685647637 \times T^2 + 6.400054181017841e+9 \times T - 4.51914538369342e+11$ $K_{7,3} = 149.601386715460876 \times T^4 - 170118.3903450048529 \times T^3 + 72421280.32549875974 \times T^2 - 1.367911124421202e+10 \times T + 9.672544733460782e+11$ $K_{8,3} = -216.080536475273817 \times T^4 + 245972.965744795074 \times T^3 - 104825836.75099624693 \times T^2 + 1.982151737409837e+10 \times T - 1.403160810753543e+12$ $K_{9,3} = 208.528016714157587 \times T^4 - 237582.0518041840696 \times T^3 + 101339354.76017145813 \times T^2 - 1.917950228946529e+10 \times T + 1.358957382793612e+12$ $K_{10,3} = -128.648630272366432 \times T^4 + 146680.9468983050902 \times T^3 - 62612523.06659654528 \times T^2 + 1.185900191909874e+10 \times T - 8.409099766116382e+11$ $K_{11,3} = 45.862214041144405 \times T^4 - 52323.81826514477143 \times T^3 + 22349358.16426483542 \times T^2 - 4.235780194080044e+9 \times T + 3.005522361710247e+11$ $K_{12,3} = -7.185307946068086 \times T^4 + 8202.238421019834277 \times T^3 - 3505436.076118038502 \times T^2 + 664747740.961967349 \times T - 4.719465114689993e+10$ $K_{0,4} = -.0000192255394011085 \times T^4 + 0.021451855148696 \times T^3 - 8.949177062086774 \times T^2 + 1654.341424624854653 \times T - 114347.8315392331278$ $K_{1,4} = -0.00081645884929378 \times T^4 + 0.915963370235589 \times T^3 - 384.394885101222144 \times T^2 + 71516.78036990862165 \times T - 4977237.941760426387$ $K_{2,4} = 0.018665516848548 \times T^4 - 20.945499132537545 \times T^3 + 8792.787151743495997 \times T^2 - 1636507.520356033929 \times T + 113940643.510729596$ $K_{3,4} = -0.208551404290907 \times T^4 + 234.064252746103051 \times T^3 - 98280.91590542987979 \times T^2 + 18297020.93438888714 \times T - 1.274317674892173e+9$ $K_{4,4} = 1.339574048511812 \times T^4 - 1503.615180965887021 \times T^3 + 631459.032932954724 \times T^2 - 117585216.0713095963 \times T + 8.191520568488794e+9$ $K_{5,4} = -5.41634189133107 \times T^4 + 6080.279572206331977 \times T^3 - 2553905.465719996486 \times T^2 + 475671351.9166372418 \times T - 3.314607225791437e+10$ $K_{6,4} = 14.554042749470186 \times T^4 - 16340.35331930969369 \times T^3 + 6864766.807159300894 \times T^2 - 1.278884505325829e+9 \times T + 8.91410026807912e+10$ $K_{7,4} = -26.702810592234627 \times T^4 + 29985.37313494967748 \times T^3 - 12599908.78297643736 \times T^2 + 2.347923449255732e+9 \times T - 1.637030338813723e+11$ $K_{8,4} = 33.616003692593779 \times T^4 - 37755.79519816931134 \times T^3 + 15868689.48295781203 \times T^2 - 2.957814271722582e+9 \times T + 2.062859919415767e+11$ $K_{9,4} = -28.549327238622432 \times T^4 + 32071.84076537256988 \times T^3 - 13482853.98914256319 \times T^2 + 2.513751298973701e+9 \times T - 1.753644153967844e+11$ $K_{10,4} = 15.615889964970963 \times T^4 - 17546.34309475550617 \times T^3 + 7378066.55368669983 \times T^2 - 1.375903085110361e+9 \times T + 9.601048284484978e+10$ $K_{11,4} = -4.961400910069002 \times T^4 + 5575.897482064596261 \times T^3 - 2345115.56629166659 \times T^2 + 437428445.089415431 \times T - 3.053090860965102e+10$ $K_{12.4}$=0.695014380923983×$T^4$−781.253406883600064×$T^3$+ 328646.8735752489884×$T^2$−61314347.82639360428×$T$+ 4.280426730538583$e$+9

$K_{0.5}$=0.0000055685857458958×$T^4$−0.006269943903778×$T^3$+ 2.640726168426087×$T^2$−493.072682310015125×$T$+ 34439.01298486242012

$K_{1.5}$=0.000161459388938338×$T^4$−0.181685886575457×$T^3$+ 76.48491361543168×$T^2$−14275.91988238808517×$T$+ 996832.7974418463418

$K_{2.5}$=−0.003644982089995×$T^4$+4.101798825788432×$T^3$− 1726.917806184043457×$T^2$+322373.2470881768968×$T$− 22513770.08513562009

$K_{3.5}$=0.040176201294742×$T^4$−45.2111990768366×$T^3$+ 19035.3292236953348×$T^2$−3553687.279590429272×$T$+ 248205168.0678731203

$K_{4.5}$=−0.252724149200711×$T^4$+284.364088978607867×$T^3$− 119717.74444384659×$T^2$+22349178.49348734319×$T$− 1.5609506067017$e$+9

$K_{5.5}$=0.99321211747314×$T^4$−1117.34604256486864×$T^3$+ 470334.9616640359164×$T^2$−87793226.38023105264×$T$+ 6.13128593721498$e$+9

$K_{6.5}$=−2.577149995346287×$T^4$+2898.568018064226635×$T^3$− 1219882.472908790689×$T^2$+227667403.1106119156×$T$− 1.589763369995698$e$+10

$K_{7.5}$=4.546336695206962×$T^4$−5112.045211581619696×$T^3$+ 2150963.609311953653×$T^2$−401358455.5349878669×$T$+ 2.802150292308567$e$+10

$K_{8.5}$=−5.493312202741592×$T^4$+6175.273952080845447×$T^3$− 2597737.064942202996×$T^2$+484624717.2114210725×$T$− 3.382866307244066$e$+10

$K_{9.5}$=4.479715688077147×$T^4$−5034.625069146578426×$T^3$+ 2117431.804731178563×$T^2$−394939977.4744403362×$T$+ 2.756315841920568$e$+10

$K_{10.5}$=−2.35745032434141×$T^4$+2648.891592185625086×$T^3$− 1113825.013085700106×$T^2$+207708652.5919890404×$T$− 1.449351552776621$e$+10

$K_{11.5}$=0.722700953370907×$T^4$ 811.891530954773657×$T^3$+ 341327.5026830868446×$T^2$−63640350.16188571602×$T$+ 4.439957102906778$e$+9

$K_{12.5}$=−098012110608512×$T^4$+110.090753050316849×$T^3$− 46276.03871921345126×$T^2$+8626818.395340621472×$T$− 601771718.735604167

In the above-described function formulas, "e+9", "e+10", "e+11" and "e+12" in the constant terms indicate "×$10^9$", "×$10^{10}$", "×$10^{11}$," and "×$10^{12}$" respectively.

As above described, in this embodiment, the function formula of the approximate curve concerning the internal resistance Rd(Q, I, T) is expressed first by the twelve-dimensional polynomial of the remaining capacity Q [the integrated discharged quantity (C−Q)], then by the penta-dimensional polynomial of the current value I with respect to the coefficients in the twelve-dimensional polynomial, finally by the quatre-dimensional polynomial of the battery temperature T with respect to the coefficients in the penta-dimensional polynomial.

It should be understood that the present invention is not limited to the dimensions of these polynomials and the order of these polynomials to be obtained. In addition, the previously described function formulas indicating the basic data of the rechargeable battery are not limited to such polynomial of n-dimension.

Detection of Remaining Capacity of Inspective Rechargeable Battery

EXAMPLE 1

In this example, as a rechargeable battery to be inspected (that is, an inspective rechargeable battery), there were provided three commercially available lithium ion rechargeable batteries (as Sample1, Sample2, and Sample 3) having a diameter of 17 mm, a length of 67 mm and a nominal capacity of 1300 mAh which are respectively in a paused state without having being subjected to charging or discharging. And these three inspective rechargeable batteries were detected with respect to their internal state in accordance with the detecting method of the present invention.

In Example A, for the normal commercially available lithium ion rechargeable battery (having a diameter of 17 mm, a length of 67 mm and a nominal capacity of 1300 mAh) which is corresponding to each of the three inspective rechargeable batteries (Sample 1 to Sample 3), there were acquired the characteristics-relative basic data of the relationship of the remaining capacity (Q) and the open-circuit voltage (Voc) and the function formulas Voc(Q) and Q(Voc) based on said basic data.

With reference to the above characteristics-relative basic data or the above function formula Voc(Q) or Q(Voc) for the corresponding normal rechargeable battery and in accordance with the judging procedures shown in FIG. 3 of the detecting method according to the present invention, judgment was performed for each of Samples 1 to 3. As a result, Samples 1 to 3 were found to be not short-circuited and normal.

Then, each of the three inspective rechargeable batteries (Samples 1 to 3) was subjected to charging and discharging in the following manner. That is, each inspective rechargeable battery was charged for 2.5 hours by a constant current-constant voltage charging method under condition of 4.2 V for the maximum charging voltage, where under condition of maintaining the temperature of the rechargeable battery at 25° C., the rechargeable battery was subjected to constant current charging at a charging current of 1 A until the battery voltage reached 4.2 V, followed by subjecting to constant voltage charging, whereby the rechargeable was full-charged. After this, the rechargeable battery was paused for a prescribed period of time, and thereafter, the rechargeable battery was subjected to discharging at a discharging current of 0.2 C (=0.26 A) to discharge an electricity quantity corresponding to a prescribed percentage (20% for Sample 1, 50% for Sample 2, and 80% for Sample 3) of the nominal capacity. In this case, the remaining capacities of Samples 1 to 3 must be 80%, 50%, and 20% respectively of the nominal capacity.

Then, for each of Samples 1 to 3, a value of the remaining capacity thereof was detected in the following manner. First, an open-circuit voltage (Voc) of each of Samples 1 to 3 after the discharging operation was measured. And with reference to the previously described relationship Q(Voc) of the remaining capacity (Q) and the open-circuit voltage (Voc) and the measured open-circuit voltage, a value of the remaining capacity of each of Samples 1 to 3 was detected. Thereafter, each of Samples 1 to 3 was subjected to discharging at a constant discharging current 0.2 C (=0.26 A), where the discharged quantity (the discharged electricity quantity) was measured in order to confirm that the detected remaining capacity value was correct.

The measured open-circuit voltage values, the detected remaining capacity values and the measured discharged quantity values of Samples 1 to 3 which were obtained in the above are collectively shown in Table 2.

Separately, using the equation [(the detected remaining capacity−the discharged quantity)/the nominal capacity× 100] which makes it possible to obtain a proportion (%) as a detection precision index for the situation of the measured open-circuit voltage value, the detected remaining capacity value (obtained in accordance with the detecting method of the present invention) and the measured discharged quantity, a detection precision index was obtained for each of Samples 1 to 3. The results obtained are collectively shown in Table 2.

From the results shown in Table 2, it is understood that the detection precision indexes of Samples 1 to 3 are harmonized with each other at a marked precision. Particularly, the values of the detection precision indexes indicate that an error between the detected quantity and the measured quantity is very small to be less than 1% of the nominal capacity of the battery and therefore, the detection accuracy is quite high.

EXAMPLE 2

In this example, as for an inspective rechargeable battery, there were provided three commercially available lithium ion rechargeable batteries (as Sample 1, Sample 2, and Sample 3) having a diameter of 17 mm, a length of 67 mm and a nominal capacity of 1300 mAh which are respectively in a paused state without having being subjected to charging or discharging. And these three inspective rechargeable batteries were detected with respect to their internal state in accordance with the detecting method of the present invention.

In Example A, for the normal commercially available lithium ion rechargeable battery (having a diameter of 17 mm, a length of 67 mm and a nominal capacity of 1300 mAh) which is corresponding to each of the three inspective rechargeable batteries (Sample 1 to Sample 3), there were acquired the characteristics-relative basic data of the relationship of the remaining capacity (Q) and the open-circuit voltage (Voc) and the function formulas Voc(Q) and Q(Voc) based on said basic data.

In accordance with the procedures shown in FIG. 6, each of the three inspective rechargeable batteries (Samples 1 to 3) was subjected to discharging at a discharging current of 0.2 C (=0.26 A), followed by subjecting to constant current charging at a charging current of 0.2 C (=0.26 A), where when the charged quantity became to be a prescribed percentage of the nominal capacity based on a charge-and-discharge Coulomb efficiency (20% for Sample 1, 50% for Sample 2, and 80% for Sample 3), charging pulse was supplied to measure a battery voltage and an open-circuit voltage of the inspective rechargeable battery at this time. Then, with reference to the characteristics-relative basic data or the function formula Voc(Q) or Q(Voc) for the corresponding normal rechargeable battery and in accordance with the procedures shown in the chart of FIG. 6 of the detecting method according to the present invention, Samples 1 to 3 were found to be not short-circuited and normal, and the remaining capacities of the inspective rechargeable batteries were detected. In this way, the remaining capacity value of each of the three inspective rechargeable batteries (Samples 1 to 3) engaged in the charging operation was detected. After the termination of the charging operation, each of Samples 1 to 3 was subjected to discharging at a constant discharging current 0.2 C (=0.26 A), where the discharged quantity (the discharged electricity quantity) was measured in order to confirm that the detected remaining capacity value was correct.

The measured open-circuit voltage values, the detected remaining capacity values and the measured discharged quantity values of Samples 1 to 3 which were obtained in the above are collectively shown in Table 3.

Separately, as well as in Example 1, using the equation [(the detected remaining capacity−the discharged quantity)/ the nominal capacity×100], a detection precision index (%) was obtained for each of Samples 1 to 3. The results obtained are collectively shown in Table 3.

From the results shown in Table 3, it is understood that the detection precision indexes of Samples 1 to 3 are harmonized with each other at a marked precision. Particularly, the values of the detection precision indexes indicate that an error between the detected quantity and the measured quantity is very small to be less than 1% of the nominal capacity of the battery and therefore, the detection accuracy is quite high.

EXAMPLE 3

In this example, as for an inspective rechargeable battery, there were provided nine commercially available lithium ion rechargeable batteries having a diameter of 17 mm, a length of 67 mm and a nominal capacity of 1300 mAh which are respectively in a paused state without having being subjected to charging or discharging. And these nine inspective rechargeable batteries were detected with respect to their internal state in accordance with the detecting method of the present invention.

In Example A, for the normal commercially available lithium ion rechargeable battery (having a diameter of 17 mm, a length of 67 mm and a nominal capacity of 1300 mAh) which is corresponding to each of the nine inspective rechargeable batteries, there were acquired the characteristics-relative basic data of the relationship between the battery temperature (T), the discharging current (Id), the battery voltage (Vd), and the remaining capacity (Q) of the normal rechargeable battery upon the discharging operation and the function formulas Vd(Q, Id, T) and Q(Vd, Id, T) based on said basic data.

Each of the nine inspective rechargeable batteries was subjected to charging at a charging current of 0.2 C (=0.26 A) under condition of maintaining the temperature of the rechargeable battery at 25° C., where the rechargeable battery was full-charged. The nine inspective rechargeable batteries thus full-charged were divided into three groups (1) to (3) each comprising the three inspective rechargeable batteries. After this, the three inspective rechargeable batteries of each of Groups (1) to (3) were separately subjected to constant current discharging as will be described below, where with reference to the above-described characteristics-relative basic data or the above-described function formula Vd(Q, Id, T) or Q(Vd, Id, T) for the corresponding normal rechargeable battery and in accordance with the procedures of the flow chart shown in FIG. 14, the three inspective rechargeable batteries of each of Groups (1) to (3) were found to be normal (see, S1006 in FIG. 14), followed by detecting their remaining capacities (see, S1007 in FIG. 14).

Particularly, the three inspective rechargeable batteries of Group (1) were separately subjected to discharging at a constant discharging current (Id) of 1.0 C (=1.3 A) under condition of maintaining the temperature (T) of the rechargeable battery at 25° C. In this discharging operation, for one of the three inspective rechargeable batteries, at the time when the discharged quantity reached 260 mAh, the rechargeable battery was found to be normal, followed by detecting the remaining capacity value, where the battery voltage was measured; for one of the remaining two inspective rechargeable batteries, at the when the discharged quantity reached 650 mAh, the rechargeable battery was found to be normal, followed by detecting the remaining capacity value, where the battery voltage was measured; for the remaining inspective rechargeable battery, at the when the discharged quantity reached 1040 mAh, the rechargeable battery was found to be normal, followed by detecting the remaining capacity value,where the battery voltage was measured.

The three inspective rechargeable batteries of Group (2) were separately subjected to discharging at a constant discharging current (Id) of 0.2 C (=0.26 A) under condition of maintaining the temperature (T) of the rechargeable battery at 0° C. In this discharging operation, for one of the three inspective rechargeable batteries, at the time when the discharged quantity reached 260 mAh, the rechargeable battery was found to be normal, followed by detecting the remaining capacity value, where the battery voltage was measured; for one of the remaining two inspective rechargeable batteries, at the when the discharged quantity reached 650 mAh, the rechargeable battery was found to be normal, followed by detecting the remaining capacity value, where the battery voltage was measured; for the remaining inspective rechargeable battery, at the when the discharged quantity reached 1040 mAh, the rechargeable battery was found to be normal, followed by detecting the remaining capacity value, where the battery voltage was measured.

The three inspective rechargeable batteries of Group (3) were separately subjected to discharging at a constant discharging current (Id) of 0.5 C (=0.65 A) under condition of maintaining the temperature (T) of the rechargeable battery at 40° C. In this discharging operation, for one of the three inspective rechargeable batteries, at the time when the discharged quantity reached 260 mAh, the rechargeable battery was found to be normal, followed by detecting the remaining capacity value, where the battery voltage was measured; for one of the remaining two inspective rechargeable batteries, at the when the discharged quantity reached 650 mAh, the rechargeable battery was found to be normal, followed by detecting the remaining capacity value, where the battery voltage was measured; for the remaining inspective rechargeable battery, at the when the discharged quantity reached 1040 mAh, the rechargeable battery was found to be normal, followed by detecting the remaining capacity value, where the battery voltage was measured.

After this, the three inspective rechargeable batteries of each of Groups (1) to (3) were separately subjected to discharging under prescribed condition, where the discharged quantity (the discharged electricity quantity) of each rechargeable battery was measured in order to confirm that the detected remaining capacity value was correct.

The measured battery voltage values, the detected remaining capacity values and the measured discharged quantity values of the nine inspective rechargeable batteries which were obtained in the above are collectively shown in Table 4.

Separately, as well as in Example 1, using the equation [(the detected remaining capacity−the discharged quantity)/ the nominal capacity×100], a detection precision index (%) was obtained for each of the nine inspective rechargeable batteries. The results obtained are collectively shown in Table 4.

From the results shown in Table 4, it is understood that the detection precision indexes of the nine inspective rechargeable batteries are harmonized with each other at a marked precision. Particularly, the values of the detection precision indexes indicate that an error between the detected quantity and the measured quantity is very small to be less than 2% of the nominal capacity of the battery and therefore, the detection accuracy is quite high.

EXAMPLE 4

In this example, as an inspective rechargeable battery, there was provided a commercially available lithium ion rechargeable battery having a diameter of 17 mm, a length of 67 mm and a nominal capacity of 1300 mAh which is in a paused state without having being subjected to charging or discharging. And this inspective rechargeable battery was detected with respect to the internal state in accordance with the detecting method of the present invention.

In Example A, for the normal commercially available lithium ion rechargeable battery (having a diameter of 17 mm, a length of 67 mm and a nominal capacity of 1300 mAh) which is corresponding the inspective rechargeable battery, there were acquired the characteristics-relative basic data of the relationship between the battery temperature (T), the discharging current (Id), the battery voltage (Vd), and the remaining capacity (Q) of the normal rechargeable battery upon the discharging operation and the function formulas Vd(Q, Id, T) and Q(Vd, Id, T) based on said basic data.

Prior to detecting the internal state of the inspective rechargeable battery, the inspective rechargeable battery was subjected to a charging and discharging cycle procedure, where a cycle comprising a step (a) of charging the inspective rechargeable battery for 2.5 hours by a constant current-constant voltage charging method under condition of 4.2 V for the maximum charging voltage wherein under condition of maintaining the temperature of the rechargeable battery at 25° C., the rechargeable battery is subjected to constant current charging at a charging current of 1 A until the battery voltage reaches 4.2 V, followed by subjecting to constant voltage charging; a step (b) of pausing the rechargeable battery for 20 minutes; and a step (c) of subjecting the rechargeable battery to constant current discharging at a discharging current of 650 mA (=0.5 C=0.65 A) until the battery voltage reaches 2.75 V; and a step (d) of pausing the rechargeable battery for 20 minutes was repeated 200 times.

The inspective rechargeable battery thus endured was subjected to charging in the same manner as the above step (a), followed by subjecting to constant current discharging at a discharging current of 0.5 C (=0.65 A=650 mA) under condition of maintaining the temperature of the rechargeable battery at 25° C . During this discharging operation, following the flow charts shown in FIGS. 14, 16 and 17, a discharging pulse current of 650 mA×5 seconds was doubled to the constant discharging current to occur a change in the discharging current four times, where the battery voltage was measured, a decrease coefficient D of the decreased electricity storable capacity and the increased internal resistance value were computed, and the remaining capacity value was detected with reference to the foregoing characteristics-relative basic data of the corresponding normal rechargeable battery or the foregoing function formula Vd(Q, Id, T) or Q(Vd, Id, T).

After this, the inspective rechargeable battery was subjected to discharging at a constant discharging current 0.2 C (=0.26 A), where the discharged quantity (the discharged electricity quantity) was measured in order to confirm that the detected remaining capacity value was correct.

The measured battery voltage values and the discharging current values are collectively shown in Table 5. In Table 5, $V_{n0}$ is the battery voltage value before the n-time change of the discharging current, $V_{n1}$ is the battery voltage value after the change of the discharging current, which was computed from the equation $V=V_{n1}+(V_{n0}-V_{n1})\times e^{-t/\tau}$, $I_{n0}$ is the discharging current value before the n-time change thereof, and $I_{n1}$ is the discharging current value after the n-time change thereof The computed decrease coefficient D, the computed internal resistance value, and the detected remaining capacity value, and the measured discharged quantity value of the inspective rechargeable battery which were obtained in the above are collectively shown in Table 6.

The increased internal resistance value shown in Table 6 is one computed by assuming that it can be expressed by $R'=a \times R+b$ (where R is an internal resistance when the inspective rechargeable battery is normal, and each of a and b is a constant).

Separately, as well as in Example 1, using the equation [(the detected remaining capacity−the discharged quantity)/ the nominal capacity×100], a detection precision indexes (%) was obtained for the inspective rechargeable battery. The result obtained is also shown in Table 6.

From the results shown in Table 6, there were obtained a finding in that the remaining capacity computed in an error range of about 3.5% of the nominal capacity coincides with the practical remaining capacity.

There was also obtained a finding in that according to the detecting method of the present invention, even for an inspective rechargeable battery whose performance has been deteriorated, it is possible to detect the remaining capacity at a high precision.

Separately, in this example, the number of times for the discharging current to be changed was made to be a minimum number (4 times) necessary for computing particularly the remaining capacity. However, even when the number of change times is increased, the computation of the remaining capacity can be performed at a high precision.

EXAMPLE 5

In this example, the procedures of Example 1 were repeated, except that instead of the three inspective lithium ion rechargeable batteries, there were three commercially available nickel-metal hydride rechargeable batteries having an AA-size and a nominal capacity of 1550 mAh (as Sample 1, Sample 2, and Sample 3) which are respectively in a paused state without having being subjected to charging or discharging.

Separately, for a commercially available normal nickel-hydride rechargeable product having a AA-size and a nominal capacity of 1550 mAh which is corresponding to each of the three rechargeable batteries (Samples 1 to 3), in the same manner as in Example A, there were acquired the characteristics-relative basic data of the relationship of the remaining capacity (Q) and the open-circuit voltage (Voc) and the function formulas Voc(Q) and Q(Voc) based on said basic data.

With reference to the above characteristics-relative basic data or the above function formula Voc(Q) or Q(Voc) for the corresponding normal rechargeable battery and in accordance with the judging procedures shown in FIG. 3 of the detecting method according to the present invention, judgment was performed for each of Samples 1 to 3. As a result, Samples 1 to 3 were found to be not short-circuited and normal.

Then, each of the three inspective rechargeable batteries (Samples 1 to 3) was subjected to charging and discharging in the following manner. That is, each inspective rechargeable battery was charged a constant charging current of 310 mA for 7.5 hours, whereby the rechargeable battery was full-charged. After this, the rechargeable battery was paused for a prescribed period of time, and thereafter, the rechargeable battery was subjected to discharging at a discharging current of 0.2 C (=310 mA), where an electricity quantity corresponding to a prescribed percentage (20% for Sample 1, 50% for Sample 2, and 80% for Sample 3) of the nominal capacity was discharged. In this case, the remaining capacities of Samples 1 to 3 must be 80%, 50%, and 20% respectively of the nominal capacity.

Then, for each of Samples 1 to 3, a value of the remaining capacity thereof was detected in accordance with the procedures of the flow chart shown in FIG. 3 in the following manner. First, an open-circuit voltage (Voc) of each of Samples 1 to 3 after the discharging operation was measured. And with reference to the previously described relationship Q(Voc) of the remaining capacity (Q) and the open-circuit voltage (Voc) and the measured open-circuit voltage, a value of the remaining capacity of each of Samples 1 to 3 was detected. Thereafter, each of Samples 1 to 3 was subjected to discharging at a constant discharging current 0.2 C, where the discharged quantity (the discharged electricity quantity) was measured in order to confirm that the detected remaining capacity value was correct.

The measured open-circuit voltage values, the detected remaining capacity values and the measured discharged quantity values of Samples 1 to 3 which were obtained in the above are collectively shown in Table 7.

Separately, as well as in Example 1, using the equation [(the detected remaining capacity−the discharged quantity)/ the nominal capacity×100], a detection precision index (%) was obtained for each of Samples 1 to 3. The results obtained are collectively shown in Table 7.

From the results shown in Table 7, it is understood that the detection precision indexes of Samples 1 to 3 are harmonized with each other at a marked precision. Particularly, the values of the detection precision indexes indicate that an error between the detected quantity and the measured quantity is very small and therefore, the detection accuracy is quite high.

EXAMPLE 6

In this example, the procedures of Example 3 were repeated, except that instead of the nine commercially available lithium ion rechargeable batteries, there were provided nine nickel-metal hydride rechargeable batteries having a size of AA and a nominal capacity of 1550 mAh which are respectively in a paused state without having being subjected to charging or discharging.

And these nine inspective rechargeable batteries were detected with respect to their internal state in accordance with the detecting method of the present invention.

Separately, for a commercially available normal nickel-metal hydride rechargeable product having a AA-size and a nominal capacity of 1550 mAh which is corresponding to each of the nine inspective rechargeable batteries (Samples 1 to 9), in the same manner as in Example A, there were acquired the characteristics-relative basic data of the relationship between the battery temperature (T), the discharging current (Id), the battery voltage (Vd), and the remaining capacity (Q) of the normal rechargeable battery upon the discharging operation and the function formulas Vd(Q, Id, T) and Q(Vd, Id, T) based on said basic data.

Each of the nine inspective rechargeable batteries (Samples 1 to 9) was subjected to charging at a charging current of 0.2 C for 7.5 hours, where the rechargeable battery was full-charged. The nine inspective rechargeable batteries thus full-charged were divided into three groups (1) to (3) each comprising the three inspective rechargeable batteries. After this, the three inspective rechargeable batteries of each of Groups (1) to (3) were separately subjected to constant current discharging as will be described below, where with reference to the above-described characteristics-relative basic data or the above-described function formula Vd(Q, Id, T) or Q(Vd, Id, T) for the corresponding normal rechargeable battery and in accordance with the procedures of the flow chart shown in FIG. 14, the three inspective rechargeable batteries of each of Groups (1) to (3) were found to be normal (see, S1006 in FIG. 14), followed by detecting their remaining capacities (see, S1007 in FIG. 14).

Particularly, the three inspective rechargeable batteries of Group (1) were separately subjected to discharging at a constant discharging current (Id) of 1.0 C under condition of maintaining the temperature (T) of the rechargeable battery at 25° C. In this discharging operation, for one of the three inspective rechargeable batteries, at the time when the discharged quantity reached 310 mAh, the rechargeable battery was found to be normal, followed by detecting the remaining capacity value, where the battery voltage was measured; for one of the remaining two inspective rechargeable batteries, at the when the discharged quantity reached 775 mAh, the rechargeable battery was found to be normal, followed by detecting the remaining capacity value, where the battery voltage was measured; for the remaining inspective rechargeable battery, at the when the discharged quantity reached 1240 mAh, the rechargeable battery was found to be normal, followed by detecting the remaining capacity value, where the battery voltage was measured.

The three inspective rechargeable batteries of Group (2) were separately subjected to discharging at a constant discharging current (Id) of 0.2 C under condition of maintaining the temperature (T) of the rechargeable battery at 0° C. In this discharging operation, for one of the three inspective rechargeable batteries, at the time when the discharged quantity reached 310 mAh, the rechargeable battery was found to be normal, followed by detecting the remaining capacity value, where the battery voltage was measured; for one of the remaining two inspective rechargeable batteries, at the when the discharged quantity reached 775 mAh, the rechargeable battery was found to be normal, followed by detecting the remaining capacity value, where the battery voltage was measured; for the remaining inspective rechargeable battery, at the when the discharged quantity reached 1240 mAh, the rechargeable battery was found to be normal, followed by detecting the remaining capacity value, where the battery voltage was measured.

The three inspective rechargeable batteries of Group (3) were separately subjected to discharging at a constant discharging current (Id) of 0.5 C under condition of maintaining the temperature (T) of the rechargeable battery at 40° C. In this discharging operation, for one of the three inspective rechargeable batteries, at the time when the discharged quantity reached 310 mAh, the rechargeable battery was found to be normal, followed by detecting the remaining capacity value, where the battery voltage was measured; for one of the remaining two inspective rechargeable batteries, at the when the discharged quantity reached 775 mAh, the rechargeable battery was found to be normal, followed by detecting the remaining capacity value, where the battery voltage was measured; for the remaining inspective rechargeable battery, at the when the discharged quantity reached 1240 mAh, the rechargeable battery was found to be normal, followed by detecting the remaining capacity value, where the battery voltage was measured.

After this, the three inspective rechargeable batteries of each of Groups (1) to (3) were separately subjected to discharging under prescribed condition, where the discharged quantity (the discharged electricity quantity) of each rechargeable battery was measured in order to confirm that the detected remaining capacity value was correct.

The measured battery voltage values, the detected remaining capacity values and the measured discharged quantity values of the nine inspective rechargeable batteries which were obtained in the above are collectively shown in Table 8.

Separately, as well as in Example 1, using the equation [(the detected remaining capacity−the discharged quantity)/ the nominal capacity×100], a detection precision index (%) was obtained for each of the nine inspective rechargeable batteries. The results obtained are collectively shown in Table 8.

From the results shown in Table 8, it is understood that the detection precision indexes of the nine inspective rechargeable batteries are harmonized with each other at a marked precision. Particularly, the values of the detection precision indexes indicate that an error between the detected quantity and the measured quantity is very small to be less than 2% of the nominal capacity and therefore, the detection accuracy is quite high.

As being apparent from the results obtained in Examples 1 to 6, according to the detecting method for detecting internal state of a rechargeable battery, for any rechargeable battery regardless of whether it is in a normal state or in a deteriorated state, the remaining capacity (the presently stored electricity quantity) can be detected at an extremely high precision. This situation enables one to detect the actuation duration of an instrument in which a rechargeable battery is used as the power source. Further, it is possible to accurately detect an decreased in the electricity storable capacity of the rechargeable battery which relates the lifetime.

Separately, the present invention can be applied for various batteries in order to detect their internal states.

TABLE 1

| remaining capacity (Ah) | Voc (V) | Vd (V) Id = 0.13A | Vd (V) Id = 0.26A | Vd (V) Id = 0.65A | Vd (V) Id = 1.3A | Vd (V) Id = 1.95A | Vd (V) Id = 2.6A |
| --- | --- | --- | --- | --- | --- | --- | --- |
| 1.3 | 4.189 | 4.172 | 4.158 | 4.094 | 4.043 | 3.959 | 3.894 |
| 1.2 | 4.111 | 4.077 | 4.050 | 3.945 | 3.851 | 3.728 | 3.619 |
| 1.1 | 4.044 | 4.012 | 3.980 | 3.876 | 3.779 | 3.654 | 3.545 |
| 1.0 | 3.986 | 3.944 | 3.911 | 3.804 | 3.710 | 3.598 | 3.500 |
| 0.9 | 3.933 | 3.893 | 3.860 | 3.757 | 3.665 | 3.555 | 3.460 |
| 0.8 | 3.879 | 3.841 | 3.811 | 3.705 | 3.611 | 3.501 | 3.408 |
| 0.7 | 3.833 | 3.795 | 3.767 | 3.656 | 3.563 | 3.463 | 3.378 |
| 0.6 | 3.806 | 3.772 | 3.740 | 3.629 | 3.538 | 3.440 | 3.356 |
| 0.5 | 3.789 | 3.755 | 3.717 | 3.606 | 3.510 | 3.407 | 3.320 |
| 0.4 | 3.770 | 3.724 | 3.690 | 3.567 | 3.474 | 3.375 | 3.290 |
| 0.3 | 3.747 | 3.701 | 3.670 | 3.547 | 3.457 | 3.358 | 3.268 |
| 0.2 | 3.712 | 3.680 | 3.642 | 3.507 | 3.425 | 3.316 | 3.215 |
| 0.1 | 3.676 | 3.622 | 3.583 | 3.409 | 3.334 | 3.226 | 3.125 |

TABLE 2

|  | open-circuit voltage (V) | detected remaining capacity (Ah) | discharged quantity (Ah) | (detected remaining capacity−discharged quantity)/nominal capacity × 100 (%) |
| --- | --- | --- | --- | --- |
| Sample 1 | 4.008 | 1.0583 | 1.0612 | −0.2231 |
| Sample 2 | 3.817 | 0.6633 | 0.6712 | −0.6077 |
| Sample 3 | 3.735 | 0.2710 | 0.2812 | −0.7846 |

TABLE 3

|  | open-circuit voltage (V) | detected remaining capacity (Ah) | discharged quantity (Ah) | (detected remaining capacity-discharged quantity)/nominal capacity × 100 (%) |
|---|---|---|---|---|
| Sample 1 | 3.726 | 0.2482 | 0.2565 | −0.6385 |
| Sample 2 | 3.811 | 0.6368 | 0.6465 | −0.7462 |
| Sample 3 | 3.994 | 1.0333 | 1.0365 | −0.2462 |

TABLE 4

| | Sample No. | battery voltage (V) | detected remaining capacity (Ah) | discharged quantity (Ah) | (detected remaining capacity- discharged quantity)/nominal capacity × 100 (%) |
|---|---|---|---|---|---|
| (1) | 1 | 3.733 | 1.0472 | 1.0367 | 0.8077 |
| T = 25° C. | 2 | 3.549 | 0.6458 | 0.6467 | −0.0692 |
| I = 1.0C | 3 | 3.450 | 0.2504 | 0.2567 | −0.4846 |
| (2) | 4 | 3.730 | 0.9338 | 0.9458 | −1.1308 |
| T = 0° C. | 5 | 3.537 | 0.5366 | 0.5585 | −1.6846 |
| I = 0.2C | 6 | 3.304 | 0.1571 | 0.1685 | −0.8769 |
| (3) | 7 | 3.859 | 1.0124 | 1.0134 | −0.0769 |
| T = 40° C. | 8 | 3.675 | 0.6069 | 0.6234 | −1.2692 |
| I = 0.5C | 9 | 3.575 | 0.2263 | 0.2334 | −0.5462 |

TABLE 5

| temperature: 25° C. | $V_{n0}$ [V] | $V_{n1}$ [V] | $I_{n0}$ [A] | $I_{n1}$ [A] |
|---|---|---|---|---|
| first current change | 3.800 | 3.577 | 0.650 | 1.300 |
| second current change | 3.750 | 3.537 | 0.650 | 1.300 |
| third current change | 3.700 | 3.521 | 0.650 | 1.300 |
| fourth current change | 3.650 | 3.497 | 0.650 | 1.300 |

TABLE 6

| | |
|---|---|
| detected remaining capacity according to the present invention(detected quantity) [Ah] | 0.8249 |
| actual discharged quantity [Ah] | 0.7791 |
| (detected remaining capacity-discharged quantity)/nominal capacity × 100 (%) | 3.5231 |
| decrease coefficient D of decreased electricity storable capacity | 0.8764 |
| computed internal resistance R = a × R + b | 2.4973 × R − 0.1600 |

TABLE 7

|  | open-circuit voltage (V) | detected remaining capacity (Ah) | discharged quantity (Ah) | (detected quantity- discharged quantity)/nominal capacity × 100 (%) |
|---|---|---|---|---|
| Sample 1 | 1.320 | 1.2464 | 1.2483 | −0.1226 |
| Sample 2 | 1.290 | 0.7738 | 0.7833 | −0.6129 |
| Sample 3 | 1.243 | 0.3131 | 0.3183 | −0.3355 |

TABLE 8

| | Sample No. | battery voltage (V) | detected remaining capacity (Ah) | discharged quantity (Ah) | (detected remaining capacity- discharged quantity)/nominal capacity × 100 (%) |
|---|---|---|---|---|---|
| (1) | 1 | 1.203 | 1.1613 | 1.1639 | −0.1677 |
| T = 25° C. | 2 | 1.175 | 0.6870 | 0.6989 | −0.7677 |
| I = 1.0C | 3 | 1.114 | 0.2319 | 0.2339 | −0.1290 |
| (2) | 4 | 1.229 | 1.1681 | 1.1667 | 0.0903 |
| T = 0° C. | 5 | 1.209 | 0.6793 | 0.7018 | −1.4516 |
| I = 0.2C | 6 | 1.168 | 0.2388 | 0.2367 | 0.1355 |
| (3) | 7 | 1.241 | 1.1971 | 1.2000 | −0.1871 |
| T = 40° C. | 8 | 1.220 | 0.7273 | 0.7350 | −0.4968 |
| I = 0.5C | 9 | 1.171 | 0.2668 | 0.2700 | −0.2065 |

What is claimed is:

1. A detecting method for detecting an internal state of an inspective rechargeable battery ($B_a$), said internal state including a deterioration state, an electricity storable capacity, a remaining capacity, and an internal resistance of said inspective rechargeable battery ($B_a$), said detecting method comprising:
   (1) a step in which basic data (BD) of characteristics of a normal non-deteriorated rechargeable battery ($B_n$) as a reference rechargeable battery for said inspective rechargeable battery ($B_a$) are provided; and
   (2) a step in which for said inspective rechargeable battery ($B_a$), a voltage value or/and a current value thereof are measured, and the measured result is compared with said basic data (BD) obtained in said step (1) to judge:
      (i) the inspective rechargeable battery ($B_a$) is short-circuited,
      (ii) the internal resistance of the inspective rechargeable battery ($B_a$) is increased,
      (iii) the electricity storable capacity of the inspective rechargeable battery ($B_a$) is decreased,
      (iv) the electricity storable capacity of the rechargeable battery ($B_a$) is decreased and the internal resistance thereof is increased, or
      (v) the inspective rechargeable battery ($B_a$) is normal.

2. A detecting method for detecting an internal state of an inspective rechargeable battery ($B_a$), said internal state including a deterioration state, an electricity storable capacity, a remaining capacity and an internal resistance of said inspective rechargeable battery ($B_a$), said detecting method comprising:
   (1) a step in which basic data (BD) of characteristics of a normal non-deteriorated rechargeable battery ($B_n$) as a reference rechargeable battery for said inspective rechargeable battery ($B_a$) are provided; and
   (2) a step in which for said inspective rechargeable battery ($B_a$), a voltage value or/and a current value thereof are measured, and the measured result is compared with said basic data (BD) obtained in said step (1) to judge:
      (i) the inspective rechargeable battery ($B_a$) is short-circuited,
      (ii) the internal resistance of the inspective rechargeable battery ($B_a$) is increased,
      (iii) the electricity storable capacity of the inspective rechargeable battery ($B_a$) is decreased,
      (iv) the electricity storable capacity of the rechargeable battery ($B_a$) is decreased and the internal resistance thereof is increased, or
      (v) the inspective rechargeable battery ($B_a$) is normal, after this judgment, a remaining capacity of the inspective rechargeable battery ($B_a$) or a usable capacity thereof with which an instrument can be operated is computed.

3. The detecting method according to claim 1, wherein said basic data (BD) comprises averaged basic data obtained by providing a plurality of normal non-deteriorated rechargeable batteries ($B_n$) and subjecting said plurality of normal non-deteriorated rechargeable batteries ($B_n$) to charging and discharging under various temperature conditions and at various rates of charge or discharge where the battery voltages, and the remaining capacities or the discharged electricity quantities of the normal non-deteriorated rechargeable batteries ($B_n$) are measured and averaging the measured battery voltages and the measured remaining capacities or the measured discharged electricity quantities of the normal non-deteriorated rechargeable batteries ($B_n$).

4. The detecting method according to claim 1, wherein said basic data (BD) are basic data previously obtained by way of computer simulation.

5. The detecting method according to claim 3, wherein said basic data are obtained by way of computer simulation on the basis of said averaged basic data (BD).

6. The detecting method according to claim 1, wherein the inspective rechargeable battery ($B_a$) is judged of whether or nor it is short-circuited, then the inspective rechargeable battery ($B_a$) is judged of whether or not the electricity storable capacity of the battery is decreased or whether or not the internal resistance of the battery is increased.

7. The detecting method according to claim 1, wherein:
  (1) the inspective rechargeable battery ($B_a$) is judged to be short-circuited when the battery falls in any of the following cases (i) to (iv):
    (i) a case where when the inspective rechargeable battery ($B_a$) is paused without subjecting to charging or discharging, the battery has a decrease with the passage of time in the open-circuit voltage,
    (ii) a case where upon charging, an increase in the battery voltage or open-circuit voltage of the inspective rechargeable battery ($B_a$) is smaller than that of the normal rechargeable battery ($B_n$) which is corresponding to the inspective rechargeable battery ($B_a$),
    (iii) a case where in comparison with the normal rechargeable battery ($B_n$), the open-circuit voltage of the inspective rechargeable battery ($B_a$) is smaller than that of the normal rechargeable battery ($B_n$) and a decrease in the battery voltage of the inspective rechargeable battery ($B_a$) upon discharging is greater than that of the normal rechargeable battery ($B_n$), and
    (iv) a case where the internal resistance of the inspective rechargeable battery ($B_a$) is smaller than that of the normal rechargeable battery ($B_n$);
  (2) when the inspective rechargeable battery ($B_a$) is judged to be not short-circuited in the judgment (1) but it falls in any of the following cases (i) to (iii), the inspective rechargeable battery ($B_a$) is judged that the internal resistance is increased:
    (i) a case where the open-circuit voltage of the inspective rechargeable battery ($B_a$) is substantially the same as that of the normal rechargeable battery ($B_n$) but an increase in the battery voltage of the former upon charging is greater than that of the latter,
    (ii) a case where the open-circuit voltage of the inspective rechargeable battery ($B_a$) is substantially the same as that of the normal rechargeable battery ($B_n$) but a decrease in the battery voltage of the former upon discharging is greater than that of the latter, and
    (iii) a case where the internal resistance of the inspective rechargeable battery ($B_a$) is greater than that of the normal rechargeable battery ($B_n$);
  (3) when the inspective rechargeable battery ($B_a$) is judged to be not short-circuited in the judgment (1) but it falls in any of the following cases (i) and (ii), the inspective rechargeable battery ($B_a$) is judged that the electricity storable capacity is decreased:
    (i) a case where an increase in the battery voltage of the inspective rechargeable battery ($B_a$) upon charging and an increase in the open-circuit voltage thereof after the charging are greater than those of the normal rechargeable battery ($B_n$), and
    (ii) a case where a decrease in the battery voltage of the inspective rechargeable battery ($B_a$) upon discharging and a decrease in the open-circuit voltage thereof after the discharging are smaller than those in a case where the inspective rechargeable battery ($B_a$) is short-circuited but they are greater than those of the normal rechargeable battery ($B_n$); and
  (4) when the inspective rechargeable battery ($B_a$) does not fall in any of the cases mentioned in the above judgments (1) to (3), it is judged to be normal.

8. The detecting method according to claim 1, wherein said basic data (BD) include one or more of data or function formulas selected from those mentioned in the following (1) to (5):
  (1) for a non-deteriorated normal rechargeable battery, basic data of a relationship Voc(Q) or Q(Voc) of the open-circuit voltage (Voc) to the remaining capacity (Q) which are obtained by way of measurement or function formulas obtained on the basis of said data;
  (2) for said non-deteriorated normal rechargeable battery when it is in a full-charged state, basic data of relationships between battery voltages (Vd) measured when the rechargeable battery is subjected to discharging at various battery temperatures (T) and at various discharging currents (Id), open-circuit voltages (Voc) measured when the discharging is temporarily suspended, said discharging currents (Id) and said battery temperatures (T) or a function formula Vd(Voc, Id, T) obtained on the basis of said data; and basic data or a function formula of a battery voltage-related function formula Vd(Q, Id, T) or Q(Vd, Id, T) obtained with reference to aforesaid data and aforesaid function formula and also with reference to the data or the function formula of the relationship Voc(Q) of the open-circuit voltage (Voc) to the remaining capacity which are described in the above (1);
  (3) internal resistance-related basic data computed from a relation expression Vd=Voc−Id×Rd or Rd=(Voc−Vd)/Id when the internal resistance of the normal rechargeable battery is made to be Rd in the above (2), or a function formula Rd(Voc, Id, T) or Rd(Vd, Id, T) obtained on the basis of said data, in addition, basic data or a function formula of an internal resistance-related function formula Rd(Q, Id, T) or Q(Rd, Id, T) obtained with reference to aforesaid data and aforesaid function formula of the relationship Voc(Q) of the open-circuit voltage (Voc) which are described in the above (1);
  (4) for the above non-deteriorated normal rechargeable battery when the remaining capacity thereof is zero, data of relationships between battery voltages (Vc) measured when the rechargeable battery is subjected to charging at various battery temperatures (T) and at various charging currents (Ic), open-circuit voltages (Voc) measured when the charging is temporarily suspended, said discharging currents (Ic) and said battery temperatures (T) or a function formula Vc(Voc, Ic, T) obtained on the basis of said data, in addition, data or a function formula of a battery voltage-related function formula Vc(Q, Ic, T) or Q(Vc, Ic, T) obtained with reference to aforesaid data and aforesaid function formula and also with reference to the data or the function formula of the relationship Voc(Q) of the open-circuit voltage (Voc) which are described in the above (1);

(5) internal resistance-related data computed from a relation expression Vc=Voc+Ic×Rc or Rc=(Vc−Voc)/Ic when the internal resistance of the normal rechargeable battery is made to be Rc in the above (4), or a function formula Rc(Voc, Ic, T) obtained on the basis of said data, in addition, data or a function formula of an internal resistance-related function formula Rc(Q, Ic, T) or Q(Rc, Ic, T) obtained with reference to aforesaid data and aforesaid function formula and also with reference to the data or the function formula of the relationship Voc(Q) of the open-circuit voltage (Voc) which are described in the above (1).

9. The detecting method according to claim 1, wherein when the inspective rechargeable battery ($B_a$) is in a paused state, a change with the passage of time in open-circuit voltage (Voc) thereof is measured; the inspective rechargeable battery ($B_a$) is judged to be short-circuited when a decrease rate (−dVoc/dt) of the Voc is greater than a prescribed value $v_0$, that is, $-dVoc/dt > v_0 > 0$, and the inspective rechargeable battery ($B_a$) is judged to be not short-circuited when said increase rate of the Voc is $0 \leq -dVoc/dt \leq v_0$.

10. The detecting method according to claim 8, wherein when the inspective rechargeable battery ($B_a$) is in a paused state without subjecting to charging or discharging, with reference to the data or relation expression of the relation Q(Voc), a remaining capacity of said rechargeable battery is computed.

11. The detecting method according to claim 8, wherein when the inspective rechargeable battery ($B_a$) is in a paused state without subjecting to charging or discharging, said rechargeable battery is judged of whether the battery is normal or deteriorated by measuring a change with the passage of time in the open-circuit voltage (Voc), discharging an electricity quantity $q_1$ of a current value $I_1 \times$ a time $t_1$ from the measured open-circuit voltage, and measuring a battery voltage (V) of said battery duration until said discharging is terminated and an open-circuit voltage (Voc) of said battery after the termination of the discharging.

12. The detecting method according to claim 11, wherein judgment of the inspective rechargeable battery ($B_a$) is performed as will be described below:

(1) when a decrease rate (−dVoc/dt) of the open-circuit voltage (Voc) is greater than a prescribed value $v_0$, that is, $-dVoc/dt > v_0 > 0$, the inspective rechargeable battery ($B_a$) is judged to be short-circuited;

(2) when the inspective rechargeable battery ($B_a$) does not correspond to the above (1), with reference to the basic data mentioned in (1) of claim 8, a remaining capacity $Q_0 = Q(Voc_0)$ when the open-circuit voltage of the normal rechargeable battery ($B_n$) is $Voc_0$ is estimated and an open-circuit voltage $Voc = Voc(Q_0-q_1)$ of the normal rechargeable battery is estimated when an electricity quantity $q_1$ is discharged from $Q_0$, and when a difference between the open-circuit voltage $Voc(Q_0-q_1)$ of the normal rechargeable battery ($B_n$) and the measured open-circuit voltage $Voc_1$ of the inspective rechargeable battery ($B_a$) is $f_0 \leq [Voc(Q_0-q_1)-Voc_1] \leq f_1$ ($f_0 < 0 < f_1$) which is an allowable variation range of the characteristics of the normal rechargeable battery ($B_n$) as a product, the inspective rechargeable battery ($B_a$) is judged to be free of a decrease in the electricity storable capacity; and by assuming that transient characteristics of the battery voltage of the inspective rechargeable battery at an initial stage when discharging for the inspective rechargeable battery is initiated can be expressed by an equation $V = V_1 + (Voc_0-V_1) \times e^{-t/\tau}$ (with V being a battery voltage, t being a discharging time, $V_1$ being a battery voltage of the battery when the discharging time is extrapolated to infinity, and $\tau$ being a time constant decided by an internal resistance or the like of the battery), in accordance with the battery voltage V to a measured discharging time and in accordance with said equation, a time constant $\tau$ when the discharging is initiated at a discharging current $I_1$ from the open-circuit voltage $Voc_0$ and a battery voltage $V_1$ are computed where when the internal resistance of the inspective rechargeable battery is made to be $R_1$, there is obtained an equation $V_1 = Voc_0 - I_1 \times R_1$ or $R_1 = (Voc_0 - V_1)/I_1$; in accordance with this equation, an internal resistance $R_1$ of the $B_a$ inspective rechargeable battery ($B_a$) is estimated, and this internal resistance $R_1$ of the inspective rechargeable battery ($B_a$) is compared with the internal resistance Rd($Voc_0$, $I_1$, T)[or Rd($Q_0$, $I_1$, T)] of the normal rechargeable battery ($B_n$) which is obtained from the function formula Rd(Voc, Id, T) or Rd(Q0, Id, T) mentioned in (3) of claim 8, where judgment is performed as will be described below, (i) when the internal resistance $R_1$ of the inspective rechargeable battery ($B_a$) is substantially the internal resistance Rd($Voc_0$, I1, T) or Rd($Q_0$, $I_1$, T) of the normal rechargeable battery ($B_n$), in other words, when the internal resistance $R_1$ of the inspective rechargeable battery ($B_a$) falls in an allowable variation range of $r_1 \leq [R_1-Rd(Q_0, I_1, T)] \leq r_2 (r_1 < 0 < r_2)$ for the normal rechargeable battery ($B_n$) as a product, the inspective rechargeable battery ($B_a$) is judged that it is normal, and (ii) when the internal resistance $R_1$ of the inspective rechargeable battery ($B_a$) falls in a variation range of $[R_1-Rd(Q_0, I_1, T)] > r_2 (0 < r_2)$, the inspective rechargeable battery ($B_a$) is judged that the internal resistance is increased; and (3) when the inspective rechargeable battery ($B_a$) does not correspond to the above (1) and a difference between the open-circuit voltage $Voc(Q_0-q_1)$ of the normal rechargeable battery ($B_n$) and the measured open-circuit voltage $Voc_1$ of the inspective rechargeable battery ($B_a$) is in a range of $[Voc(Q_0-q_1)-Voc_1] > f_1$ ($0 < f_1$), the inspective rechargeable battery ($B_a$) is judged that the electricity storable capacity is decreased.

13. The detecting method according to claim 12, wherein in the judgment (2)-(ii) of claim 12, when the inspective rechargeable battery ($B_a$) is judged that the internal resistance is increased, for the inspective rechargeable battery, an electricity quantity $q_2$ of a current value $I_2 \times$ a time $t_2$ is discharged from the open-circuit voltage $Voc_1$, where a battery voltage duration until the discharging operation is terminated and an open-circuit voltage $Voc_2$ after the termination of the discharging operation are measured, then by assuming that transient characteristics of the battery voltage of the inspective rechargeable battery ($B_a$) at a initial stage of the commencement of the discharging operation can be expressed by an equation $V=V_2+(Voc_1-V_2)\times e^{-t/\tau}$ (with V being a battery voltage, t being a discharging time, $V_2$ being a battery voltage of the battery when the discharging time t is extrapolated to infinity, and τ being a time constant), in accordance with the battery voltage V to a measured discharging time and in accordance with said equation, a time constant τ when the discharging operation is initiated at a discharging current $I_2$ from the open-circuit voltage $Voc_1$ and a battery voltage $V_2$ are computed, then an internal resistance $R_2$ of the inspective rechargeable battery at this time is computed from an equation $V_2=Voc_1-I_2\times R_2$ or $R_2=(Voc_1-V_2)/I_2$, successively by assuming that the internal resistance of the inspective rechargeable battery ($B_a$) is increased from the internal resistance Rd(Q, Id, T) of the normal rechargeable battery ($B_n$) to a×Rd(Q, Id, T)+b (where each of a and b is a constant) and in accordance with an equation $R_1-[a\times Rd(Q_0, I_1, T)+b]=0$ (where each of a and b is a constant) and an equation $R_2-[a\times Rd(Q_0-q_1, I_2, T)+b]=0$ (where each of a and b is a constant) or an equation $R_2-[a\times Rd(Q_1, I_2, T)+b]=0$ (where each of a and b is a constant) using $Q_1=Q_0-q_1=Q(Voc_1)$, the constant a and the constant b are computed to estimate a value of the increased internal resistance Rd'=a×Rd(Q, Id, T)+b.

14. The detecting method according to claim 12, wherein in the judgment (3) of claim 12, when the inspective rechargeable battery ($B_a$) is judged that the electricity storable capacity is decreased, by assuming that the electricity storable capacity C' of the inspective rechargeable battery is D times the electricity storable capacity C of the normal rechargeable battery (where D is a constant and is 0<D<1) and making the remaining capacity $Q_0'$ of the inspective rechargeable battery to be $Q_0'=Q_0\times D$ (where $Q_0$ is a remaining capacity of the normal rechargeable battery ($B_n$), and D is a constant and is 0<D<1) and with reference to the remaining capacity $Q_0$ of the normal rechargeable battery which is corresponding to the open-circuit voltage $Voc_0$ of the inspective rechargeable battery, the remaining capacity $Q_0'=Q_0\times D$ of the inspective rechargeable battery, the remaining capacity $Q_1$ of the normal rechargeable battery which is corresponding to the open-circuit voltage $Voc_1$ of the inspective rechargeable battery, and the remaining capacity $Q_1'=Q_0'-q_1=Q_1\times D$ of the inspective rechargeable battery and also with reference to function formulas $Voc(Q)=Voc(Q_0'/D)=Voc_0$ and $Voc(Q_1)=Voc(Q_1'/D)=Voc(Q_0'/D-q_1/D)=Voc_1$ which are obtained on the basis of the basic data mentioned in (1) of claim 8, a value of the constant D and a value of the remaining capacity $Q_1'=Q_0'-q_1=Q_1\times D$ are estimated, where judgment of the inspective rechargeable battery is performed as will be described below, (i) when a difference between the internal resistance $R_1$ computed in the (2) of claim 12 and an internal resistance $Rd(Q_0'/D, I_1, T)$ estimated from the above basic data falls in a range of $r_1 \leq [R_1-Rd(Q_0'/D, I_1, T)] \leq r_2$ ($r_1<0<r_2$), the inspective rechargeable battery is judged that the internal resistance is not increased but the electricity storable capacity is decreased, and (ii) when said difference falls in a range of $[R_1-Rd(Q_0'/D, I_1, T)]>r_2(0<r_2)$, the inspective rechargeable battery is judged that the internal resistance is increased and the electricity storable capacity is decreased;

then, for the inspective rechargeable battery, an electricity quantity $q_1$ of a current value $I_1\times$a time $t_1$ is discharged from the open-circuit voltage $Voc_0$, followed by discharging an electricity quantity $q_2$ of a current value $I_2\times$a time $t_2$, where a battery voltage of the inspective rechargeable battery duration until the discharging operation is terminated and an open-circuit voltage $Voc_2$ after the termination of the discharging operation are measured, and by assuming that transient characteristics of the battery voltage of the inspective rechargeable battery at a initial stage of the commencement of the discharging operation can be expressed by an equation $V=V_2+(Voc_1-V_2)\times e^{-t/\tau}$ (with V being a battery voltage, t being a discharging time, $V_2$ being a battery voltage of the battery when the discharging time t is extrapolated to infinity, and τ being a time constant), in accordance with the battery voltage V to a measured discharging time and in accordance with said equation, a time constant τ when the discharging operation is initiated at a discharging current $I_2$ from the open-circuit voltage $Voc_1$ and a battery voltage $V_2$are computed, then an internal resistance $R_2$ of the inspective rechargeable battery at this time is computed from an equation $V_2=Voc_1-I_2\times R_2$ or $R_2=(Voc_1-V_2)/I_2$, successively by assuming that the internal resistance of the inspective rechargeable battery is increased from the internal resistance Rd(Q, Id, T) of the normal rechargeable battery to a×Rd(Q, Id, T)+b (where each of a and b is a constant) and in accordance with an equation $R_1-[a\times Rd(Q_0, I_1, T)+b]=0$ (where each of a and b is a constant) and an equation $R_2-[a\times Rd(Q_1,I_2,T)+b]=R_2-[a\times Rd(Q_0-q_1/D, I_2, T)+b=0$ (where each of a and b is a constant) [where $Q_0=Q_0'/D$, $Q_1=Q_0-q_1/D=Q_1'/D$, and $Q_0'$ and $Q_1'$ are a remaining capacity when the open-circuit voltage is $Voc_0$ and a remaining capacity when the open-circuit voltage is $Voc_1$ respectively], the constant a and the constant b are computed to estimate a value of the increased internal resistance Rd'=a×Rd(Q'/D, Id, T)+b (where Q' is a true remaining capacity when the electricity storable capacity is decreased) of the inspective rechargeable battery, whereby a deteriorated state and a remaining capacity of the inspective rechargeable are capable of being detected.

15. The detecting method according to claim 8 or 10, wherein for the inspective rechargeable battery which is in a paused state without subjecting to charging or discharging, after an open-circuit voltage Voc thereof is measured, charging for said rechargeable battery is started at a charging voltage $Ic_1$ where a battery voltage Vc of the battery is measured, followed by charging an electricity quantity $q_1$ of a time $t_1\times$a charge-and-discharge efficiency Eff where the charging operation is terminated when the battery voltage of the battery becomes $Vc_1$, where a change with the passage of time in the open-circuit voltage Voc of the battery is measured and a stable open-circuit voltage of the battery is made to be $Voc_1$.

16. The detecting method according to claim 8, wherein for the inspective rechargeable battery which is in a paused state without subjecting to charging or discharging, after an open-circuit voltage Voc thereof is measured, charging for said rechargeable battery is started at a charging voltage $Ic_1$ where a battery voltage Vc of the battery is measured, followed by charging an electricity quantity $q_1$ of a time $t_1\times$a charge-and-discharge efficiency Eff where the charging operation is terminated when the battery voltage of the battery becomes $Vc_1$, where an open-circuit voltage $Voc_1$ of the battery after an elapse of a prescribed period of time is measured.

17. The detecting method according to claim 15 or 16, wherein:

(1) when the inspective rechargeable battery falls in any of the following cases (i) to (iii), the inspective battery is judged to be short-circuited;

(i) a case where with reference to the basic data mentioned in (1) of claim 8, a remaining capacity $Q_0$ of the normal rechargeable battery when the open-circuit voltage of the normal rechargeable battery is $Voc_0$ is estimated, and when a difference between an open-circuit voltage $Voc(Q_0+q_1)$ of the normal rechargeable battery which is estimated with reference to the basic data mentioned in (1) of claim 8 and the open-circuit voltage $Voc_1$ of the inspective rechargeable battery falls in a range of $[Voc(Q_0+q_1)-Voc_1] > g_1 (g_1>0)$, (ii) a case where a difference between a battery voltage $Vc(Q_0+q_1, Ic_1, T)$ of the normal rechargeable battery which is estimated with reference to the basic data mentioned in (4) of claim 8 and the battery voltage $Vc_1$ of the inspective rechargeable battery falls in a range of $[Vc(Q_0+q_1, Ic_1, T)-Vc_1] > j_1 (j_1>0)$, and (iii) a case where a difference between an internal resistance $Rc(Voc_0, Ic, T)$ of the normal rechargeable battery which is estimated with reference to the basic data mentioned in (5) of claim 8 and an internal resistance $Rc_1$ of the inspective rechargeable battery which is obtained in accordance with the equation $Rc_1=(Vc_1-Voc_1)/Ic_1$ falls in a range of $[Rc_1-Rc(Voc_1, Ic_1, T)] < z_1 (z_1<0)$;

(2) when the difference between the open-circuit voltage $Voc(Q_0+q_1)$ of the normal rechargeable battery and the open-circuit voltage $Voc_1$ of the inspective rechargeable in the above (1)-(i) falls in a range of $g_0 \leq [Voc(Q_0+q_1)-Voc_1] \leq g_1 (g_0<0<g_1)$, the inspective rechargeable battery is judged that the electricity storable capacity is not decreased, then by assuming that transient characteristics of the battery voltage (Vc) of the inspective rechargeable battery at an initial stage when the charging operation for the battery is commenced can be expressed by the equation $$Vc=V_1-(V_1-Voc_0)\times e^{-t/\tau}$$

(with t being a charging time, $V_1$ being a battery voltage of the battery when the charging time is extrapolated to infinity, and $\tau$ being a time constant) and in accordance with the battery voltage Vc to a measured charging time t and in accordance with said equation, a time constant $\tau$ when the charging operation is initiated at a charging current $Ic_1$ from the open-circuit voltage $Voc_0$ and a battery voltage $V_1$ are computed, and a difference between an internal resistance $Rc_1$ of the inspected rechargeable battery which is obtained in accordance with the equation $V_1=Voc_0+Ic_1\times Rc_1$ or $Rc_1=(V_1-Voc_0)/Ic_1$ and an internal resistance $Rc(Voc_0, Ic_1, T)$ or $Rc(Q_0, Ic_1, T)$ of the normal rechargeable battery which is estimated with reference to the basic data mentioned in (5) of claim 8 is subjected to a judgment of the inspective rechargeable battery as will be described below;

(i) when said difference falls in a range of $z_1 \leq [Rc_1-Rc(Q_0, Ic_1, T)] \leq z_2 (z_1<0<z_2)$ or a range of $j_1 \leq [Vc_1-Vc(Q_0+q_1, Ic_1, T)] \leq j_2 (j_1<0<j_2)$, the inspective rechargeable battery is judged to be normal, (ii) when said difference falls in a range of $[Rc_1-Rc(Q_0, Ic_1, T)] > z_2 (0<z_2)$ or a range of $j_2 < [Vc_1-Vc(Q_0+q_1, Ic, T)] (0<j_2)$, the rechargeable battery is judged that the internal resistance is increased, and (iii) when said difference falls in a range of $[Voc(Q_0+q_1)-Voc_1] < g_0 (g_0<0)$, the rechargeable battery is judged that the electricity storable capacity is decreased, whereby a deteriorated state and a remaining capacity of the inspective rechargeable battery is capable of being detected.

18. The detecting method according to claim 17, wherein in the judgment (2)-(ii) of claim 17, when the inspective rechargeable battery is judged that the internal resistance is increased, for the inspective rechargeable battery which is in a paused state, charging is performed at least two times, that is, an electricity quantity q1 of a current value $Ic_1\times$a time $t_1$ is charged from the battery voltage $Voc_0$, followed by charging an electricity quantity q2 of a current value $Ic_2\times$a time $t_2$ where a battery voltage Vc of the inspective rechargeable battery duration until the charging operation is terminated and an open-circuit voltage $Voc_2$ of the inspective rechargeable battery after the termination of the charging operation are measured, then by assuming that transient characteristics of the battery voltage of the inspective rechargeable battery at a initial stage of the commencement of the charging operation can be expressed by an equation $Vc=V_2-(V_2-Voc_1)\times e^{-t/\tau}$ (with Vc being a battery voltage, t being a discharging time, $V_2$ being a battery voltage of the battery when the discharging time t is extrapolated to infinity, and $\tau$ being a time constant) and in accordance with the battery voltage V to a measured discharging time and in accordance with said equation, a time constant $\tau$ when the charging operation is initiated at a discharging current $Ic_2$ from the open-circuit voltage $Voc_1$ and a battery voltage $V_2$ are computed, then an internal resistance $Rc_2$ of the inspective rechargeable battery at this time is computed from an equation $V_2=Voc_1+Ic_2\times Rc_2$ or $Rc_2=(V_2-Voc_1)/Ic_2$, successively by assuming that the internal resistance of the inspective rechargeable battery is increased from the internal resistance $Rc(Q, Ic, T)$ of the normal rechargeable battery to $a\times Rc(Q, Ic, T)+b$ (where each of a and b is a constant) and in accordance with an equation $Rc_1-[a\times Rc(Q_0, Ic_1, T)+b]=0$ (where each of a and b is a constant) and an equation $Rc_2-[a\times Rc(Q_0+q_1, Ic_2, T)+b]=0$ (where each of a and b is a constant) or an equation $Rc_2-[a\times Rc(Q_1, Ic_2, T)+b]=0$ (where each of a and b is a constant) using $Q_1=Q(Voc_1)$, the constant a and the constant b are computed to estimate a value of the increased internal resistance $Rc'=a\times Rc(Q, Ic, T)+b$, whereby a deteriorated state and a remaining capacity of the inspective rechargeable battery are capable of being detected.

19. The detecting method according to claim 17, wherein in the judgment (2)-(iii) of claim 17, when the inspective rechargeable battery is judged that the electricity storable capacity is decreased, by assuming that the electricity storable capacity C' of the inspective rechargeable battery is D times the electricity storable capacity C of the normal rechargeable battery (where D is a constant and is 0<D<1) and making the remaining capacity $Q_0'$ of the inspective rechargeable battery to be $Q_0'=Q_0\times D$ (where $Q_0$ is a remaining capacity of the normal rechargeable battery, and D is a constant and is 0<D<1) and with reference to the remaining capacity $Q_0$ of the normal rechargeable battery which is corresponding to the open-circuit voltage $Voc_0$ of the inspective rechargeable battery, the remaining capacity $Q_0'=Q_0\times D$ of the inspective rechargeable battery, the remaining capacity $Q_1$ of the normal rechargeable battery which corresponds to the open-circuit voltage $Voc_1$ of the inspective rechargeable battery, and the remaining capacity $Q_1'=Q_0'+q_1=Q_1\times D$ of the inspective rechargeable battery and also with reference to function formulas $Voc(Q_0)=Voc(Q_0'/D)=Voc_0$ and $Voc(Q_1)=Voc(Q_1'/D)=Voc(Q_0'/D+q_1/D)=Voc_1$ which are obtained on the basis of the basic data mentioned in (1) of claim 8, a value of the constant D and a value of the remaining capacity $Q_1'=Q_0'+q_1=Q_1\times D$ are estimated, where judgment of the inspective rechargeable battery is performed as will be described below, (i) when a difference between the internal resistance $Rc_1$ computed in the (2) of claim 17 and an internal resistance $Rc(Q_0'/D, Ic_1, T)$ estimated from the above basic data falls in a range of $z_1 \leq [Rc_1 - Rc(Q_0'/D, Ic_1, T)] \leq z_2$ ($z_1 < 0 < z_2$), the inspective rechargeable battery is judged that the internal resistance is not increased but the electricity storable capacity is decreased, and (ii) when said difference falls in a range of $[Rc_1 - Rc(Q_0'/D, Ic_1, T)] > z_2 (0 < z_2)$, the inspective rechargeable battery is judged that the internal resistance is increased and the electricity storable capacity is decreased;

then, for the inspective rechargeable battery, an electricity quantity $q_2$ of a current value $Ic_2 \times a$ time $t_2$ is charged from the open-circuit voltage $Voc_1$, where a battery voltage of the inspective rechargeable battery duration until the charging operation is terminated and an open-circuit voltage $Voc_2$ after the termination of the charging operation are measured, and by assuming that transient characteristics of the battery voltage of the inspective rechargeable battery at a initial stage of the commencement of the charging operation can be expressed by an equation $Vc = V_2 - (V_2 - Voc_1) \times e^{-t/\tau}$ (with $Vc$ being a battery voltage, $t$ being a charging time, $V_2$ being a battery voltage of the battery when the charging time $t$ is extrapolated to infinity, and $\tau$ being a time constant), in accordance with the battery voltage $Vc$ to a measured charging time $t$ and in accordance with said equation, a time constant $\tau$ when the charging operation is initiated at a charging current $Ic_2$ from the open-circuit voltage $Voc_1$ and a battery voltage $V_2$ are computed, then an internal resistance $Rc_2$ of the inspective rechargeable battery at this time is computed from an equation $V_2 = Voc_1 + Ic_2 \times Rc_2$ or $Rc_2 = (V_2 - Voc_1)/Ic_2$, successively by assuming that the internal resistance of the inspective rechargeable battery is increased from the internal resistance $Rc(Q_0'/D, Ic, T)$ of the normal rechargeable battery to $a \times Rc(Q_0'/D, Ic, T) + b$ (where each of a and b is a constant) and in accordance with an equation $Rc_1 - [a \times Rc(Q_0'/D, Ic_1, T) + b] = 0$ (where each of a and b is a constant) and an equation $Rc_2 - [a \times Rc(Q_0'/D + q_1/D, Ic_2, T) + b] = 0$ or an equation $Rc_2 - [a \times Rd(Q_1'/D, Ic_2, T) + b] = 0$ (where each of a and b is a constant) using $Q_1 = Q_1'/D = Q(Voc_1)$, the constant a and the constant b are computed to estimate a value of the increased internal resistance $Rc' = a \times Rc(Q'/D, Ic, T) + b$ (where Q' is a true remaining capacity when the electricity storable capacity is decreased) of the inspective rechargeable battery, whereby a deteriorated state and a remaining capacity of the inspective rechargeable are capable of being detected.

20. The detecting method according to claim 1, wherein the inspective rechargeable battery is subjected to charging and the charging operation is terminated at a battery voltage $Vc_E$, where a change with the passage of time in the open-circuit voltage $Voc$ of the battery is detected.

21. The detecting method according to claim 1, wherein the inspective rechargeable battery is subjected to charging and the charging operation is terminated at a battery voltage $Vc_E$, where an open-circuit voltage $Voc_E$ of the battery after an elapse of a prescribed period of time is detected.

22. The detecting method according to claim 20, wherein a time t since the termination of the charging operation and an open-circuit voltage $Voc$ of the inspective rechargeable battery at that time are measured, by making an open-circuit voltage of the inspective rechargeable battery when the open-circuit voltage $Voc$ becomes to be a steady state to be $Voc_E$ and assuming that the open-circuit voltage $Voc$ can be expressed by an equation $Voc = Voc_E + (Vc_E - Voc_E) \times e^{-t/\tau}$ (with $Voc$ being an open-circuit voltage, t being a time, $Voc_E$ being an open-circuit voltage when the time t is extrapolated to infinity, and $\tau$ being a time constant), in accordance with this equation and from the $Voc$ values measured at a plurality of time points, a time constant $\tau$ is computed and a value of the $Voc_E$ is estimated.

23. The detecting method according to claim 20 or 21, wherein the inspective rechargeable battery is judged to be short-circuited when the inspective rechargeable battery falls in any of the following cases (i) and (ii);

(i) a case where a change with the passage of time in the open-circuit voltage $Voc$ of the inspective rechargeable battery, namely, a decrease rate $(-dVoc/dt)$ of the open-circuit voltage is greater than that $(v_e)$ of the corresponding normal rechargeable battery, that is, $-dVoc_E/dt > v_e > 0$, and (ii) a case where the charge termination voltage $Vc_E$ of the inspective rechargeable battery is smaller than that $(m_0)$ of the corresponding normal rechargeable battery, that is, $Vc_E < m_0 (0 < m_0)$.

24. The detecting method according to claim 1, wherein the inspective rechargeable battery is charged by a constant current-constant voltage charging method wherein the inspective rechargeable battery is charged at a prescribed constant current value until the battery voltage reaches a prescribed upper limit battery voltage $Vc_L$ and following this constant current discharging operation, the inspective rechargeable battery whose battery voltage is $Vc_L$ is charged at a constant voltage $Vc_L$ and after an elapse of a prescribed period of time, the charging operation is terminated, where the inspective rechargeable battery is judged with respect to internal state while comparing with a normal rechargeable battery corresponding to the inspective rechargeable battery as will be described below:

(1) when the inspective rechargeable battery falls in any of the following cases (i) to (iii), the inspective rechargeable battery is judged to be short-circuited;

(i) a case where a change $(-dVoc_E/dt)$ with the passage of time in the open-circuit voltage $(Voc_E)$ of the inspective rechargeable battery after full-charging in the constant current-constant voltage charging operation is greater than that $(v_e)$ of the corresponding normal rechargeable battery, that is, $-dVoc_E/dt > v_e > 0$, (ii) a case where the battery voltage $(Vc_E)$ of the inspective rechargeable battery when the entire charging operation is terminated is smaller than that $(m_0)$ of the corresponding normal rechargeable battery, that is, $Vc_E < m_0 (0 < m_0)$, and (iii) a case where an increase rate $(dVc/dt)$ of the battery voltage $(Vc)$ of the inspective rechargeable battery upon the constant current charging operation is smaller than that $(S_0)$ of the corresponding normal rechargeable battery, that is, $dVc/dt < S_0 (0 < s_0)$;

(2) when an increase rate $(dVc/dt)$ of the battery voltage $(Vc)$ of the inspective rechargeable battery upon the constant current charging is greater than that $(s_1)$ the corresponding normal rechargeable battery, that is, $dVc/dt > s_1 > 0$, and the open-circuit voltage $(Voc_E)$ of the inspective rechargeable battery after full-charging in the constant current-constant voltage charging operation is smaller than that $(Voc_n)$ of the corresponding normal rechargeable battery, that is, $0 < Voc_E < Voc_n$, the inspective rechargeable battery is judged that the internal resistance is increased;

(3) when a period of time consumed to reach the upper limit voltage $(Vc_L)$ from the prescribed battery voltage in the constant current charging operation for the inspective rechargeable batter is shorter than that for the corresponding normal rechargeable battery or an increase rate (dVc/dt) of the battery voltage (Vc) of the inspective rechargeable battery in the constant current charging is greater than that ($s_1$) of the corresponding normal rechargeable battery, that is, $dVc/dt > s_1 > 0$, and the open-circuit voltage ($Voc_E$) of the inspective rechargeable battery after full-charging in the constant current-constant voltage charging operation is greater than that ($Voc_n$) of the corresponding normal rechargeable battery, that is, $Voc_E \geq Voc_n > 0$, the inspective rechargeable battery is judged that the electricity storable capacity is decreased;

(4) when a period of time consumed to reach the upper limit voltage ($Vc_L$) from the prescribed battery voltage in the constant current charging for the inspective rechargeable batter is substantially the same as that for the corresponding normal rechargeable battery or an increase rate (dVc/dt) of the battery voltage (Vc) of the inspective rechargeable battery in the constant current charging operation is substantially the same as that ($s_1$) of the corresponding normal rechargeable battery, that is, $s_0 \leq dVc/dt \leq s_1 (0<s_0<s_1)$, and the open-circuit voltage ($Voc_E$) of the inspective rechargeable battery after full-charging in the constant current-constant voltage charging operation is substantially the same as or greater than that ($Voc_n$) of the corresponding normal rechargeable battery, that is, $0<Voc_n \leq Voc_E$, the inspective rechargeable battery is judged to be normal;

whereby the internal state of the inspective rechargeable battery is capable of being detected.

25. The detecting method according claim 1, wherein when constant current charging for the inspective rechargeable battery is terminated by detecting a battery voltage thereof, a change with the passage of time in the battery voltage, a battery temperature of the battery or a change with the passage of time in the battery temperature, (1) when the inspective rechargeable battery falls in any of the following cases (i) to (iii), the inspective rechargeable battery is judged to be short-circuited:

(i) a case where a change ($-dVoc_E/dt$) with the passage of time in the open-circuit voltage ($Voc_E$) of the inspective rechargeable battery after full-charging is greater than that ($v_e$) of a normal rechargeable battery corresponding to the inspective rechargeable battery and having been subjected to the constant current charging in the same manner as the inspective rechargeable battery, that is, $-dVoc_E/dt > v_e > 0$, (ii) a case where an increase rate (dT/dt) of the battery temperature (T) of the inspective rechargeable battery upon the constant current charging operation is greater than that ($u_0$) of the corresponding normal rechargeable battery, that is, $dT/dt > u_0 > 0$, and (iii) a case where an increase rate (dVc/dt) of the battery voltage (Vc) of the inspective rechargeable battery upon the constant current charging operation is smaller than that ($s_0$) of the corresponding normal rechargeable battery, that is, $0 < dVc/dt < s_0$;

(2) when an increase rate (dVc/dt) of the battery voltage (Vc) of the inspective rechargeable battery upon the constant current charging operation is greater than that ($s_1$) of the corresponding normal rechargeable battery, that is, $dVc/dt > s_1 > 0$, and an open-circuit voltage ($Voc_E$) of the inspective rechargeable battery after the termination of the constant current charging operation is smaller than that ($Voc_n$) of the corresponding normal rechargeable battery, that is, $0<Voc_E<Voc_n$, the inspective rechargeable battery is judged that the internal resistance is increased;

(3) when an increase rate (dVc/dt) of the battery voltage (Vc) of the inspective rechargeable battery during the constant current charging operation is greater than that ($s_1$) of the corresponding normal rechargeable battery, that is, $dVc/dt > s_1 > 0$, and an open-circuit voltage ($Voc_E$) of the inspective rechargeable battery after the termination of the constant current charging operation is greater than that ($Voc_n$) of the corresponding normal rechargeable battery, that is, $Voc_E > Voc_n (0 < Voc_n)$, the inspective rechargeable battery is judged that the electricity storable capacity is decreased;

(4) when an increase rate (dVc/dt) of the battery voltage (Vc) of the inspective rechargeable battery during the constant current charging operation is substantially the same as that ($s_1$) of the corresponding normal rechargeable battery, that is, $s_0 \leq dVc/dt \leq s_1 (0<s_0<s_1)$, and an open-circuit voltage ($Voc_E$) of the inspective rechargeable battery after the termination of the constant current charging operation is substantially the same as or greater than that ($Voc_n$) of the corresponding normal rechargeable battery, that is, $0<Voc_n \leq Voc_E$, the inspective rechargeable battery is judged to be normal;

whereby the internal state of the inspective rechargeable battery is capable of being detected.

26. The detecting method according to claim 1, wherein when constant current charging for the inspective rechargeable battery is terminated after an elapse of a prescribed period of time since the commencement of the constant current charging or when the battery voltage of the inspective rechargeable battery reaches a prescribed upper limit voltage ($Vc_L$), (1) when the inspective rechargeable battery falls in any of the following cases (i) to (iii), the inspective rechargeable battery is judged to be short-circuited:

(i) a case where a change ($-dVoc_E/dt$) with the passage of time in the open-circuit voltage ($Voc_E$) of the inspective rechargeable battery after full-charging is greater than that ($v_e$) of a normal rechargeable battery corresponding to the inspective rechargeable battery and having been subjected to the constant current charging in the same manner as the inspective rechargeable battery, that is, $-dVoc_E/dt > v_e > 0$, (ii) a case where a battery voltage ($Vc_E$) of the inspective rechargeable battery upon the termination of the constant current charging operation is smaller than that ($m_0$) of the corresponding normal rechargeable battery, that is, $Vc_e < m_0 (m_0 > 0)$, and (iii) a case where an increase rate (dVc/dt) of the battery voltage (Vc) of the inspective rechargeable battery upon the constant current charging operation is smaller than that ($s_0$) of the corresponding normal rechargeable battery, that is, $0<dVc/dt <s_0$;

(2) when an increase rate (dVc/dt) of the battery voltage (Vc) of the inspective rechargeable battery during the constant current charging operation is greater than that ($s_1$) of the corresponding normal rechargeable battery, that is, $dVc/dt > s_1 > 0$, and an open-circuit voltage ($Voc_E$) of the inspective rechargeable battery after the termination of the constant current charging operation is smaller than that ($Voc_n$) of the corresponding normal rechargeable battery, that is, $0<Voc_E \leq Voc_n$, the inspective rechargeable battery is judged that the internal resistance is increased;

(3) when an increase rate (dVc/dt) of the battery voltage (Vc) of the inspective rechargeable battery during the constant current charging operation is greater than that ($s_1$) of the corresponding normal rechargeable battery, that is, $dVc/dt > s_1 > 0$, and an open-circuit voltage ($Voc_E$) of the inspective rechargeable battery after the termination of the constant current charging operation is greater than that ($Voc_n$) of the corresponding normal rechargeable battery, that is, $Voc_E > Voc_n$ ($0 < Voc_n$), the inspective rechargeable battery is judged that the electricity storable capacity is decreased;

(4) when an increase rate ($dVc/dt$) of the battery voltage (Vc) of the inspective rechargeable battery during the constant current charging operation is substantially the same as that ($s_1$) of the corresponding normal rechargeable battery, that is, $s_0 \leq dVc/dt \leq s_1 (0 < s_0 < s_1)$, and an open-circuit voltage ($Voc_E$) of the inspective rechargeable battery after termination of the constant current charging operation is substantially the same as or greater than that ($Voc_n$) of the corresponding normal rechargeable battery, that is, $0 < Voc_n \leq Voc_E$, the inspective rechargeable battery is judged to be normal;

whereby the internal state of the inspective rechargeable battery is capable of being detected.

27. The detecting method according to claim 1, wherein when the inspective rechargeable battery is in a state that it is being subjected to discharging, the inspective rechargeable battery is judged to be in a last stage where a residual electricity quantity capable of being discharged is little or to be short-circuited when the battery voltage is less than a prescribed voltage value from the basic data of a normal rechargeable battery corresponding to the inspective rechargeable battery or when a decrease rate ($-dVd/dt$) of the battery voltage (Vd) is greater than a prescribed value ($x_1$) from said basic data, that is, $-dVd/dt > x_1 (0 < x_1)$.

28. The detecting method according to claim 1, wherein when the inspective rechargeable battery is in a state that it is being subjected to discharging, a discharging current ($Id_0$) of the discharging operation and a battery voltage (Vd) of the inspective rechargeable battery are measured, where when the battery voltage (Vd) is greater than a prescribed voltage value the basic data of a normal rechargeable battery corresponding to the inspective rechargeable battery or when a decrease rate ($-dVd/dt$) of the battery voltage (Vd) is less than a prescribed value ($x_1$) from said basic data, that is, $0 < -dVd/dt\ x_1$, the inspective rechargeable battery is judged to be normal or to be in a deterioration mode other than short-circuit.

29. The detecting method according to claim 28, wherein when the inspective rechargeable battery is in a substantially steady state while being subjected to discharging where a discharging current of the discharging operation is $Id_0$, a battery temperature of the inspective rechargeable battery is T and a battery voltage of the inspective rechargeable battery is $Vd_0$ where a remaining capacity of the battery is $Q_0$ and after an electricity quantity q is discharged, the battery voltage of the inspective rechargeable battery in the steady state becomes to be $Vd_1$ at a discharging current $Id_1$, with reference to the basic data mentioned in (1) and (2) of claim 8, a battery voltage $Vd_0 = Vd(Q_0, Id_0, T)$ and a remaining capacity $Q_0 = Q(Vd_0, Id_0, T)$ of the normal rechargeable battery when the battery voltage is $Vd_0$ are estimated and a battery voltage $Vd(Q_0-q, Id_1, T)$ when the remaining capacity becomes $(Q_0-q)$ from $Q_0$ and a remaining capacity $Q(Vd_1, Id_1, T)$ of the normal rechargeable battery when the battery current is $Id_1$ and the battery voltage is $Vd_1$ are estimated, and the inspective rechargeable battery is subjected as will be described below:

(1)(i) when $y_1 \leq [Vd_1 - Vd(Q_0-q, Id_1, T)] \leq y_2 (y_1 < 0 y_2)$ or (ii) when $w_1 \leq Q(Vd_1, Id_1, T) - [Q(Vd_0, Id_0, T)-q] \leq w_2$ ($w_1 < 0 < w_2$), the inspective rechargeable battery is judged to be normal;

(2)(i) when $[Vd_1 - Vd(Q_0-q, Id_1, T)] > y_2 (0 < y_2)$ or (ii) when $Q(Vd_1, Id_1, T) - [Q(Vd_0, Id_0, T)-q] > w_2 (0 < w_2)$, the inspective rechargeable battery is judged that the internal resistance is increased; and (3)(i) when $[Vd_1 - Vd(Q_0-q, Id_1, T)] < y_1 (y_1 < 0)$ or (ii) when $Q(Id_1, Vd_1, T) - [Q(Id_0, Vd_0, T)-q] < w_1 (w_1 < 0)$, the inspective rechargeable battery is judged that the electricity storable capacity is decreased;

whereby the internal state of the inspective rechargeable battery is capable of being detected.

30. The detecting method according to claim 29, wherein for the inspective rechargeable battery in the substantially steady state where the discharging current is a steady discharging current of $I_{no}$ and the battery voltage is $V_{no}$, when the discharging current is changed n-times (with n being a positive integer of 1, 2, 3, 4, . . . ) such that the discharging current is changed to $I_{n1}$ from $I_{no}$ and an electricity quantity $q_n$ of a current value $I_{n1} \times$ a time $t_{n1}$ is discharged and thereafter, the discharging current is returned to the steady discharging current $I_{no}$, battery voltages (V) at a plurality of time points upon changes in the discharging current are measured and by assuming that transient characteristics of the battery voltage (V) when the discharging current is changed can be expressed by an equation $V = V_{n1} + (V_{no} - V_{n1}) \times e^{-t/\tau}$ (with t being a discharging time, $V_{n1}$ being a battery voltage of the battery when the discharging time t is extrapolated to infinity, $\tau$ being a time constant, and n is a positive integer of 1, 2, 3, 4, . . . ), and in accordance with the measured battery voltages V to the time t since the time when the discharging current is changed and in accordance with said equation, the time constant $\tau$ is estimated and a true value of the $V_{n1}$ is estimated, whereby the internal state of the rechargeable battery is detected.

31. The detecting method according to claim 30, wherein in a case where the discharging current for the inspective rechargeable battery is changed at least three times such that when the battery voltage in the steady discharging at a discharging current $I_{10}$ is $V_{10}$, the discharging current is changed to $I_{11}$ and an electricity quantity $q_1$ of a current value $I_{11} \times$ a time $t_{11}$ from the battery voltage $V_{10}$ is discharged where the battery voltage is changed to $V_{20}$ from $V_{10}$, then, the discharging current $I_{20}$ of the steady discharging is changed to $I_{21}$ and an electricity quantity $q_2$ of a current value $I_{21} \times$ a time $t_{21}$ is discharged from the battery voltage $V_{20}$ where the battery voltage is changed to $V_{30}$ from $V_{20}$, and the discharging current $I_{30}$ of the steady discharging is changed to $I_{31}$ and an electricity quantity $q_3$ of a current value $I_{31} \times$ a time $t_{31}$ is discharged from the battery voltage $V_{30}$ where the battery voltage is changed to $V_{40}$ from $V_{30}$, wherein as a result that the discharging current $I_{n0}$ of the steady discharging is changed to $I_{n1}$ and an electricity quantity $q_n$ of a current value $I_{n1} \times$ a time $t_{n1}$ is discharged, when the inspective rechargeable battery is judged that the internal resistance is increased in (2) of claim 29, then, by assuming that the internal resistance of the inspective rechargeable battery is changed from the internal resistance $Rd(Q, Id, T)$ of the corresponding normal rechargeable battery to an internal resistance $Rd'(Q, Id, T) = a \times Rd(Q, Id, T) + b$ (where each of a and b is a constant) and also assuming that transient characteristics of the battery voltage in every change in the discharging current can be expressed by an equation $V = V_{n1} + (V_{no} - V_{n1}) \times e^{t/\tau}$ (with t being a discharging time, $V_{n1}$ being a battery voltage of the battery when the discharging time t is extrapolated to infinity, τ being a time constant, and n is a positive integer of 1, 2, 3, 4, . . . ), in accordance with the measured battery voltages V to the time t since the time when the discharging current is changed and in accordance with said equation, the time constant τ when the discharging current $I_{n0}$ is changed to $I_{n1}$ is estimated and a true value of the $V_{n1}$ is estimated, further, an open-circuit voltage $Voc_{n0}$ of the inspective rechargeable battery having a remaining capacity $Q_{no}$ when the discharging current is $I_{no}$ and the battery voltage is expressed to be $Voc_{n0}=V_{n0}+I_{n0}\times Rd'(Q_{n0}, I_{n0}, T)=V_{n1}+I_{n1}\times Rd'(Q_{n0}, I_{n1}, T)$[where n=1, 2, 3, . . . ], and when the remaining capacities when battery voltages are $V_{10}$, $V_{20}$, and $V_{30}$ are made to be $Q_{10}$, $Q_{20}$, and $Q_{30}$, the following relationships are established:

$Q_{20}=Q_{10}-q_1$ $Q_{30}=Q_{20}-q_2=Q_{10}31\ q_1-q_2$ $V_{10}-V_{11}=I_{11}\times Rd'(Q_{10}, I_{11}, T)-I_{10}\times Rd'(Q_{10}, I_{10}, T)$ $V_{20}-V_{21}=I_{21}\times Rd'(Q_{20}, I_{21}, T)-I_{20}\times Rd'(Q_{20}, I_{20}, T)$ $V_{30}-V_{31}=I_{31}\times Rd'(Q_{30}, I_{31}, T)-I_{30}\times Rd'(Q_{30}, I_{30}, T)$ $Rd'(Q_{10}, I_{10}, T)=a\times Rd(Q_{10}, I_{10}, T)+b$ $Rd'(Q_{10}, I_{11}, T)=a\times Rd(Q_{10}, I_{11}, T)+b$ $Rd'(Q_{20}, I_{20}, T)=a\times Rd(Q_{20}, I_{20}, T)+b$ $Rd'(Q_{20}, I_{21}, T)=a\times Rd(Q_{20}, I_{21}, T)+b$ $Rd'(Q_{30}, I_{30}, T)=a\times Rd(Q_{30}, I_{30}, T)+b$ $Rd'(Q_{30}, I_{31}, T)=a\times Rd(Q_{30}, I_{31}, T)+b$ (where each of a and b is a constant)

by solving these equations, the constants a and b and the remaining capacity $Q_{10}$ are estimated and a present remaining capacity $Q_{30}$ and an internal resistance Rd' (Q, I, T) of the inspective rechargeable battery which is deteriorated to increase the internal resistance are estimated, whereby the internal state of the inspective rechargeable battery is detected.

32. The detecting method according to claim 30, wherein in a case where the discharging current is changed at least four times from the steady discharging state such that when the battery voltage in the steady discharging at a discharging current $I_{10}$ is $V_{10}$, the discharging current is changed to $I_{11}$ and an electricity quantity $q_1$ of a current value $I_{11}\times a$ time $t_{11}$ from the battery voltage $V_{10}$ is discharged where the battery voltage is changed to $V_{20}$ from $V_{10}$, then the discharging current $I_{20}$ of the steady discharging is changed to $I_{21}$ and an electricity quantity $q_2$ of a current value $I_{21}\times a$ time $t_{21}$ is discharged from the battery voltage $V_{20}$ where the battery voltage is changed to $V_{30}$ from $V_{20}$, successively the discharging current $I_{30}$ of the steady discharging is changed to $I_{31}$ and an electricity quantity $q_3$ of a current value $I_{31}\times a$ time $t_{31}$ is discharged from the battery voltage $V_{30}$ where the battery voltage is changed to $V_{40}$ from $V_{30}$, finally the discharging current $I_{40}$ of the steady discharging is changed to $I_{41}$ and an electricity quantity $q_4$ of a current value $I_{41}\times a$ time $t_{41}$ is discharged from the battery voltage $V_{40}$ where the battery voltage is changed to $V_{50}$ from $V_{40}$, wherein as a result that the discharging current $I_{n0}$ of the steady discharging is changed to $I_{n1}$ and an electricity quantity $q_n$ of a current value $I_{n1}\times a$ time $t_{n1}$ is discharged, when the inspective rechargeable battery is judged that the electricity storable capacity is decreased in (3) of claim 29, then, the electricity storable capacity of the inspective rechargeable battery is assumed to be decreased from C to C'=D×C (where D is a constant of 0<D<1), the remaining capacity of the inspective rechargeable battery is assumed to be decreased from the remaining capacity Q of the corresponding normal rechargeable to a remaining capacity Q'=D×Q, and the internal resistance of the inspective rechargeable battery is assumed to be increased from the internal resistance Rd(Q, Id, T) of the corresponding normal rechargeable battery to an internal resistance R'(Q, Id, T)=a×Rd(Q, Id, T)+b (where each of a and b is a constant), successively, it is assumed that transient characteristics of the battery voltage in every change in the discharging current can be expressed by an equation $V=V_{n1}+(V_{n0}-V_{n1})\times e^{-t/\tau}$ (with t being a discharging time, $V_{n1}$ being a battery voltage of the battery when the discharging time t is extrapolated to infinity, τ being a time constant, and n is a positive integer of 1, 2, 3, 4, . . . ), in accordance with the measured battery voltages V to the time t since the time when the discharging current is changed and in accordance with said equation, the time constant τ when the discharging current $I_{n0}$ is changed to $I_{n1}$ is estimated and a true value of the $V_{n1}$ is estimated, next, an open-circuit voltage $Voc_{n0}$ of the inspective rechargeable battery having a remaining capacity $Q_{n0}'=D\times Q_{n0}$ when the discharging current is $I_{n0}$ and the battery voltage is $V_{n0}$ is expressed to be $Voc_{n0}=V_{n0}+I_{n0}\times Rd'(Q_{n0}, I_{n0}, T)=V_{n1}+I_{n1}\times Rd'(Q_{n0}, I_{n1}, T)$, [where n=1, 2, 3, . . . ], and when the remaining capacities when battery voltages are $V_{10}$, $V_{20}$, $V_{30}$, and $V_{40}$ are made to be $Q_{10}$, $Q_{20}$, $Q_{30}$ and $Q_{40}$, the following relationships are established: when Q=Q'/D:

$Q_{20}'=Q_{10}'-1_1$ $Q_{30}'=Q_{20}'-q_2=Q_{10}'-q_1-q_2$ $Q_{40}'=Q_{30}'-q_3=Q_{10}'-q_1-q_2q_3$ when $Q_{10}=Q_{10}'/D$, $Q_{20}=(Q_{10}'-q_1)/D$, $Q_{30}=(Q_{10}'-q_1-q_2)/D$, and $Q_{40}=(Q_{10}'-q_1-q_2-q_3)/D$:

$V_{10}-V_{11}=I_{11}\times Rd'(Q_{10}, I_{11}, T)-I_{10}\times Rd'(Q_{10}, I_{10}, T)$ $V_{20}-V_{21}=I_{21}\times Rd'(Q_{20}, I_{21}, T)-I_{20}\times Rd'(Q_{20}, I_{20}, T)$ $V_{30}-V_{31}=I_{31}\times Rd'(Q_{30}, I_{31}, T)-I_{30}\times Rd'(Q_{30}, I_{30}, T)$ $V_{40}-V_{41}=I_{41}\times Rd'(Q_{40}, I_{41}, T)-I_{40}\times Rd'(Q_{40}, I_{40}, T)$ $Rd'(Q_{10}, I_{10}, T)=a\times Rd(Q_{10}, I_{10}, T)+b$ $Rd'(Q_{10}, I_{11}, T)=a\times Rd(Q_{10}, I_{11}, T)+b$ $Rd'(Q_{20}, I_{20}, T)=a\times Rd(Q_{20}, I_{20}, T)+b$ $Rd'(Q_{20}, I_{21}, T)=a\times Rd(Q_{20}, I_{21}, T)+b$ $Rd'(Q_{30}, I_{30}, T)=a\times Rd(Q_{30}, I_{30}, T)+b$ $Rd'(Q_{30}, I_{31}, T)=a\times Rd(Q_{30}, I_{31}, T)+b$ $Rd'(Q_{40}, I_{40}, T)=a\times Rd(Q_{40}, I_{40}, T)+b$ $Rd'(Q_{40}, I_{41}, T)=a\times Rd(Q_{40}, I_{41}, T)+b$ (where each of a and b is a constant)

by solving these equations, a value of each of the constants a and b, a value of the D, and a value of the $Q_{10}=Q_{10}'/D$ are estimated, and a value of the electricity storable capacity which is deteriorated to be D times and a value of the increased internal resistance are estimated, whereby the internal state of the inspective rechargeable battery is detected.

33. The detecting method according to any of claims 30 to 32, wherein a current of ΔId is intentionally flown so that the discharging current $I_{n1}$ becomes to be $I_{n1}=I_{n0}+\Delta Id$ which is greater than the steady discharging current $I_{n0}$.

34. The detecting method according to claim 33, wherein the discharging current $I_{n1}$ is less than a current value of a rate of 2C.

35. The detecting method according to claim 8, wherein for the inspective rechargeable battery judged to be normal, the internal state thereof is detected as will be described below:
   (1) when the inspective rechargeable battery is in a paused state, using data or function formula of the relationship $Voc(Q_0)=Voc_0$ or $Q_0=Q(Voc_0)$ derived from the open-circuit voltage ($Voc_0$) of the inspective rechargeable battery and the basic data mentioned in (1) of claim 8, a remaining capacity $Q_0$ of the inspective rechargeable battery is estimated;
   (2) when the inspective rechargeable battery is during it being subjected to charging, a remaining capacity of the inspective rechargeable battery is estimated by any of the following manners (i) to (iii):
      (i) by measuring a charging current for the inspective rechargeable battery during the charging operation, a battery temperature and a battery voltage of the inspective rechargeable battery and with reference to the basic data and the function formula Vc(Q, Ic, T) or Q(Vc, Ic, T) mentioned in (4) of claim 8, a remaining capacity of the inspective rechargeable battery is estimated,
      (ii) the charging operation is temporarily suspended, where a charging time t and an open-circuit voltage Voc of the inspective rechargeable battery are measured to estimate a remaining capacity of the inspective rechargeable battery at that time, and
      (iii) by measuring a charging termination voltage $Vc_E$ of the inspective rechargeable battery and an open-circuit voltage $Voc_E$ of inspective rechargeable battery after the termination of the charging operation and with reference to data or function formulas of a relationship $Vc_E(Q_E, Ic, T)$ [$Q_E$ is a remaining capacity upon the termination of the charging operation] or $Q(Vc_E, Ic, T)$ derived from the basic data or the function formulas mentioned in (4) of claim 8 or data or function formulas of a relationship $Voc(Q_E)=Voc_E$ or $Q_E=Q(Voc_E)$ derived from the basic data or function formulas mentioned in (1) of claim 8, a remaining capacity of the inspective rechargeable battery is estimated;
   (3) when the inspective rechargeable battery is during it being subjected to discharging, a remaining capacity of the inspective rechargeable battery is estimated by any of the following manners (i) to (ii):
      (i) with reference to the function formula Vd(Q, Id, T) or Q(Vd, Id, T) mentioned in (2) of claim 8, a remaining capacity of the inspective rechargeable battery is estimated, and
      (ii) by estimating an internal resistance Rd of the inspective rechargeable battery and with reference to the function formula Q(Rd, Id, T) mentioned in (3) of claim 8, a remaining capacity the inspective rechargeable battery is estimated.

36. The detecting method according to claim 18, wherein for the inspective rechargeable battery judged to be free of short-circuit and of a decrease in the electricity storable but have an increase in the internal resistance, an increased internal resistance Rc'(Q, Ic, T) upon the charging operation is estimated and with reference to a relation expression Vc=Voc(Q)+Ic×Rc'(Q, Ic, T) of a relationship between the battery voltage, the open-circuit voltage Voc(Q), the charging current Ic, and the internal resistance Rc'(Q, Ic, T) upon the charging operation, the electricity storable capacity C' of the inspective rechargeable battery upon the termination of the charging operation is estimated from measured values of the charging current, battery voltage and open-circuit voltage upon the termination of the charging operation.

37. The detecting method according to claim 13 or 31, wherein for the inspective rechargeable battery judged to free of short-circuit and of a decrease in the electricity storable but have an increase in the internal resistance, an increased internal resistance Rd'(Q, Id, T) of the inspective rechargeable battery upon the discharging operation is estimated, and with reference to a relation expression Vd=Voc(Q)−Id×Rd'(Q, Id, T) of said increased internal resistance [in said relation expression, Vd is a battery voltage, Voc(Q) is an open-circuit voltage, Q is a remaining capacity, Id is a discharging current, and Rd'(Q, Id, T) is said internal resistance] and also reference to a function formula Vd'=Vd'(q, Id, T) [where T is a battery temperature], a battery voltage (Vd), a discharging current (Id), and a battery temperature (T) of the inspective rechargeable battery are measured upon the discharging operation, and a remaining capacity (Q) of the inspective rechargeable battery is computed.

38. The detecting method according to claim 19, wherein for the inspective rechargeable battery judged that the electricity storable capacity is decreased, a decrease coefficient D (0<D<1) of the decreased electricity storable capacity is estimated, and
   (1) when the internal resistance of the inspective rechargeable battery is not decreased, the electricity storable capacity is estimated to be D times the nominal capacity of the corresponding normal rechargeable battery, and
   (2) when the internal resistance is increased, with reference to a relation expression Vc=Voc(Q)+Ic×Rc'(Q, Ic, T) [where Vc is a battery voltage, Voc is an open-circuit voltage, Q is a remaining capacity, Ic is a charging current, and Rc'(Q, Id, T) is said increased internal resistance], a remaining capacity (Q) of the inspective rechargeable battery is computed and the value of the computed Q upon termination of full-charging is multiplied by D where the value obtained is estimated as an electricity storable capacity C' upon the termination of the full-charging.

39. The detecting method according to claim 14 or 32, wherein the inspective rechargeable battery is judged that the electricity storable capacity is decreased, and
   (1) when the internal resistance of the inspective rechargeable battery is not decreased, a decrease coefficient D (0<D<1) of the decreased electricity storable capacity is estimated, and the electricity storable capacity of the inspective rechargeable battery is estimated to be D times the nominal capacity of the corresponding normal rechargeable battery, and
   (2) when the internal resistance is increased, the decrease coefficient of the decreased electricity storable capacity and the increased internal resistance upon the discharging operation are estimated as a function formula $Rd'(Q, Id, T)$, and with reference to a relation expression $Vd=Voc(Q)-Id \times Rd'(Q, Id, T)$ [where Vc is a battery voltage, $Voc(Q)$ is an open-circuit voltage, Q is a remaining capacity, Id is a discharging current, and $Rc'(Q, Id, T)$ is said increased internal resistance]and also reference to a function formula $Vd=Vd(Q, Id, T)$ [where T is a battery temperature], a battery voltage (Vd), a discharging current (Id), and a battery temperature (T) of the inspective rechargeable battery are measured upon the discharging operation to estimate an apparent remaining capacity (Q) of the inspective rechargeable battery, and the apparent remaining capacity (Q) is multiplied by D to obtain a remaining capacity $Q'=D \times Q$ as a true remaining capacity of the inspective rechargeable battery.

40. The detecting method according to claim 8, wherein for the inspective rechargeable battery is during it being subjected to charging, a remaining capacity Q thereof is computed and a period of time until reaching a remaining capacity upon the termination of the charging operation is computed.

41. The detecting method according to claim 8, wherein for the inspective rechargeable battery is during it being subjected to discharging, after a remaining capacity Q thereof is computed and a remaining capacity $Q_{min}$ of the inspective rechargeable battery when the battery voltage becomes to be a minimum actuation voltage $V_{min}$ of an instrument in which the inspective rechargeable battery is used as the power source is computed, an usable capacity $(Q-Q_{min})$ of the inspective rechargeable battery with which the instrument is still able to operate is computed.

42. The detecting method according to claim 41, wherein after the usable capacity $(Q-Q_{min})$ of the inspective rechargeable battery is computed, in accordance with an equation $h=(Q-Q_{min})/i$ (where h is an actuation time of the instrument, and i is an average consumptive current of the instrument) or $h=(Vd+V_{min}) \times (Q-Q_{min})/2p$ (where p is an average consumptive power), a residual actuation time of the instrument is computed.

43. The detecting method according to claim 11, wherein the discharging current is a rectangular wave pulse current.

44. The detecting method according to claim 15 or 16, wherein the discharging current is a rectangular wave pulse current.

45. The detecting method according to claim 33, wherein the discharging current is a rectangular wave pulse current.

46. The detecting method according to claim 33, wherein the changing discharging current comprises a pausing pulse with no discharging current.

47. The detecting method according to claim 42, wherein the value of the average consumptive current or that of the average consumptive power is a value computed based on an operation pattern and a use frequency of the instrument by a user.

48. The detecting method according to claim 36 or 38, wherein when the performance $100 \times C'/C$ [%] relating to the electricity storable capacity of the inspective rechargeable battery after having deteriorated becomes to be less than 60%, the inspective rechargeable battery is judged to be over the lifetime.

49. The detecting method according to claim 1, wherein the inspective rechargeable battery is a rechargeable battery in which oxidation-reduction reaction of lithium is used.

50. The detecting method according to claim 1, wherein the inspective rechargeable battery is a rechargeable battery in which a hydrogen storage alloy is used in the anode of the battery.

51. The detecting method according to claim 1, wherein the inspective rechargeable battery is a rechargeable battery in which a nickel hydroxide is used in the cathode.

52. The detecting method according to claim 1, wherein the inspective rechargeable battery is a nickel-cadmium rechargeable battery.

53. The detecting method according to claim 1, wherein the inspective rechargeable battery is a lead-acid rechargeable battery.

54. A detecting device for detecting an internal state of a rechargeable battery in which the detecting method defined in claim 1 is adopted.

55. The detecting device according to claim 54, comprising at least (i) a voltage-detecting means for detecting a voltage between a pair of terminals of an inspective rechargeable battery, (ii) a current-detecting means for detecting a charging or discharging current flown in said inspective rechargeable battery, (iii) a temperature-detecting means for detecting a temperature of said inspective rechargeable battery, and (iv) a memorizing means for memorizing previously acquired basic data of a normal rechargeable battery which is the same kind and the same type of said inspective rechargeable battery or a function formula obtained by digitizing said basic data, wherein from said basic data or said function formula memorized in said memorizing means (iv) and information obtained from said voltage-detecting means (i), said current-detecting means (ii) and said temperature-detecting means (iii), an internal state of said inspective rechargeable battery is detected.

56. The detecting device according to claim 55 which further comprises a current-changing means for intentionally changing a current flown in the inspective rechargeable battery.

57. The detecting device according to claim 56, wherein the current-changing means includes a means for adding a prescribed pulse current to the current flown in the inspective rechargeable battery.

58. The detecting device according to claim 55 which further comprises a current flow change-detecting means for detecting a change in the current flown in inspective rechargeable battery.

59. The detecting device according to claim 55 which further comprises a wave form-processing means for processing a signal wave form outputted from each of the voltage-detecting means (i), the current-detecting means (ii) and the temperature-detecting means (iii).

60. The detecting device according to claim 55 which further comprises a operational means for processing the basic data and the information obtained from each of the voltage-detecting means (i), the current-detecting means (ii) and the temperature-detecting means (iii).

61. The detecting device according to claim 60, wherein the operational means has one or more means selected from the group consisting of (1) a computation means for computing at least either a remaining capacity or an internal resistance of the inspective rechargeable battery, (2) a computation means for computing an usable capacity of the inspective rechargeable battery with which an instrument can be used and at least either an average consumptive current or an average consumptive power which is consumed by said instrument, and (3) a computation means for computing at least either a time required until charging operation for the inspective rechargeable battery is terminated or a remaining capacity of the inspective rechargeable battery after said charging operation is terminated.

62. The detecting device according to claim 55 which further comprises a judging means for judging whether the inspective rechargeable battery is normal or deteriorated and also judging a deterioration mode when the inspective rechargeable battery is deteriorated.

63. The detecting device according to claim 55 which further comprises a means for outputting at least either the information obtained from each of the voltage-detecting means (i), the current-detecting means (ii) and the temperature-detecting means (iii) or information relating to the internal state of the inspective rechargeable battery.

64. The detecting device according to claim 63 which includes an indication means for indicating at least either the information obtained from each of the voltage-detecting means (i), the current-detecting means (ii) and the temperature-detecting means (iii) or the information relating to the internal state of the inspective rechargeable battery.

65. A battery module comprising at least one rechargeable battery and which is provided with a detecting device defined in claim 54.

66. The battery module according to claim 65 which has a communication means to an instrument.

67. An instrument which is provided with a detecting device defined in claim 54.

68. The instrument according to claim 67 which has a communication means.

69. A machine which is provided with a detecting device defined in claim 54.

70. The instrument according to claim 68, wherein said instrument is a cellular phone or a personal digital assistant.

71. The instrument according to claim 67, wherein said instrument is a computer.

72. The machine according to claim 69, wherein said machine comprises a computer.

73. The machine according to claim 69, wherein said machine is a vehicle.

74. The machine according to claim 69, wherein said vehicle is a machine having wheels.

75. The instrument according to claim 67, wherein said instrument is a charger to charge a rechargeable battery.

76. The machine according to claim 69 which has a charger to charge a rechargeable battery.

77. The instrument according to claim 67, wherein said instrument is an instrument for inspecting a rechargeable battery product whether it is good or not good.

78. The machine according to claim 69, wherein said machine is a machine for inspecting a rechargeable battery product whether it is good or not good.

79. A power storage system having a detecting device defined in claim 54.

80. A detecting program for detecting an internal state of a rechargeable battery, the program containing a detecting method defined in claim 1.

81. A memory medium having a detecting program defined in claim 80 therein.

82. The detecting method according to claim 1 or 2, wherein two or more of the judgment items (i) to (v) are used in combination.

83. A detecting program for detecting an internal state of a recharging battery by executing the detecting method of claim 2.

84. A detecting program for detecting an internal state of a recharging battery by executing the detecting method of claim 7.

85. A detecting program for detecting an internal state of a recharging battery by executing the detecting method of claim 8.

86. A computer program for executing a method for determining an internal state of a battery, wherein the method comprises:

inputting basic data of characteristics of a normal non-deteriorated rechargeable battery as a reference rechargeable battery for a subject rechargeable battery, the basic data of characteristics of the normal non-deteriorated rechargeable battery stored in a memory medium and including at least (i) a battery voltage, (ii) a remaining capacity, and (iii) a discharging capacity, which are aquired by subjecting the normal non-deteriorated rechargeable battery to charging or discharging under various temperature conditions and at various rates of charge or discharge;

inputting at least one of a measured voltage value and a measured current value of the subject rechargeable battery for comparison with the basic data of the normal non-deteriorated rechargeable battery; and determining, in comparison with the normal non-deteriorated rechargeable battery, at least one of whether (i) the subject rechargeable battery is short-circuited, (ii) the internal resistance of the subject rechargeable battery is increased, (iii) the electricity storable capacity of the subject rechargeable battery is decreased, and (iv) the subject rechargeable bettery is normal.

87. A computer program according to claim 86, wherein the method further comprises computing a remaining charge of the subject rechargeable battery or the a usable capacity of the subject battery in which the subject battery is capable of energizing an instrument.

88. A computer program according to claim 86 or 87, wherein the basic data comprise averaged basic data obtained by providing a plurality of normal non-deteriorated rechargeable batteries and subjecting the plurality of normal non-deteriorated rechargeable batteries to charging and discharging under various temperature conditions and at various rates of charge or discharge where battery voltages and remaining capacities or discharged electricity quantities of the normal rechargeable batteries are measured and averaging the measured battery voltages and the measured remaining capacities or the measured discharged electricity quantities of the normal rechrageable batteries.

89. A computer program according to claim 88, wherein the basic data comprise basic data obtained by computer simulation on the basis of the averaged basic data.

90. A computer program according to claim 86 or 87, wherein the basic data are obtained by computer simulation.

91. A computer program according to claim 86 or 87, wherein said determining step determines, by comparison with the normal non-deteriorated rechargeable battery, if the subject rechargeable battery is not short-circuited, then determines whether or not the electricity storable capacity of the subject rechargeable battery is decreased or whether or not the internal resistance of the subject rechargeable battery is increased.

92. A computer program according to claim 86 or 87, wherein (1) said determining step determines that the subject rechargeable battery is short-circuit when any of the following conditions (i) to (iv) are satisifed:

(i) without subjecting the subject rechargeable battery to charging or discharging, the battery has a decrease in battery voltage with the passage of time in the open-circuit voltage, (ii) upon charging, an increase in the battery voltage or open-circuit voltage of the subject rechargeable battery is smaller than that of the normal rechargeable battery, (iii) the open-circuit voltage of the subject rechargeable battery is smaller than that of the normal rechargeable battery and a descrease in the battery voltage of the subject rechargeable battery upon discharging is greater than that of the normal rechargeable battery, and (iv) the internal resistance of the subject rechargeable battery is smaller than that of the normal rechargeable battery;

(2) said determining step determines that the subject rechargeable battery is not short-circuited but that the internal resistance of the subject rechargeable battery is increased in comparison to a normal rechargeable battery if the subject rechargeable battery satisfies any of the following conditions (i) to (iii):

(i) the open-circuit voltage of the subject rechargeable battery is substantially the same as that of the normal rechargeable battery but an increase in the battery voltage of the subject rechargeable battery upon charging is greater than that of the normal rechargeable battery, (ii) the open-circuit voltage of the subject rechargeable battery is substantially the same as that of the normal rechargeable battery but a decrease in the battery voltage of the subject rechargeable battery upon charging is greater than that of the normal rechargeable battery, or (iii) the internal resistance of the subject rechargeable battery is greater than that of the normal rechargeable battery; and (3) said determining step determines that the subject rechargeable battery is not short-circuited but that the electricity storable capacity is decreased in comparison to a normal rechargeable battery if the subject rechargeable battery satisfies either of the following conditions (i) and (ii):

an increase in the battery voltage of the subject rechargeable battery upon charging and an increase in the open-circuit voltage thereof after the charging are greater than those of the normal rechargeable battery, or (ii) a decrease in the battery voltage of the subject rechargeable battery upon charging and a decrease in the open-circuit voltage thereof after the discharging are smaller than those in a case where the subject rechargeable battery is short-circuited but they are greater than those of the normal rechargeable battery; and (4) said determining step determines that the subject rechargeable battery is normal if the battery does not satisfy any of the above conditions (1) to (3).

93. A computer program according to claim 86 or 87, wherein the basic data include at least one of the following categories of data or function formulas:

(1)

(1) for a non-deteriorated normal rechargeable battery, basic data of a relationship $Voc(Q)$ or $Q(Voc)$ of the open-circuit voltage (Voc) to the remaining capacity (Q) which are obtained by way of measurement or function formulas obtained on the basis of the basic data;

(2) for said non-deteriorated normal rechargeable battery when it is in a full-charged state, basic data of relationships between battery voltages (Vd) measured when the rechargeable battery is subjected to discharging at various battery temperatures (T) and at various discharging currents (Id), open-circuit voltages (Voc) measured when the discharging is temporarily suspended, said discharging currents (Id) and said battery temperatures (T) or a function formula $Vd(Voc,$ $Id, T)$ obtained on the basis of said data; and basic data or a function formula of a battery voltage-related function formula $Vd(Q, Id, T)$ or $Q(Vd, Id, T)$ obtained with reference to aforesaid data and aforesaid function formula and also with reference to the data or the function formula of the relationship $Voc(Q)$ of the open-circuit voltage (Voc) to the remaining capacity which are described in the above category (1);

(3) internal resistance-related basic data computed from a relation expression $Vd=Voc-Id \times Rd$ or $Rd=(Voc-Vd)/Id$ when the internal resistance of the normal rechargeable battery is made to be Rd in the above (2), or a function formula $Rd(Voc, Id, T)$ or $Rd(Vd, Id, T)$ obtained on the basis of said data, in addition, basic data or a function formula of an internal resistance-related function formula $Rd(Q, Id, T)$ or $Q(Rd, Id, T)$ obtained with reference to aforesaid data and aforesaid function formula of the relationship $Voc(Q)$ of the open-circuit voltage (Voc) which are described in the above cateogry (1);

(4) for the above non-deteriorated normal rechargeable battery when the remaining capacity thereof is zero, data of relationships between battery voltages (Vc) measured when the rechargeable battery is subjected to charging at various battery temperatures (T) and at various charging currents (Ic), open-circuit voltages (Voc) measured when the charging is temporarily suspended, said discharging currents (Ic) and said battery temperatures (T) or a function formula $Vc(Voc, Ic, T)$ obtained on the basis of said data, in addition, data or a function formula of a battery voltage-related function formula $Vc(Q, Ic, T)$ or $Q(Vc, Ic, T)$ obtained with reference to aforesaid data and aforesaid function formula and also with reference to the data or the function formula of the relationship $Voc(Q)$ of the open-circuit voltage (Voc) which are described in the above category (1);

(5) internal resistance-related data computed from a relation expression $Vc=Voc+Ic \times Rc$ or $Rc=(Vc-Voc)/Ic$ when the internal resistance of the normal rechargeable battery is made to be Rc in the above (4), or a function formula $Rc(Voc, Ic, T)$ obtained on the basis of said data, in addition, data or a function formula of an internal resistance-related function formula $Rc(Q, Ic, T)$ or $Q(Rc, Ic, T)$ obtained with reference to aforesaid data and aforesaid function formula and also with reference to the data or the function formula of the relationship $Voc(Q)$ of the open-circuit voltage (Voc) which are described in the above category (1).

94. A computer program according to claim 93, wherein, when the subject rechargeable battery does not have a decrease in the electricity storable capacity but has an increase in the internal resistance, the relationship $Voc(Q)$ or $Q(Voc)$ of the open-circuit voltage to the remaining capacity of the normal non-deteriorated rechargeable battery can be applied between the open-circuit voltage and the remaining capacity of the subject rechargeable battery, and wherein, when the subject rechargeable battery has a decrease in the electricity storable capacity of a value D times that of the normal non-deteriorated rechargeable battery and the remaining capacity of the subject rechargeable battery is Q', when the relationship of Q' to D is made to be $Q'/D=Q$, the relationship $Voc(Q)$ or $Q(Voc)$ of the normal non-deteriorated rechargeable battery can be applied between the remaining capacity and the open-circuit voltage of the subject rechargeable battery, where the function formula $Voc(Q'/D)$ or $Q'/D=Q(Voc)$ is established.

95. A computer program according to claim 94, wherein, when the subject rechargeable battery is discharged, a change in the discharge current and a change in the battery voltage are measured and an internal state of the subject rechargeable battery is detected as will be described below:

(1) when the electricity storable capacity of the subject rechargeable battery is a value D times that of the normal non-deteriorated rechargeable battery and where the internal resistance of the subject rechargeable battery when the remaining capacity of the subject rechargeable battery $Q'=Q \times D$ is assumed to be changed to $Rd'(Q, I_d, T)$ from $Rd(Q, T_d, T)$ of the normal non-deteriorated rechargeable battery, the battery voltage V of the subject rechargeable battery upon the discharging can be expressed as $V=Voc(Q)-I_3 \times Rd'(Q, I_d), T)$;

(2) in a case where the discharge current is changed n times in an increasing direction during the discharging of the subject rechargeable battery and the discharge current is changed to $I_{n1}$ from $I_{n0}$ of the stationary discharge current during t time ($I_{n0}<I_{n1}$), the battery voltage (V) of the transient characteristics of the subject rechargeable battery is expressed by the equation $V=V_{n1}+(V_{n0}-V_{n1}) \times e^{-t/\tau}$, (with t being a discharging time, $V_{n1}$ being a battery voltage when the discharging time t is extrapolated to infinity, $\tau$ being a time constant, and n being a positive integer of 1, 2, 3, 4, ...), and a stationary value $V_{n1}$ of the battery voltage (V) when the discharging current is $I_{n1}$ is computed from a measured value of the battery voltage (V) and in accordance with aforesaid equation, wherein it is presumed that the remaining capacity is Q' when the stationary discharge current is $I_{n0}$ and the battery voltage if $V_{n0}$ and at this time, the battery voltage becomes a stationary value when the discharge current is increased to $I_{n1}$, the following equations are established:

$V_{n0}=Voc (Q'/D)-I_{n0} \times Rd'(Q'/D, I_{n0}, T)$ $V_{n1}=Voc (Q'/D)-I_{n1} \times Rd'(Q'/D, I_{n1}, T)$ $V_{n0}-V_{n1}=I_{n1} \times Rd'(Q'/D, I_{n1}, T)-I_{n0} \times Rd'(Q'/D, I_{n0}, T)$;

and (3) changed values in the current of the subject rechargeable battery which is being discharged during which the discharge current is changed n times are detected and wherein values of the discharge current and values of the battery voltage are measured during which values of the discharged electricity quantity are measured, and from the results and the "n"-related simultaneous equation $V_{n0}-V_{n1}=I_{n1} \times Rd'(Q'/D, I_{n1}, T)-I_{n0} \times Rd'(Q'/D, I_{n0}, T)$ [n=1, 2, 3, 4 ...] described in (2) above, the remaining capacity, D, the electricity storable capacity and the internal resistance of the subject rechargeable battery are computed.

96. A computer program according to claim 95, wherein, presuming that:

$Rd'(Q'/D, Id, T)=a \times Rd'(Q, Id, T)+b$ $Rd'(Q'/D, I_{n0}, T)=a \times Rd'(Q, I_{n0}, T)+b$ $Rd'(Q'/D, I_{n1}, T)=a \times Rd'(Q, I_{n1}, T)+b$ (where each of a and b is a constant),
a constant a and a constant b concerning a change in the internal resistance of the subject rechargeable battery are computed to obtain oan internal resistance of the subject rechargeable battery.

* * * * *

UNITED STATES PATENT AND TRADEMARK OFFICE
CERTIFICATE OF CORRECTION

PATENT NO.    : 6,563,318 B2
DATED         : May 13, 2003
INVENTOR(S)   : Soichiro Kawakami et al.

It is certified that error appears in the above-identified patent and that said Letters Patent is hereby corrected as shown below:

Drawings,
FIGURE 14, Box S1003, "MESUREMENT" should read -- MEASUREMENT --.
Box S1004, "MESUREMENT" should read -- MEASUREMENT --.
FIGURE 32, "VOLTAGR" should read -- VOLTAGE --.

Column 1,
Line 20, "an" should read -- to an --;
Line 34, "to" should read -- of --;
Line 45, "using" should read -- by using --;
Line 54, "Besides" should read -- Furthermore, --; and
Line 67, "includes" should read -- include --.

Column 2,
Line 38, "prising a graphite)," should read -- prises graphite), --;
Line 40, "flown" should read -- flow --;
Line 46, "comprising" should read -- comprises --;
Line 51, "other" should read -- another --; and
Line 55, "cummulative" should read -- cumulative --.

Column 3,
Line 37, "while flowing an alternate" should read -- by applying an alternating --;
Line 42, "alternate" should read -- alternating --; and
Line 44, "when" should read -- the time when --.

Column 4,
Line 24, "experiments" should read -- experimental --;
Line 27, "its" should read -- to its --; and
Line 55, "function," should read -- carried out,--

Column 9,
Line 22, "use" should read -- be used --;
Line 25, "having" should read -- has --; and Column 10,
Line 46, "formula" should read -- formulas --.

Column 11,
Line 24, "relationship" should read -- relationships --;
Line 53, "depends" should read -- depend --;
Line 58, "formula" should read -- formulas --; and
Line 65, "a" should read -- an --.

UNITED STATES PATENT AND TRADEMARK OFFICE
CERTIFICATE OF CORRECTION

PATENT NO. : 6,563,318 B2
DATED : May 13, 2003
INVENTOR(S) : Soichiro Kawakami et al.

It is certified that error appears in the above-identified patent and that said Letters Patent is hereby corrected as shown below:

Column 12,
Line 5, "graph of a graph" should read -- graph --; and
Lines 38 and 66, "formula" should read -- formulas --..

Column 13,
Line 33, "formula which is intended to obtain can" should read -- formula can --.

Column 14,
Line 66, "recharge" should read -- rechargeable --.

Column 15,
Line 5, "recharge" should read -- rechargeable --; and
Lines 51 and 57, "batter" should read -- battery .

Column 17,
Line 67, "the" should read -- to the --.

Column 19,
Lines 31 and 32, "judged" should read -- it is judged --.

Column 21,
Line 46, "a" should read -- an --.

Column 22,
Line 6, "$R_2$[a" should read -- $R_2$ - [a --; and
Line 67, "q," should read -- $q_1$ --.

Column 23,
Line 27, "intended to examine" should read -- to be examined --.

Column 24,
Lines 44 and 46, "judged" should read -- it is judged --.

Column 25,
Line 39, "constants" should read -- constant --.

Column 26,
Line 18, "intended to examine is subjected charging" should read -- to be examined is subjected to charging --.

UNITED STATES PATENT AND TRADEMARK OFFICE
CERTIFICATE OF CORRECTION

PATENT NO. : 6,563,318 B2
DATED : May 13, 2003
INVENTOR(S) : Soichiro Kawakami et al.

It is certified that error appears in the above-identified patent and that said Letters Patent is hereby corrected as shown below:

Column 28,
Line 5, "intended to examine" should read -- to be examined --.

Column 33,
Line 16, "is" should read -- that is --; and
Line 44, "a" should read -- an --.

Column 34,
Line 48, "occur" should read -- bring about --;
Line 52, "influence to an" should read -- influence an --; and
Line 54, "occurred" should read -- brought about --.

Column 35,
Line 12, "shows the of the" should read -- shows the --; and
Line 65, "$V_{vn1} + I_{n1} \times Rd'(Q_{n0}, I_{n1}, T)$" should read -- $V_{n1} + I_{n1} \times Rd'(Q_{n0}, I_{N1}, T)$ --.

Column 38,
Line 16, "is deteriorated to be D" should read -- has deteriorated by a factor of D --; and
Line 17, "time and the" should read -- and the --.

Column 40,
Line 33, "D time" should read -- a factor of D --;
Line 40, "time" should read -- times --;
Line 48, "D time to" should read -- D to --; and
Line 59, "is started using" should read -- has begun to be used --.

Column 41,
Line 19, "D time is" should read -- D is --;
Line 20, "time" should read -- times --; and
Line 42, "D time to" should read -- D to --.

Column 42,
Line 44, "flown" should read -- flowing --.

Column 44,
Line 29, "batter" should read -- battery --; and
Line 61, "vale" should read -- value --.

Column 48,
Line 19, "batter" should read -- battery --.

UNITED STATES PATENT AND TRADEMARK OFFICE
CERTIFICATE OF CORRECTION

PATENT NO. : 6,563,318 B2
DATED : May 13, 2003
INVENTOR(S) : Soichiro Kawakami et al.

It is certified that error appears in the above-identified patent and that said Letters Patent is hereby corrected as shown below:

Column 49,
Line 7, "becomes to a voltage" should read -- becomes a voltage --.
Line 41, "batter" should read -- battery --; and
Line 49, "internal state of a" should read -- an internal state of an --.

Column 50,
Line 8, "flown" should read -- flowing --; and
Line 24, "equipments which are using," should read -- equipment which is in use, --.

Column 51,
Line 2, "For" should read -- for --;
Line 2, "is" should read -- battery is --; and
Line 53, "(flown" should read -- (flowing --.

Column 52,
Line 55, "base." should read -- base was obtained. --; and
Line 56, "a graph" should read -- is a graph --.

Column 53,
Line 35, "bases." should read -- bases are obtained.--.

Column 55,
Line 54, "+ $K_{12.4} \times I^3$" should read -- + $K_{12.4} \times I^4$ + $K_{12.3} \times I^3$ --;
Line 55, "+ $K_{11.2} \times I^1$" should read -- + $K_{11.2} \times I^2$ + $K_{11.1} \times I^1$ --; and
Line 56, "+ $K_{0.1} \times I^0$" should read -- + $K_{0.1} \times I^1$ + --.

Column 58,
Line 30, "$K_{0.4=-.}0$" should read -- $K_{0.4}$=-0.0 --.

Column 60,
Line 5, "being" should read -- been --.

Column 61,
Line 22, "being" should read -- been --.

Column 62,
Line 65, "when" should read -- time when --.

Column 63,
Lines 2, 20, 34 and 38, "when" should read -- time when --.

UNITED STATES PATENT AND TRADEMARK OFFICE
CERTIFICATE OF CORRECTION

PATENT NO.    : 6,563,318 B2
DATED         : May 13, 2003
INVENTOR(S)   : Soichiro Kawakami et al.

It is certified that error appears in the above-identified patent and that said Letters Patent is hereby corrected as shown below:

Column 64,
Line 6, "being" should read -- been --;
Line 12, "is corresponding" should read -- corresponds to --;
Line 44, "occur" should read -- bring about --; and
Line 67, "thereof" should read -- thereof. --.

Column 65,
Line 13, "indexes" should read -- index --;
Line 40, "being" should read -- been --; and
Line 63, "a" should read -- with a --.

Column 67,
Lines 38 and 60, "when" should read -- time when --.

Column 68,
Line 33, "an decreased" should read -- a decrease --; and
Line 34, "the" should read -- to the --.

Column 74,
Line 35, "I1," should read -- $I_1$, --.

Column 76,
Line 36, "are" should read -- battery are --;
Line 37, "claim 8 or 10" should read -- claims 8 to 10 --.

Column 79,
Line 60, "an elapse" should read -- a lapse --.

Column 80,
Line 28, "an elapse" should read -- a lapse --;
Line 52, "($S_o$)" should read -- ($s_o$) --;
Line 53, "dvc/dt<$S_o$(0<$s_o$);" should read -- $dVc/dt<s_o(0<s_o)$; --; and
Line 56, "the" should read -- of the --.

Column 81,
Lines 2 and 17, "batter" should read -- battery --.

Column 82,
Line 28, "an elapse" should read -- a lapse --.

UNITED STATES PATENT AND TRADEMARK OFFICE
CERTIFICATE OF CORRECTION

PATENT NO.    : 6,563,318 B2
DATED         : May 13, 2003
INVENTOR(S)   : Soichiro Kawakami et al.

It is certified that error appears in the above-identified patent and that said Letters Patent is hereby corrected as shown below:

Column 85,
Line 20, "$Q_{10}31q_1-q_2$" should read -- $Q_{10}-q_1-q_2$ --.

Column 86,
Line 8, "to" should read -- battery to --; and
Line 40, "$Q_{20}' = Q_{10}'- 1_1$" should read -- $Q_{20}' = Q_{10}' - q_1$ --.

Column 87,
Line 9, "flown" should read -- made to flow;, ; and
Lines 26 and 57, "during it" should read -- is --.

Column 88,
Line 2, "the" should read -- of the --; and
Lines 6 and 20, "have" should read -- which has --.

Column 89,
Line 4, "$V_c$" should read -- $V_d$ --;
Line 6, "$Rc^1(Q,$" should read -- $Rd^1(Q,$ --;
Lines 18 and 24, "is during it" should read -- is --; and
Line 29, "an" should read -- a --.

Column 90,
Lines 17, 32 and 36, "flown" should read -- flowing --;
Line 40, "flown in inspective" should read -- flowing in the inspective --.
Line 40, "inspective" should read -- the inspective --; and
Lines 48 and 57, "a" should read -- an --.

Column 92,
Line 25, "the a" should read -- the --; and
Line 56, "short-circuit" should read -- short-circuited --.

Column 93,
Line 52, "(1)" should be deleted.

Column 94,
Line 35, "(1);" should read -- (1); and --.

Column 95,
Line 16, "$I_d$)," should read -- $I_d$, --.

UNITED STATES PATENT AND TRADEMARK OFFICE
CERTIFICATE OF CORRECTION

PATENT NO. : 6,563,318 B2
DATED : May 13, 2003
INVENTOR(S) : Soichiro Kawakami et al.

It is certified that error appears in the above-identified patent and that said Letters Patent is hereby corrected as shown below:

Column 96,
Line 33, "oan" should read -- an --.

Signed and Sealed this

Sixth Day of April, 2004

JON W. DUDAS
*Acting Director of the United States Patent and Trademark Office*